(12) United States Patent
Sakamoto et al.

(10) Patent No.: US 12,740,316 B2
(45) Date of Patent: Sep. 15, 2026

(54) LIGHT EMITTING DEVICE AND AMINE COMPOUND FOR LIGHT EMITTING DEVICE

(71) Applicant: Samsung Display Co., Ltd., Yongin-si (KR)

(72) Inventors: Naoya Sakamoto, Yokohama (JP); XiuLan Jin, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 965 days.

(21) Appl. No.: 17/579,921

(22) Filed: Jan. 20, 2022

(65) Prior Publication Data

US 2023/0013038 A1 Jan. 19, 2023

(30) Foreign Application Priority Data

Jun. 11, 2021 (KR) ........................ 10-2021-0076270

(51) Int. Cl.

*H10K 85/60* (2023.01)
*H10K 50/11* (2023.01)
*H10K 50/15* (2023.01)
*H10K 59/80* (2023.01)
*H10K 101/10* (2023.01)

(52) U.S. Cl.

CPC ........... *H10K 85/631* (2023.02); *H10K 50/15* (2023.02); *H10K 85/626* (2023.02); *H10K 85/654* (2023.02); *H10K 85/6574* (2023.02); *H10K 85/6576* (2023.02); *H10K 50/11* (2023.02);

(Continued)

(58) Field of Classification Search

CPC .... H10K 85/631; C07C 211/54; C07C 211/57
See application file for complete search history.

(56) References Cited

U.S. PATENT DOCUMENTS 10,879,471 B2 12/2020 Miyake et al.
2018/0226585 A1* 8/2018 Park ....................... C09K 11/06

(Continued)

FOREIGN PATENT DOCUMENTS

CN 108101897 A 6/2018
CN 111808013 A * 10/2020 ........... C07D 209/86

(Continued)

OTHER PUBLICATIONS

Machine Translation of CN111808013A (Year: 2020).*
Machine Translation of KR101854886B1 (Year: 2018).*
Machine Translation of CN111995530A (Year: 2020).*

*Primary Examiner* — Jenna N Chandhok
(74) *Attorney, Agent, or Firm* — Lerner David LLP

(57) ABSTRACT

A light emitting device includes a first electrode, a second electrode facing the first electrode, and organic layers disposed between the first electrode and the second electrode, wherein the organic layers include at least one organic layer that includes an amine compound represented by Formula 1. The light emitting device may exhibit improved luminous efficiency characteristics.

[Formula 1]

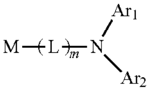

21 Claims, 6 Drawing Sheets

(52) U.S. Cl.
CPC ....... *H10K 59/805* (2023.02); *H10K 2101/10* (2023.02)

(56) References Cited

U.S. PATENT DOCUMENTS

| | | | | |
|---|---|---|---|---|
| 2019/0039996 | A1 | 2/2019 | Takada et al. | |
| 2019/0348605 | A1 | 11/2019 | Mujica-Fernaud et al. | |
| 2020/0185612 | A1 | 6/2020 | Tokuda et al. | |
| 2021/0066597 | A1 | 3/2021 | Miyake et al. | |
| 2023/0078029 | A1* | 3/2023 | Uno | C07D 307/91 257/40 |
| 2023/0107477 | A1* | 4/2023 | Uno | H10K 85/626 257/40 |

FOREIGN PATENT DOCUMENTS

| | | | | |
|---|---|---|---|---|
| CN | 111995530 | A * | 11/2020 | H10K 85/631 |
| KR | 10-1854886 | | 5/2018 | |
| KR | 101854886 | B1 * | 5/2018 | |
| KR | 20190103788 | A | 9/2019 | |
| KR | 10-2078171 | | 2/2020 | |
| KR | 20210066692 | A | 6/2021 | |
| WO | 2019/044542 | | 3/2019 | |

* cited by examiner

LIGHT EMITTING DEVICE AND AMINE COMPOUND FOR LIGHT EMITTING DEVICE

CROSS-REFERENCE TO RELATED APPLICATION(S)

This application claims priority to and benefits of Korean Patent Application No. 10-2021-0076270 under 35 U.S.C. § 119, filed on Jun. 11, 2021 in the Korean Intellectual Property Office, the entire contents of which are incorporated herein by reference.

BACKGROUND

1. Technical Field

The disclosure herein relates to a light emitting device including a novel amine compound used as a hole transport material.

2. Description of the Related Art

Active development continues for an organic electroluminescence display apparatus as an image display apparatus. In contrast to liquid crystal display apparatuses and the like, the organic electroluminescence display apparatus is a so-called self-luminescent display apparatus in which holes and electrons respectively injected from a first electrode and a second electrode recombine in an emission layer, and thus a luminescent material including an organic compound in the emission layer emits light to implement display.

In the application of an organic electroluminescence display apparatus to an image display apparatus, there is a demand for decreasing driving voltage and for increasing emission efficiency and the life of the organic electroluminescence device, and continuous development is required on materials for an organic electroluminescence device which is capable of stably attaining such characteristics.

Development on materials of a hole transport layer is being conducted in order to realize a highly efficient organic electroluminescence device.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a light emitting device in which luminous efficiency and a service life are improved.

The disclosure also provides an amine compound capable of improving luminous efficiency and device service life of a light emitting device.

An embodiment provides a light emitting device which may include a first electrode, a second electrode facing the first electrode, and organic layers disposed between the first electrode and the second electrode, wherein the organic layers includes at least one organic layer which may include an amine compound represented by Formula 1:

[Formula 1]

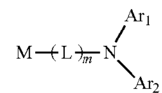

In Formula 1, L may be a substituted or unsubstituted arylene group having 6 to 30 ring-forming carbon atoms, or a substituted or unsubstituted heteroarylene group having 2 to 30 ring-forming carbon atoms, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms, m may be 1 or 2, M may be a group represented by Formula 2, and at least one of $Ar_1$ and $Ar_2$ may be a group represented b Formula 3:

[Formula 2]

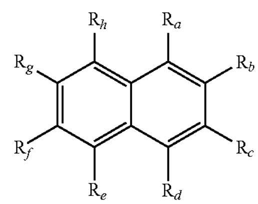

In Formula 2, $R_a$ to $R_h$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, wherein at least one of $R_a$ to $R_h$ may not be a hydrogen atom, and one of $R_a$ to $R_h$ may be a position linked to L in Formula 1.

[Formula 3]

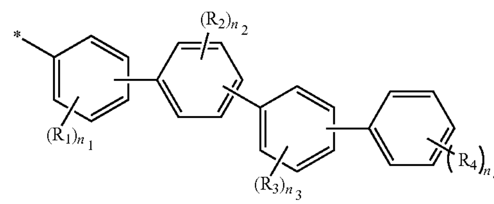

In Formula 3, $R_1$ to $R_4$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, where the case in which each of $R_1$ and $R_2$ is an unsubstituted phenyl group may be excluded, ——* is a position linked to N in Formula 1, $n_1$ to $n_3$ may each independently be an integer from 0 to 4, $n_4$ may be an integer from 0 to 5. In Formula 3, when L in Formula 1 is a p-phenylene group, when a group represented by Formula 3 is a group represented by Formula 3-a, and when $R_a$ in Formula 2 is linked to L in Formula 1, $R_b$ in Formula 2 may not be an unsubstituted phenyl group.

[Formula 3-a]

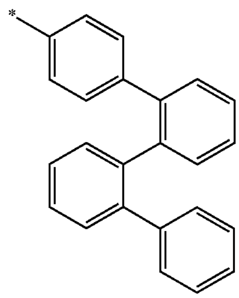

In an embodiment, the organic layers may include a hole transport region disposed on the first electrode, an emission layer disposed on the hole transport region, and an electron transport region disposed on the emission layer, and the hole transport region may include the amine compound.

In an embodiment, the hole transport region may include a hole injection layer disposed on the first electrode, and a hole transport layer disposed on the hole injection layer, and the hole transport layer may include the amine compound.

In an embodiment, the hole transport region may include hole transport organic layers, and the hole transport organic layers may include a layer that is adjacent to the emission layer and includes the amine compound.

In an embodiment, the amine compound represented by Formula 1 may be a monoamine compound.

In an embodiment, the amine compound represented by Formula 1 may be represented by Formula 4-1 or Formula 4-2:

[Formula 4-1]

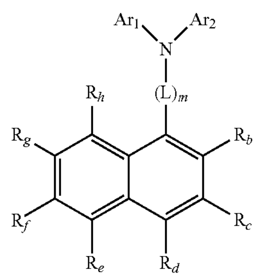

[Formula 4-2]

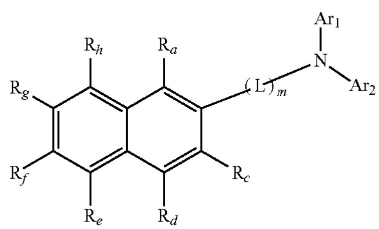

In Formula 4-1 and Formula 4-2, $Ar_1$, $Ar_2$, L, $R_a$ to $R_h$, and m may be the same as defined in Formula 1 and Formula 2.

In an embodiment, the amine compound represented by Formula 1 may be represented by any one of Formula 5-1 to Formula 5-3:

[Formula 5-1]

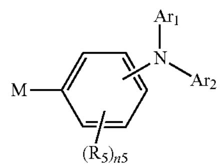

[Formula 5-2]

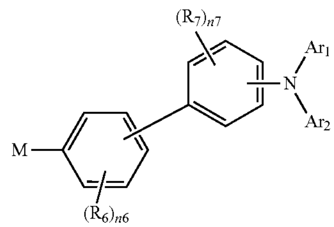

[Formula 5-3]

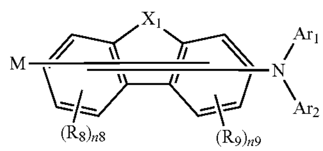

In Formula 5-1 to Formula 5-3, $X_1$ may be $N(R_{10})$, O, or S, $R_5$ to $R_{10}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $n_5$ to $n_9$ may each independently be an integer from 0 to 4, and the sum of $n_5$ and $n_9$ may be equal to or less than 6.

In Formula 5-1 to Formula 5-3, M, $Ar_1$, and $Ar_2$ may be the same as defined in Formula 1.

In an embodiment, the amine compound represented by Formula 1 may be represented by any one of Formula 6-1 to Formula 6-5:

[Formula 6-1]

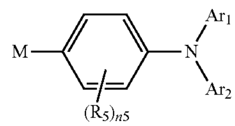

[Formula 6-2]

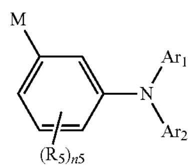

[Formula 6-3]

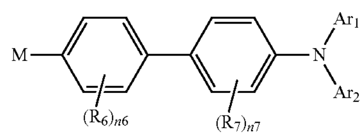

[Formula 6-4]

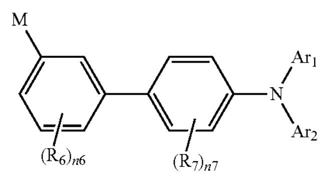

-continued

[Formula 6-5]

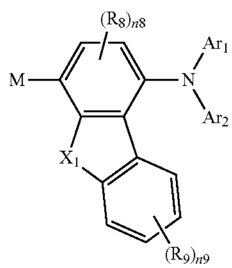

In Formula 6-1 to Formula 6-5, $n_{8-1}$ may be an integer from 0 to 2.

In Formula 6-1 to Formula 6-5 above, $Ar_1$, $Ar_2$, M, $X_1$, $R_5$ to $R_9$, $n_5$ to $n_7$, and $n_9$ may be the same as defined in Formula 1 and Formula 5-1 to Formula 5-3.

In an embodiment, $Ar_1$ may be a group represented by Formula 3, and $Ar_2$ may be a group represented by any one of Formula 7-1 to Formula 7-5.

[Formula 7-1]

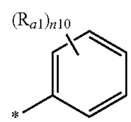

[Formula 7-2]

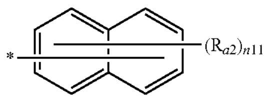

[Formula 7-3]

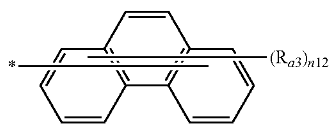

[Formula 7-4]

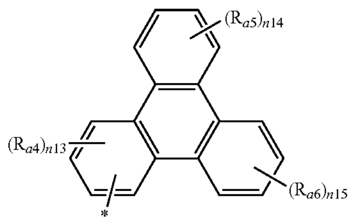

[Formula 7-5]

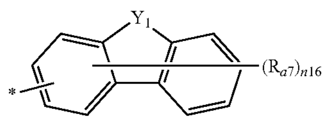

In Formula 7-1 to Formula 7-5, $Y_1$ may be $N(R_{11})$, O, or S, $R_{a1}$ to $R_{a6}$ and $R_{11}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{a7}$ may be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, $n_{10}$ may be an integer from 0 to 5, $n_{11}$ and $n_{16}$ may each independently be an integer from 0 to 7, $n_{12}$ may be an integer from 0 to 9, $n_{13}$ may be an integer from 0 to 3, $n_{14}$ and $n_{15}$ may each independently be an integer may be 0 to 4, and ——* is a position linked to N in Formula 1.

In an embodiment, $R_a$ to $R_h$ may each independently be a hydrogen atom, a deuterium atom, a halogen atom, a substituted or unsubstituted alkyl group having 1 to 10 carbon atoms, a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group.

In an embodiment, the at least one of $Ar_1$ and $Ar_2$ that is represented by Formula 3 may be a group represented by any one of Formula 8-1 to Formula 8-9.

[Formula 8-1]

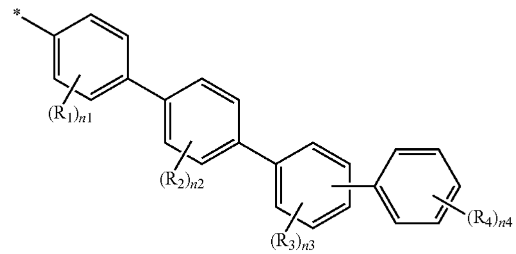

[Formula 8-2]

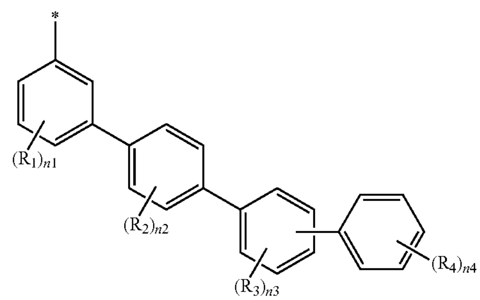

[Formula 8-3]

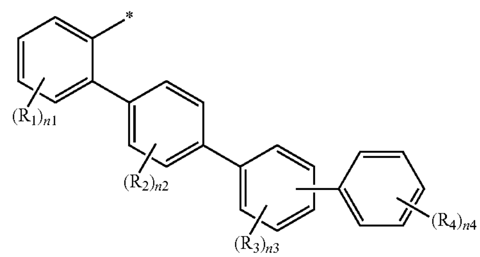

[Formula 8-4]

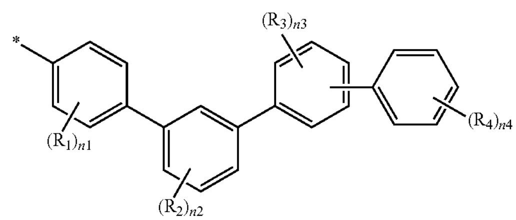

-continued

[Formula 8-5]

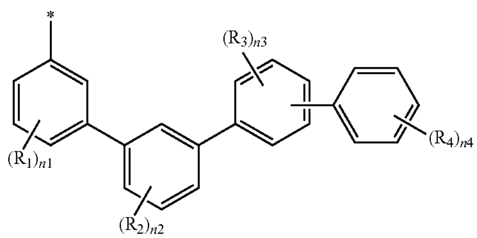

[Formula 8-6]

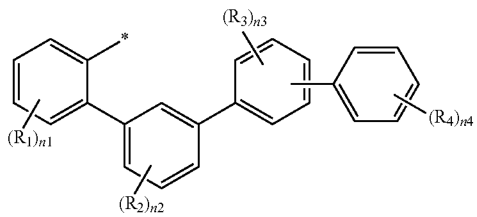

[Formula 8-7]

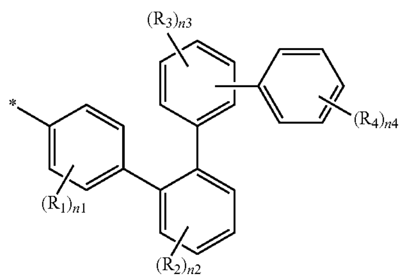

[Formula 8-8]

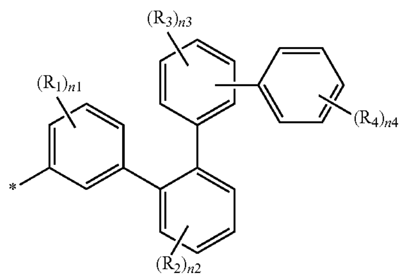

[Formula 8-9]

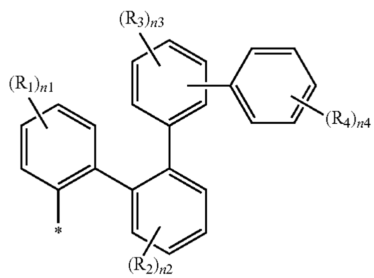

In Formula 8-1 to Formula 8-9, $R_1$ to $R_4$, $n_1$ to $n_4$, and ——* may be the same as defined in Formula 3.

In an embodiment, $R_1$ to $R_4$ may each independently be a hydrogen atom, a deuterium atom, a halogen atom, or a substituted or unsubstituted alkyl group having 1 to 10 carbon atoms.

In an embodiment, when L in Formula 1 is linked to $R_a$ in Formula 2, at least any one of $R_b$ to $R_h$ may be a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group, except that $R_b$ may not be an unsubstituted phenyl group, and when L in Formula 1 is linked to $R_b$ in Formula 2, at least one of $R_a$ and $R_c$ to $R_h$ may be a substituted or unsubstituted phenyl group.

In an embodiment, the amine compound represented by Formula 1 may include at least one selected from Compound Group 1, which is defined below.

In an embodiment, an amine compound may be represented by Formula 1.

BRIEF DESCRIPTION OF THE DRAWINGS

The accompanying drawings are included to provide a further understanding of the embodiments, and are incorporated in and constitute a part of this specification. The drawings illustrate embodiments of the disclosure and principles thereof. The above and other aspects and features of the disclosure will become more apparent by describing in detail embodiments thereof with reference to the attached drawings, in which.

DETAILED DESCRIPTION OF THE EMBODIMENTS

Figure 1:
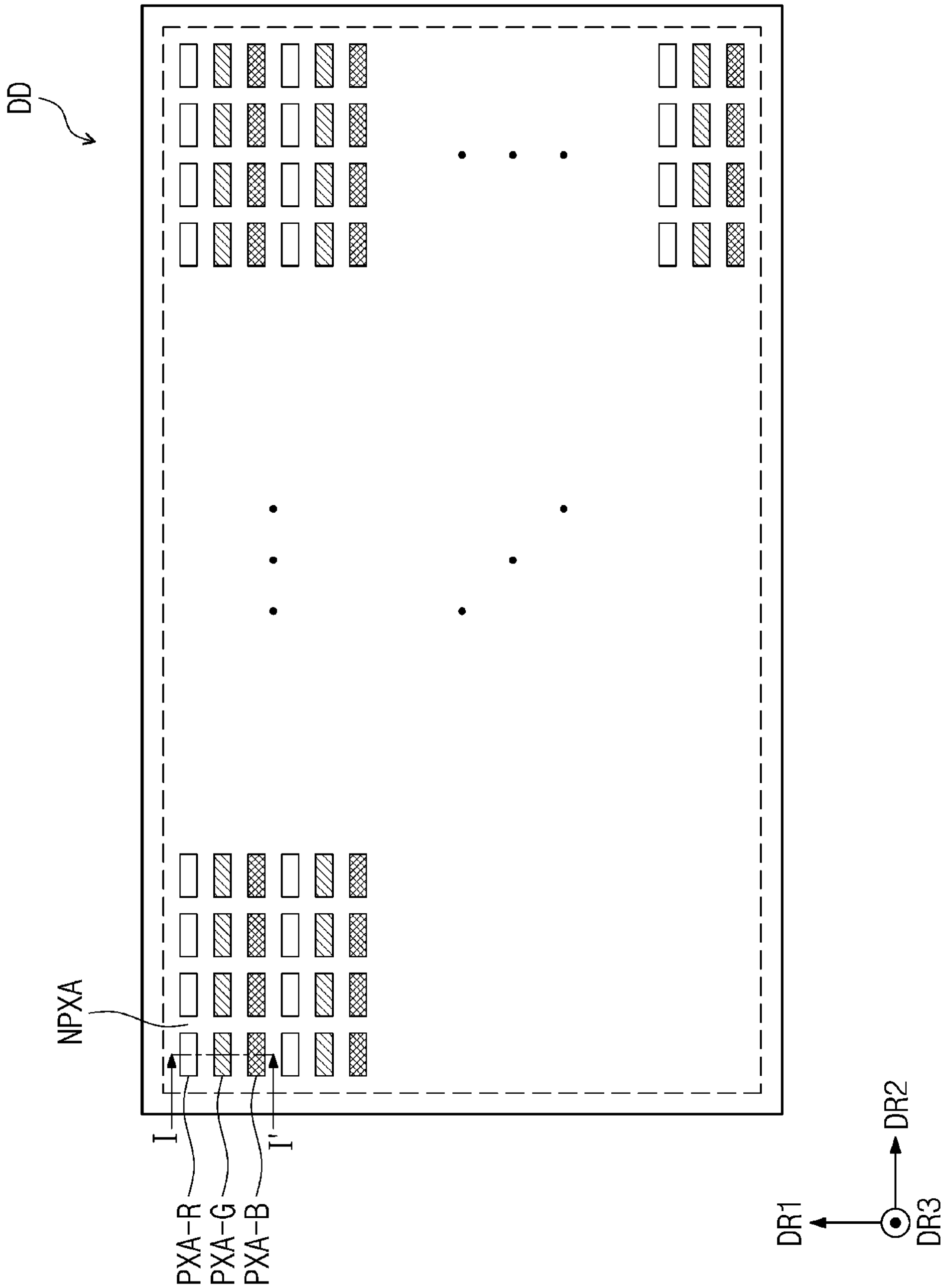
FIG. 1 is a plan view of a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the specification, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the specification, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as “a,” “an,” and “the,” are intended to include the plural forms as well, unless the context clearly indicates otherwise.

As used herein, the term “and/or” includes any and all combinations of one or more of the associated listed items. For example, “A and/or B” may be understood to mean “A, B, or A and B.” The terms “and” and “or” may be used in the conjunctive or disjunctive sense and may be understood to be equivalent to “and/or”.

The term “at least one of” is intended to include the meaning of “at least one selected from” for the purpose of its meaning and interpretation. For example, “at least one of A and B” may be understood to mean “A, B, or A and B.” When preceding a list of elements, the term, “at least one of,” modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms “below”, “beneath”, “lower”, “above”, “upper”, or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned “below” or “beneath” another device may be placed “above” another device. Accordingly, the illustrative term “below” may include both the lower and upper positions. The device may also be oriented in other directions and thus the spatially relative terms may be interpreted differently depending on the orientations.

The terms “about” or “approximately” as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, “about” may mean within one or more standard deviations, or within ±20%, ±10%, or ±5% of the stated value.

It should be understood that the terms “comprises,” “comprising,” “includes,” “including,” “have,” “having,” “contains,” “containing,” and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

In the specification, the term “substituted or unsubstituted” may mean a group that is substituted or unsubstituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkynyl group, an alkoxy group, a hydrocarbon ring group, an aryl group, and a heterocyclic group. Each of the substituents recited above may itself be substituted or unsubstituted. For example, a biphenyl group may be interpreted as an aryl group or as a phenyl group substituted with a phenyl group.

In the specification, the phrase “bonded to an adjacent group to form a ring” may mean a group that is bonded to an adjacent group to form a substituted or unsubstituted hydrocarbon ring, or a substituted or unsubstituted heterocycle. The hydrocarbon ring may include an aliphatic hydrocarbon ring and an aromatic hydrocarbon ring. The heterocycle may include an aliphatic heterocycle and an aromatic heterocycle. The hydrocarbon ring and the heterocycle may each independently be monocyclic or polycyclic. Rings which are formed by groups being bonded to each other may be connected to another ring to form a spiro structure.

In the specification, the term “adjacent group” may mean a substituent substituted for an atom which is directly linked to an atom substituted with a corresponding substituent, another substituent substituted for an atom which is substituted with a corresponding substituent, or a substituent sterically positioned at the nearest position to a corresponding substituent. For example, two methyl groups in 1,2-dimethylbenzene may be interpreted as “adjacent groups” to each other and two ethyl groups in 1,1-diethylcyclopentane may be interpreted as “adjacent groups” to each other. For example, two methyl groups in 4,5-dimethylphenanthrene may be interpreted as “adjacent groups” to each other.

In the specification, examples of the halogen atom may include a fluorine atom, a chlorine atom, a bromine atom, or an iodine atom.

In the specification, an alkyl group may be a linear, branched, or cyclic type. The number of carbon atoms in the alkyl group may be 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but embodiments are not limited thereto.

In the specification, a cycloalkyl group may be a cyclic alkyl group. The number of carbon atoms in the cycloalkyl group may be 3 to 50, 3 to 30, 3 to 20, or 3 to 10. Examples of the cycloalkyl group may include a cyclopropyl group, a cyclobutyl group, a cyclopentyl group, a cyclohexyl group, a 4-methylcyclohexyl group, a 4-t-butylcyclohexyl group, a cycloheptyl group, a cyclooctyl group, a cyclononyl group, a cyclodecyl group, a norbornyl group, a 1-adamantyl group, a 2-adamantyl group, an isobornyl group, a bicycloheptyl group, etc., but embodiments are not limited thereto.

In the specification, an alkenyl group may be a hydrocarbon group including at least one carbon-carbon double bond in the middle or a terminal end of an alkyl group having 2 or more carbon atoms. The alkenyl group may be a linear chain or a branched chain. The number of carbon atoms is not specifically limited, but may be 2 to 30, 2 to 20 or 2 to 10. Examples of the alkenyl group may include a vinyl group, a 1-butenyl group, a 1-pentenyl group, a 1,3-butadienyl aryl group, a styrenyl group, a styrylvinyl group, etc., without limitation.

In the specification, an aryl group may be any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quinquephenyl group, a sexiphenyl group, a triphenylenyl group, a pyrenyl group, a benzofluoranthenyl group, a chrysenyl group, etc., but embodiments are not limited thereto.

In the specification, a fluorenyl group may be substituted, and two substituents may be bonded to each other to form a spiro structure. Examples of substituted fluorenyl groups are as follows. However, embodiments are not limited thereto.

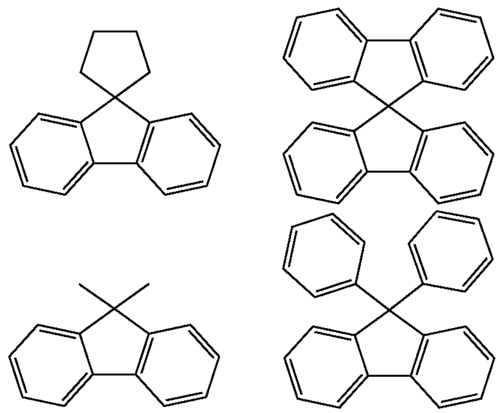

In the specification, a heteroaryl group may include at least one of B, O, N, P, Si, or S as a heteroatom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyrido pyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but embodiments are not limited thereto.

In the specification, the above description of the aryl group may be applied to an arylene group except that the arylene group is a divalent group. The above description of the heteroaryl group may be applied to a heteroarylene group except that the heteroarylene group is a divalent group.

In the specification, the number of carbon atoms in an amine group is not limited, but may be 1 to 30. The amine group may include an alkyl amine group or an aryl amine group. Examples of the amine group may include a methylamine group, a dimethylamine group, a phenylamine group, a diphenylamine group, a naphthylamine group, a 9-methyl-anthracenylamine group, a triphenylamine group, etc., but embodiments are not limited thereto.

In the specification, a direct linkage may be a single bond.

In the specification, "——*" indicates a binding site to a neighboring atom.

Hereinafter, embodiments will be described with reference to the accompanying drawings.

Figure 2:
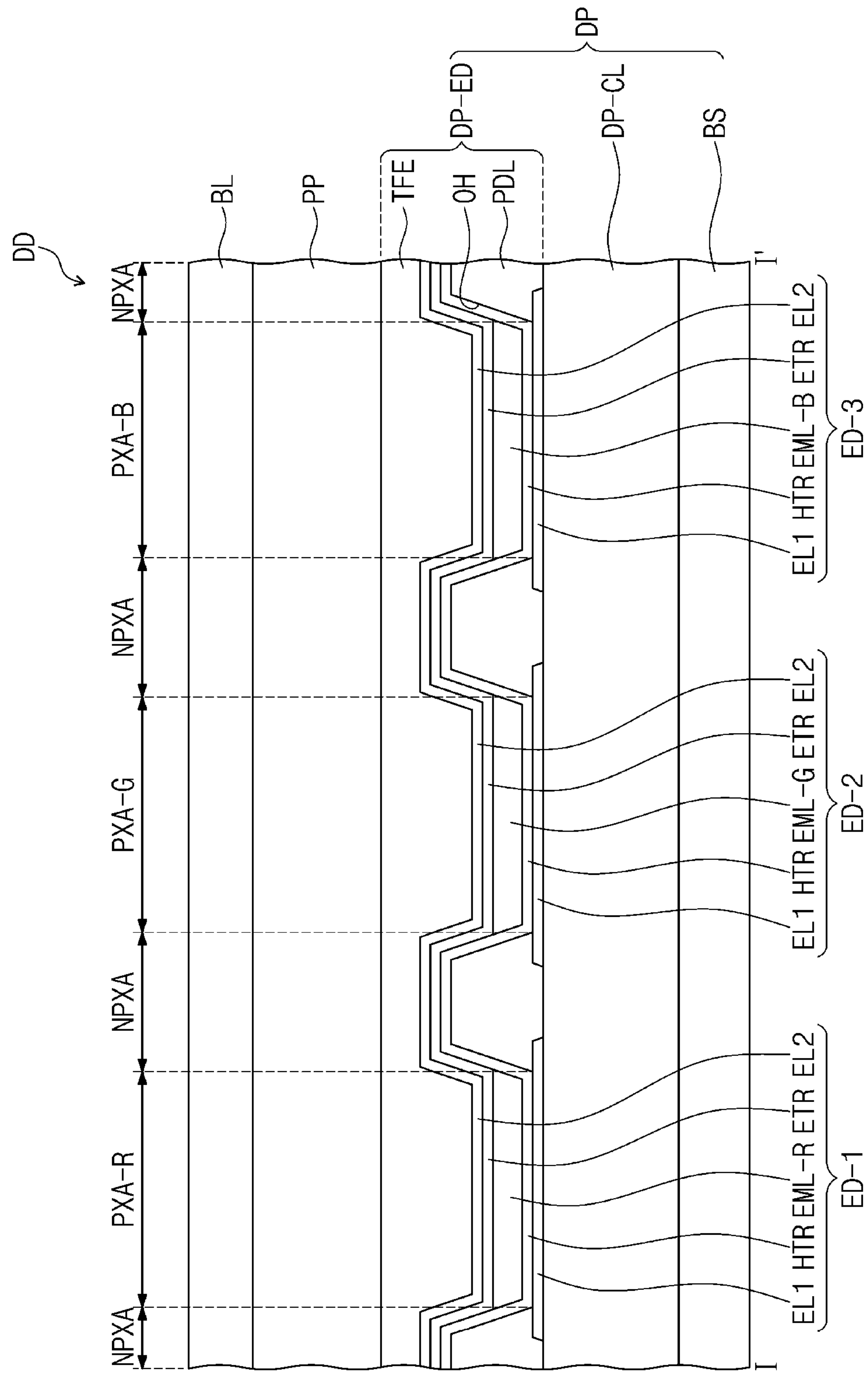
FIG. 2 is a schematic cross-sectional view of a display apparatus according to an embodiment.

FIG. 1 is a plan view illustrating an embodiment of a display apparatus DD. FIG. 2 is a schematic cross-sectional view of the display apparatus DD of the embodiment. FIG. 2 is a schematic cross-sectional view illustrating a part taken along line I-I' of FIG. 1.

The display apparatus DD may include a display panel DP and an optical layer PP disposed on the display panel DP. The display panel DP includes light emitting devices ED-1, ED-2, and ED-3. The display apparatus DD may include multiples of each of the light emitting devices ED-1, ED-2, and ED-3. The optical layer PP may be disposed on the display panel DP and may control light reflected at the display panel DP from an external light. The optical layer PP may include, for example, a polarization layer or a color filter layer. Although not shown in the drawing, in an embodiment, the optical layer PP may be omitted from the display apparatus DD.

A base substrate BL may be disposed on the optical layer PP. The base substrate BL may provide a base surface on which the optical layer PP is disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

The display apparatus DD according to an embodiment may further include a filling layer (not shown). The filling layer (not shown) may be disposed between a display device layer DP-ED and the base substrate BL. The filling layer (not shown) may be an organic material layer. The filling layer (not shown) may include at least one of an acrylic-based resin, a silicone-based resin, or an epoxy-based resin.

The display panel DP may include a base layer BS, a circuit layer DP-CL provided on the base layer BS, and a display device layer DP-ED. The display device layer DP-ED may include a pixel defining film PDL, the light emitting devices ED-1, ED-2, and ED-3 disposed between portions of the pixel defining film PDL, and an encapsulation layer TFE disposed on the light emitting devices ED-1, ED-2, and ED-3.

The base layer BS may provide a base surface on which the display device layer DP-ED is disposed. The base layer BS may be a glass substrate, a metal substrate, a plastic substrate, etc. However, embodiments are not limited thereto, and the base layer BS may include an inorganic layer, an organic layer, or a composite material layer.

In an embodiment, the circuit layer DP-CL is disposed on the base layer BS, and the circuit layer DP-CL may include transistors (not shown). Each of the transistors (not shown) may include a control electrode, an input electrode, and an output electrode. For example, the circuit layer DP-CL may include a switching transistor and a driving transistor which drive the light emitting devices ED-1, ED-2, and ED-3 of the display device layer DP-ED.

Each of the light emitting devices ED-1, ED-2, and ED-3 may have a structure of a light emitting device ED of an embodiment according to FIGS. 3 to 6, which will be described later. Each of the light emitting devices ED-1, ED-2, and ED-3 may include a first electrode EL1, a hole transport region HTR, emission layers EML-R, EML-G and EML-B, an electron transport region ETR, and a second electrode EL2.

FIG. 2 illustrates an embodiment in which the emission layers EML-R, EML-G, and EML-B of the light emitting devices ED-1, ED-2, and ED-3 are disposed in the openings OH defined in the pixel defining film PDL, and the hole transport region HTR, the electron transport region ETR, and the second electrode EL2 are each provided as a common layer in the entire light emitting devices ED-1, ED-2, and ED-3. However, embodiments are not limited thereto, and although not illustrated in FIG. 2, the hole transport region HTR and the electron transport region ETR may each be provided by being patterned inside the openings OH defined in the pixel defining film PDL. For example, in an embodiment, the hole transport region HTR, the emission layers EML-R, EML-G, and EML-B, and the electron transport region ETR of the light emitting devices ED-1, ED-2, and ED-3 in an embodiment may each be provided by being patterned in an inkjet printing method.

The encapsulation layer TFE may cover the light emitting devices ED-1, ED-2, and ED-3. The encapsulation layer TFE may seal the display device layer DP-ED. The encapsulation layer TFE may be a thin film encapsulation layer. The encapsulation layer TFE may be one layer or a lamination of multiple layers. The encapsulation layer TFE may include at least one insulation layer. The encapsulation layer TFE according to an embodiment may include at least one inorganic film (hereinafter, an encapsulation-inorganic film). The encapsulation layer TFE according to an embodiment may also include at least one organic film (hereinafter, an encapsulation-organic film) and at least one encapsulation-inorganic film.

The encapsulation-inorganic film may protect the display device layer DP-ED from moisture and/or oxygen and the encapsulation-organic film protects the display device layer DP-ED from foreign substances such as dust particles. The encapsulation-inorganic film may include silicon nitride, silicon oxynitride, silicon oxide, titanium oxide, aluminum oxide, or the like, but embodiments are not limited thereto. The encapsulation-organic film may include an acrylic-based compound, an epoxy-based compound, or the like. The encapsulation-organic film may include a photopolymerizable organic material, but embodiments are not limited thereto.

The encapsulation layer TFE may be disposed on the second electrode EL2 and may be disposed to fill the openings OH.

Referring to FIGS. 1 and 2, the display apparatus DD may include non-light emitting regions NPXA and light emitting regions PXA-R, PXA-G, and PXA-B. The light emitting regions PXA-R, PXA-G, and PXA-B may each be a region which emits light generated from the light emitting devices ED-1, ED-2, and ED-3, respectively. The light emitting regions PXA-R, PXA-G, and PXA-B may be spaced apart from each other in a plane.

Each of the light emitting regions PXA-R, PXA-G, and PXA-B may be a region separated from each other by the pixel defining film PDL. The non-light emitting regions NPXA may be regions between the adjacent light emitting regions PXA-R, PXA-G, and PXA-B, which correspond to portions of the pixel defining film PDL. In the specification, each of the light emitting regions PXA-R, PXA-G, and PXA-B may correspond to a pixel. The pixel defining film PDL may separate the light emitting elements ED-1, ED-2, and ED-3. The emission layers EML-R, EML-G, and EML-B of the light emitting devices ED-1, ED-2, and ED-3 may be disposed in openings OH defined by the pixel defining film PDL and separated from each other.

The light emitting regions PXA-R, PXA-G, and PXA-B may be divided into groups according to the color of light generated from each of the light emitting devices ED-1, ED-2, and ED-3. In the display apparatus DD of an embodiment shown in FIGS. 1 and 2, three light emitting regions PXA-R, PXA-G, and PXA-B which respectively emit red light, green light, and blue light, are illustrated. For example, the display apparatus DD of an embodiment may include the red light emitting region PXA-R, the green light emitting region PXA-G, and the blue light emitting region PXA-B which are separated from one another.

In the display apparatus DD according to an embodiment, the light emitting devices ED-1, ED-2 and ED-3 may each emit light having wavelengths different from one another. For example, in an embodiment, the display apparatus DD may include a first light emitting device ED-1 that emits red light, a second light emitting device ED-2 that emits green light, and a third light emitting device ED-3 that emits blue light. For example, the red light emitting region PXA-R, the green light emitting region PXA-G, and the blue light emitting region PXA-B of the display apparatus DD may correspond to the first light emitting device ED-1, the second light emitting device ED-2, and the third light emitting device ED-3, respectively.

However, embodiments are not limited thereto, and the first to third light emitting devices ED-1, ED-2, and ED-3 may emit light in a same wavelength range or at least one light emitting device may emit light in a wavelength range that is different from the others. For example, the first to third light emitting devices ED-1, ED-2, and ED-3 may all emit blue light.

The light emitting regions PXA-R, PXA-G, and PXA-B in the display apparatus DD according to an embodiment may be arranged in a stripe form. Referring to FIG. 1, the red light emitting regions PXA-R, the green light emitting regions PXA-G, and the blue light emitting regions PXA-B may each be arranged along a second directional axis DR2. The red light emitting region PXA-R, the green light emitting region PXA-G, and the blue light emitting region PXA-B may be alternately arranged in this order along a first directional axis DR1.

FIGS. 1 and 2 illustrate that the light emitting regions PXA-R, PXA-G, and PXA-B all have a similar area, but embodiments are not limited thereto, and the light emitting regions PXA-R, PXA-G, and PXA-B may have different areas from each other according to a wavelength range of the emitted light. The areas of the light emitting regions PXA-R, PXA-G, and PXA-B may be areas in a plan view that are defined by the first directional axis DR1 and the second directional axis DR2.

The arrangement form of the light emitting regions PXA-R, PXA-G, and PXA-B is not limited to the feature illustrated in FIG. 1, and the order in which the red light emitting region PXA-R, the green light emitting region PXA-G, and the blue light emitting region PXA-B are arranged may be variously combined and provided according to display quality characteristics required for the display apparatus DD. For example, the arrangement form of the light emitting regions PXA-R, PXA-G, and PXA-B may be a PENTILE™ arrangement form or a diamond arrangement form.

In an embodiment, the areas of the light emitting regions PXA-R, PXA-G, and PXA-B may be different from each other. For example, the area of the green light emitting region PXA-G may be smaller than that of the blue light emitting region PXA-B, but embodiments are not limited thereto.

Hereinafter, FIGS. 3 to 6 are each a schematic cross-sectional view illustrating a light emitting device according to embodiments. Each of the light emitting devices ED according to embodiments may include a first electrode EL1, a hole transport region HTR, an emission layer EML, an electron transport region ETR, and a second electrode EL2 that are sequentially stacked.

Figure 3:
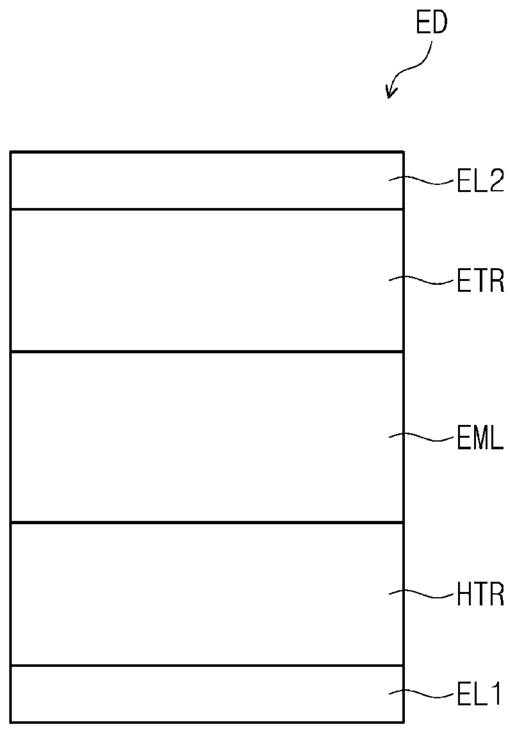
FIG. 3 is a schematic cross-sectional view illustrating a light emitting device according to an embodiment.
Figure 4:
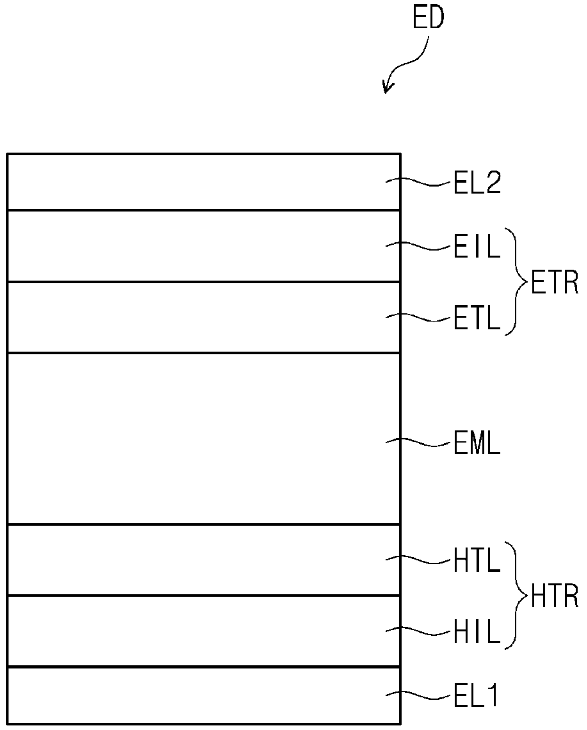
FIG. 4 is a schematic cross-sectional view illustrating a light emitting device according to an embodiment.
Figure 5:
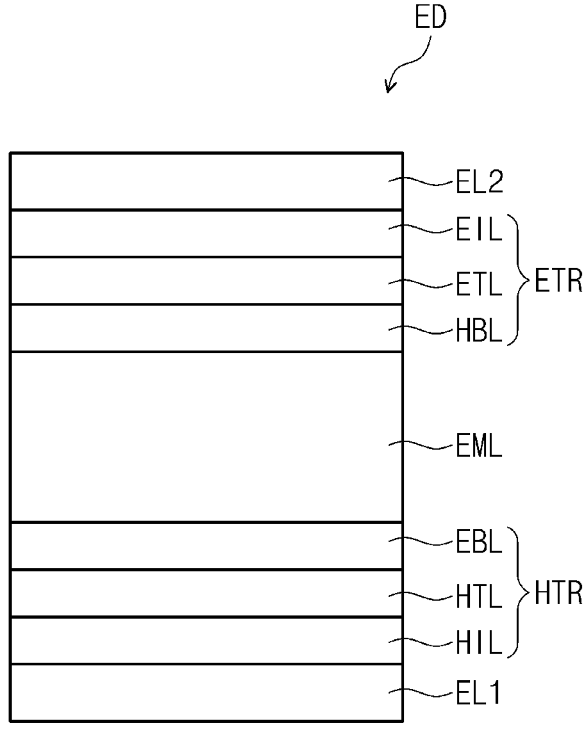
FIG. 5 is a schematic cross-sectional view illustrating a light emitting device according to an embodiment.
Figure 6:
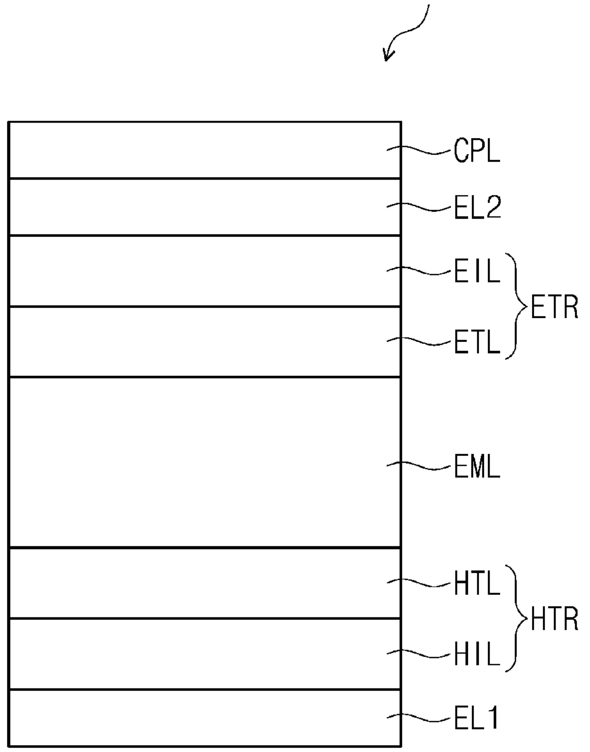
FIG. 6 is a schematic cross-sectional view illustrating a light emitting device according to an embodiment.

In comparison to FIG. 3, FIG. 4 illustrates a schematic cross-sectional view of a light emitting device ED of an embodiment, in which a hole transport region HTR includes a hole injection layer HIL and a hole transport layer HTL, and an electron transport region ETR includes an electron injection layer EIL and an electron transport layer ETL. In comparison to FIG. 3, FIG. 5 illustrates a schematic cross-sectional view of a light emitting device ED of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. In comparison to FIG. 4, FIG. 6 illustrates a schematic cross-sectional view of a light emitting device ED of an embodiment that includes a capping layer CPL disposed on a second electrode EL2.

The first electrode EL1 has conductivity. The first electrode EL1 may be formed of a metal material, a metal alloy, or a conductive compound. The first electrode EL1 may be an anode or a cathode. However, embodiments are not limited thereto. For example, the first electrode EL1 may be a pixel electrode. The first electrode EL1 may be a transmissive electrode, a transflective electrode, or a reflective electrode. If the first electrode EL1 is a transmissive electrode, the first electrode EL1 may be formed using a transparent metal oxide such as indium tin oxide (ITO), indium zinc oxide (IZO), zinc oxide (ZnO), or indium tin zinc oxide (ITZO). If the first electrode EL1 is a transflective electrode or a reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, W, a compound thereof, or a mixture thereof (e.g., a mixture of Ag and Mg). In another embodiment, the first electrode EL1 may have a multilayer structure including a reflective film or a transflective film formed of the above-described materials, and a transparent conductive film formed of ITO, IZO, ZnO, ITZO, etc. For example, the first electrode EL1 may have a three-layer structure of ITO/Ag/ITO, but embodiments are not limited thereto. The first electrode EL1 may include the above-described metal materials, combinations of at least two metal materials of the above-described metal materials, oxides of the above-described metal materials, or the like. A thickness of the first electrode EL1 may be in a range of about 700 Å to about 10,000 Å. For example, the thickness of the first electrode EL1 may be in a range of about 1,000 Å to about 3,000 Å.

The hole transport region HTR is provided on the first electrode EL1. The hole transport region HTR may include at least one of a hole injection layer HIL, a hole transport layer HTL, a buffer layer (not shown), an emission-auxiliary layer (not shown), or an electron blocking layer EBL. A thickness of the hole transport region HTR may be, for example, in a range of about 50 Å to about 15,000 Å.

The hole transport region HTR may be a layer formed of a single material, a layer formed of different materials, or a multilayer structure including layers formed of different materials.

For example, the hole transport region HTR may have a single layer structure of the hole injection layer HIL or the hole transport layer HTL, or may have a single layer structure formed of a hole injection material and a hole transport material. The hole transport region HTR may have a single layer structure formed of different materials, or a structure in which a hole injection layer HIl/hole transport layer HTL, a hole injection layer HIl/hole transport layer HTL/buffer layer (not shown), a hole injection layer HIl/buffer layer (not shown), a hole transport layer HTL/buffer layer (not shown), or a hole injection layer HIL/hole transport layer HTL/electron blocking layer EBL are stacked in its respective stated order from the first electrode EL1, but embodiments are not limited thereto.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole transport region HTR in the light emitting device ED of an embodiment may include an amine compound of an embodiment. The amine compound of an embodiment may be included in the hole transport layer HTL in the hole transport region HTR. However, embodiments are not limited thereto, and the amine compound of an embodiment may also be included in the hole injection layer HIL, the electron blocking layer EBL, or the like. The amine compound of an embodiment may be included in an organic layer, which is adjacent to the emission layer EML, among the organic layers (hole transport organic layers) included in the hole transport region HTR. In an embodiment, the hole transport region HTR may include hole transport organic layers, and the hole transport organic layers may include a layer which is adjacent to the emission layer EML and includes the amine compound of an embodiment.

The amine compound of an embodiment includes a quaterphenyl group and a naphthyl group as a substituent. The amine compound of an embodiment includes an amine group, and a quaterphenyl group and a naphthyl group substituted at the amine group. The quaterphenyl group has a quaterphenyl skeleton in which four phenyl groups are linked to each other in a linear form, and a benzene ring at a terminus of the quaterphenyl skeleton is linked to the amine group of the amine compound of an embodiment. The naphthyl group is not directly bonded to the amine group, but may be bonded to the nitrogen atom of the amine group via a linker.

The amine compound of an embodiment may be a mono-amine compound. The amine compound may include one amine group in the compound structure.

The amine compound of an embodiment may be represented by Formula 1 below:

[Formula 1]

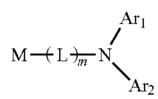

In Formula 1, L may be a substituted or unsubstituted arylene group having 6 to 30 ring-forming carbon atoms, or a substituted or unsubstituted heteroarylene group having 2 to 30 ring-forming carbon atoms. In an embodiment, L may be a substituted or unsubstituted phenylene group, a substituted or unsubstituted divalent biphenylene group, or a substituted or unsubstituted divalent dibenzofuran group. For example, L may be an unsubstituted phenylene group, an unsubstituted divalent biphenyl group, or an unsubstituted divalent dibenzofuran group.

In Formula 1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon hetero. In an embodiment, $Ar_1$ and $Ar_2$ may be each independently a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted naphthylphenyl group, a substituted or unsubstituted phenanthrenyl group, a substituted or unsubstituted triphenylene group, a substituted or unsubstituted dibenzofuran group, a substituted or unsubstituted dibenzothiophene group, or a substituted or unsubstituted carbazole group.

In Formula 1, $Ar_1$ and $Ar_2$ may be the same as or different from each other. In an embodiment, $Ar_1$ may be a group represented by Formula 3 which will be described below, and $Ar_2$ may be a substituted or unsubstituted phenyl group, a substituted or unsubstituted biphenyl group, a substituted or unsubstituted terphenyl group, a substituted or unsubstituted quaterphenyl group, a substituted or unsubstituted naphthyl group, a substituted or unsubstituted naphthylphenyl group, a substituted or unsubstituted triphenylene group, a substituted or unsubstituted dibenzofuran group, a substituted or unsubstituted dibenzothiophene group, a substituted or unsubstituted naphtho[1,2-b]benzofuran group, or a substituted or unsubstituted benzo[b]naphtho[2,1-d]thiophene group.

In Formula 1, m may be 1 or 2. When m is 2, multiple L groups may be the same as or different from each other.

In Formula 1, M may be a group represented by the following Formula 2:

[Formula 2]

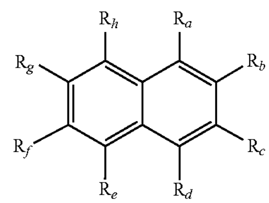

In Formula 2, $R_a$ to $R_h$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In an embodiment, $R_a$ to $R_h$ may be each independently a hydrogen atom, a deuterium atom, a halogen atom, a substituted or unsubstituted alkyl group having 1 to 10 carbon atoms, a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group.

In Formula 2, at least one of $R_a$ to $R_h$ may not be a hydrogen atom. For example, at least any one among $R_a$ to $R_h$ may be a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, at least any one of $R_a$ to $R_h$ may be a substituted or unsubstituted aryl group having 6 to 30 ring-forming carbon atoms, or a substituted or unsubstituted heteroaryl group having 2 to 30 ring-forming carbon atoms. At least any one of $R_a$ to $R_h$ may be a substituent which expands a conjugated structure.

In Formula 2, any one of $R_a$ to $R_h$ may be a position linked to L in Formula 1 above. Among $R_a$ to $R_h$ in Formula 2, the remaining substituents other than a substituent that is bonded to the nitrogen atom of the amine compound represented by Formula 1 may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. Among $R_a$ to $R_h$ in Formula 2, at least any one of the remaining substituents other than a substituent that is bonded to the nitrogen atom of the amine compound represented by Formula 1 may be a substituent which may not be a hydrogen atom. In an embodiment, when L in Formula 1 is linked to $R_a$ in Formula 2 above, at least any one of $R_b$ to $R_h$ may be a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group. In another embodiment, when L in Formula 1 is linked to $R_b$ in Formula 2 above, at least any one of $R_a$ and $R_c$ to $R_h$ may be a substituted or unsubstituted phenyl group.

In Formula 1, at least any one of $Ar_1$ and $Ar_2$ may be a group represented by Formula 3 below:

[Formula 3]

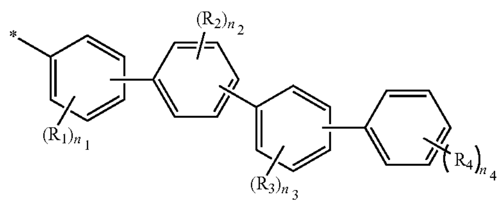

In Formula 3, $R_1$ to $R_4$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula 3, the case where each of $R_1$ and $R_2$ is an unsubstituted phenyl group is excluded. In an embodiment, $R_1$ to $R_4$ may each independently be a hydrogen atom, a deuterium atom, a halogen atom, or a substituted or unsubstituted alkyl group having 1 to 10 carbon atoms. For example, $R_1$ to $R_4$ may be each independently a hydrogen atom, a deuterium atom, a halogen atom, a substituted or unsubstituted methyl group, a substituted or unsubstituted isopropyl group, or a substituted or unsubstituted t-butyl group.

In Formula 3, ——* is a position linked to N in Formula 1 above.

In Formula 3, $n_1$ to $n_3$ may each independently be an integer from 0 to 4. If each of $n_1$ to $n_3$ is 0, it may mean that the amine compound of an embodiment is not substituted with each of $R_1$ to $R_3$. The case where each of $n_1$ to $n_3$ is 4 and $R_1$ groups, $R_2$ groups, and $R_3$ groups are each hydrogen atoms may be the same as the case where each of $n_1$ to $n_3$ in Formula 3 is 0. If each of $n_1$ to $n_3$ is 2 or more, $R_1$ groups, $R_2$ groups, and $R_3$ groups may each be the same or at least one of the $R_1$ groups, $R_2$ groups, and $R_3$ groups may be different.

In Formula 3, $n_4$ may be an integer from 0 to 5. If $n_4$ is 0, it may mean that the amine compound of an embodiment is not substituted with $R_4$. The case where $n_4$ is 5 and $R_4$ groups are all hydrogen atoms may be the same as the case where $n_4$ in Formula 3 is 0. If $n_4$ is 2 or more, $R_4$ groups may be all the same or at least one of the $R_4$ groups may be different from the others.

When L in Formula 1 is a p-phenylene group, when a group represented by Formula 3 is a group represented by Formula 3-a, and when $R_a$ in Formula 2 is linked to L in Formula 1, $R_b$ in Formula 2 may not be an unsubstituted phenyl group.

[Formula 3-a]

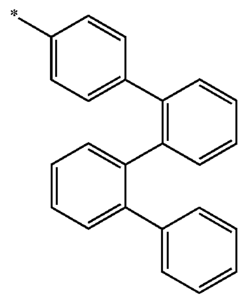

In an embodiment, the amine compound represented by Formula 1 may be represented by Formula 4-1 or Formula 4-2:

[Formula 4-1]

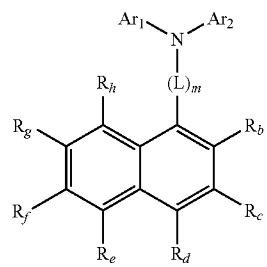

[Formula 4-2]

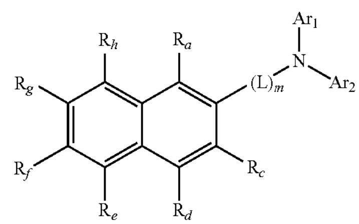

Formula 4-1 corresponds to the case where $R_a$ in Formula 2 is a position linked to L in Formula 1. Formula 4-2 corresponds to the case where $R_b$ in Formula 2 is a position linked to L in Formula 1.

In Formula 4-1 and Formula 4-2, $Ar_1$, $Ar_2$, L, $R_a$ to $R_h$, and m may be the same as defined in Formula 1 and Formula 2.

In an embodiment, the amine compound represented by Formula 1 may be represented by any one of Formula 5-1 to Formula 5-3:

[Formula 5-1]

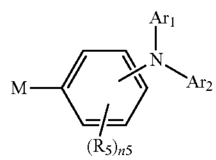

-continued

[Formula 5-2]

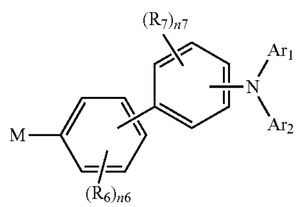

[Formula 5-3]

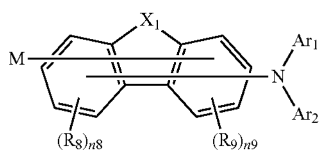

In Formula 5-1 to Formula 5-3, $X_1$ may be $N(R_{10})$, O, or S.

In Formula 5-1 to Formula 5-3, $R_5$ to $R_{10}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In an embodiment, each of $R_5$ to $R_9$ may be a hydrogen atom. In an embodiment, when $X_1$ is $N(R_{10})$, $R_{10}$ may be a substituted or unsubstituted phenyl group.

In Formula 5-1 to Formula 5-3, $n_5$ to $n_9$ may each independently be an integer from 0 to 4, and the sum of $n_5$ and $n_9$ may be equal to or less than 6. If each of $n_5$ to $n_9$ is 0, the amine compound of an embodiment may not be substituted with each of $R_5$ to $R_9$. The case where each of $n_5$ to $n_9$ is 4 and $R_5$ groups, $R_6$ groups, $R_7$ groups, $R_8$ groups, and $R_9$ groups each are hydrogen atoms may be the same as the case where each of $n_5$ to $n_9$ is 0. If each of $n_5$ to $n_9$ is 2 or more, $R_5$ groups, $R_6$ groups, $R_7$ groups, $R_8$ groups, and $R_9$ groups may each be the same or at least one of the $R_5$ groups, $R_6$ groups, $R_7$ groups, $R_8$ groups, and $R_9$ groups may be different.

In Formula 5-1 to Formula 5-3, M, An, and $Ar_2$ may be the same as defined in Formula 1.

In an embodiment, the amine compound represented by Formula 1 may be represented by any one of Formula 6-1 to Formula 6-5:

[Formula 6-1]

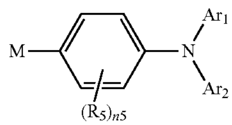

[Formula 6-2]

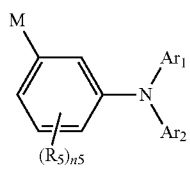

[Formula 6-3]

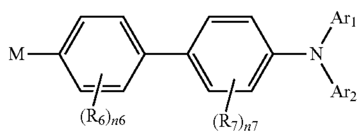

-continued

[Formula 6-4]

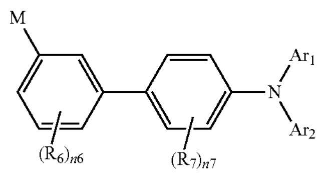

[Formula 6-5]

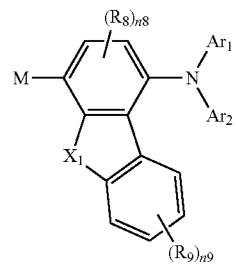

Formula 6-1 is the case where the nitrogen atom of the amine group and the naphthyl group (M) in Formula 5-1 are linked at the para-position of a phenylene linker. Formula 6-2 is the case where the nitrogen atom of the amine group and the naphthyl group (M) in Formula 5-1 are linked at the meta-position of a phenylene linker. Formula 6-3 is the case where the nitrogen atom of the amine group and the naphthyl group (M) in Formula 5-2 are linked at the para-position of a divalent biphenyl linker. Formula 6-4 is the case where the nitrogen atom of the amine group and the naphthyl group (M) in Formula 5-2 are linked at the meta-position of a divalent biphenyl linker. In Formula 6-4, the nitrogen atom of the amine group is linked at the para-position of the divalent biphenyl linker and the naphthyl group is linked at the meta-position of the divalent biphenyl linker. Formula 6-5 is the case where the nitrogen atom of the amine group and the naphthyl group (M) in Formula 5-3 are linked by interposing a benzene ring of a fused heterocycle therebetween. In Formula 6-5, the nitrogen atom of the amine group is linked at the meta-position with respect to $X_1$, and the naphthyl group is linked at the ortho-position with respect to $X_1$. In Formula 6-5, M is linked at the para-position with respect to the nitrogen atom of the amine group.

In Formula 6-1 to Formula 6-5, $n_{8-1}$ may be an integer from 0 to 2. If $n_{8-1}$ is 0, the amine compound according to an embodiment may not be substituted with $R_8$. The case where $n_{8-1}$ is 2 and $R_8$ groups are all hydrogen atoms may be the same as the case where $n_{8-1}$ is 0. If $n_{8-1}$ is 2, $R_8$ groups may be all the same or at least one of the $R_8$ groups may be different from the others.

In Formula 6-1 to Formula 6-5, $Ar_1$, $Ar_2$, M, $X_1$, $R_5$ to $R_9$, $n_5$ to $n_7$, and $n_9$ may be the same as defined in Formula 1 and Formula 5-1 to Formula 5-3.

In an embodiment, $Ar_1$ may be a group represented by Formula 3, and $Ar_2$ may be a group represented by any one of Formula 7-1 to Formula 7-5:

[Formula 7-1]

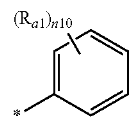

[Formula 7-2]

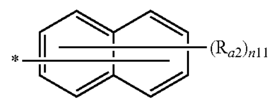

-continued

[Formula 7-3]

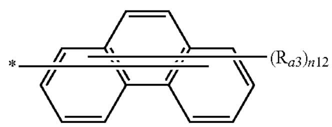

[Formula 7-4]

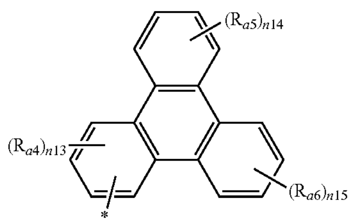

[Formula 7-5]

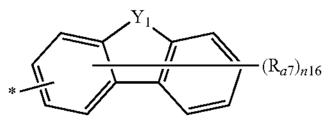

In Formula 7-1 to Formula 7-5, $Y_1$ may be $N(R_{11})$, O, or S.

In Formula 7-1 to Formula 7-5, $R_{a1}$ to $R_{a6}$ and $R_{11}$ may each independently be a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. For example, $R_{a1}$ to $R_{a6}$ and $R_{11}$ may each be independently a hydrogen atom, a deuterium atom, a halogen atom, a substituted or unsubstituted phenyl group, a substituted or unsubstituted biphenyl group, a substituted or unsubstituted terphenyl group, or a substituted or unsubstituted naphthyl group.

In Formula 7-5, $R_{a7}$ may be a hydrogen atom, a deuterium atom, a halogen atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or $R_{a7}$ may be bonded to an adjacent group to form a ring. For example, $R_{a7}$ groups may all be hydrogen atoms. In an embodiment, multiple $R_{a7}$'s groups may be present, and adjacent $R_{a7}$ groups may be bonded to each other to form an additional fused hydrocarbon ring or fused heterocycle.

In Formula 7-1 to Formula 7-5, $n_{10}$ may be an integer from 0 to 5, $n_{11}$ and $n_{16}$ may each independently be an integer from 0 to 7, $n_{12}$ may be an integer from 0 to 9, $n_{13}$ may be an integer from 0 to 3, and $n_{14}$ and $n_{15}$ may each independently be an integer from 0 to 4.

In Formula 7-1, if $n_{10}$ is 0, the amine compound of an embodiment may not be substituted with $R_{a1}$. The case where $n_{10}$ is 5 and $R_{a1}$ groups are all hydrogen atoms in Formula 7-1 may be the same as the case where $n_{10}$ is 0 in Formula 7-1. If $n_{10}$ is 2 or more, $R_{a1}$ groups may be all the same or at least one of the $R_{a1}$ groups may be different from the others.

In Formula 7-2 and Formula 7-5, if each of $n_{11}$ and $n_{16}$ is 0, the amine compound of an embodiment may not be substituted with $R_{a2}$ and $R_{a7}$, respectively. The case where each of $n_{11}$ and $n_{16}$ is 7 and $R_{a2}$ groups $R_{a7}$ groups are all hydrogen atoms may be the same as the case where each of $n_{11}$ and $n_{16}$ is 0. When each of $n_{11}$ and $n_{16}$ is 2 or more, $R_{a2}$ groups and $R_{a7}$ groups each may be the same or at least one of the $R_{a2}$ groups and $R_{a7}$ groups may be different.

In Formula 7-3, if $n_{12}$ is 0, the amine compound of an embodiment may not be substituted with $R_{a3}$. The case where $n_{12}$ is 9 and $R_3$ groups are all hydrogen atoms may be the same as the case where $n_{12}$ is 0. If $n_{12}$ is 2 or more, $R_{a3}$ groups may be all the same or at least one of the $R_{a3}$ groups may be different from the others.

In Formula 7-4, if $n_{13}$ is 0, the amine compound of an embodiment may not be substituted with $R_{a4}$. The case where $n_{13}$ is 3 and $R_{13}$ groups are all hydrogen atoms may be the same as the case where $n_{13}$ is 0. If $n_{13}$ is 2 or more, $R_{a4}$ groups may be all the same or at least one of the $R_{a4}$ groups may be different from the others.

In Formula 7-4, if each of $n_{14}$ and $n_{15}$ is 0, the amine compound of an embodiment may not be substituted with $R_a$ and $R_{a6}$, respectively. The case where each of $n_{14}$ and $n_{15}$ is 4 and $R_{a5}$ groups and $R_{a6}$ groups all are hydrogen atoms may be the same as the case where each of $n_{14}$ and $n_{15}$ is 0. When each of $n_{14}$ and $n_{15}$ is 2 or more, $R_{a5}$ groups and $R_{a6}$ groups each may be the same or at least one of the $R_{a5}$ groups and $R_{a6}$ groups may be different.

In Formula 7-1 to Formula 7-5, ——* is a position linked to N in Formula 1.

In an embodiment, the at least one of $Ar_1$ and $Ar_2$ that is represented by Formula 3 may be a group represented by any one of Formula 8-1 to Formula 8-9:

[Formula 8-1]

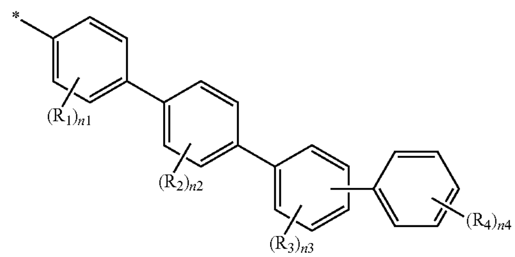

[Formula 8-2]

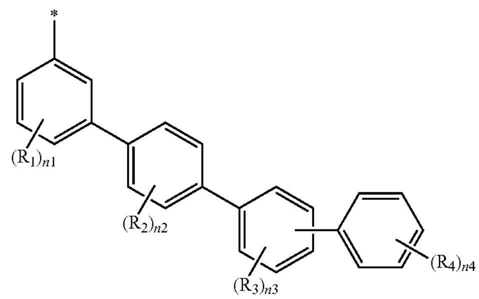

[Formula 8-3]

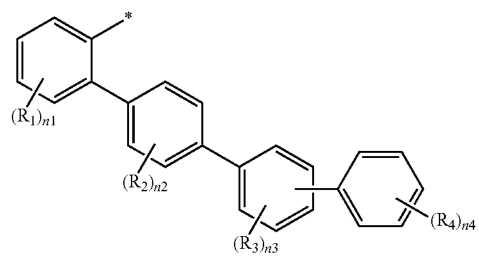

-continued
[Formula 8-4]
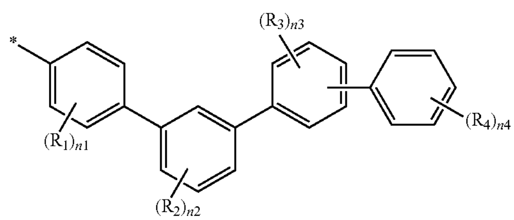
[Formula 8-5]
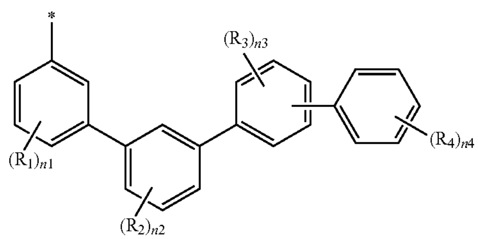
[Formula 8-6]
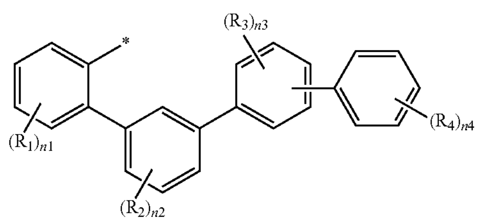
-continued
[Formula 8-7]
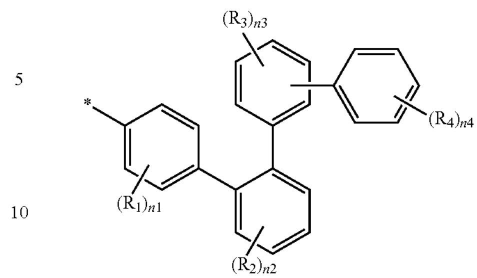
[Formula 8-8]
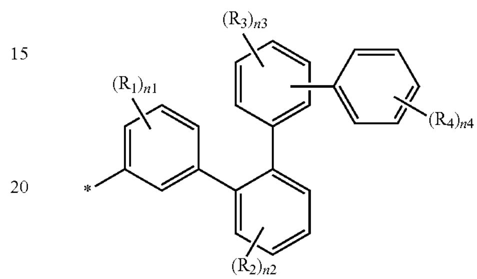
[Formula 8-9]
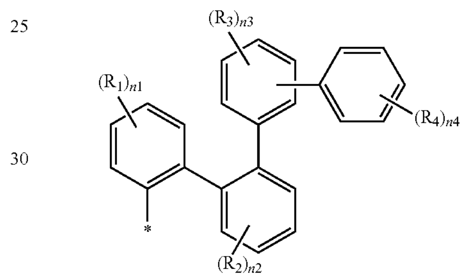
In Formula 8-1 to Formula 8-9, $R_1$ to $R_4$, $n_1$ to $n_4$, and ——* may be the same as defined in Formula 3.
In an embodiment, the amine compound represented by Formula 1 may include at least one selected from Compound Group 1:
[Compound Group 1]
1
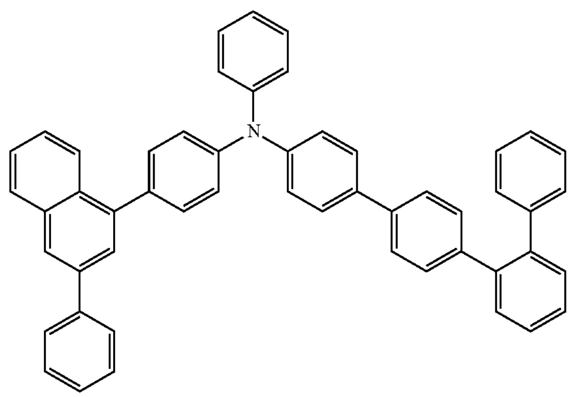
2
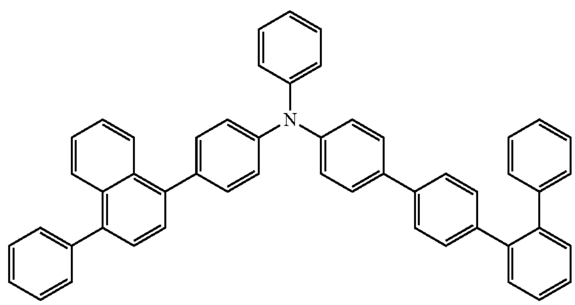

-continued
3
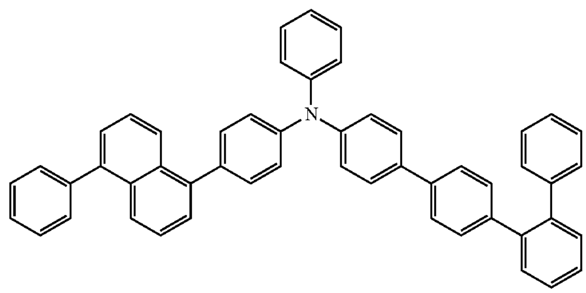
4
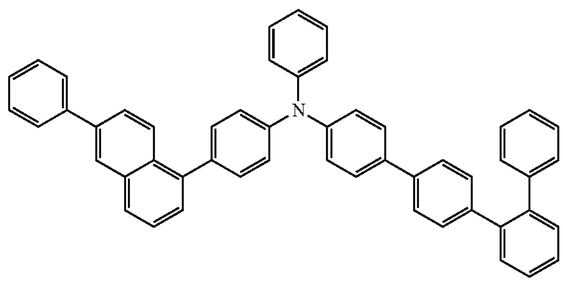
5
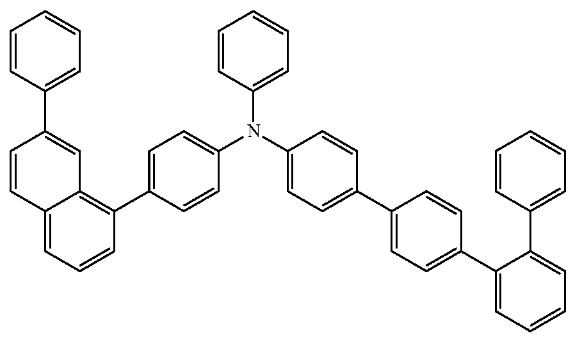
6
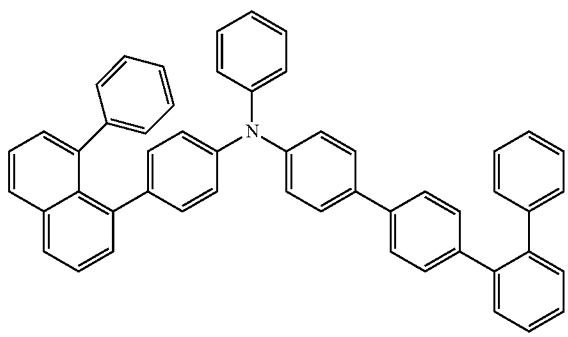
7
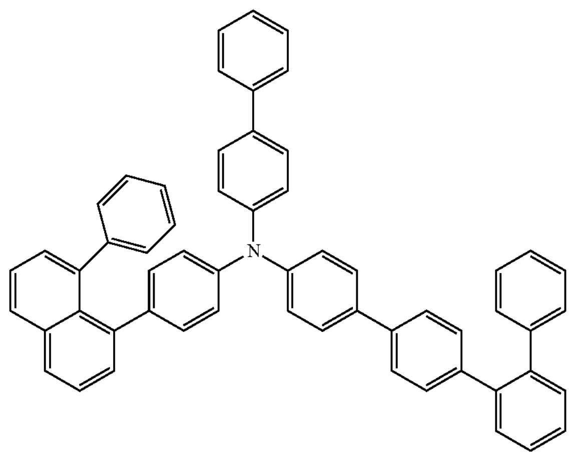
8
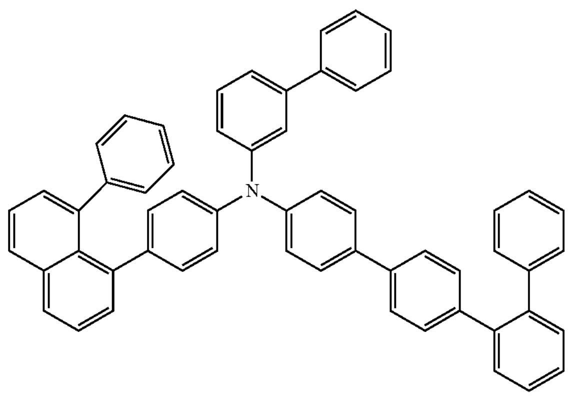
9
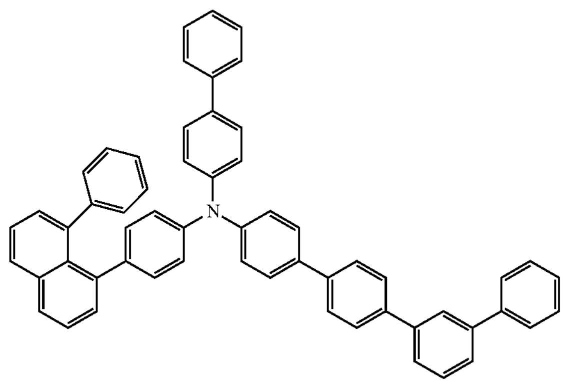
10
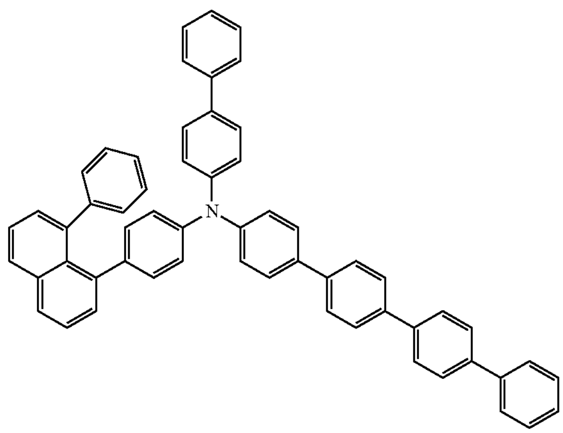

-continued
11
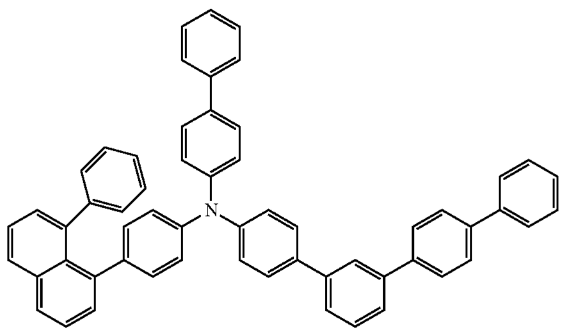
12
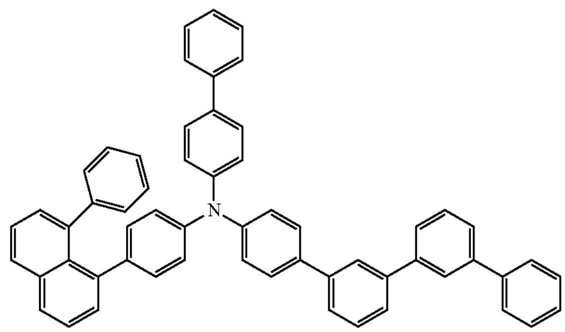
13
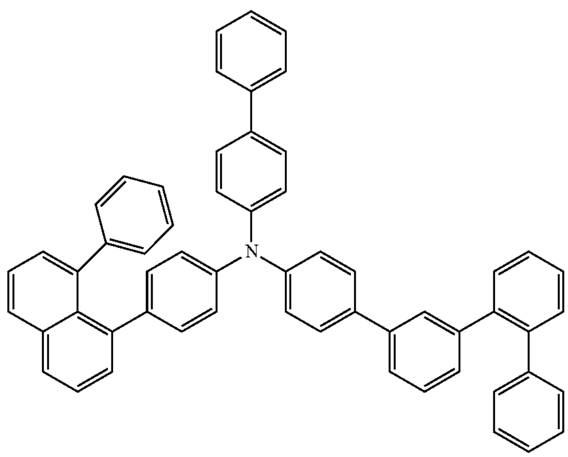
14
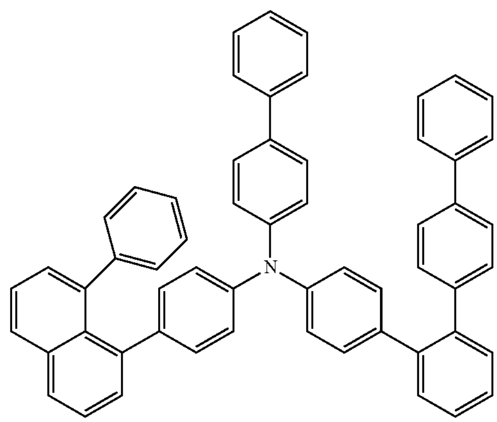
15
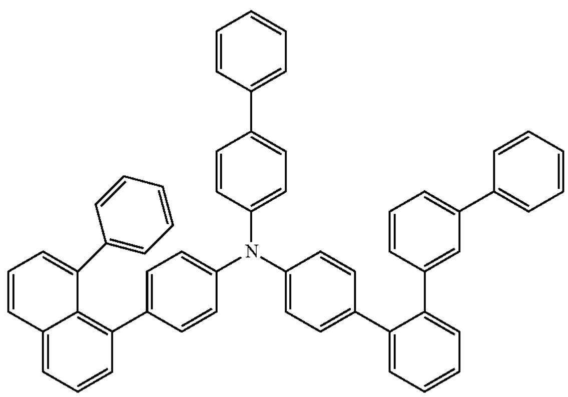
16
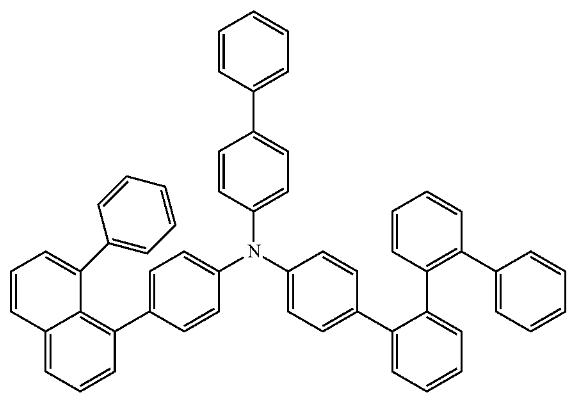
17
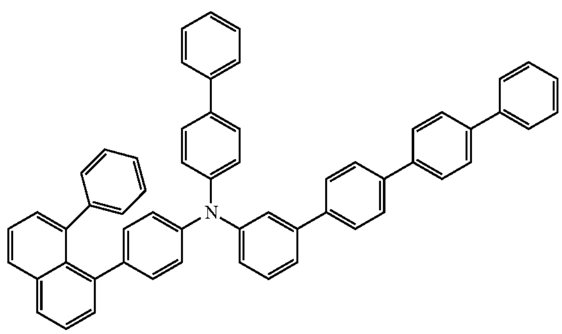
18
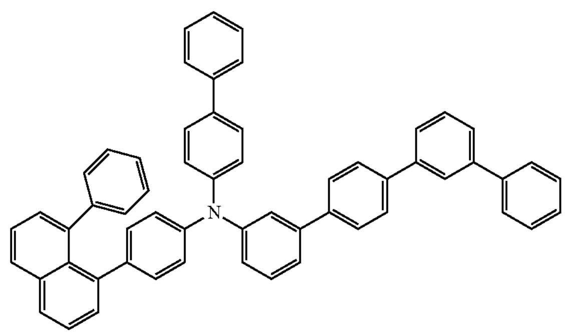

-continued
19
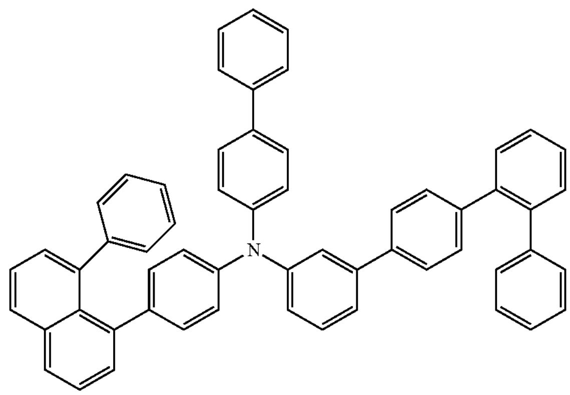
20
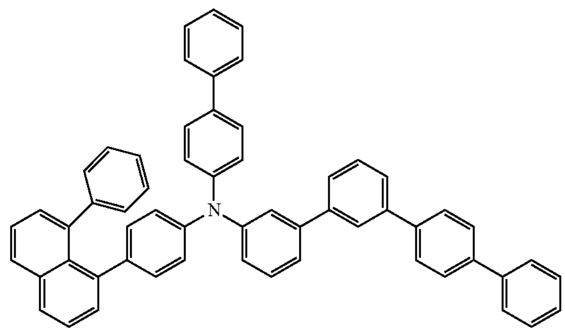
21
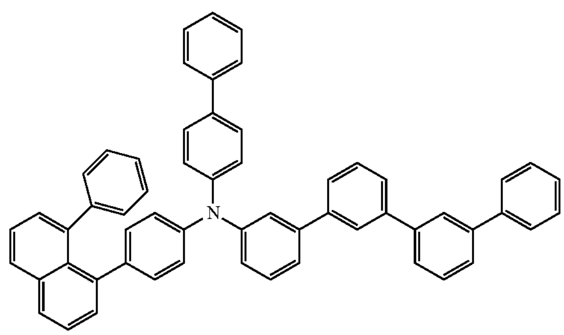
22
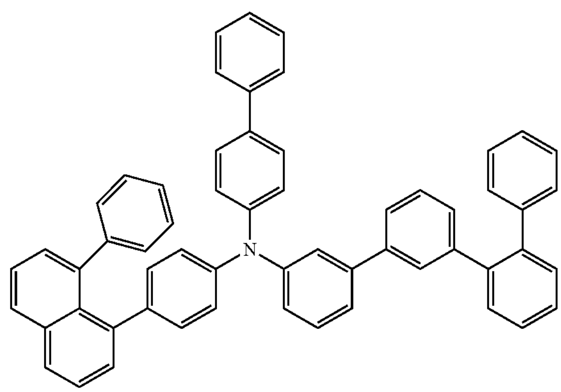
23
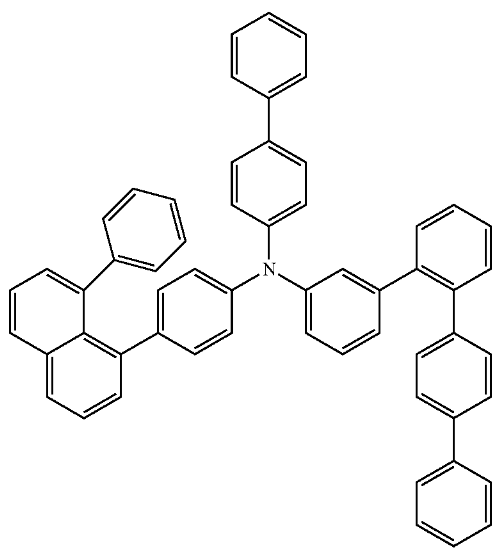
24
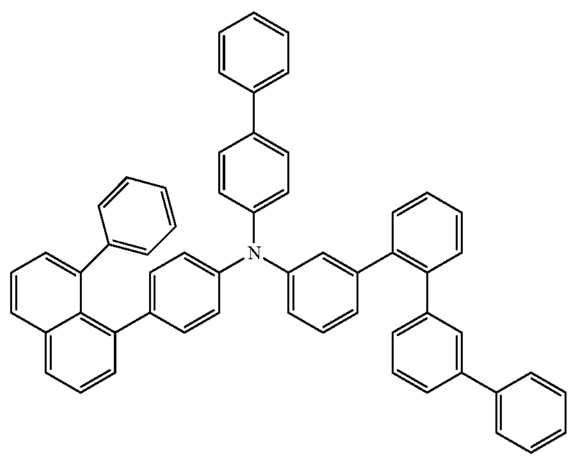

-continued
25
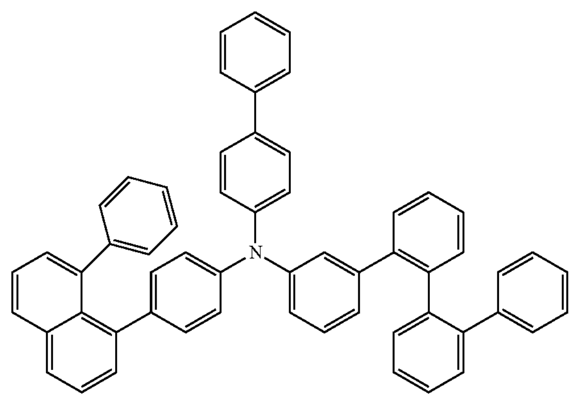
26
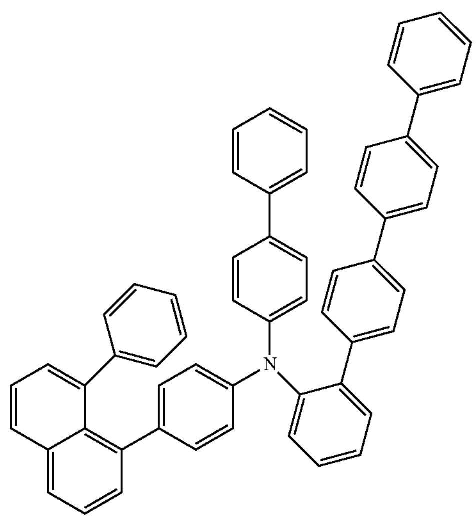
27
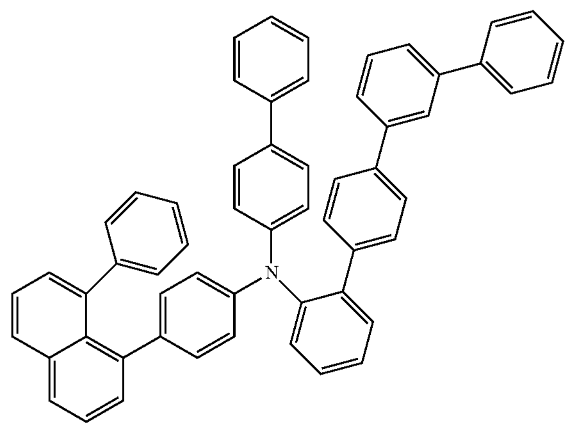
28
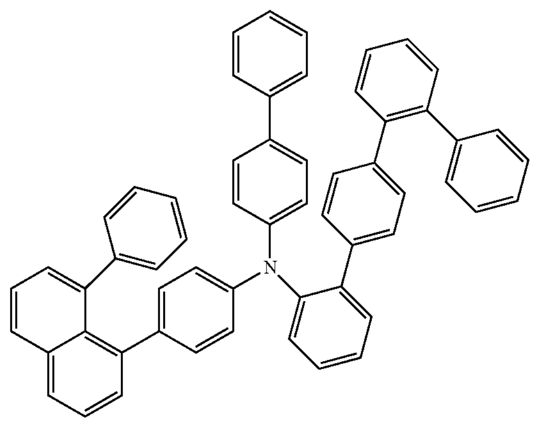
29
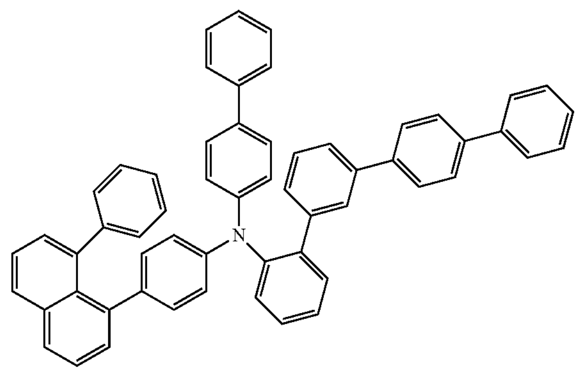
30
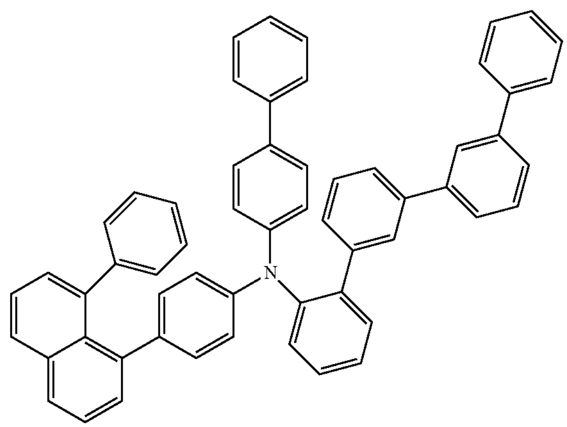

-continued
31
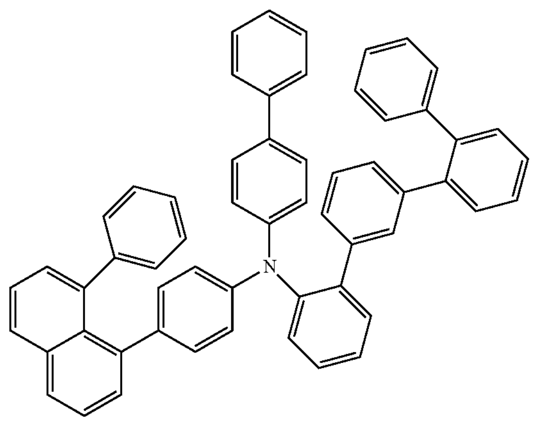
32
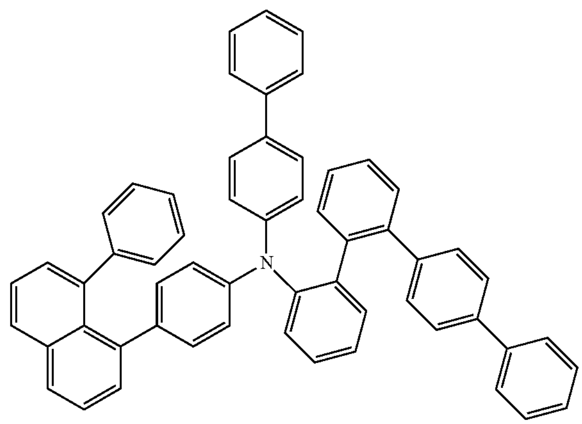
33
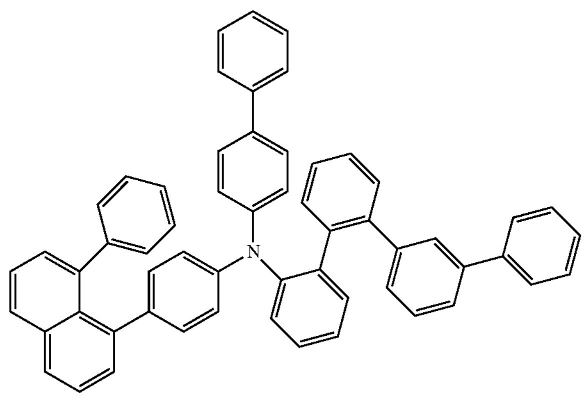
34
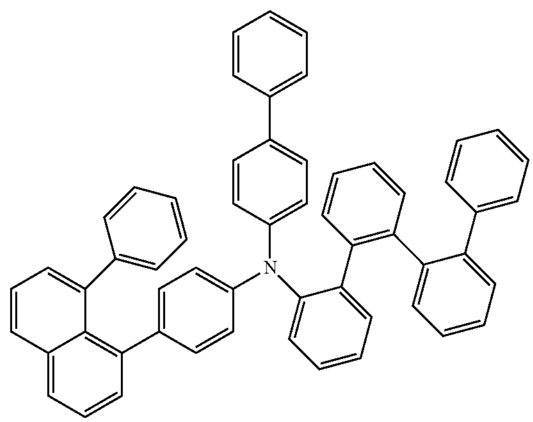
35
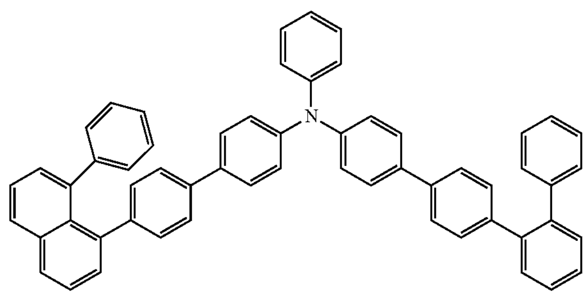
36
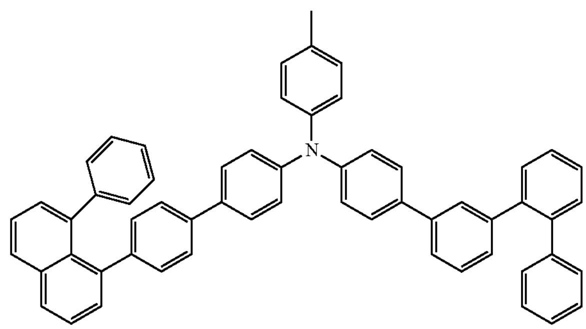
37
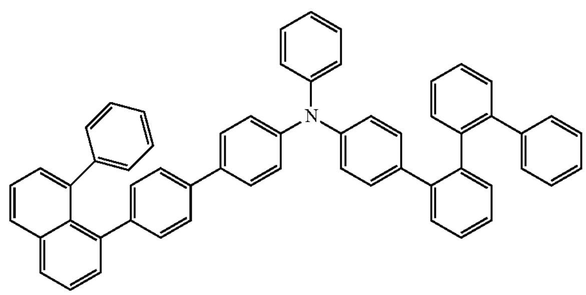
38
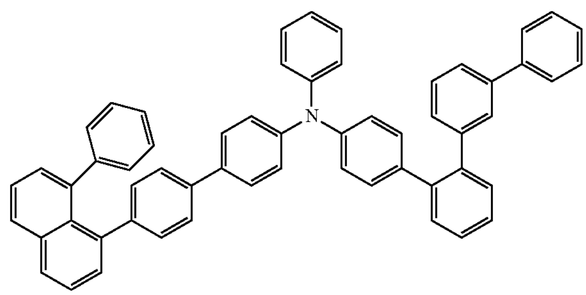

-continued
39
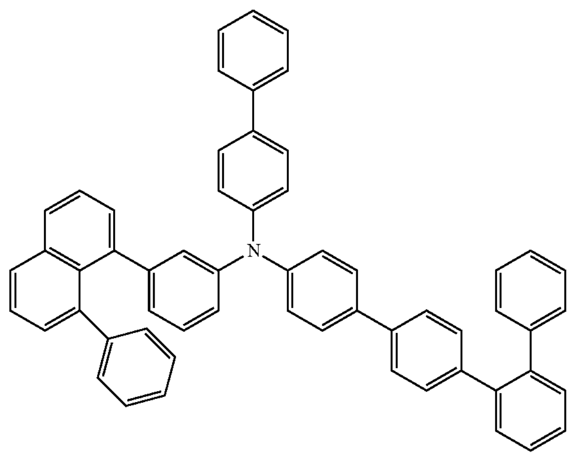
40
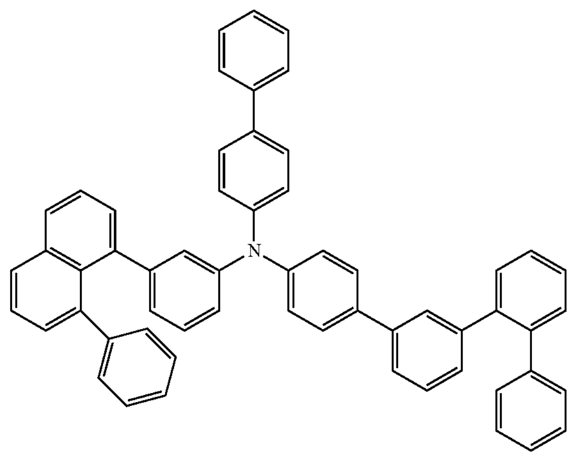
41
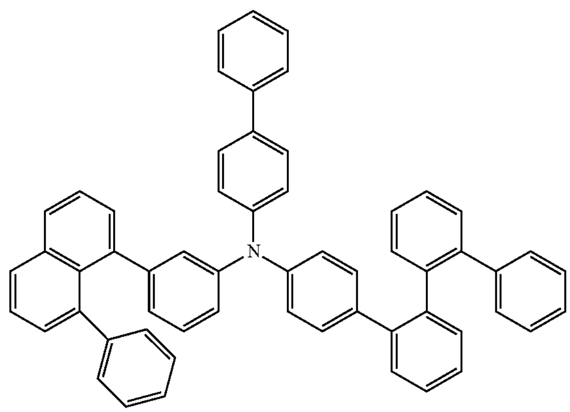
42
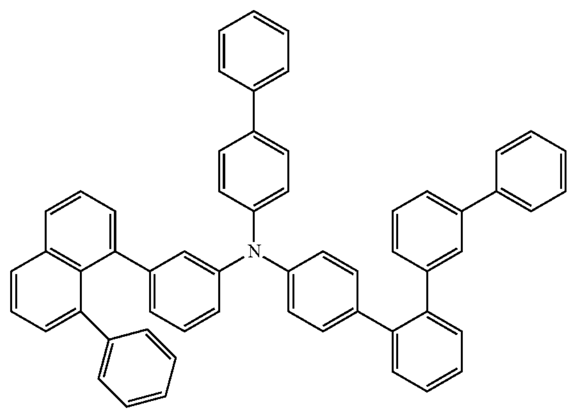
43
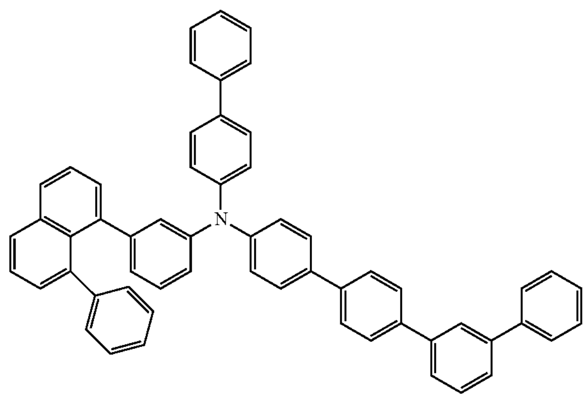
44
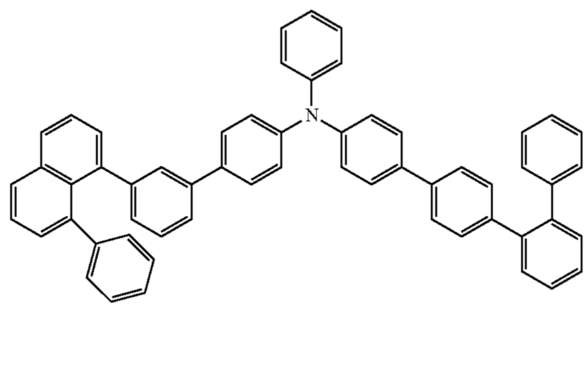
45
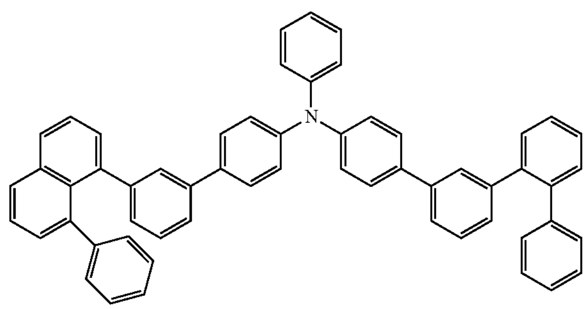
46
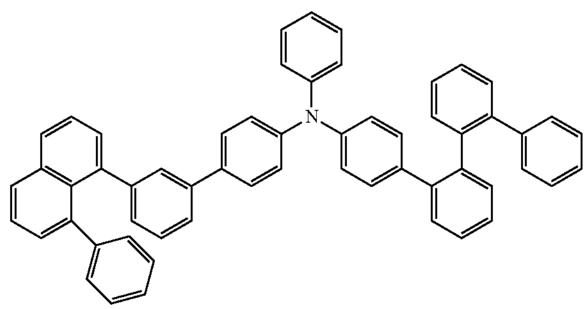

-continued
47
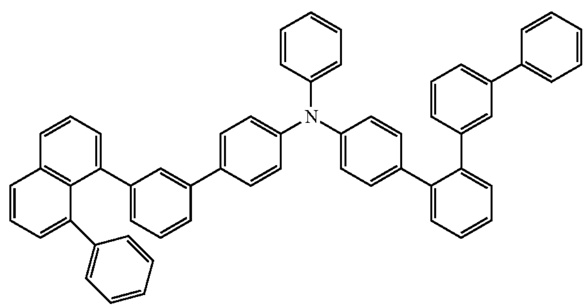
48
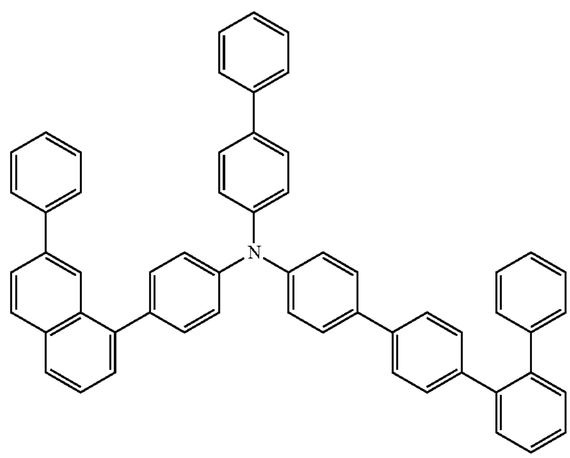
49
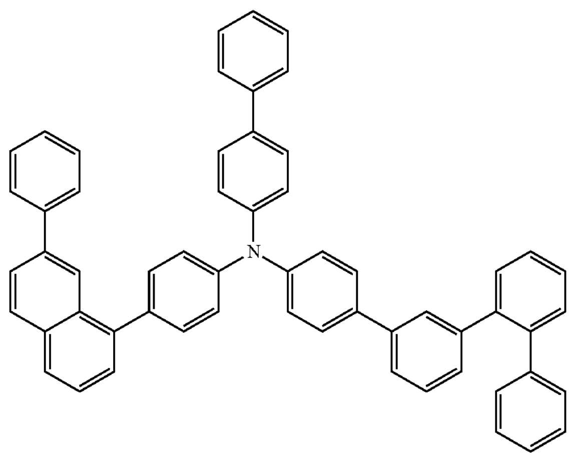
50
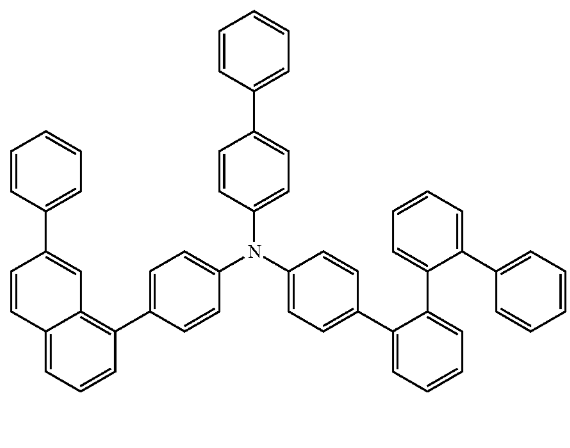
51
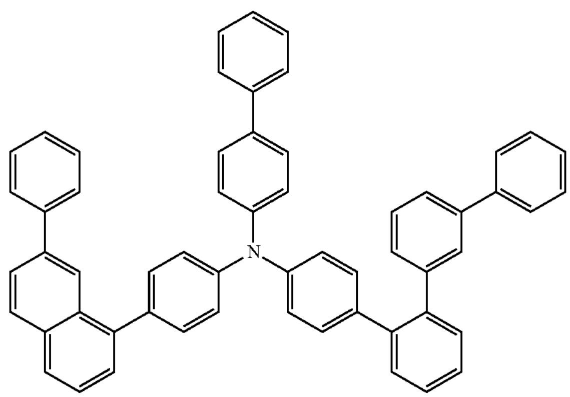
52
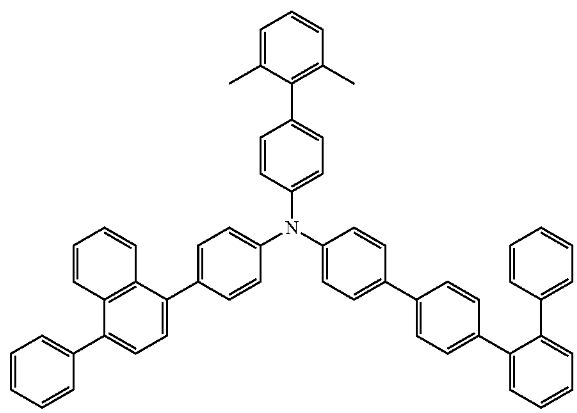

-continued
53
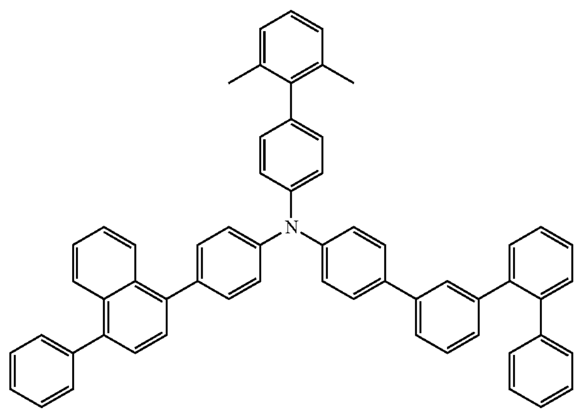
54
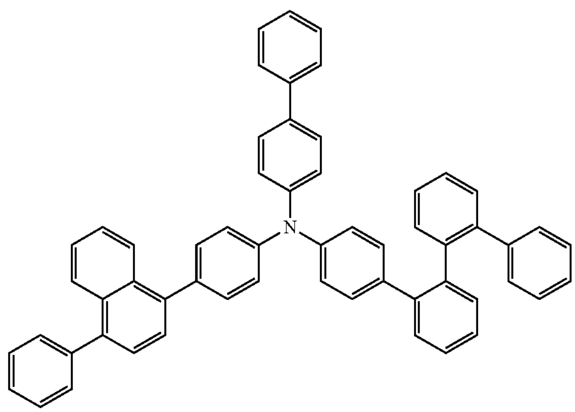
55
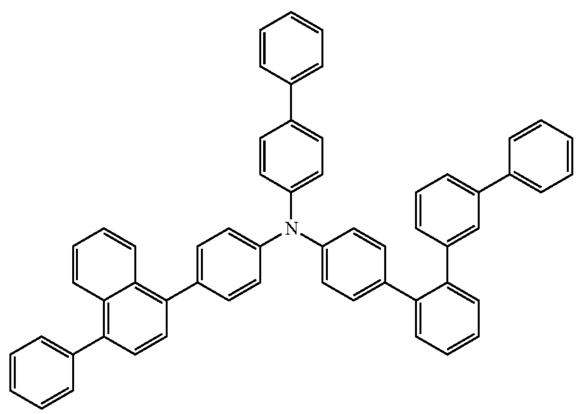
56
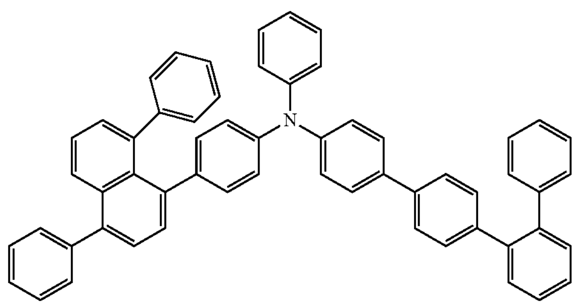
57
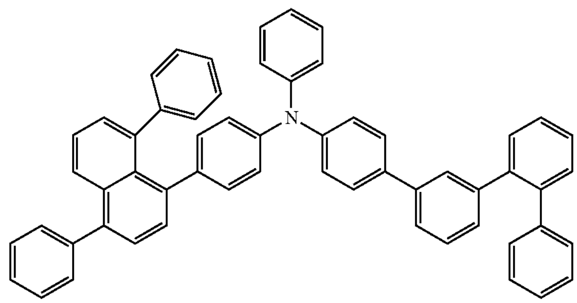
58
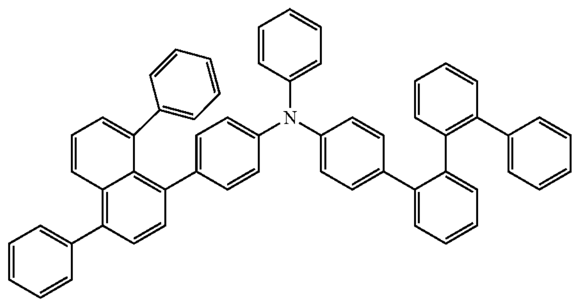
59
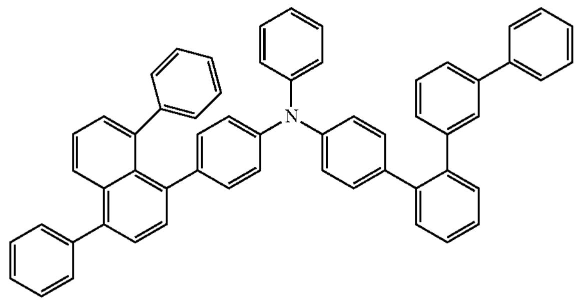
60
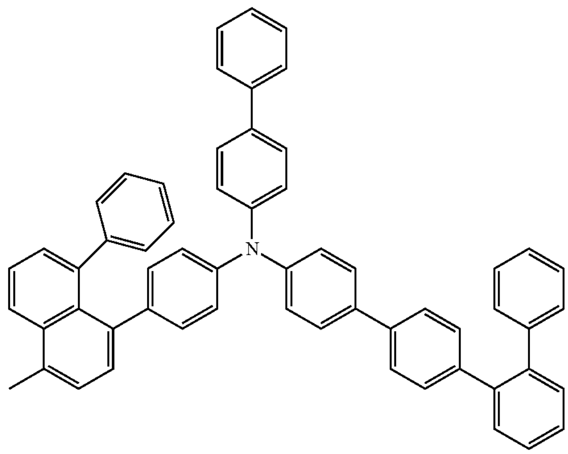

-continued
61
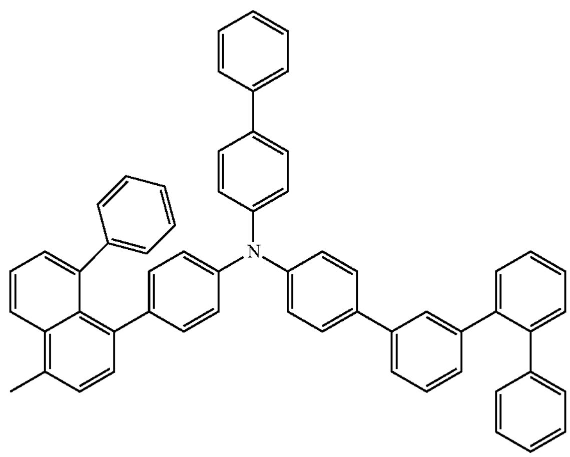
62
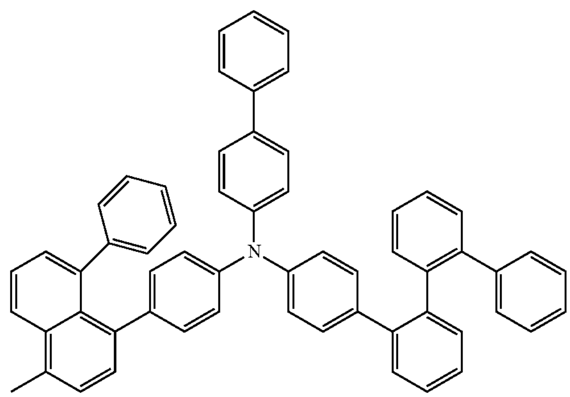
63
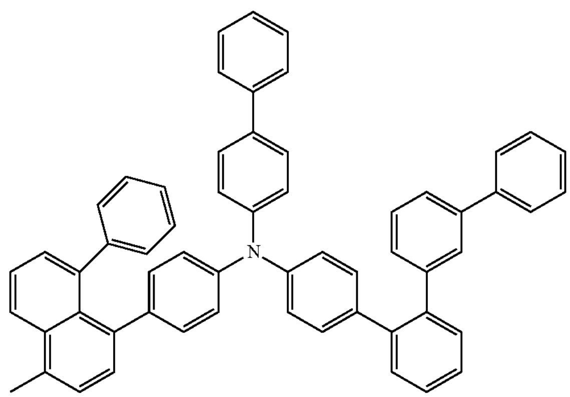
64
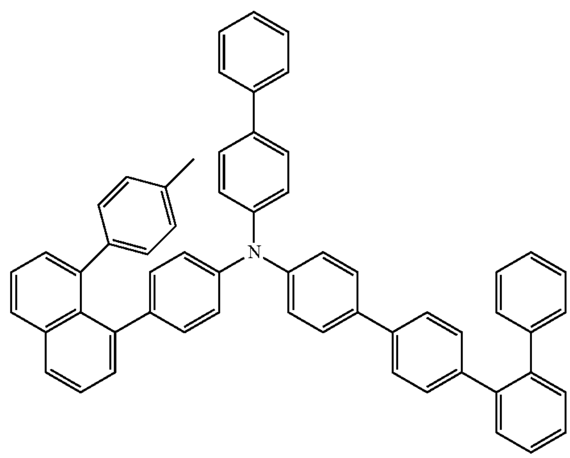
65
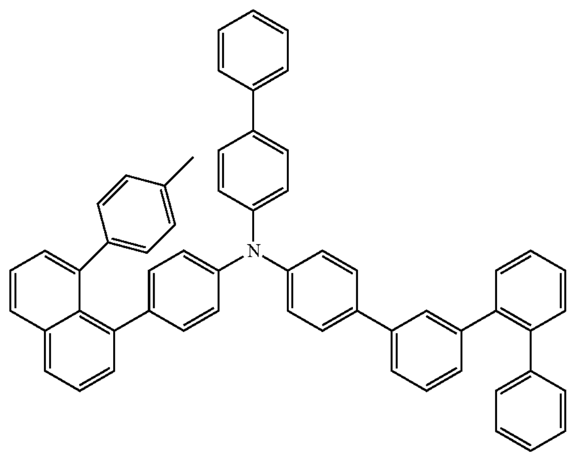
66
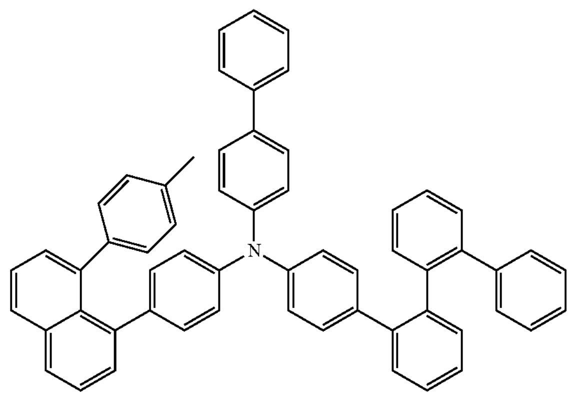

-continued
67
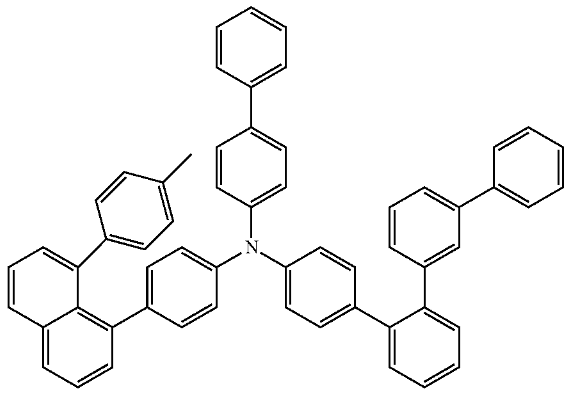
68
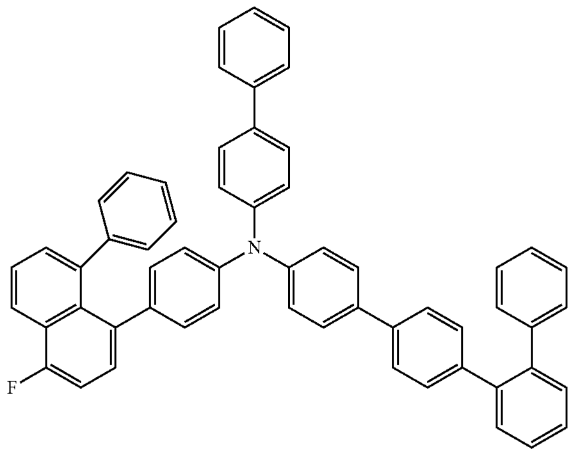
69
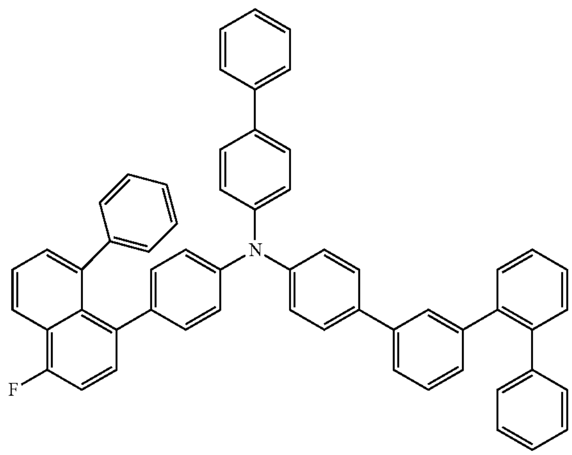
70
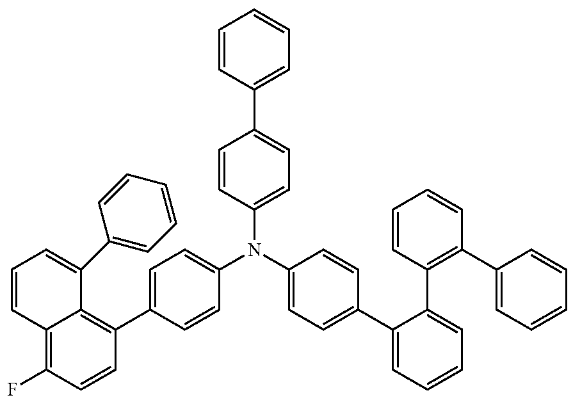
71
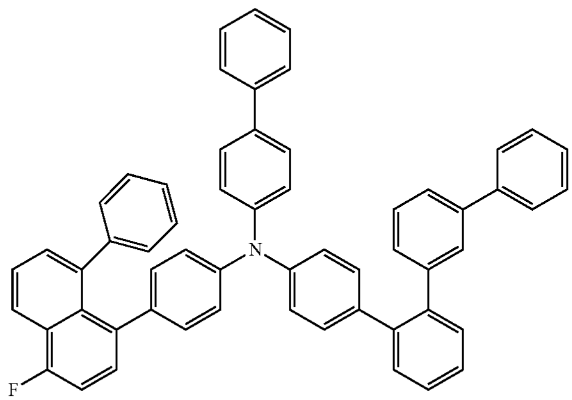
72
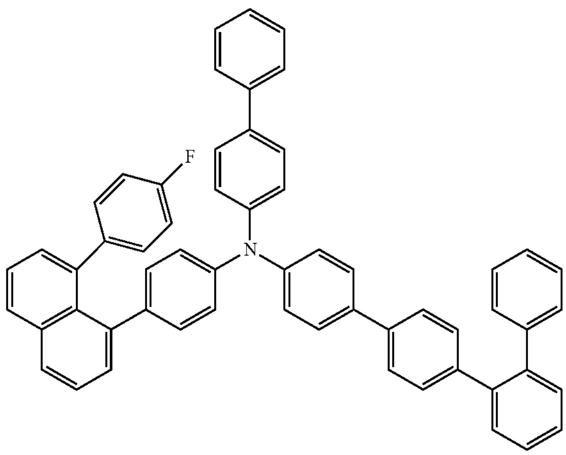

-continued
73
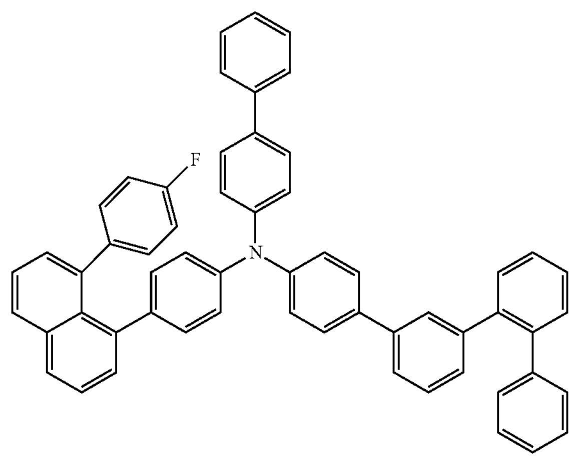
74
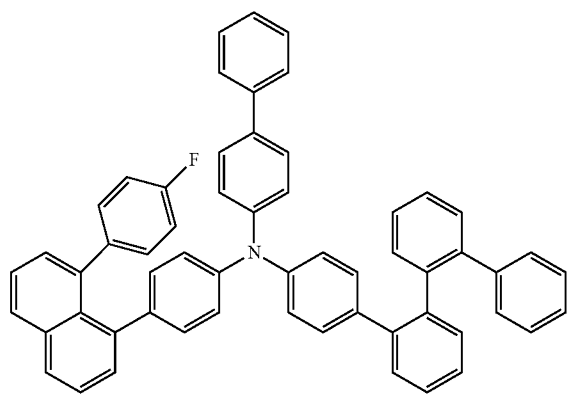
75
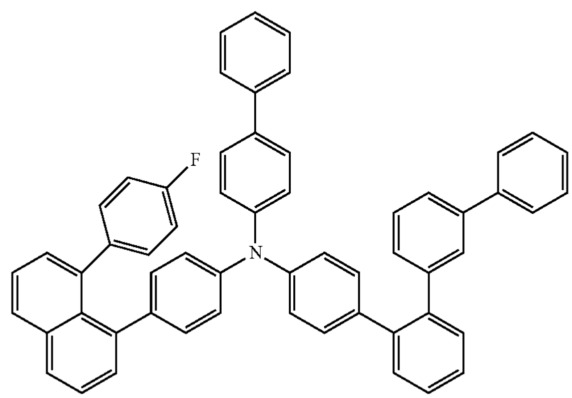
76
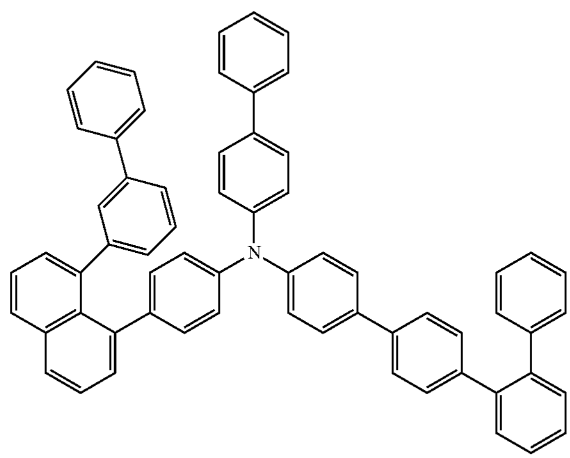
77
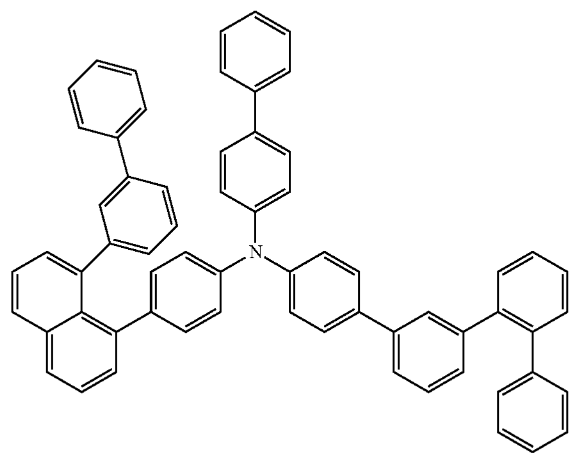
78
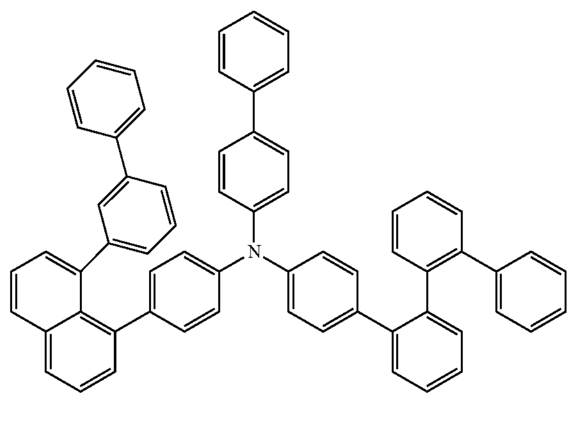

-continued
79
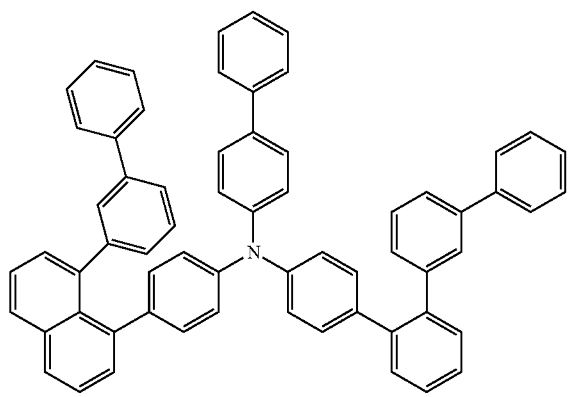
80
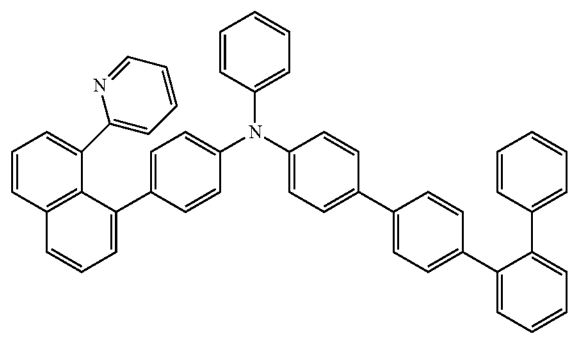
81
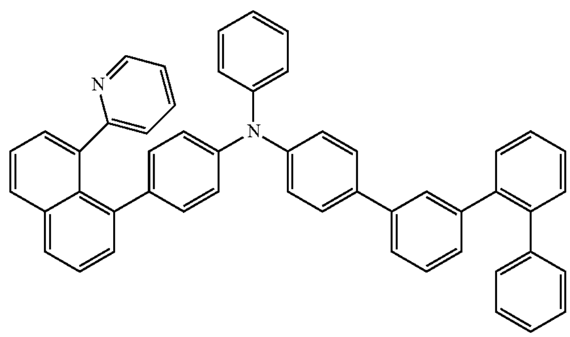
82
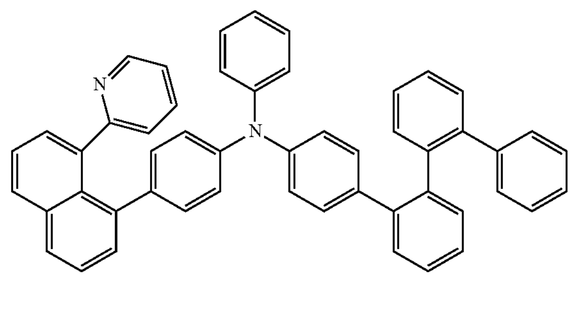
83
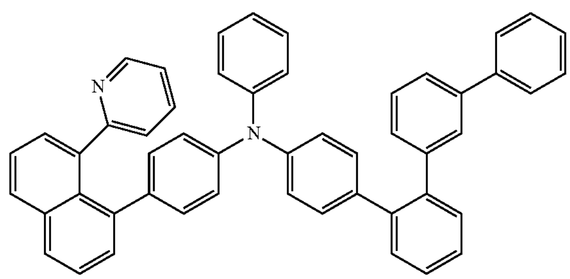
84
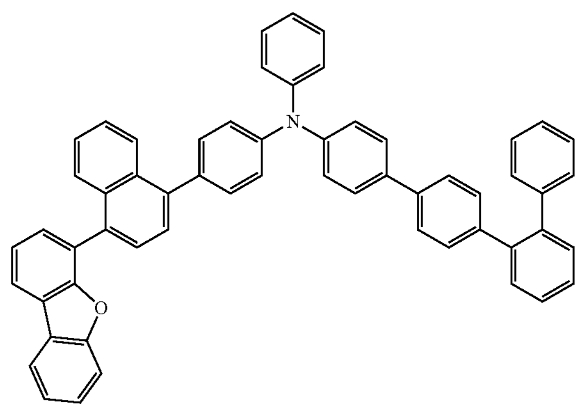
85
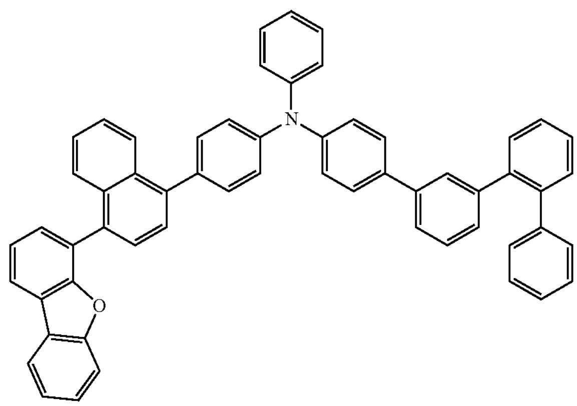
86
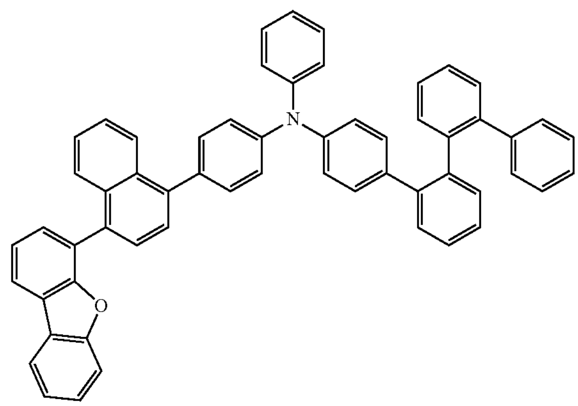

-continued
87
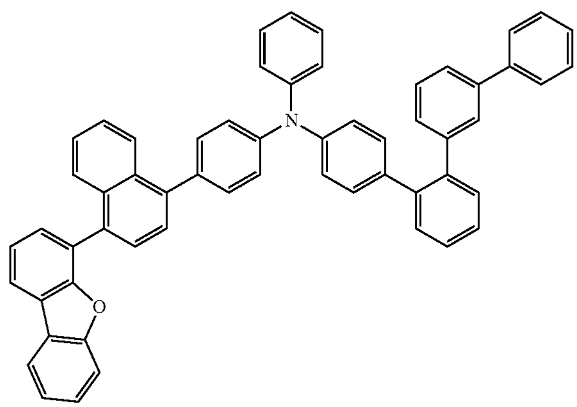
88
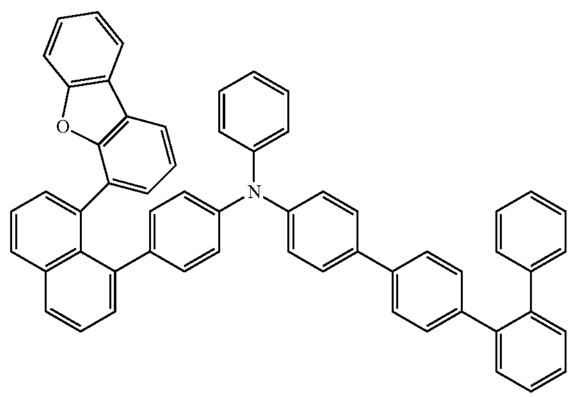
89
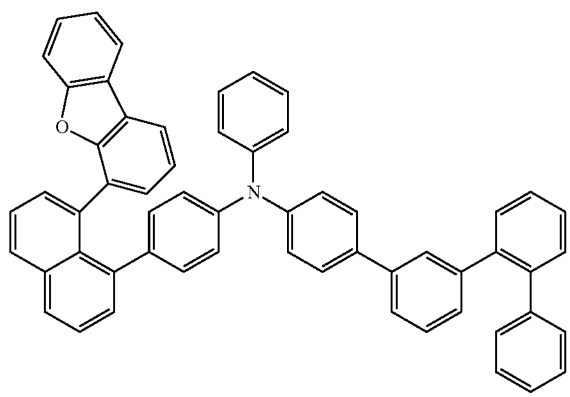
90
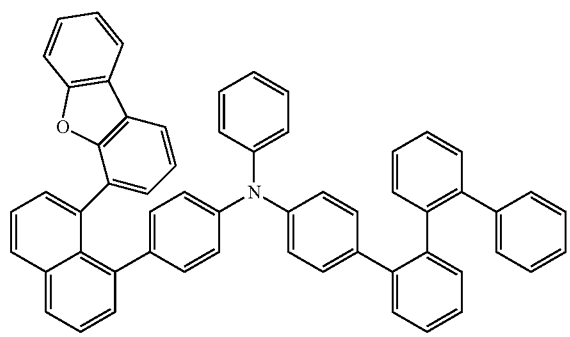
91
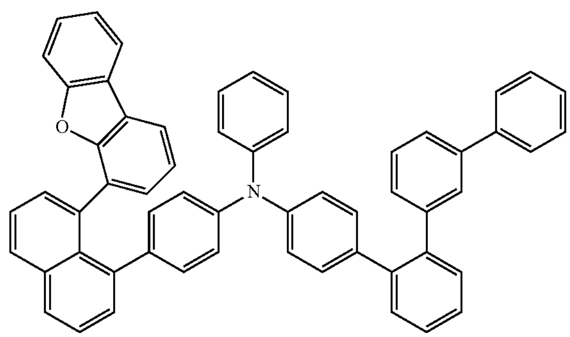
92
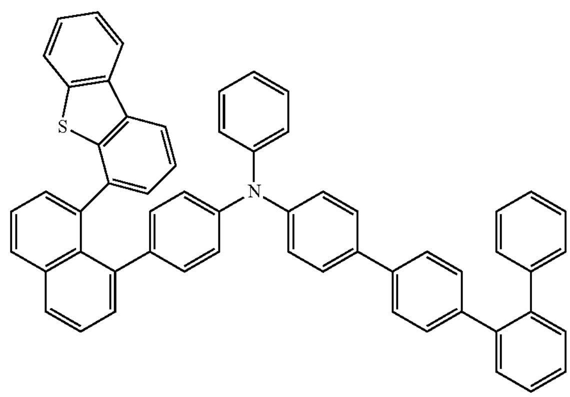

-continued
93
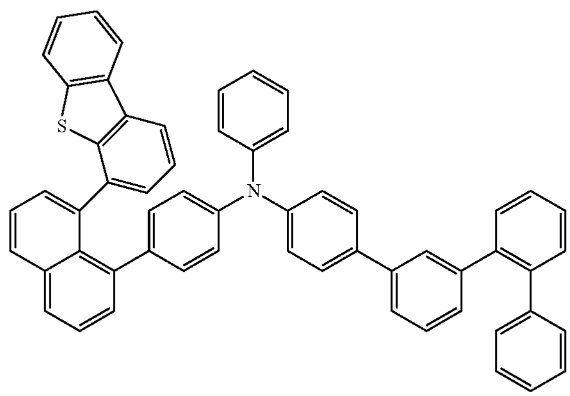
94
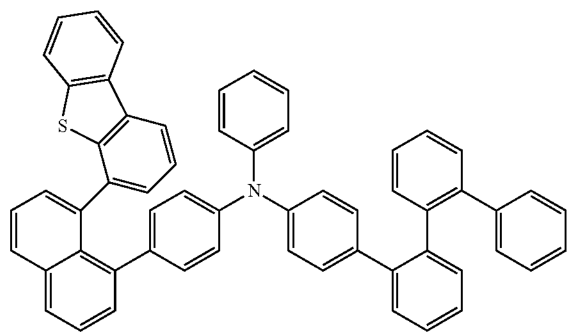
95
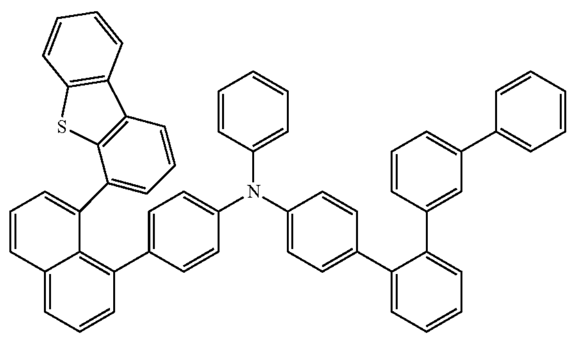
96
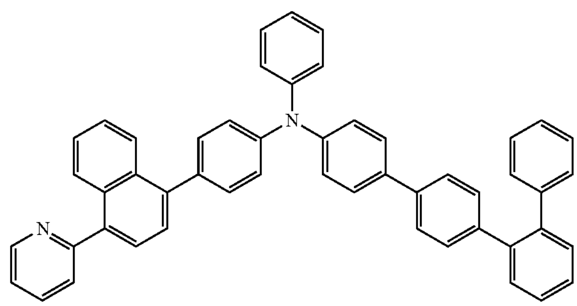
97
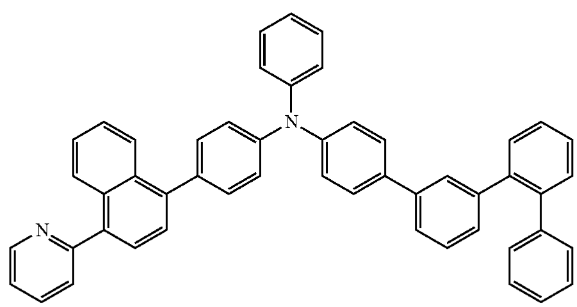
98
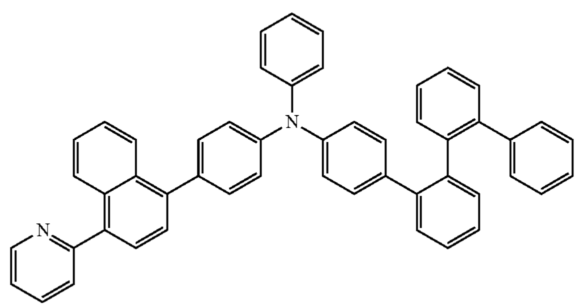
99
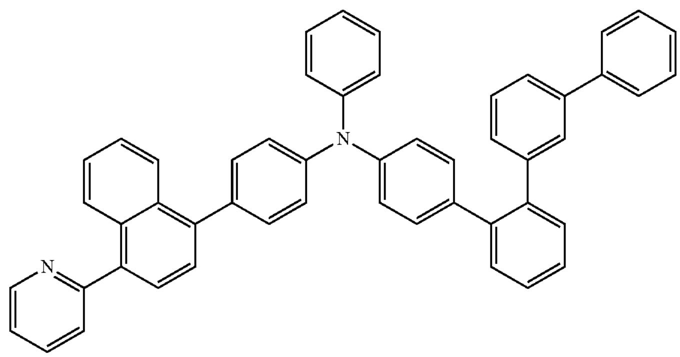

-continued
100
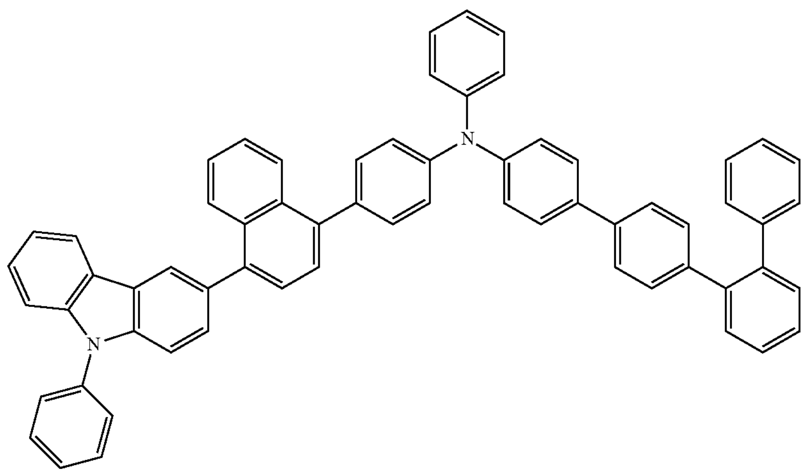
101
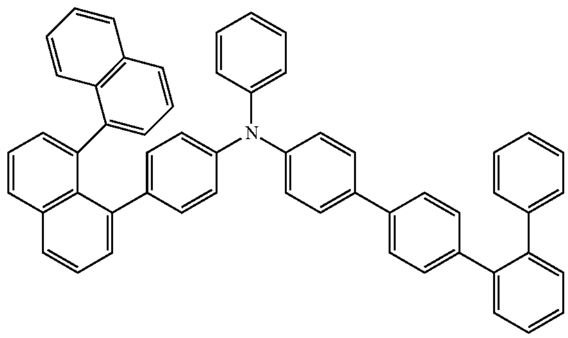
102
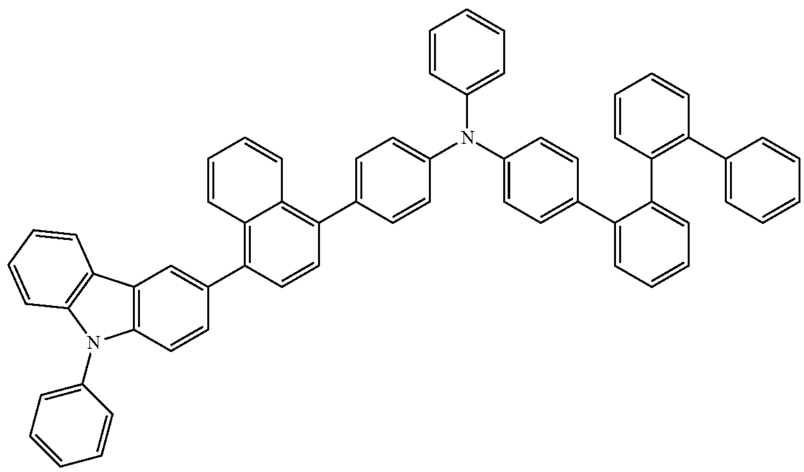
103
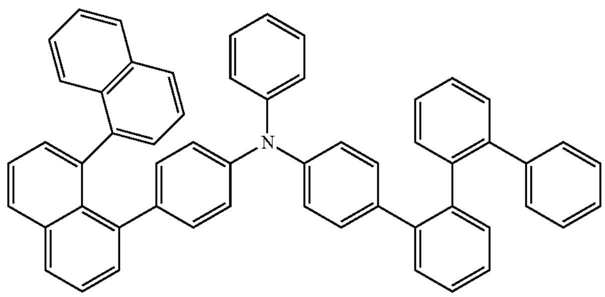

-continued
104
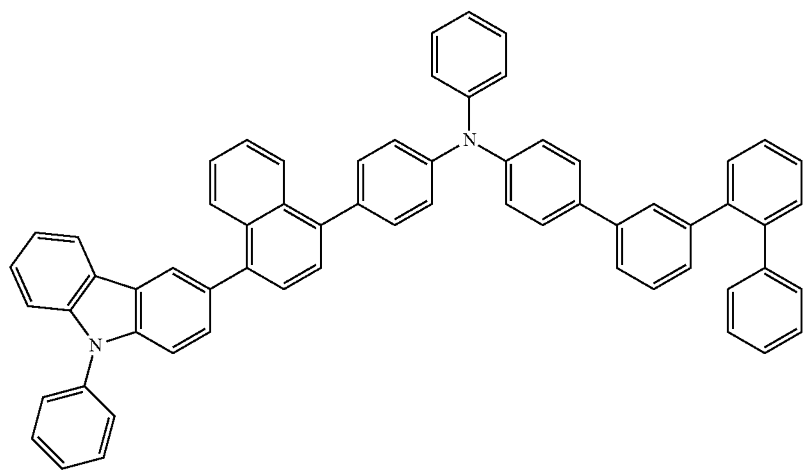
105
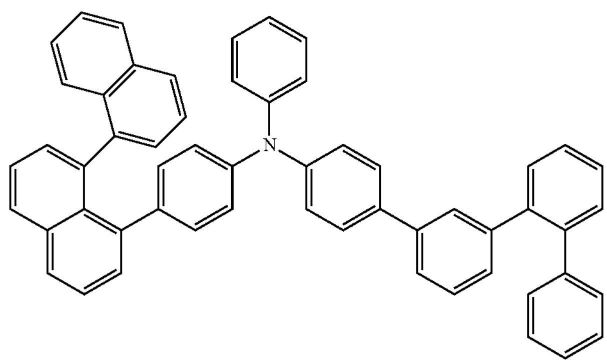
106
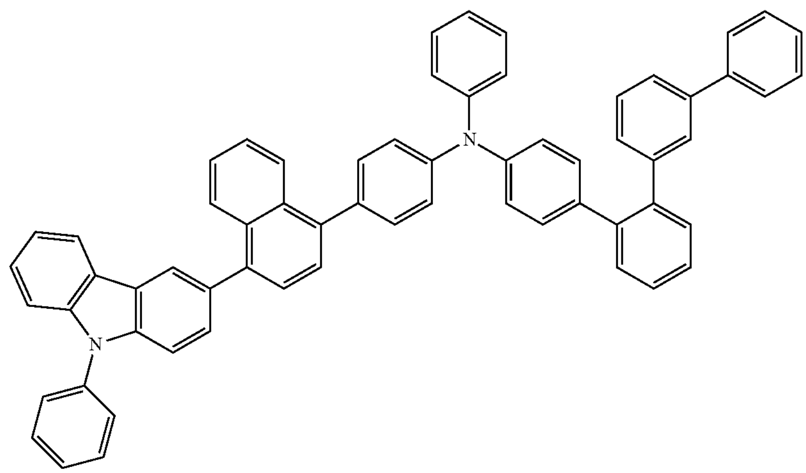

-continued
107
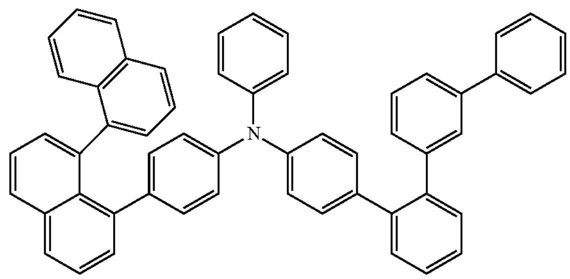
108
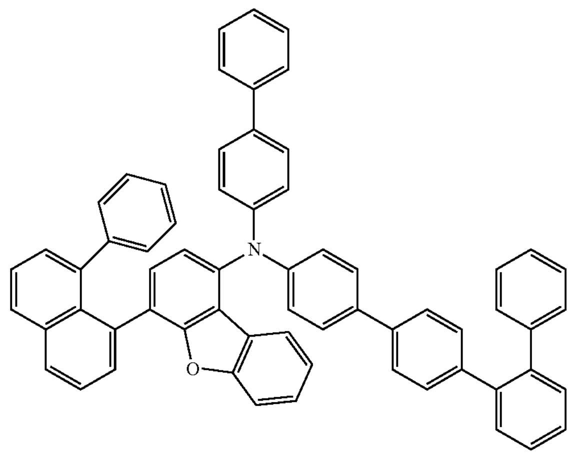
109
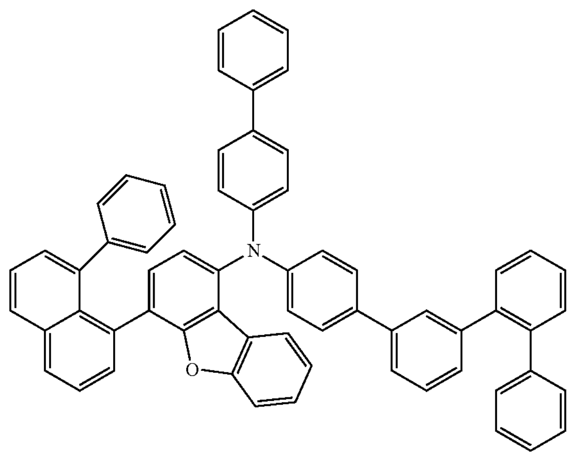
110
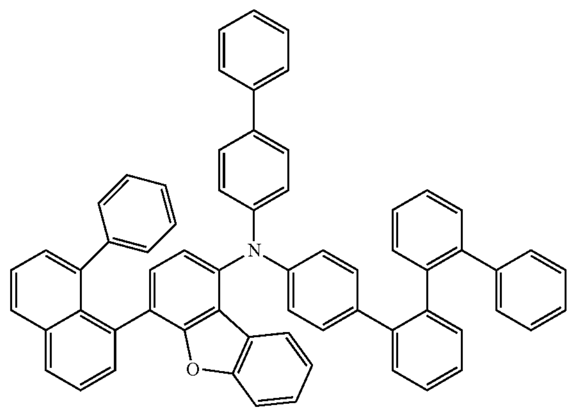
111
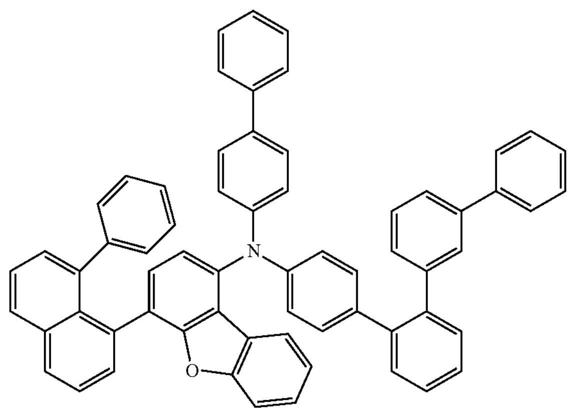
112
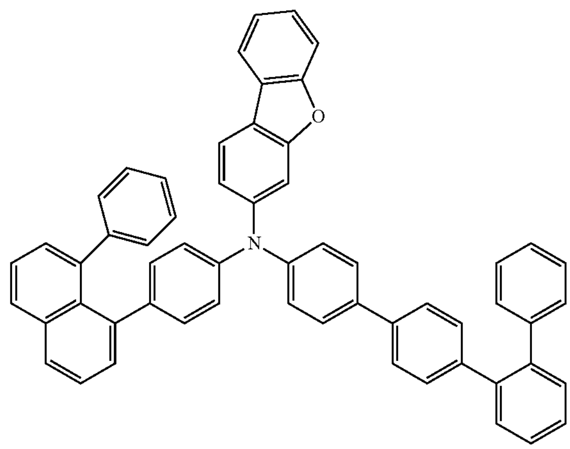

-continued
113
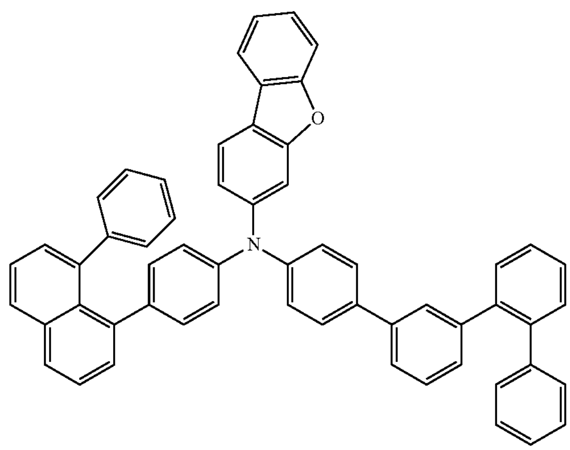
114
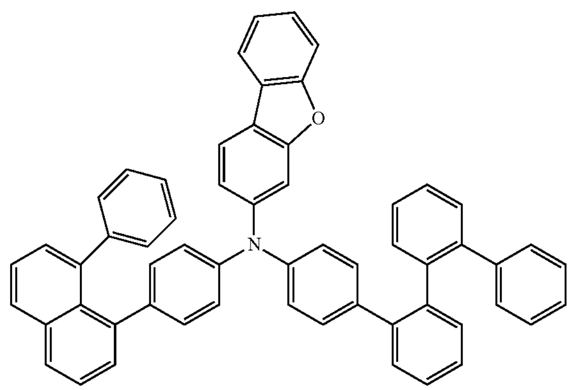
115
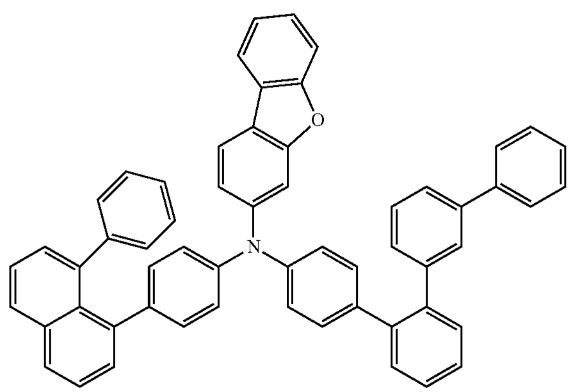
116
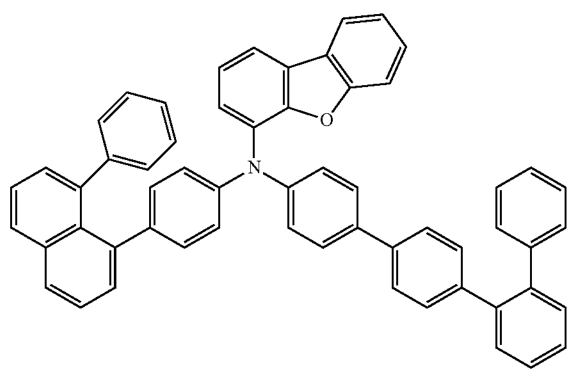
117
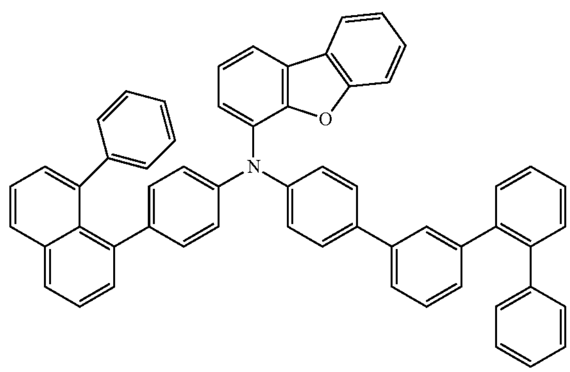
118
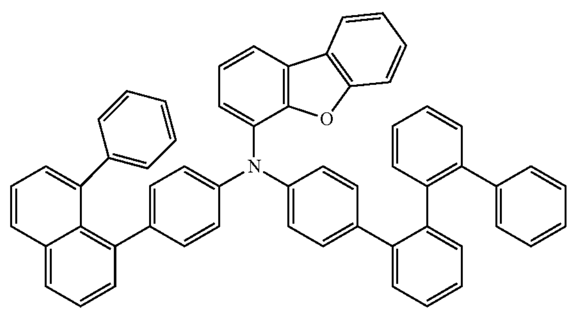
119
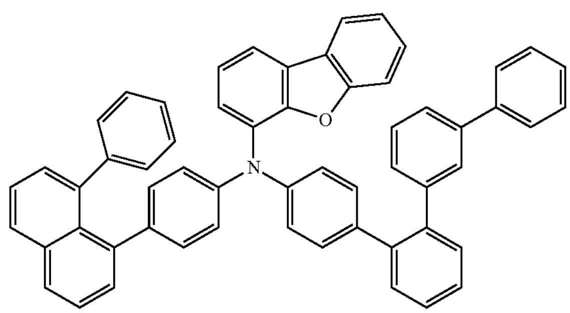
120
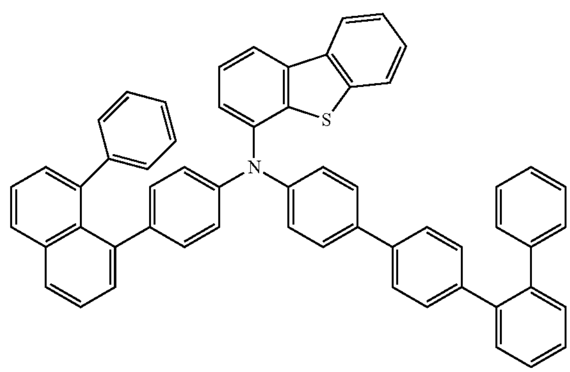

-continued
121
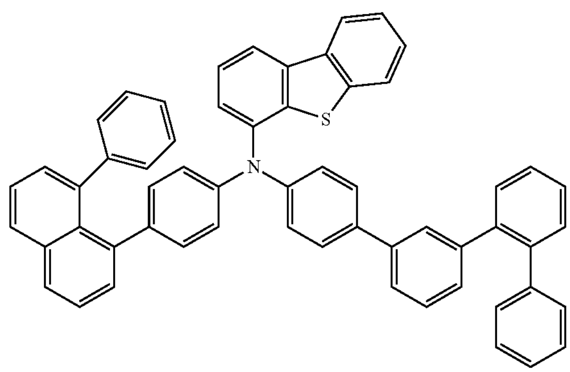
122
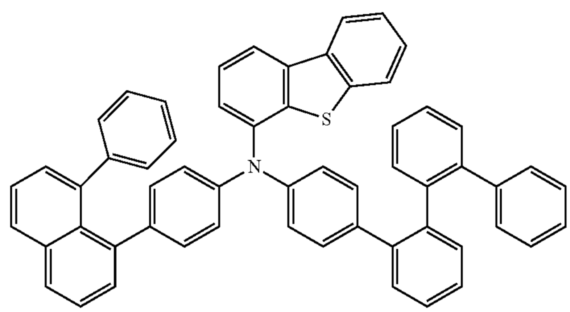
123
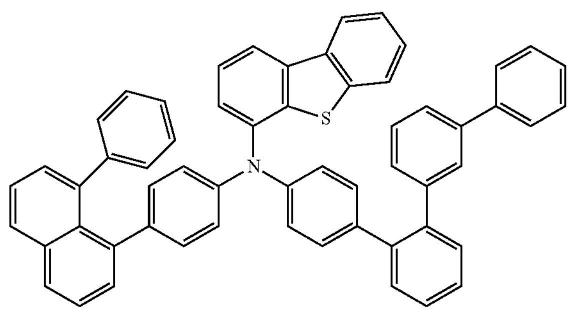
124
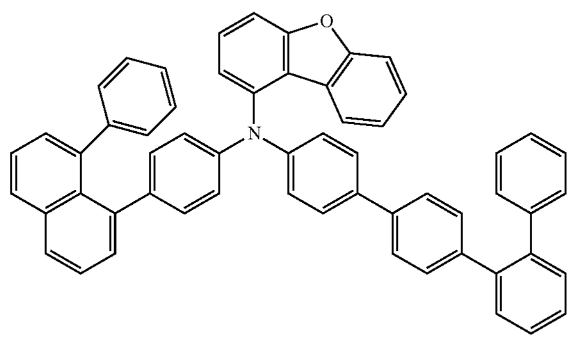
125
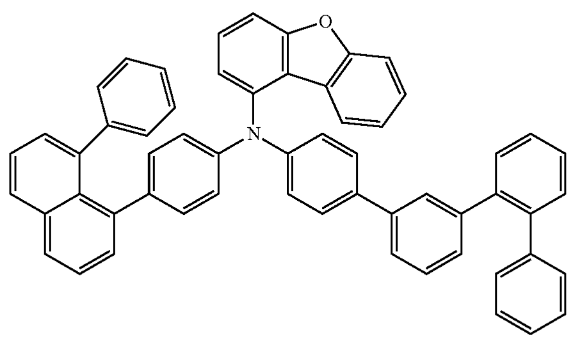
126
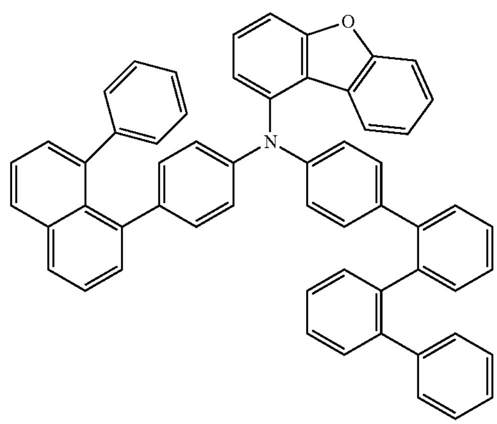

-continued
127
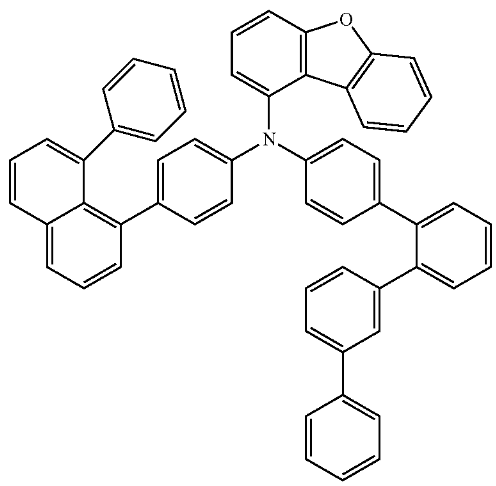
128
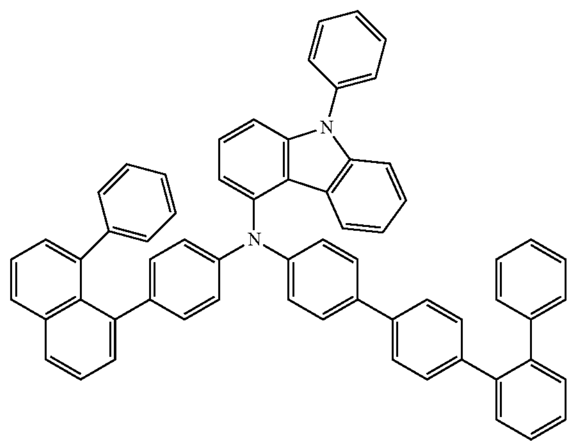
129
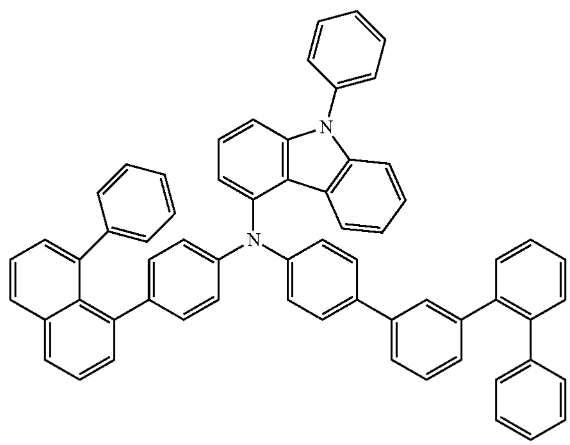
130
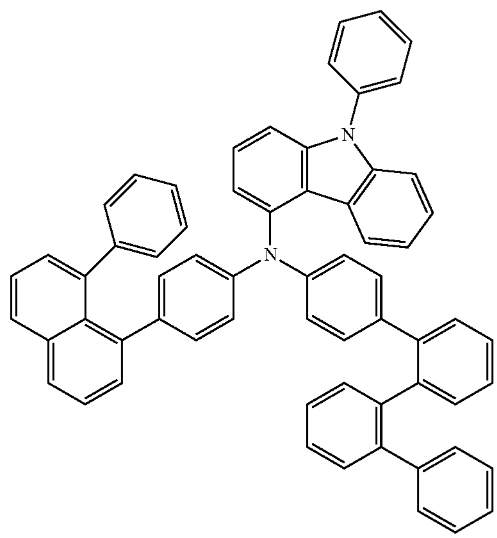
131
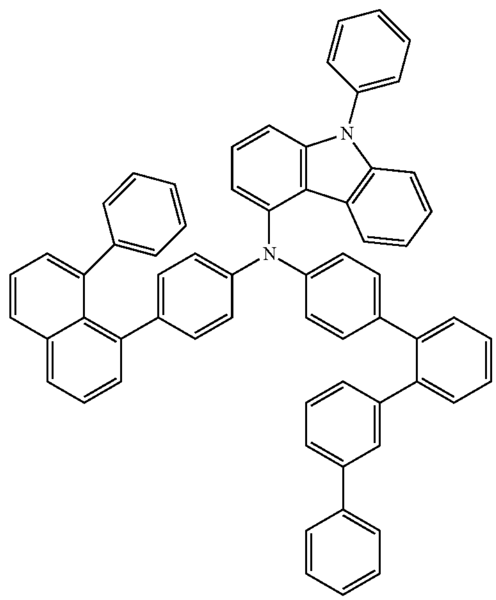
132
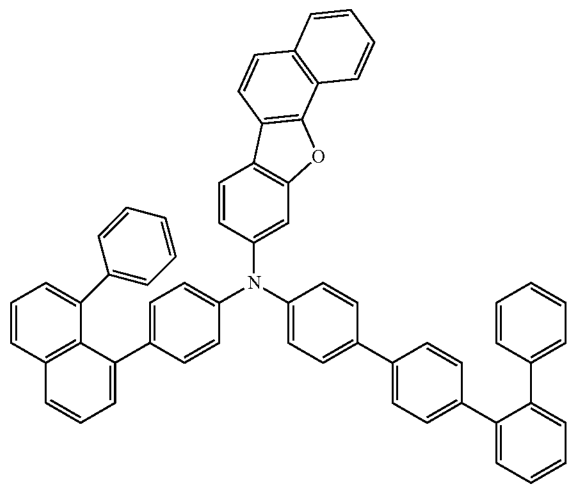

-continued
133
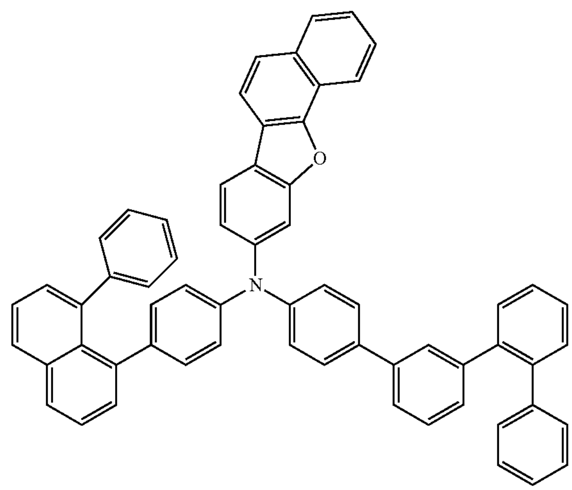
134
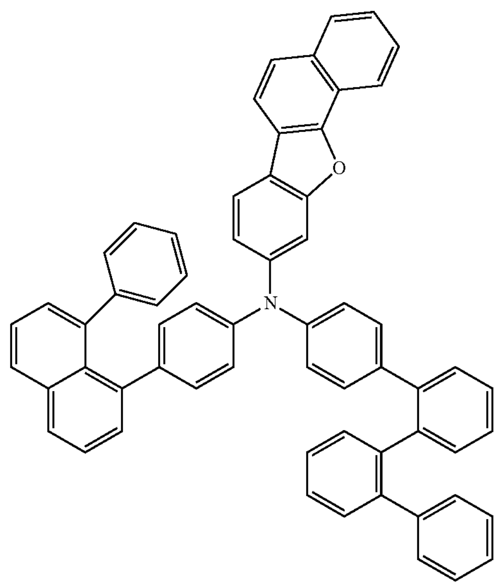
135
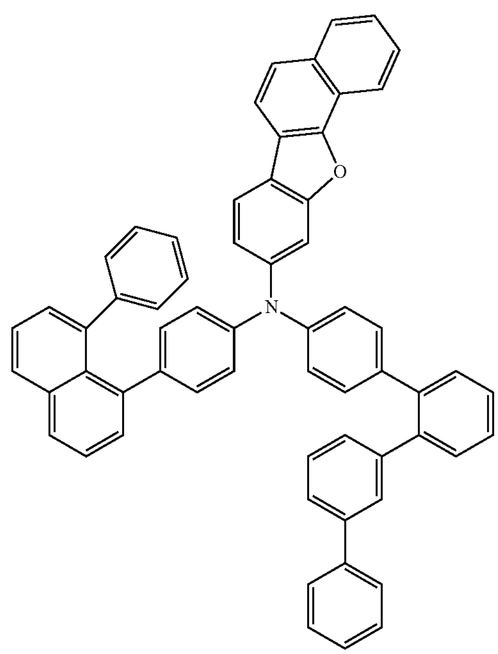
136
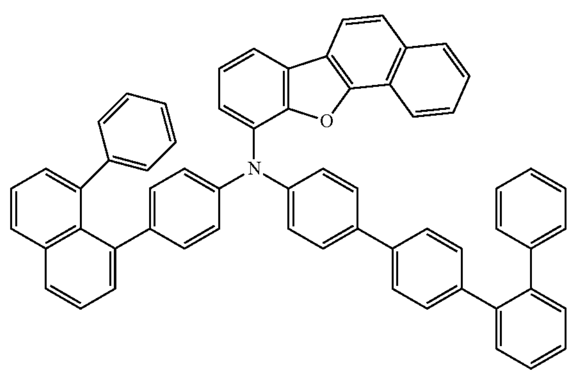

-continued
137
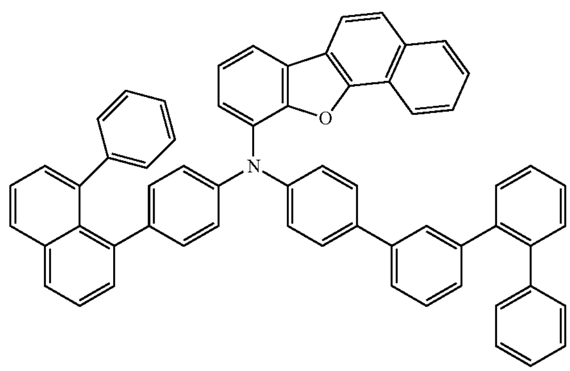
138
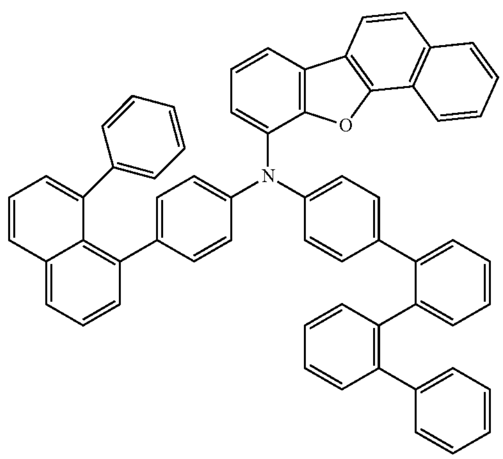
139
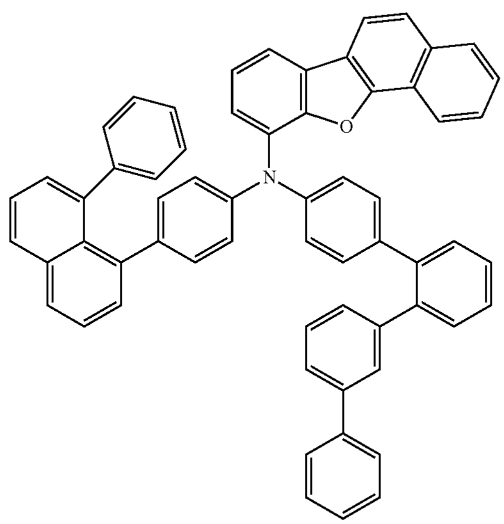
140
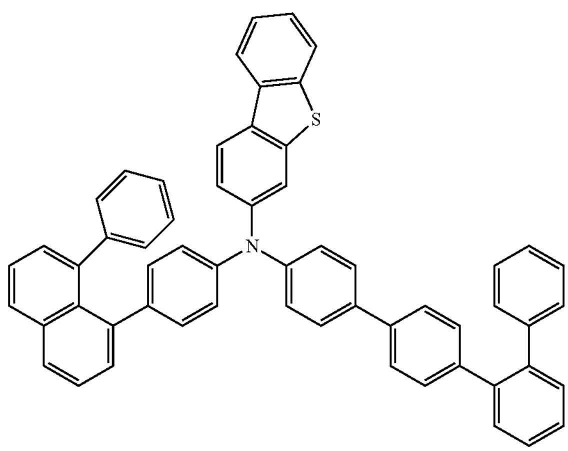
141
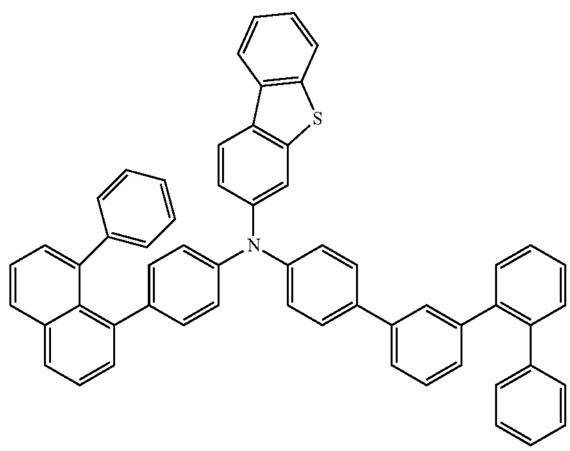
142
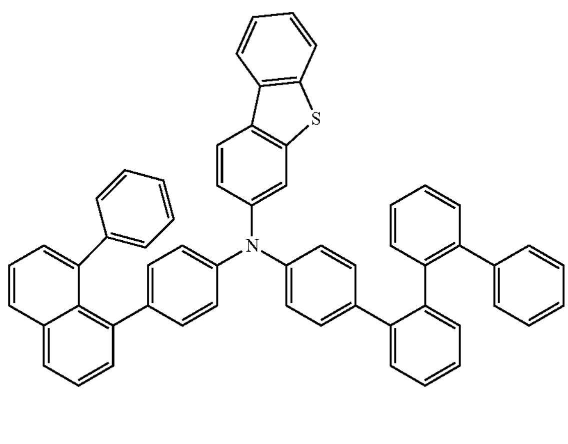

-continued
143
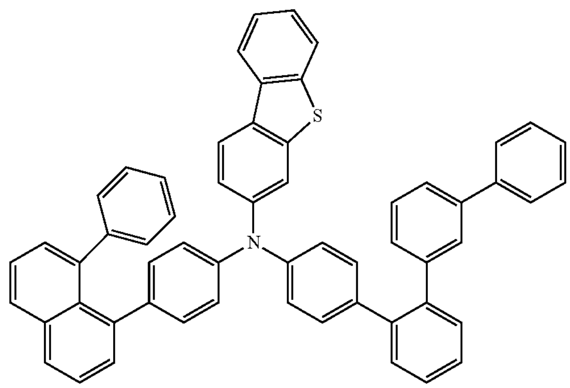
144
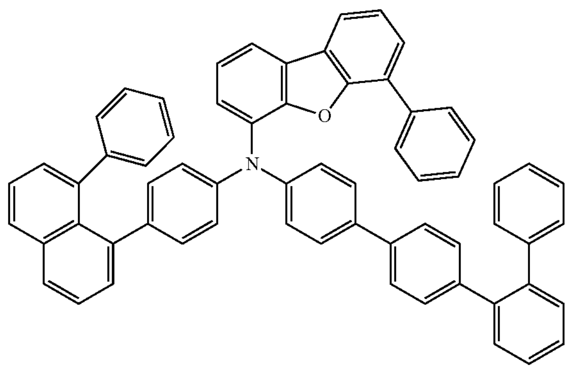
145
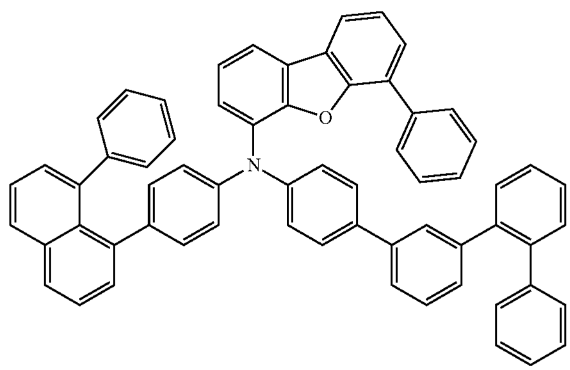
146
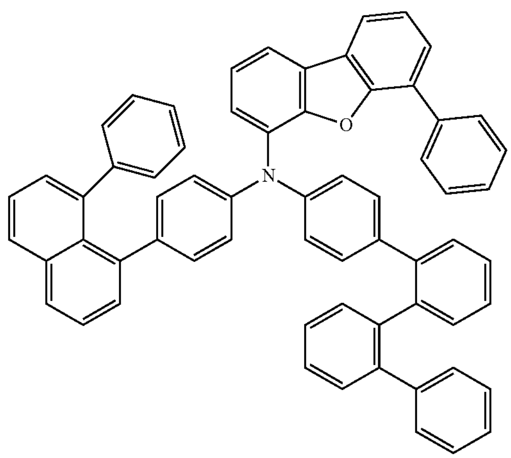
147
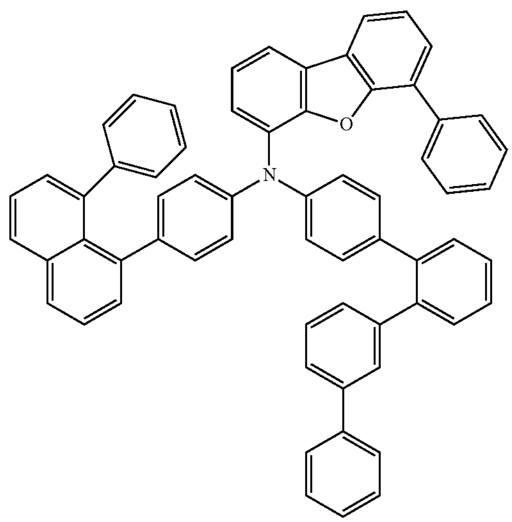
148
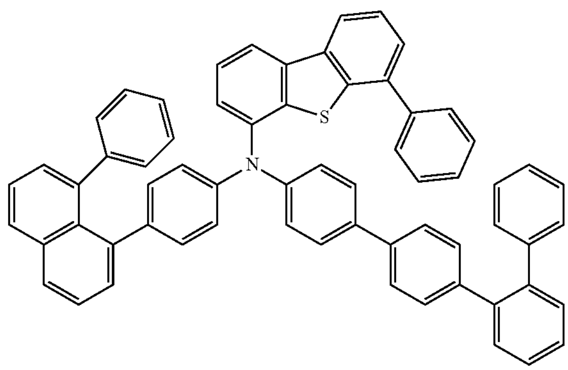

-continued
149
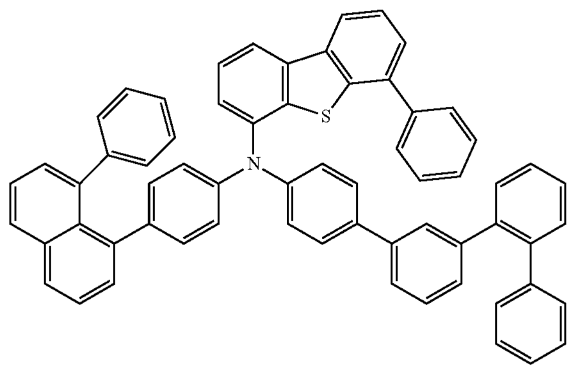
150
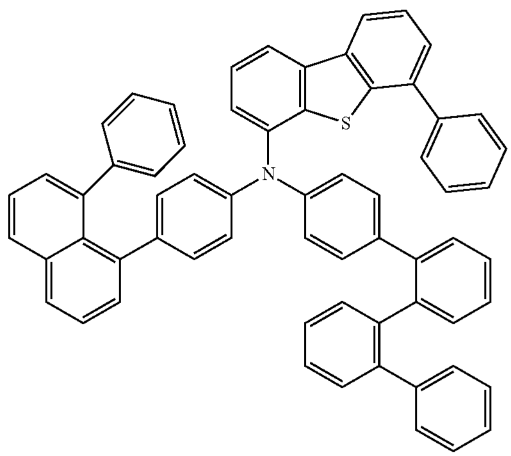
151
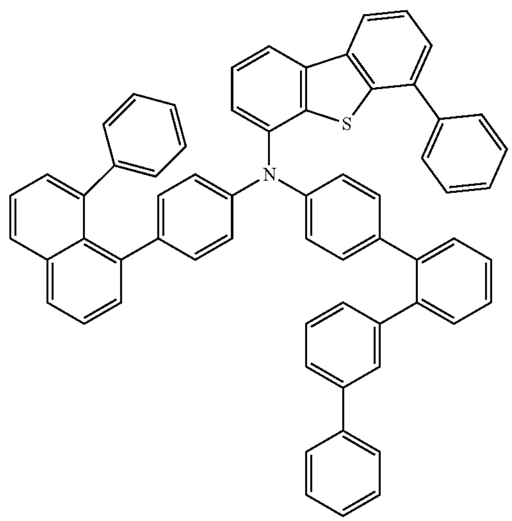
152
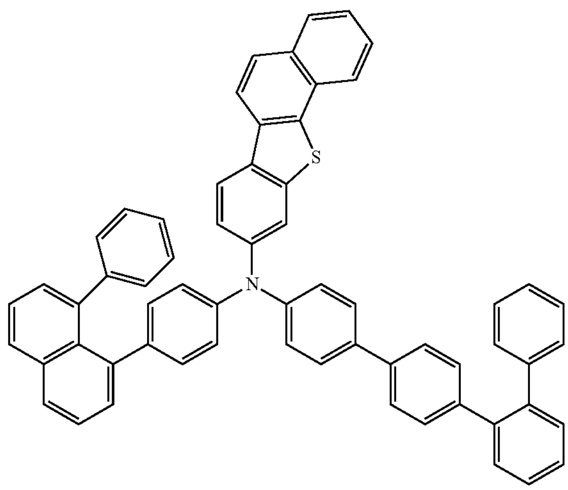
153
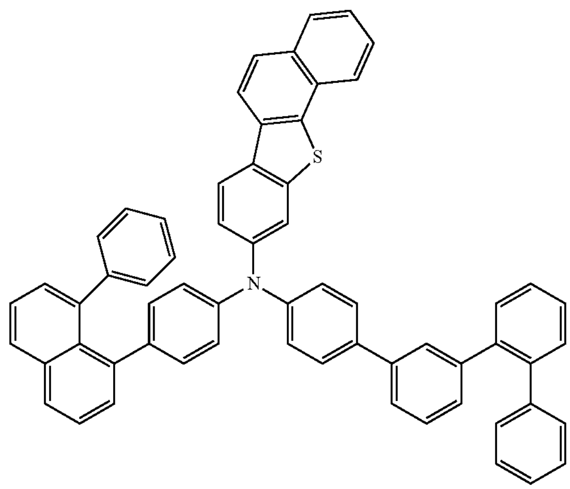
154
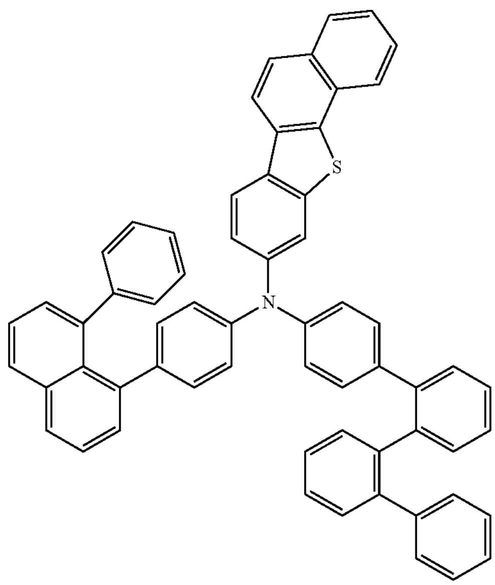

-continued
155
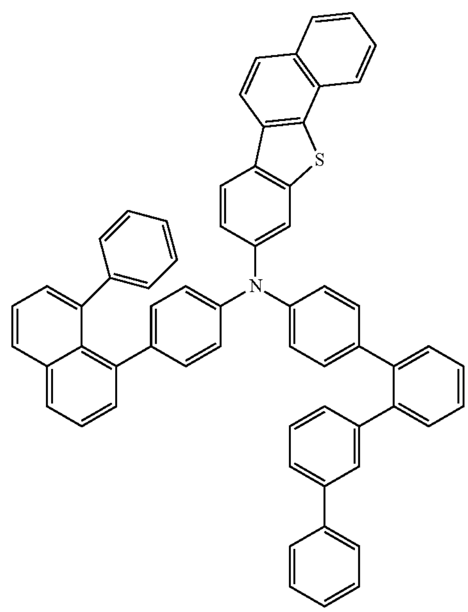
156
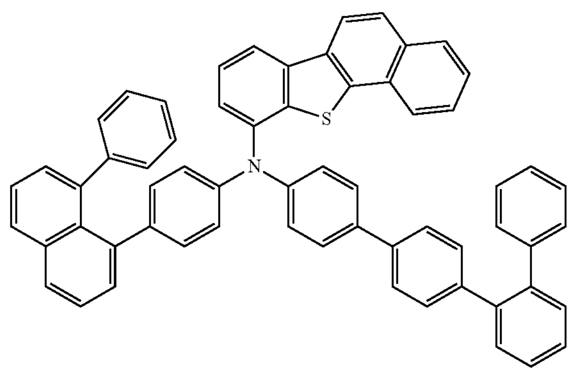
157
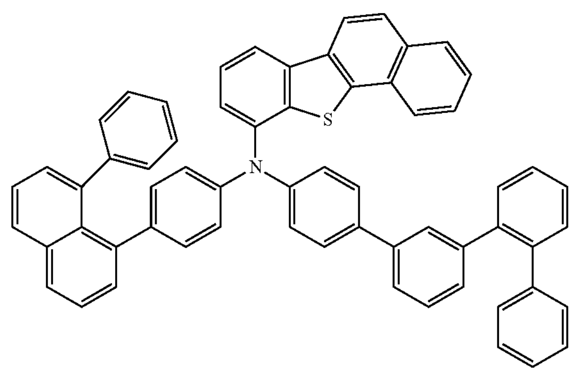
158
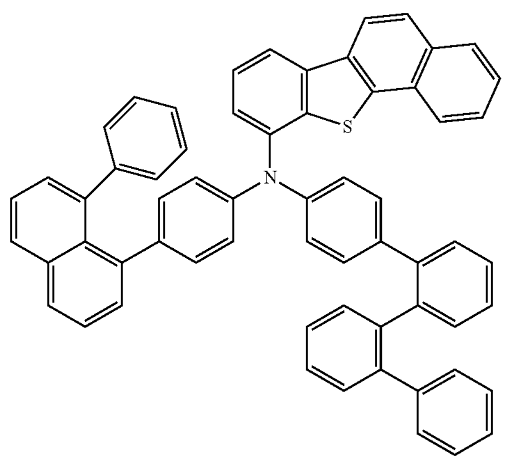
159
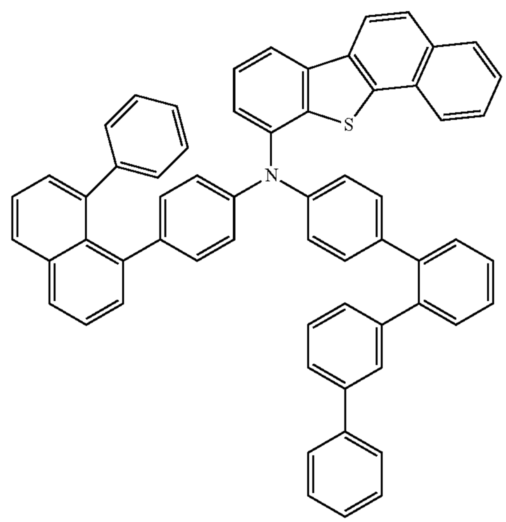
160
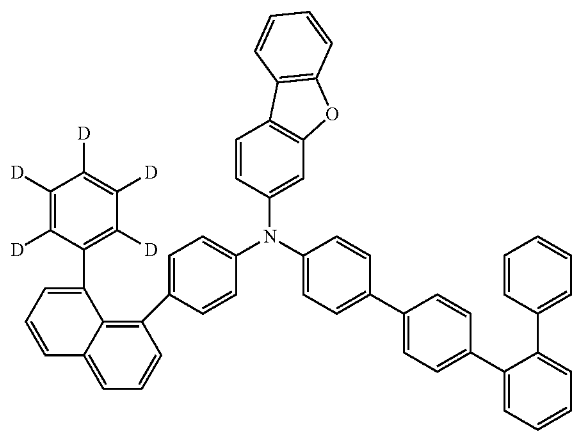

-continued
161
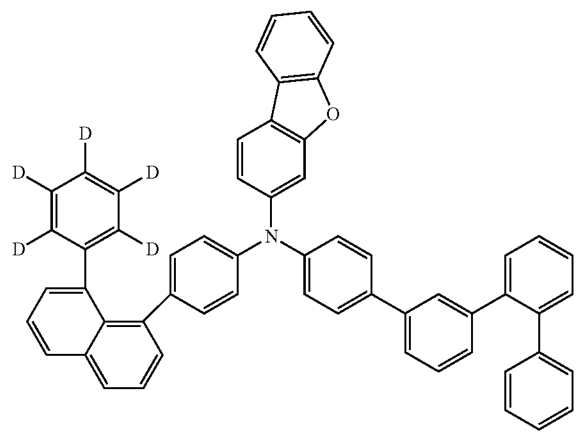
162
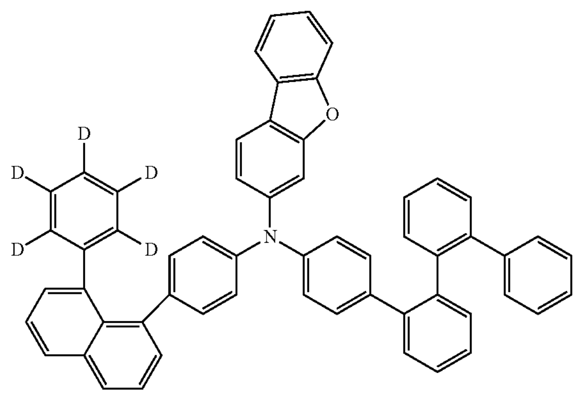
163
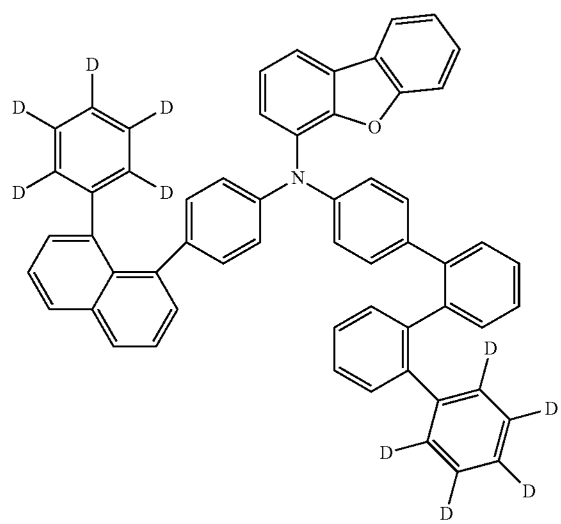
164
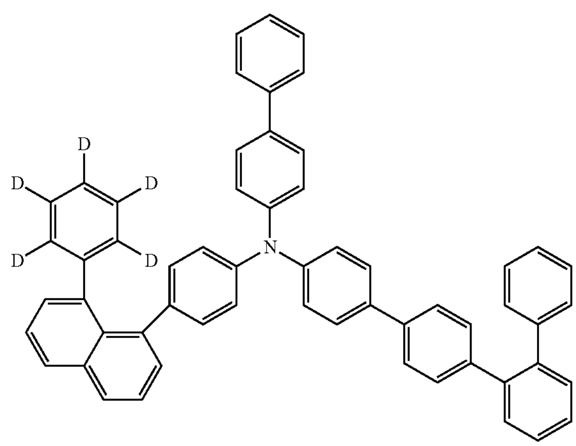
165
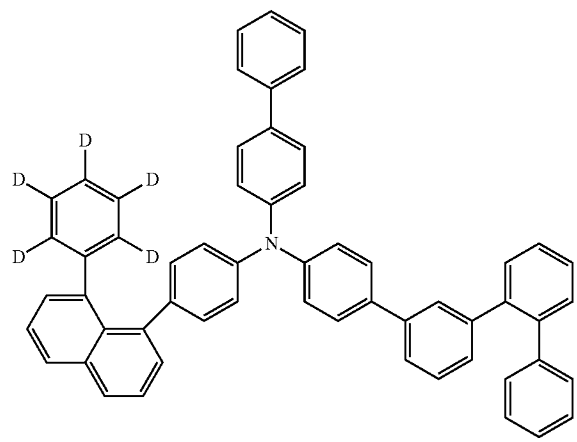
166
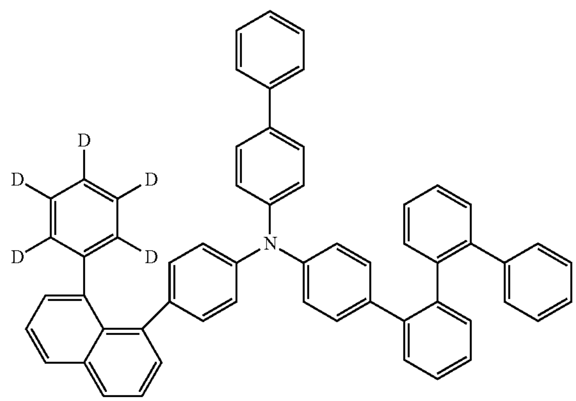

-continued
167
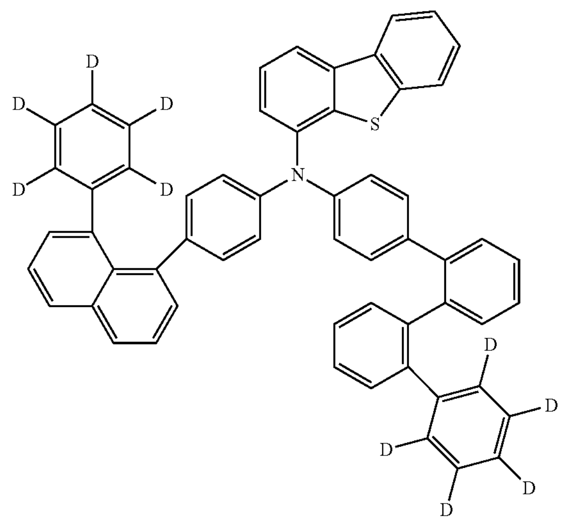
168
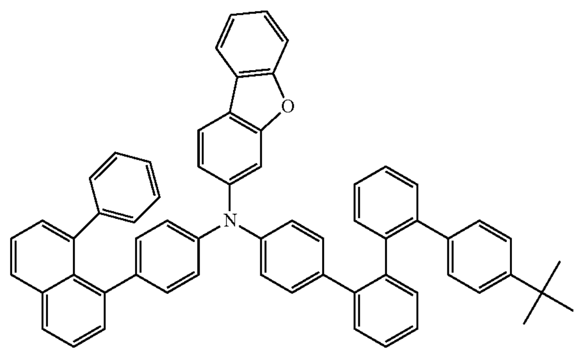
169
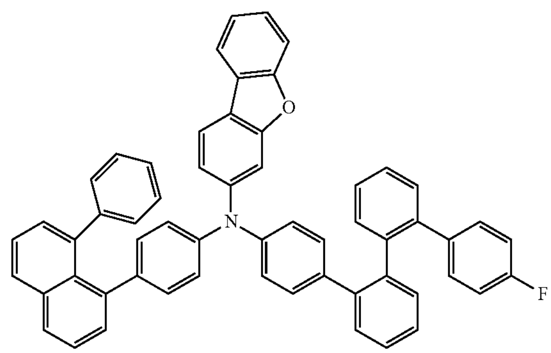
170
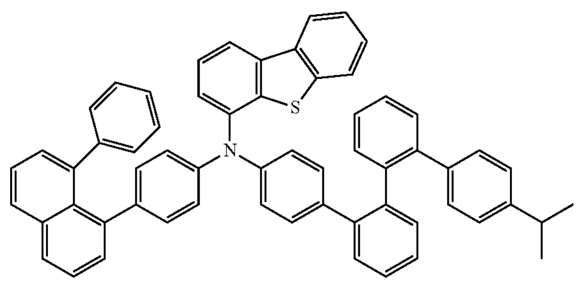
171
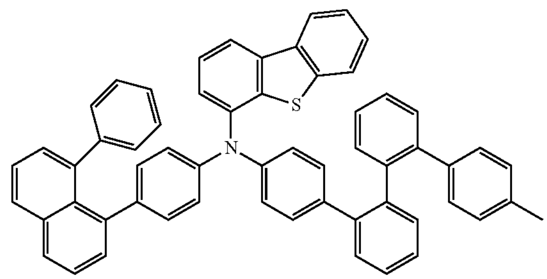
172
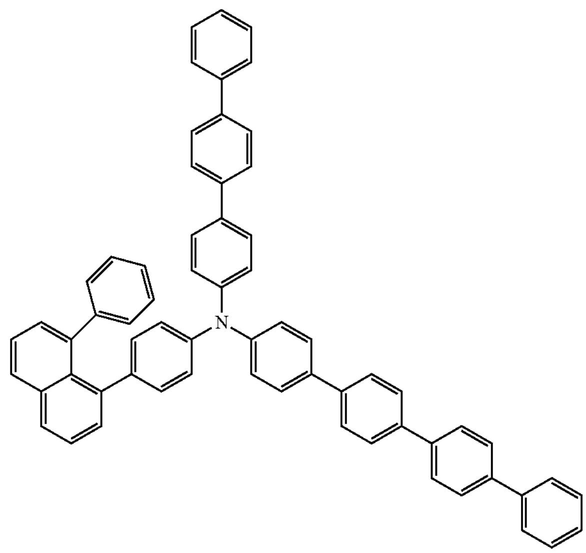

-continued
173
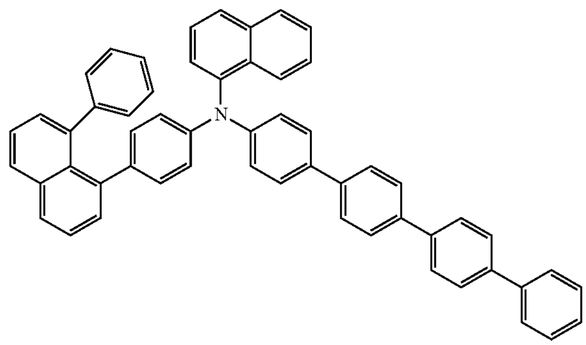
174
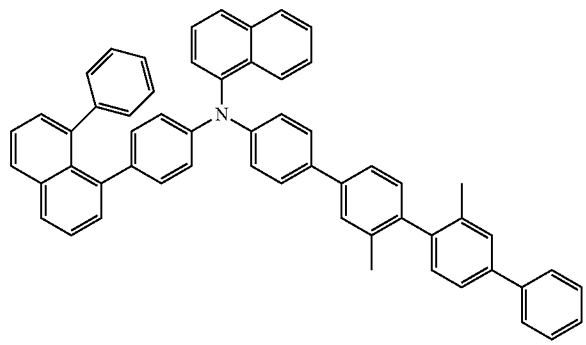
175
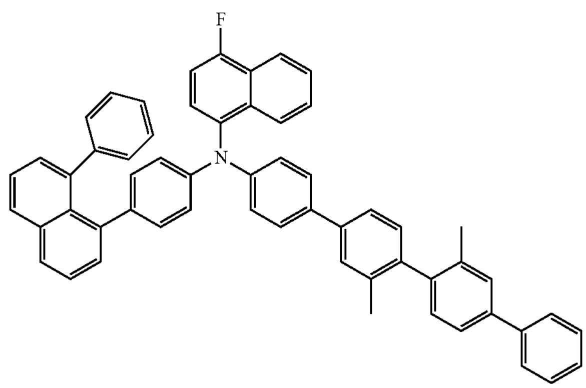
176
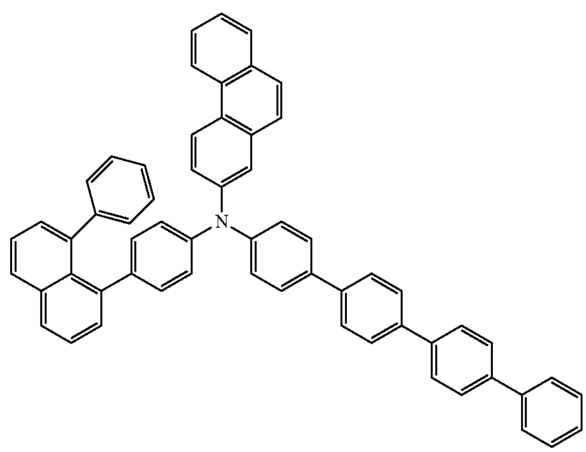
177
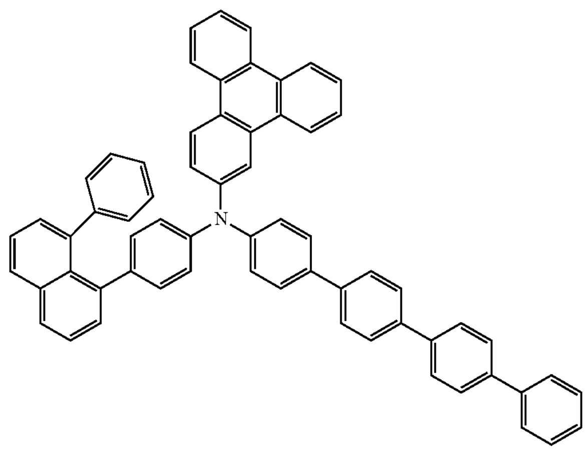
178
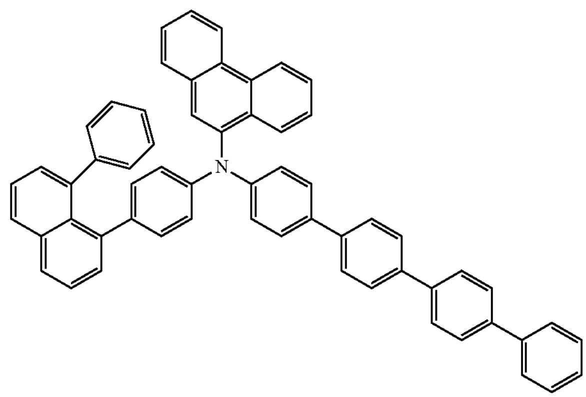

-continued
179
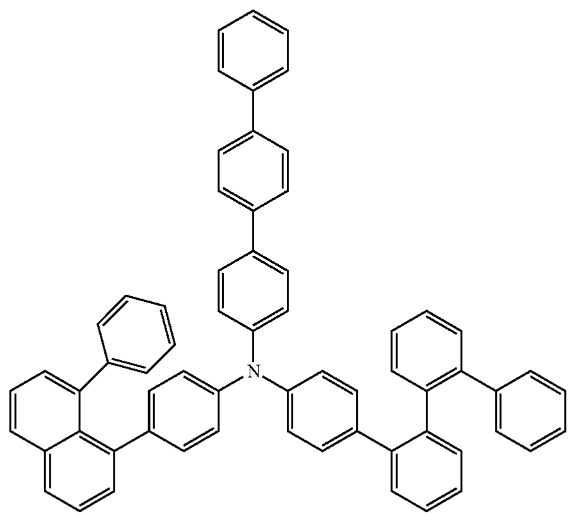
180
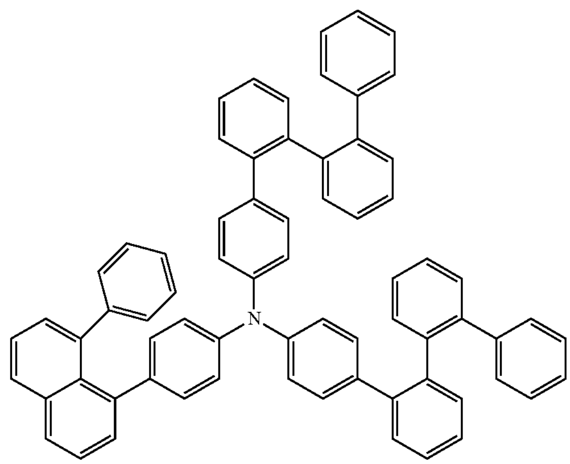
181
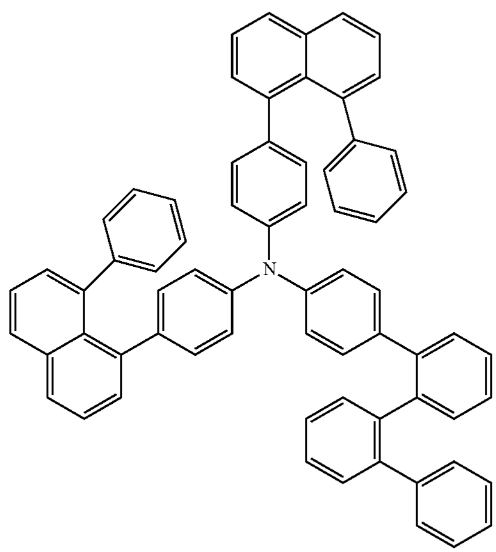
182
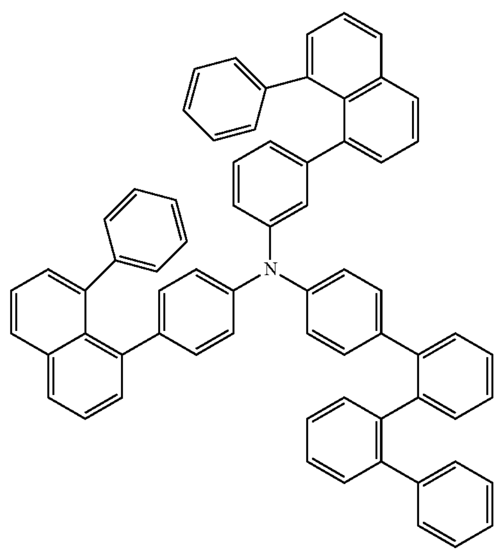
183
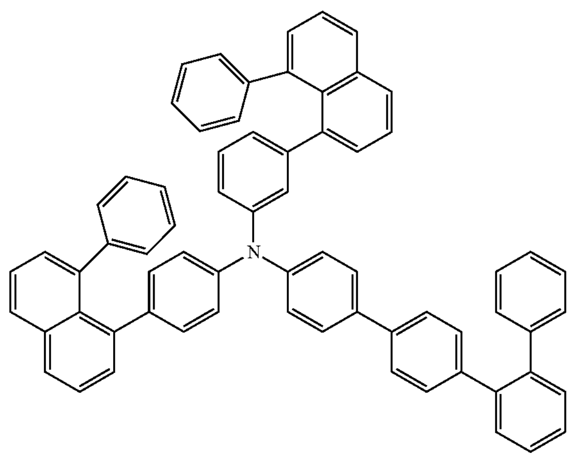
184
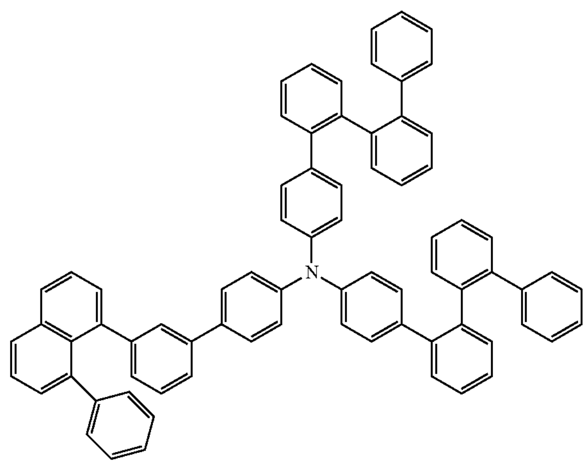

-continued
185
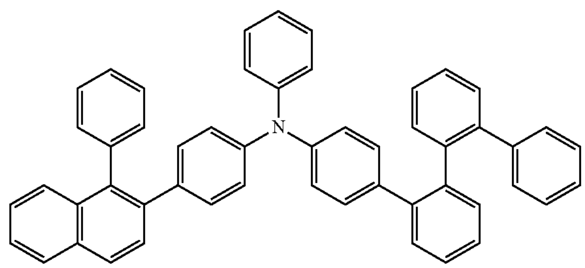
186
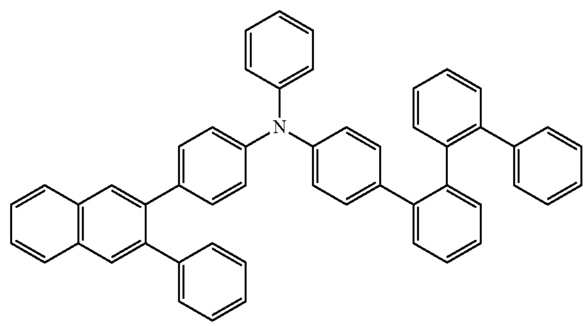
187
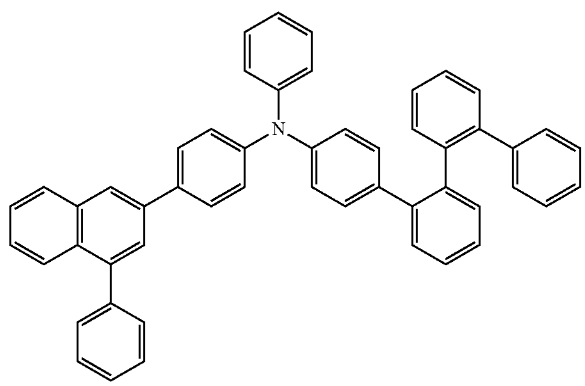
188
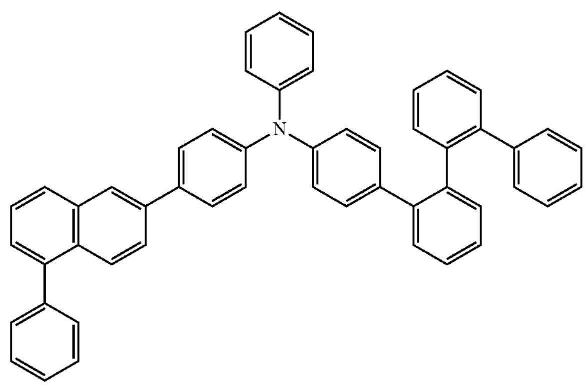
189
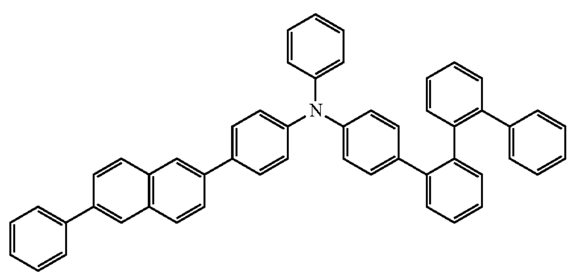
190
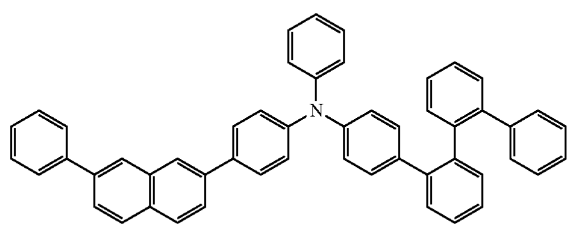
191
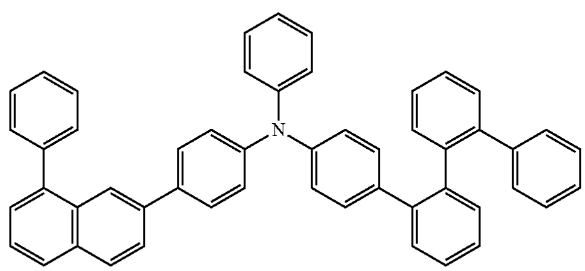
192
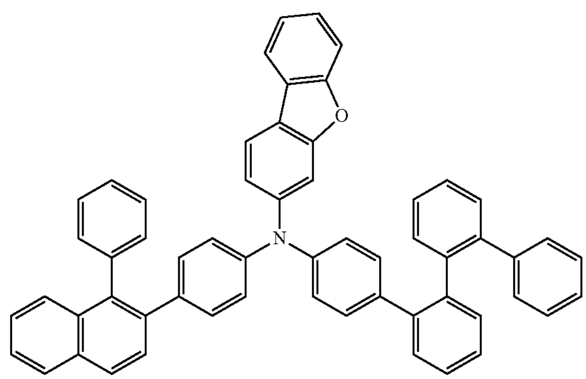

-continued
193
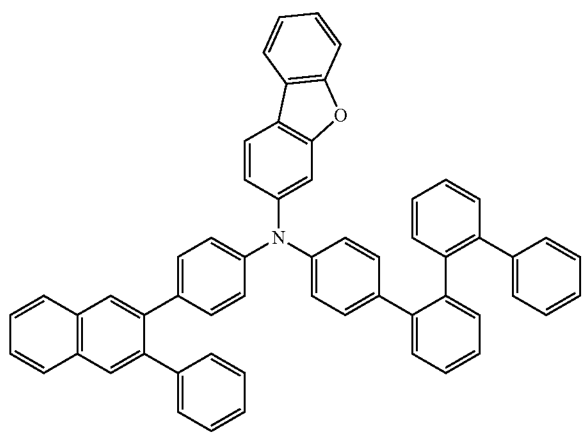
194
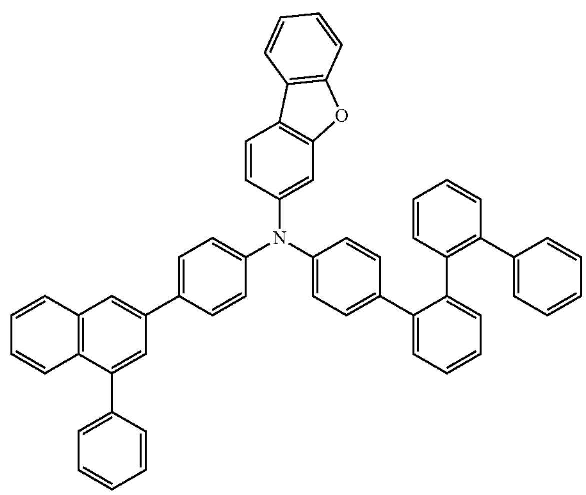
195
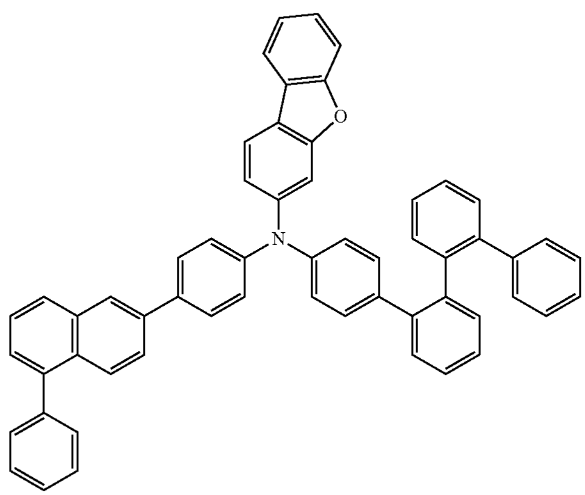
196
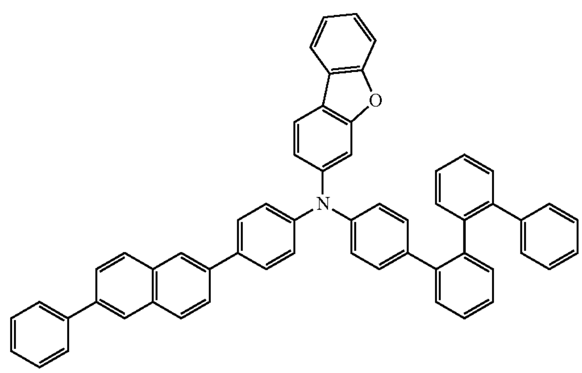
197
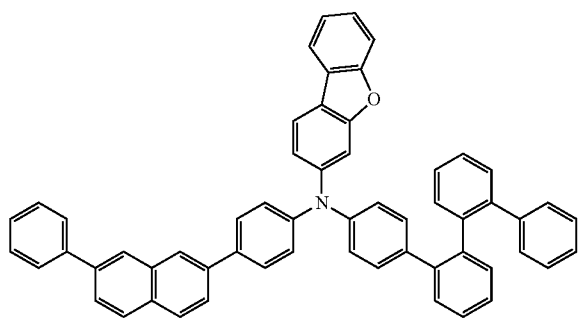
198
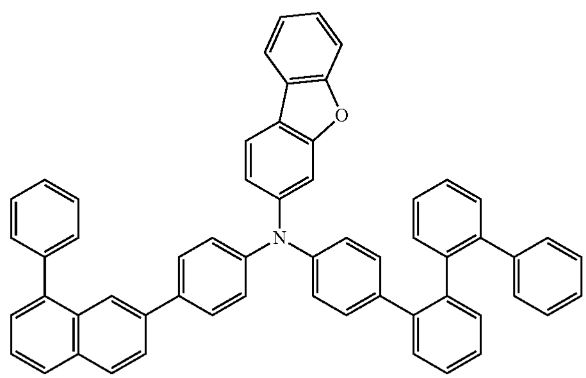

-continued
199
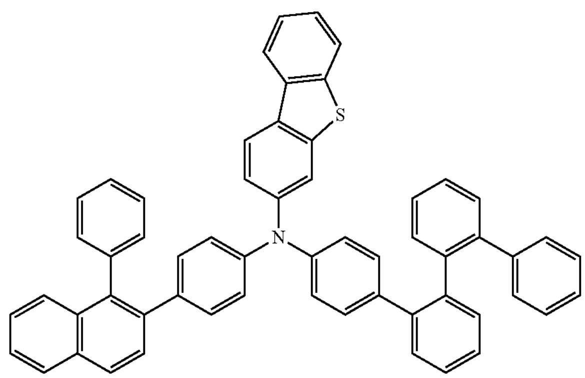
200
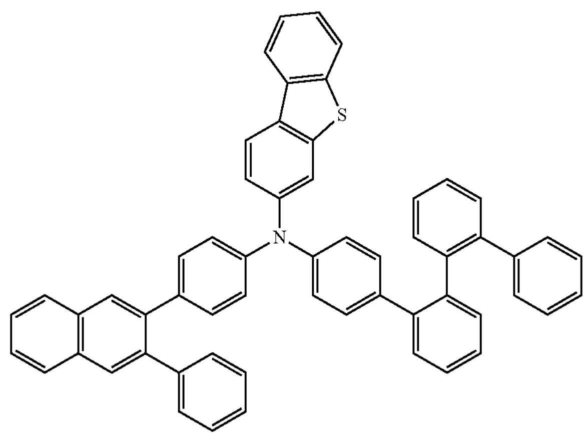
201
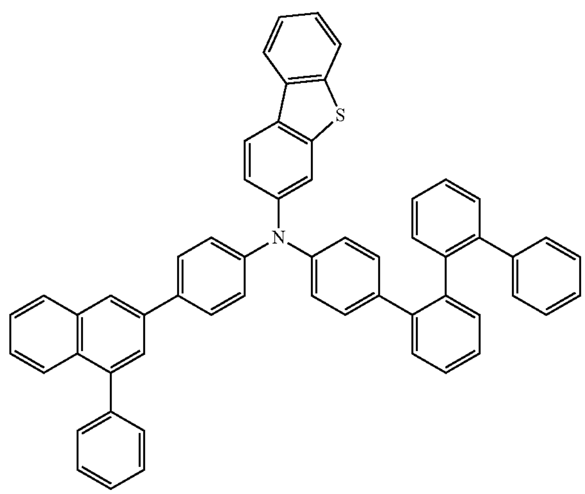
202
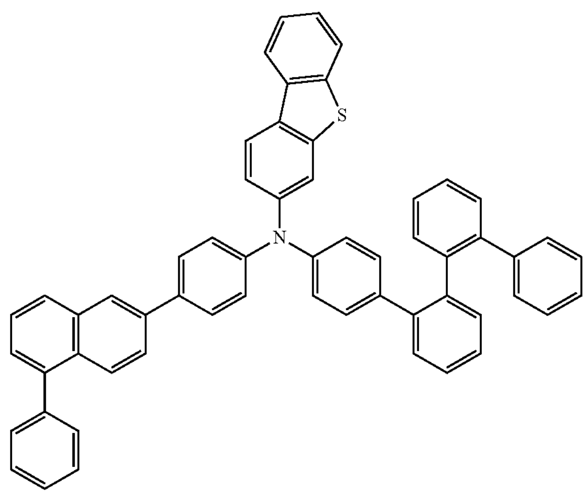
203
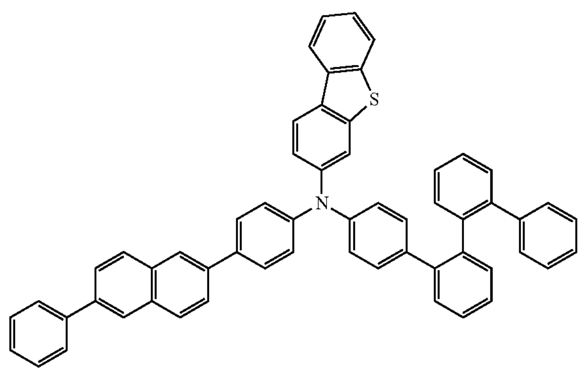
204
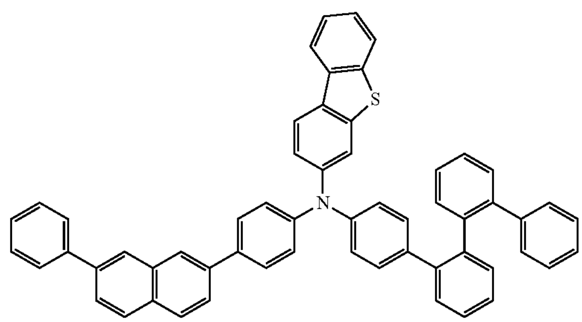

-continued
205
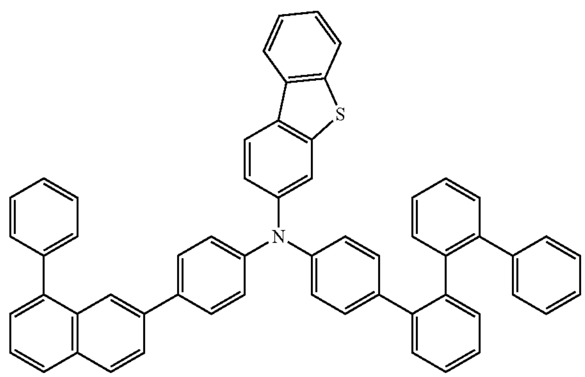
206
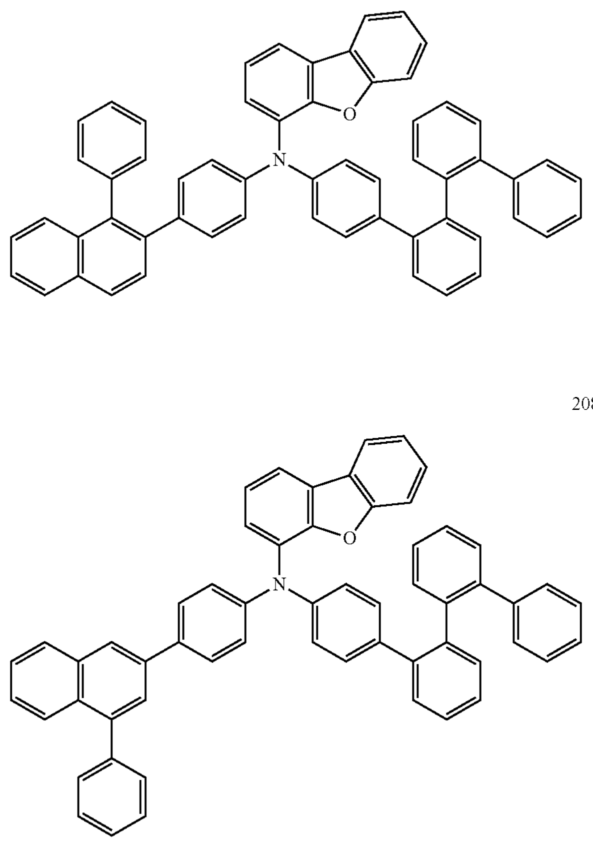
207
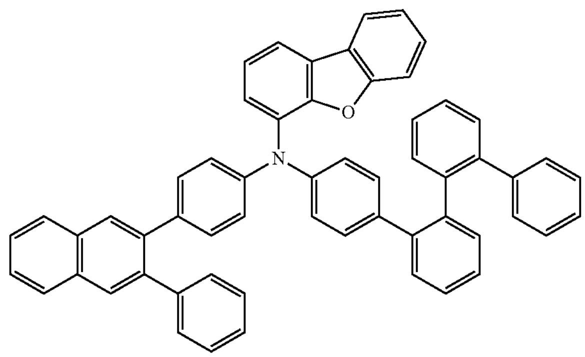
208
209
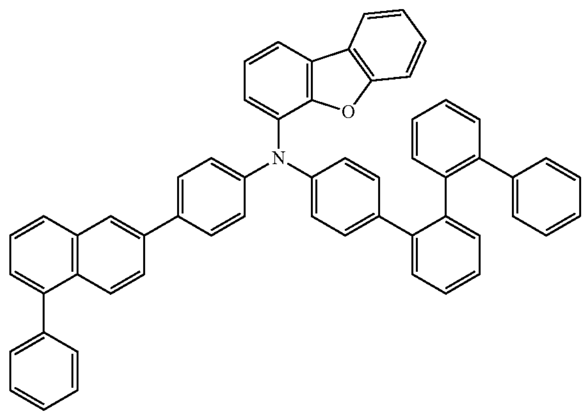
210
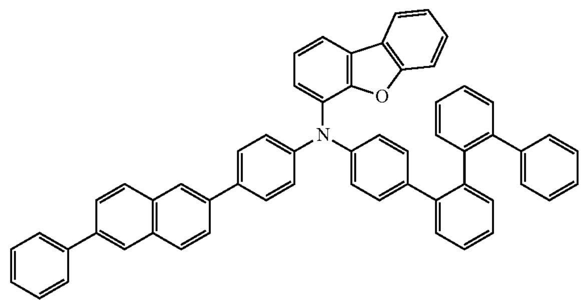
211
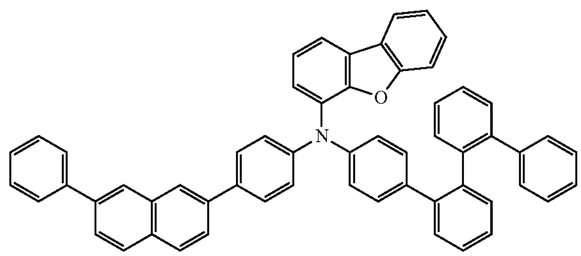
212
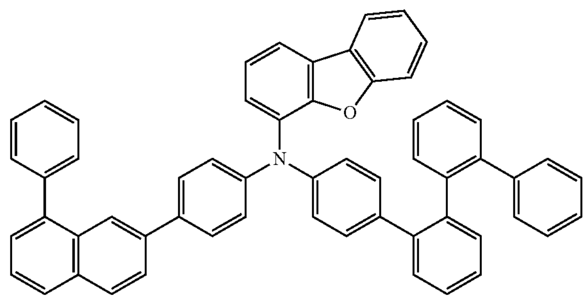

-continued
213
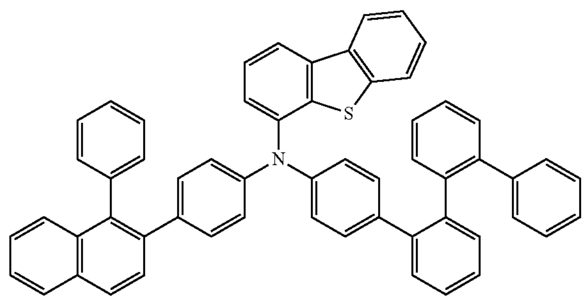
214
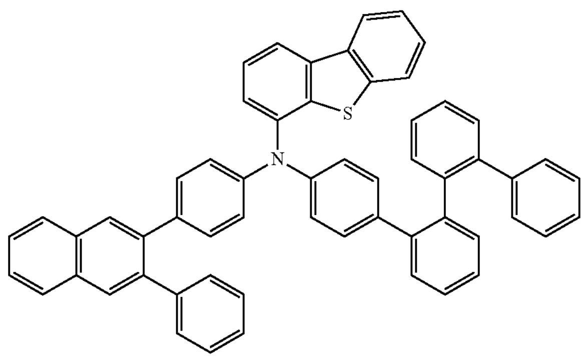
215
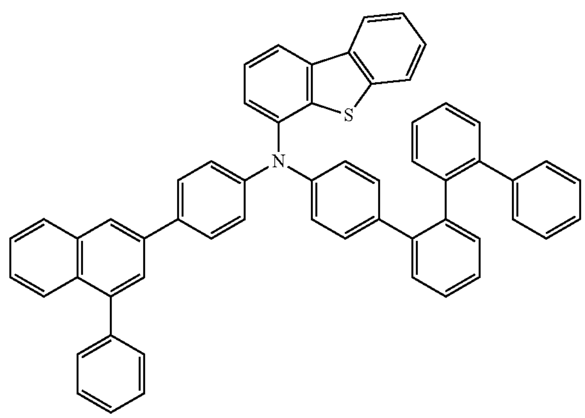
216
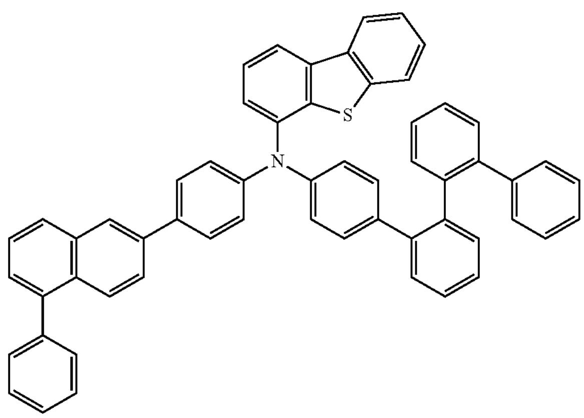
217
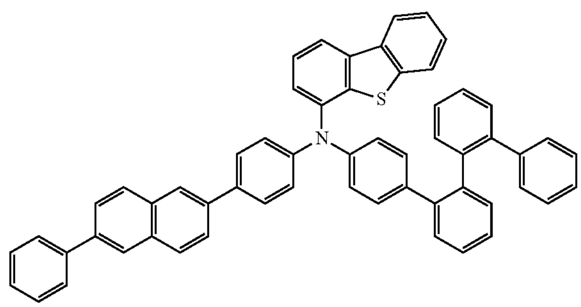
218
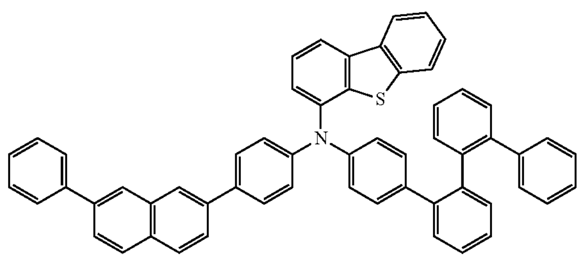
219
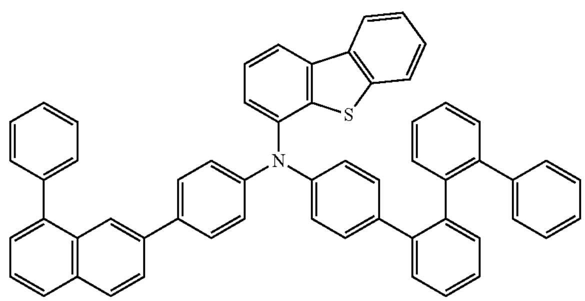
220
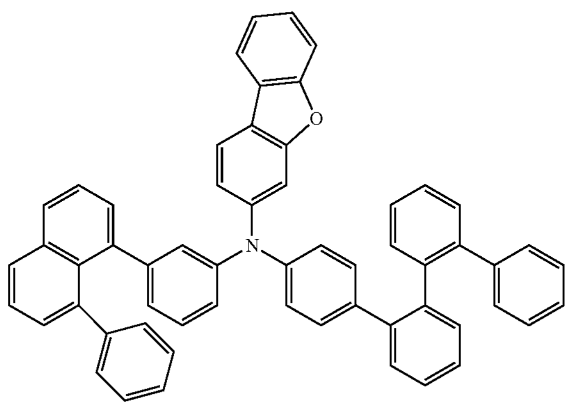

-continued
221
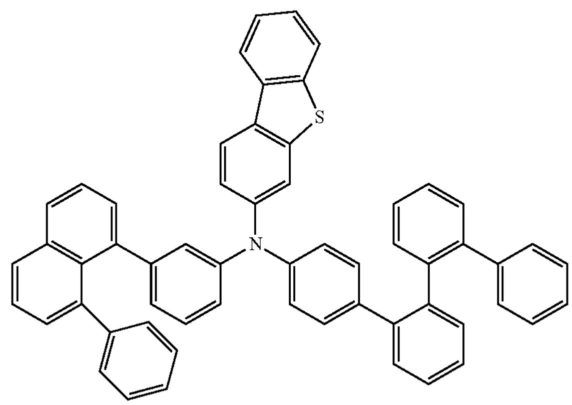
222
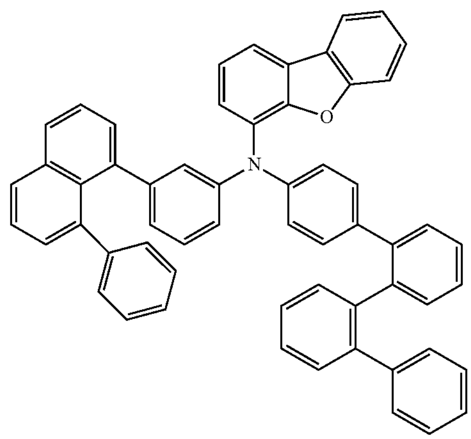
223
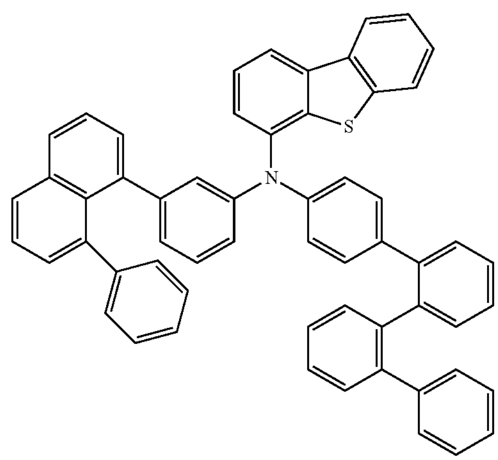
224
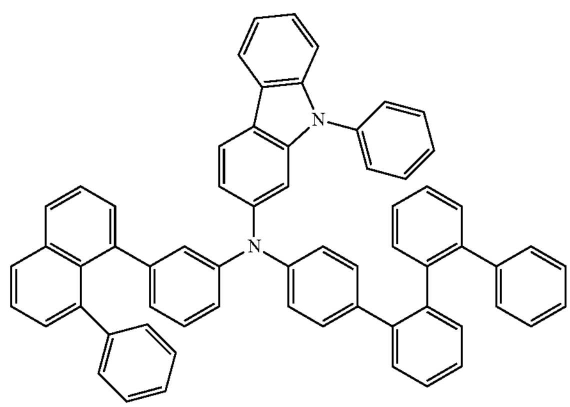
225
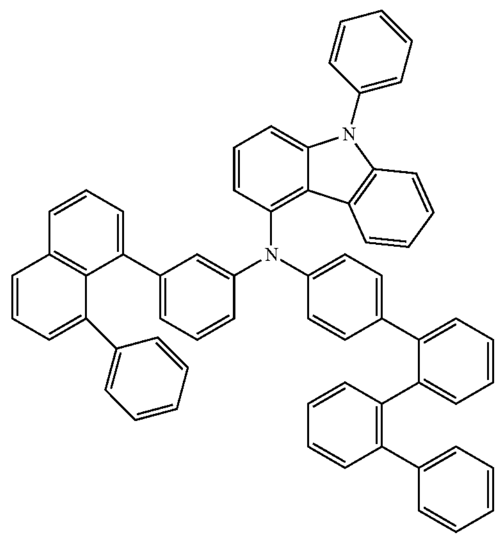
226
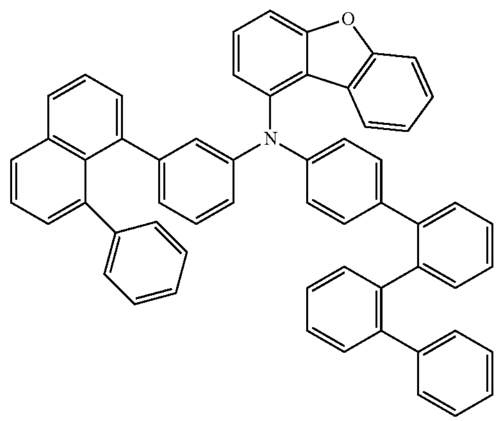

-continued

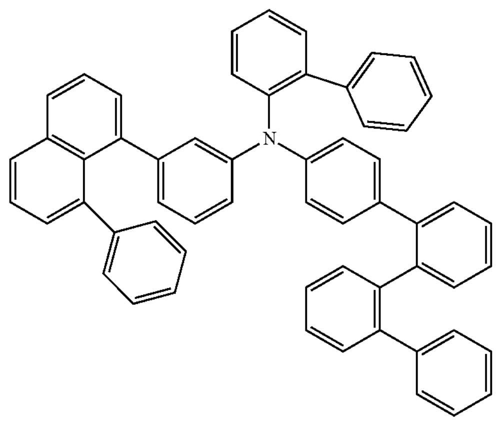

227

The amine compound of an embodiment includes a quaterphenyl group and a naphthyl group as a substituent. The quaterphenyl group may be a linear quaterphenyl group, and may have a structure in which four phenyl groups are linked to each other in a linear form, and a phenyl group at a terminus may be substituted at the nitrogen atom of the amine group. The naphthyl group may be bonded to the nitrogen atom of the amine group by interposing a linker therebetween, and the naphthyl group may include at least one substituent which expands a conjugated structure. Accordingly, for the amine compound of an embodiment, the conjugated structure of the whole compound may be expanded about the nitrogen atom to increase electron transport properties, thereby improving luminous efficiency of the light emitting device. Since the amine compound of an embodiment includes both the naphthyl group and the quaterphenyl group as substituents, the ability to appropriately control the electrons moved from the emission layer may be improved, thereby further improving a service life and efficiency of the light emitting device when the amine compound is applied to the light emitting device. In the specification, the term "substituent which expands a conjugated structure" as recited herein may mean a substituent having at least one π-bond which can be linked and conjugated to a compound having a π-conjugated structure.

Again, a light emitting device ED according to an embodiment will be described with reference to FIGS. 3 to 6.

As described above, the hole transport region HTR may include an amine compound according to an embodiment as described above. For example, the hole transport region HTR may include the amine compound represented by Formula 1.

When the hole transport region HTR has a structure having multiple layers, any one layer among the layers may include the amine compound represented by Formula 1. For example, the hole transport region HTR may include a hole injection layer HIL disposed on the first electrode EL1 and a hole transport layer HTL disposed on the hole injection layer HIL, wherein the hole transport layer HTL may include the amine compound represented by Formula 1. However, embodiments are not limited thereto, and in another embodiment, the hole injection layer HIL may include the amine compound represented by Formula 1.

The hole transport region HTR may include one or two or more of the amine compounds represented by Formula 1. For example, the hole transport region HTR may include at least one selected from Compound Group 1 as described above.

In addition to the amine compound represented by Formula 1 of an embodiment, the hole transport region HTR may further include a compound represented by Formula H-1:

[Formula H-1]

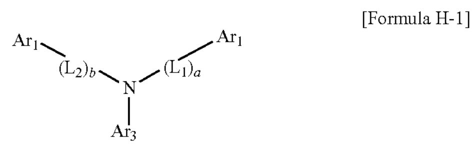

In Formula H-1, $L_1$ and $L_2$ may each independently be a direct linkage, a substituted or unsubstituted arylene group having 6 to 30 ring-forming carbon atoms, or a substituted or unsubstituted heteroarylene group having 2 to 30 ring-forming carbon atoms. In Formula H-1, a and b may each independently be an integer from 0 to 10. When a orb is 2 or greater, $L_1$ groups and $L_2$ groups may each independently be a substituted or unsubstituted arylene group having 6 to 30 ring-forming carbon atoms, or a substituted or unsubstituted heteroarylene group having 2 to 30 ring-forming carbon atoms.

In Formula H-1, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. In Formula H-1, $Ar_3$ may be a substituted or unsubstituted aryl group having 6 to 30 ring-forming carbon atoms.

The compound represented by Formula H-1 may be a monoamine compound. In another embodiment, the compound represented by Formula H-1 may be a diamine compound in which at least one of $Ar_1$ to $Ar_3$ may include the amine group as a substituent. For example, the compound represented by Formula H-1 may be a carbazole-based compound including a substituted or unsubstituted carbazole group in at least one of $Ar_1$ or $Ar_2$, or a fluorene-based compound including a substituted or unsubstituted fluorene group in at least one of $Ar_1$ or $Ar_2$.

The compound represented by Formula H-1 may be any one selected from Compound Group H. However, the compounds listed in Compound Group H are examples, and the compounds represented by Formula H-1 are not limited to Compound Group H:

[Compound Group H]
H-1-1
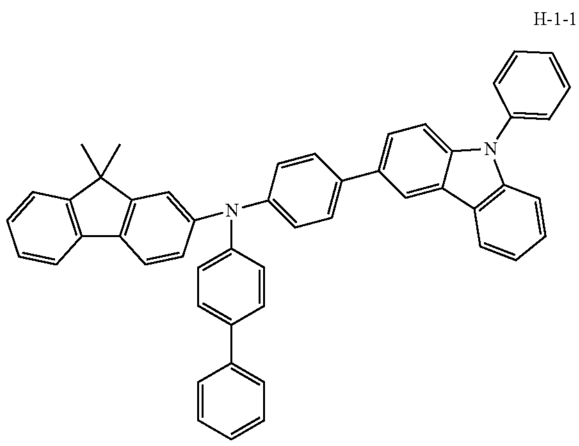
H-1-2
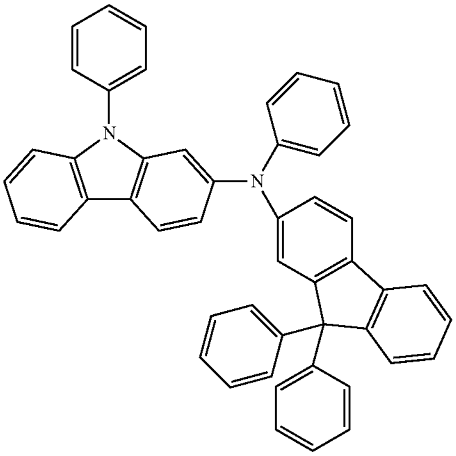
H-1-3
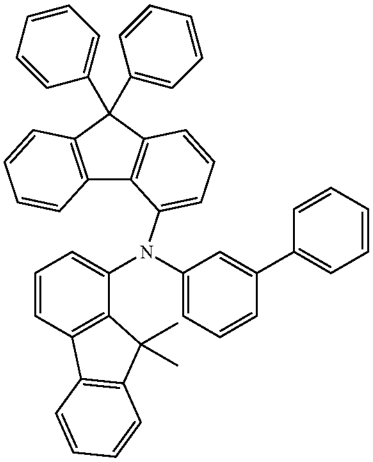
-continued
H-1-4
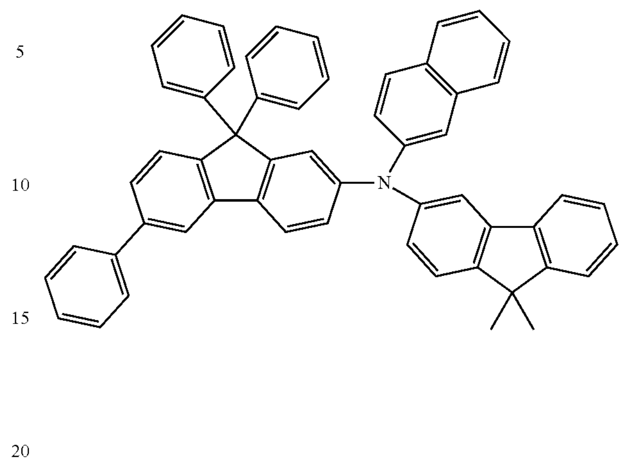
H-1-5
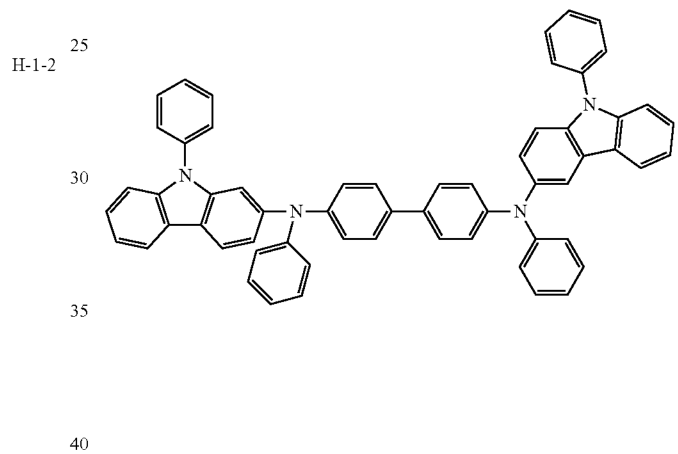
H-1-6
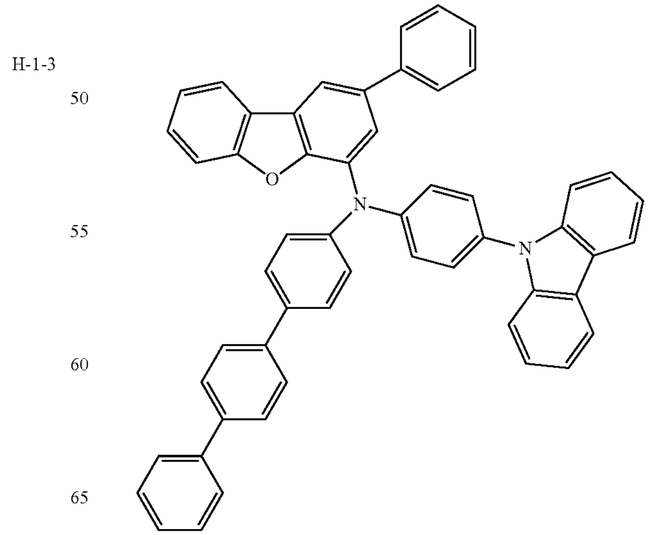

-continued
H-1-7
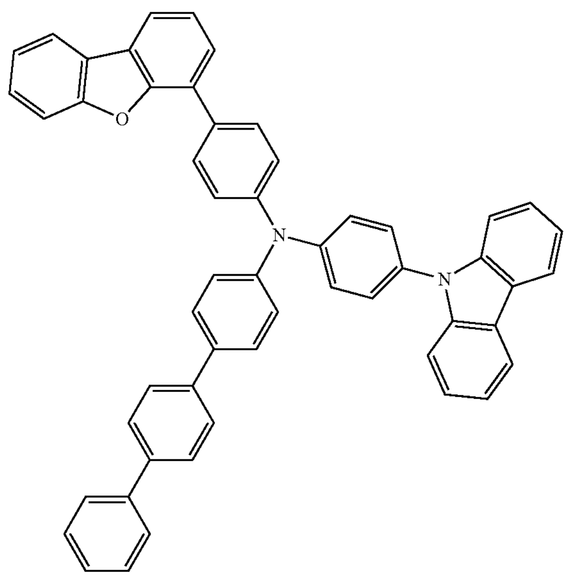
H-1-8
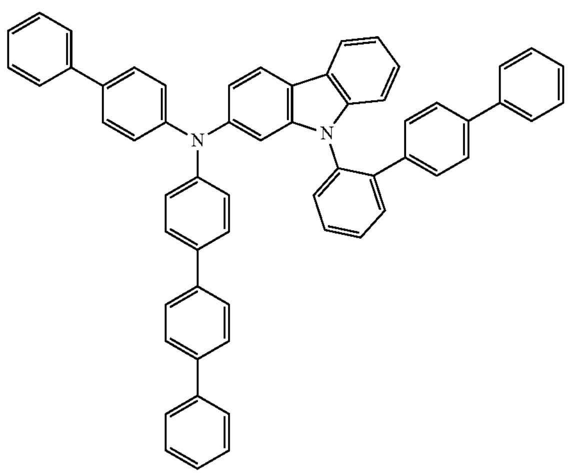
H-1-9
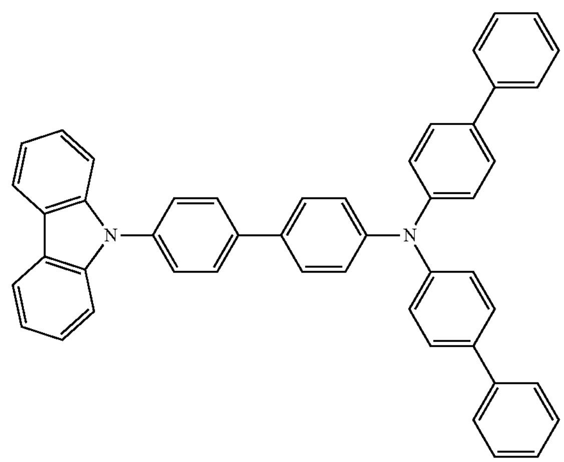
-continued
H-1-10
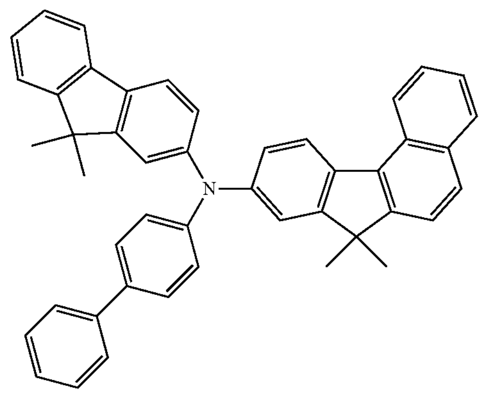
H-1-11
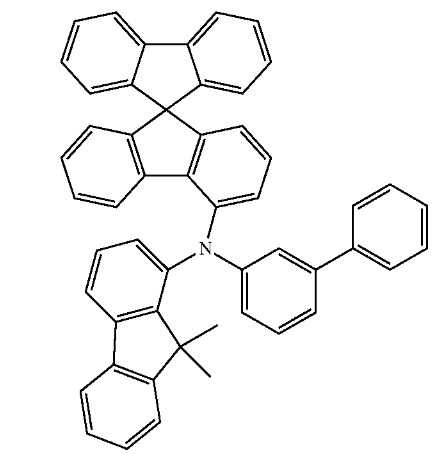
H-1-12
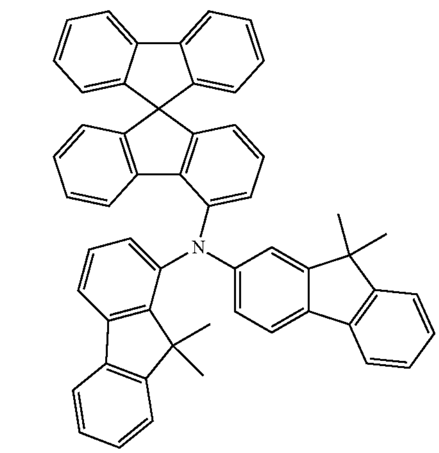
H-1-13
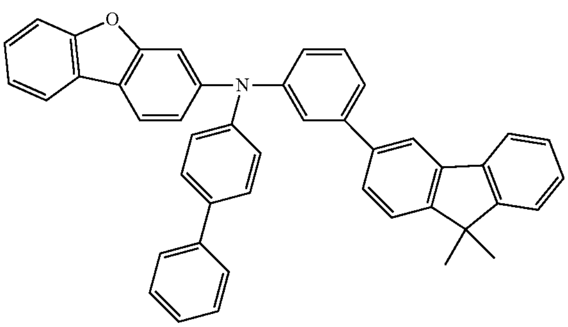

-continued

H-1-14

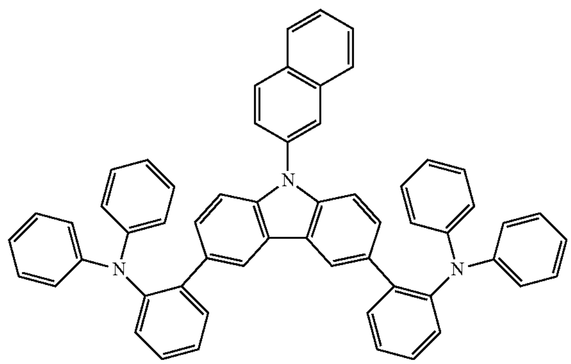

H-1-15

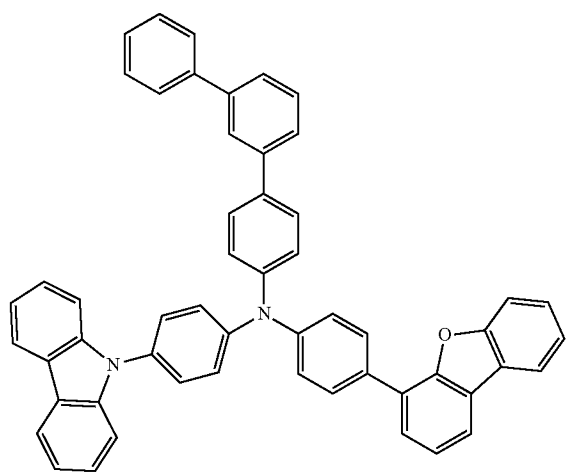

H-1-16

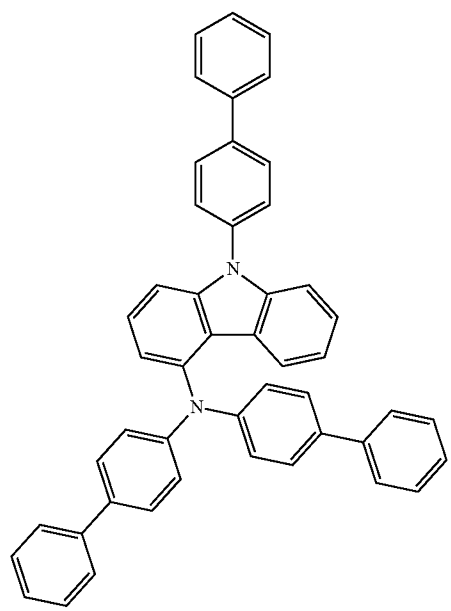

-continued

H-1-17

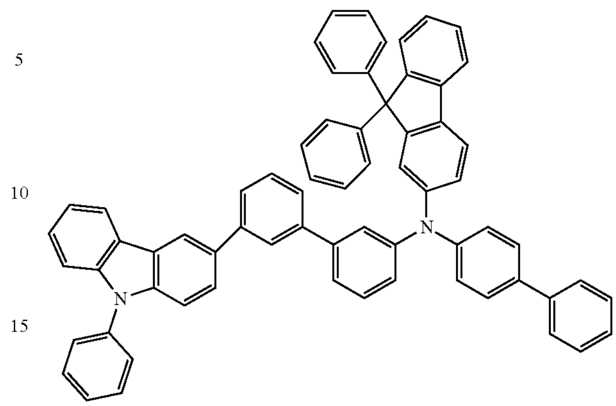

H-1-18

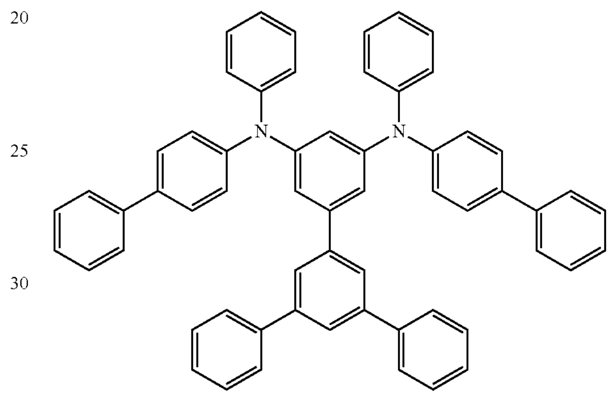

H-1-19

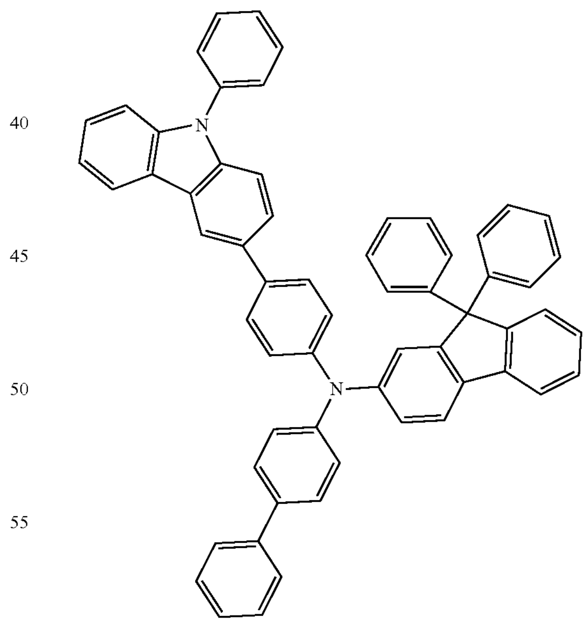

The hole transport region HTR may further include a phthalocyanine compound such as copper phthalocyanine; $N^1,N^{1'}$-([1,1'-biphenyl]-4,4'-diyl)bis(N-phenyl-$N^4,N^4$-di-m-tolylbenzene-1,4-diamine) (DNTPD), 4,4',4"-[tris(3-methylphenyl)phenylamino] triphenylamine (m-MTDATA), 4,4'4"-tris(N,N-diphenylamino)triphenylamine (TDATA), 4,4',4"-tris[N(2-naphthyl)-N-phenylamino]-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], dipyrazino[2,3-f: 2',3'-h]quinoxaline-2,3,6,7,10,11-hexacarbonitrile (HATCN), etc.

The hole transport region HTR may further include a carbazole-based derivative such as N-phenyl carbazole and polyvinyl carbazole, a fluorene-based derivative, N,N'-bis(3-methylphenyl)-N,N'-diphenyl-[1,1-biphenyl]-4,4'-diamine (TPD), a triphenylamine-based derivative such as 4,4',4"-tris(N-carbazolyl)triphenylamine (TCTA), N,N'-di(naphthalene-1-yl)-N,N'-diphenyl-benzidine (NPB), 4,4'-cyclohexylidene bis[N,N-bis(4-methylphenyl]benzenamine] (TAPC), 4,4'-bis[N,N'-(3-tolyl)amino]-3,3'-dimethylbiphenyl (HMTPD), 1,3-bis(N-carbazolyl)benzene (mCP), etc.

The hole transport region HTR may further include 9-(4-tert-butylphenyl)-3,6-bis(triphenylsilyl)-9H-carbazole (CzSi), 9-phenyl-9H-3,9'-bicarbazole (CCP), 1,3-bis(1,8-dimethyl-9H-carbazol-9-yl)benzene (mDCP), etc.

The hole transport region HTR may include the above-described compounds of the hole transport region in at least one of a hole injection layer HIL, a hole transport layer HTL, or an electron blocking layer EBL.

A thickness of the hole transport region HTR may be in a range of about 100 Å to about 10,000 Å. For example, the thickness of the hole transport region HTR may be in a range of about 100 Å to about 5,000 Å. When the hole transport region HTR includes a hole injection layer HIL, the hole injection layer HIL may have, for example, a thickness in a range of about 30 Å to about 1,000 Å. When the hole transport region HTR includes a hole transport layer HTL, the hole transport layer HTL may have a thickness in a range of about 30 Å to about 1,000 Å. When the hole transport region HTR includes an electron blocking layer EBL, the electron blocking layer EBL may have a thickness in a range of about 10 Å to about 1,000 Å. If the thicknesses of the hole transport region HTR, the hole injection layer HIL, the hole transport layer HTL and the electron blocking layer EBL satisfy the above-described ranges, satisfactory hole transport properties may be achieved without a substantial increase in driving voltage.

The hole transport region HTR may further include a charge generating material to increase conductivity. The charge generating material may be dispersed uniformly or non-uniformly in the hole transport region HTR. The charge generating material may be, for example, a p-dopant. The p-dopant may include at least one of a halogenated metal compound, a quinone derivative, a metal oxide, or a cyano group-containing compound, but embodiments are not limited thereto. For example, the p-dopant may include a metal halide compound such as CuI and RbI, a quinone derivative such as tetracyanoquinodimethane (TCNQ) and 2,3,5,6-tetrafluoro-7,7'8,8-tetracyanoquinodimethane (F4-TCNQ), a metal oxide such as tungsten oxide and molybdenum oxide, a cyano group-containing compound such as dipyrazino[2,3-f: 2',3'-h] quinoxaline-2,3,6,7,10,11-hexacarbonitrile (HATCN), 4-[[2,3-bis[cyano-(4-cyano-2,3,5,6-tetrafluorophenyl)methylidene]cyclopropylidene]-cyanom ethyl]-2,3,5,6-tetrafluorobenzonitrile (NDP9), etc., but embodiments are not limited thereto.

As described above, the hole transport region HTR may further include at least one of a buffer layer (not shown) or an electron blocking layer EBL in addition to the hole injection layer HIL and the hole transport layer HTL. The buffer layer (not shown) may compensate for a resonance distance according to a wavelength of light emitted from the emission layer EML and may thus increase light emission efficiency. A material that may be included in the hole transport region HTR may be used as a material in the buffer layer (not shown). The electron blocking layer EBL may prevent electron injection from the electron transport region ETR to the hole transport region HTR.

The emission layer EML is provided on the hole transport region HTR. The emission layer EML may have a thickness, for example, in a range of about 100 Å to about 1,000 Å. For example, the emission layer EML may have a thickness in a range of about 100 Å to about 300 Å. The emission layer EML may be a layer formed of a single material, a layer formed of different materials, or a multilayer structure having layers formed of different materials.

In the light emitting device ED of an embodiment, the emission layer EML may include an anthracene derivative, a pyrene derivative, a fluoranthene derivative, a chrysene derivative, a dihydrobenzanthracene derivative, or a triphenylene derivative. For example, the emission layer EML may include an anthracene derivative or a pyrene derivative.

In each light emitting device ED of embodiments illustrated in FIGS. 3 to 6, the emission layer EML may include a host and a dopant, and the emission layer EML may include a compound represented by Formula E-1. The compound represented by Formula E-1 may be used as a fluorescence host material.

[Formula E-1]

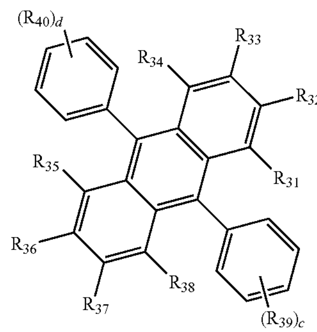

In Formula E-1, $R_{31}$ to $R_{40}$ may each independently be a hydrogen atom, a deuterium atom, a halogen atom, a substituted or unsubstituted silyl group, a substituted or unsubstituted thio group, a substituted or unsubstituted oxy group, a substituted or unsubstituted alkyl group having 1 to 10 carbon atoms, a substituted or unsubstituted alkenyl group having 1 to 10 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula E-1, $R_{31}$ to $R_{40}$ may be bonded to an adjacent group to form a saturated hydrocarbon ring or an unsaturated hydrocarbon ring, a saturated heterocycle, or an unsaturated heterocycle.

In Formula E-1, c and d may each independently be an integer from 0 to 5.

The compound represented by Formula E-1 may be any one selected from Compound E1 to Compound E19:

-continued
E1
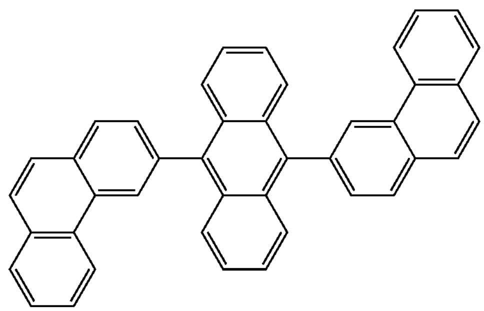
E2
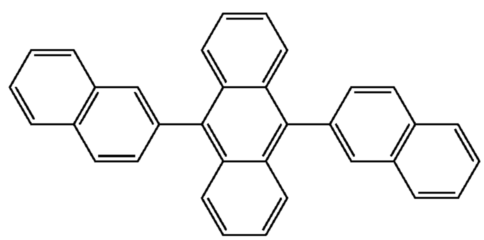
E3
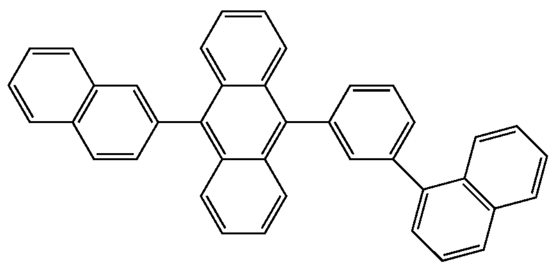
E4
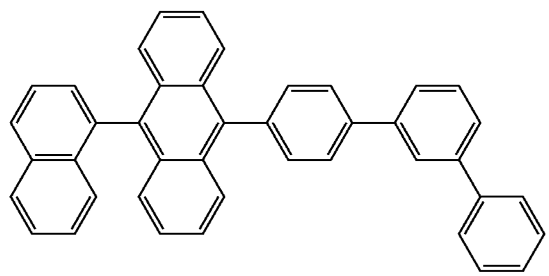
E5
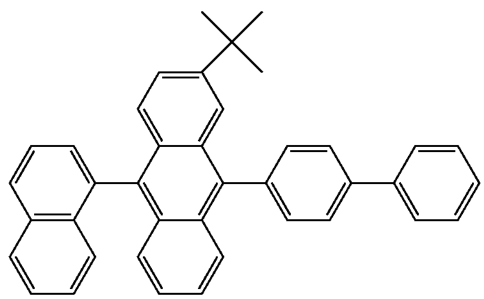
E6
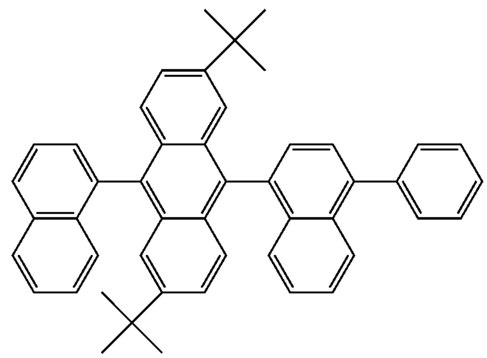
E7
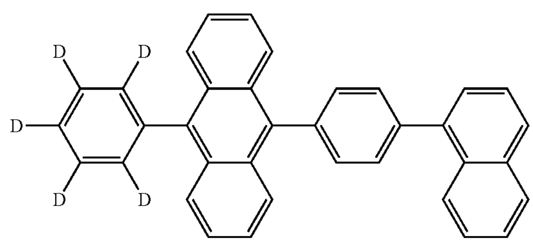
E8
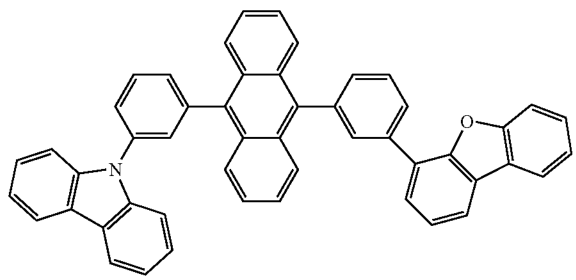
E9
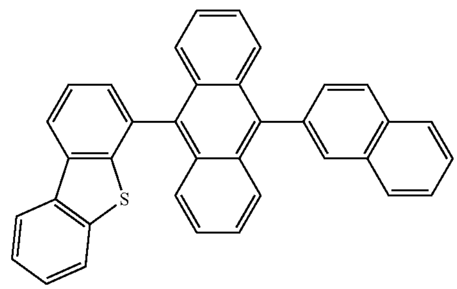
E10
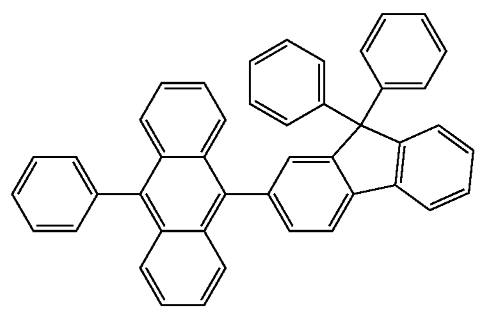

-continued
E11
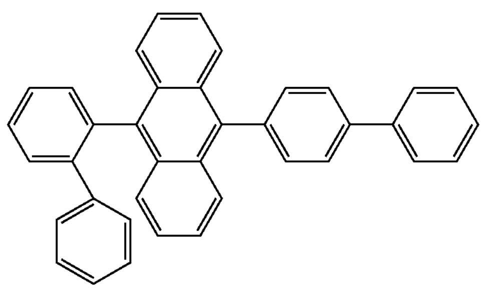
E12
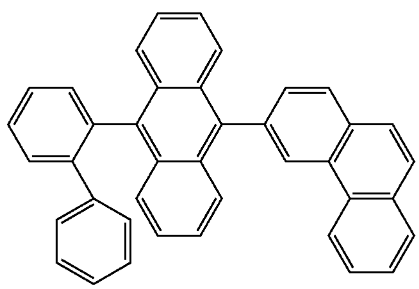
E13
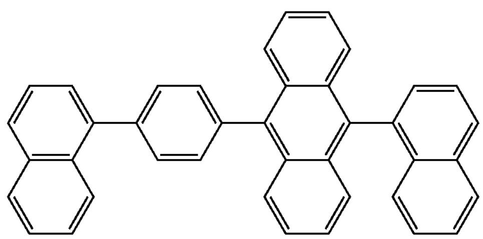
E14
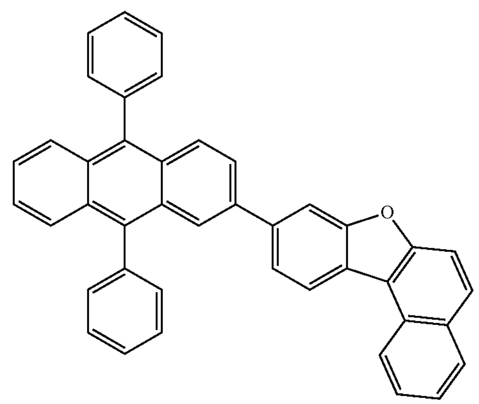
-continued
E15
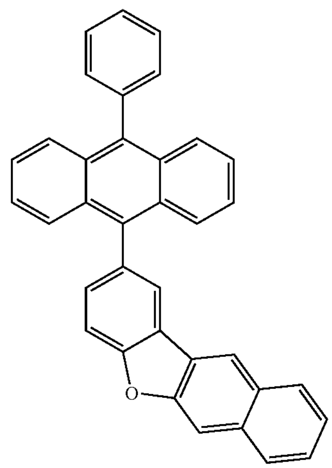
E16
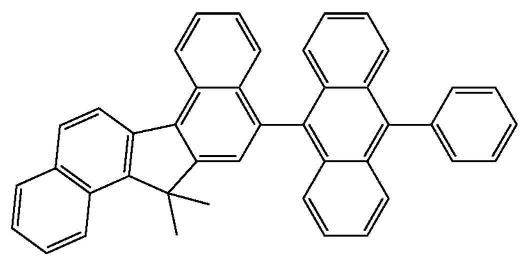
E17
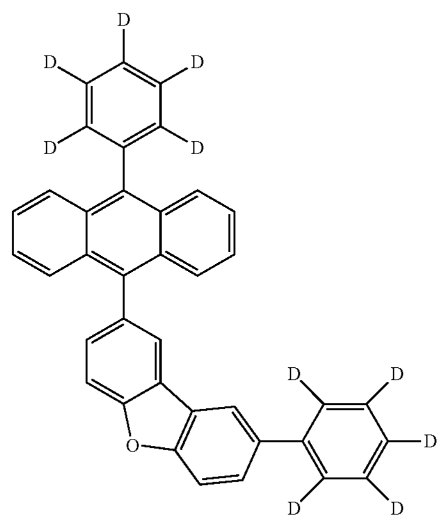

-continued

E18

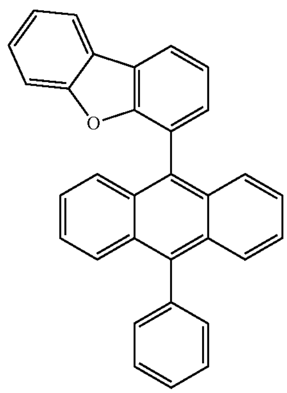

E19

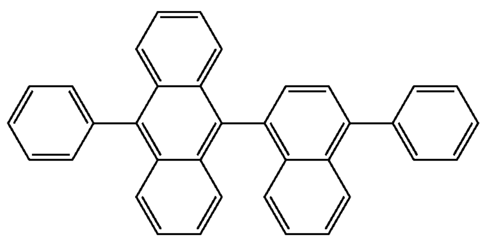

In an embodiment, the emission layer EML may include a compound represented by Formula E-2a or Formula E-2b. The compound represented by Formula E-2a or Formula E-2b may be used as a phosphorescence host material.

[Formula E-2a]

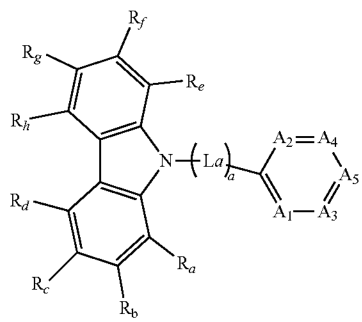

In Formula E-2a, a may be an integer from 0 to 10, and $L_a$ may be a direct linkage, a substituted or unsubstituted arylene group having 6 to 30 ring-forming carbon atoms, or a substituted or unsubstituted heteroarylene group having 2 to 30 ring-forming carbon atoms. When a is 2 or more, $L_a$ groups may each independently be a substituted or unsubstituted arylene group having 6 to 30 ring-forming carbon atoms, or a substituted or unsubstituted heteroarylene group having 2 to 30 ring-forming carbon atoms.

In Formula E-2a, $A_1$ to $A_5$ may each independently be N or $C(R_i)$. $R_a$ to $R_i$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. $R_a$ to $R_i$ may be bonded to an adjacent group to form a hydrocarbon ring or a heterocycle containing N, O, S, etc. as a ring-forming atom.

In Formula E-2a, two or three of $A_1$ to $A_5$ may be N, and the remainder of $A_1$ to $A_5$ may each be $C(R_i)$.

[Formula E-2b]

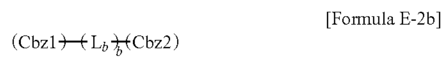

In Formula E-2b, Cbz1 and Cbz2 may each independently be an unsubstituted carbazole group, or a carbazole group substituted with an aryl group having 6 to 30 ring-forming carbon atoms. $L_b$ may be a direct linkage, a substituted or unsubstituted arylene group having 6 to 30 ring-forming carbon atoms, or a substituted or unsubstituted heteroarylene group having 2 to 30 ring-forming carbon atoms. In Formula E-2b, b may be an integer from 0 to 10, and when b is 2 or more, $L_b$ groups may each independently be a substituted or unsubstituted arylene group having 6 to 30 ring-forming carbon atoms, or a substituted or unsubstituted heteroarylene group having 2 to 30 ring-forming carbon atoms.

The compound represented by Formula E-2a or Formula E-2b may be any one selected from Compound Group E-2. However, the compounds listed in Compound Group E-2 are examples, and the compound represented by Formula E-2a or Formula E-2b is not limited to those listed in Compound Group E-2.

[Compound Group E-2]

E-2-1

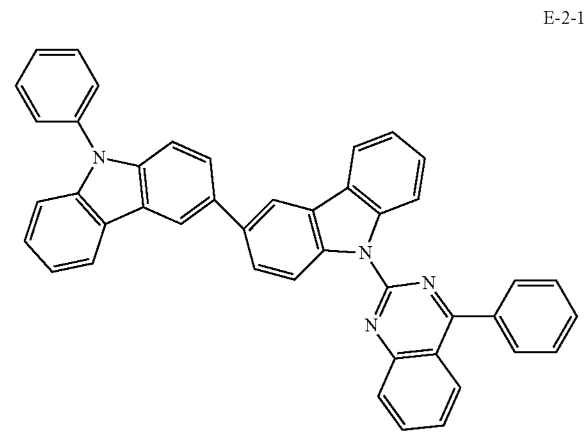

-continued
E-2-2
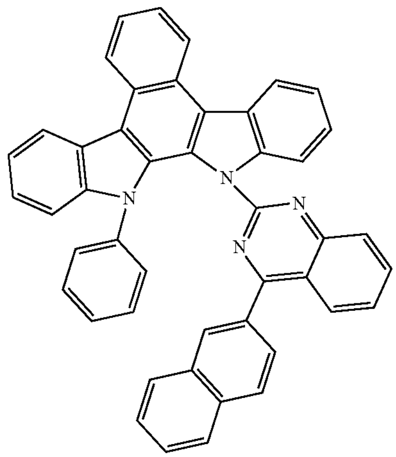
E-2-3
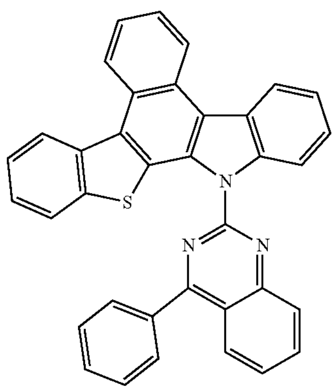
E-2-4
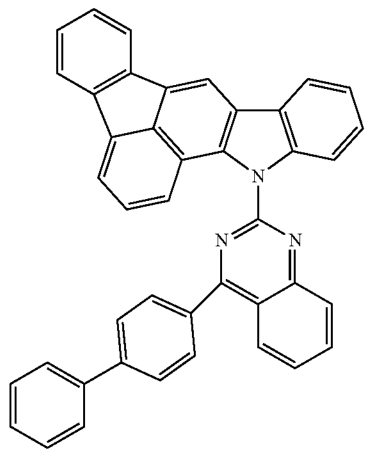
-continued
E-2-5
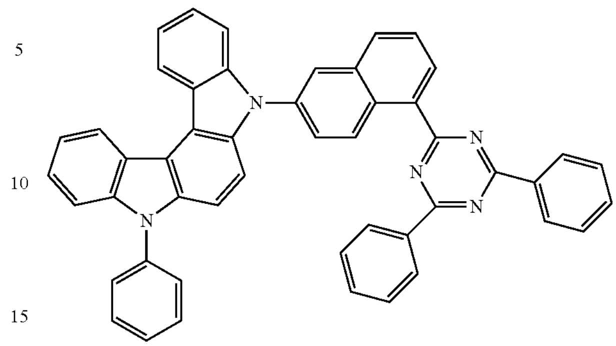
E-2-6
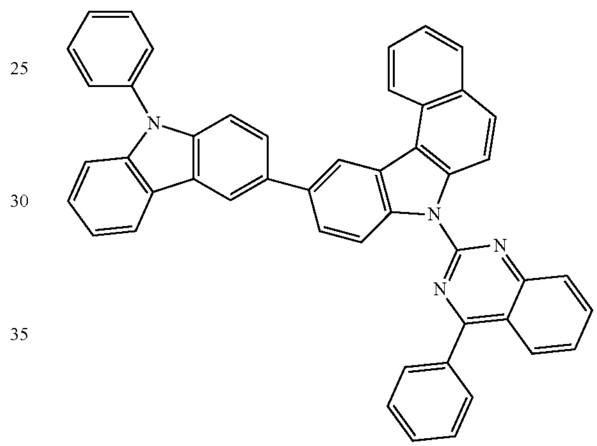
E-2-7
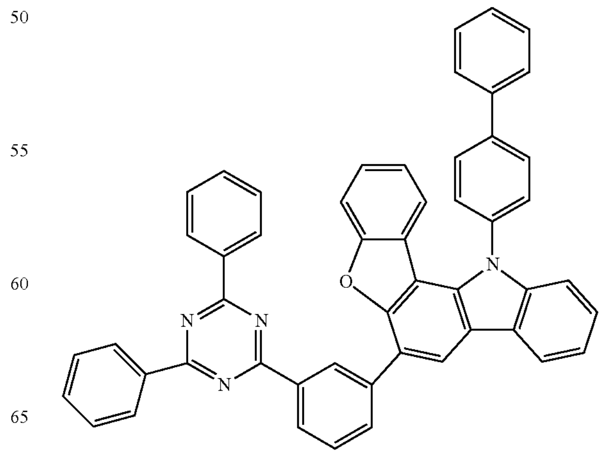

-continued
E-2-8
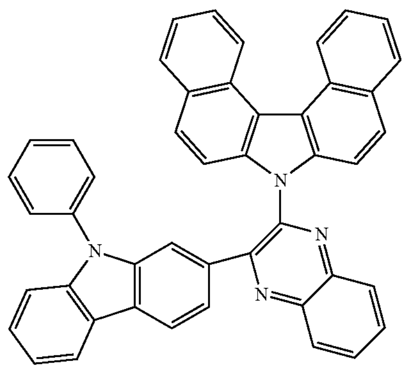
E-2-9
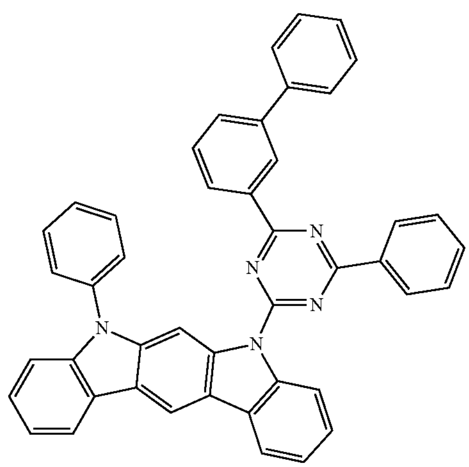
E-2-10
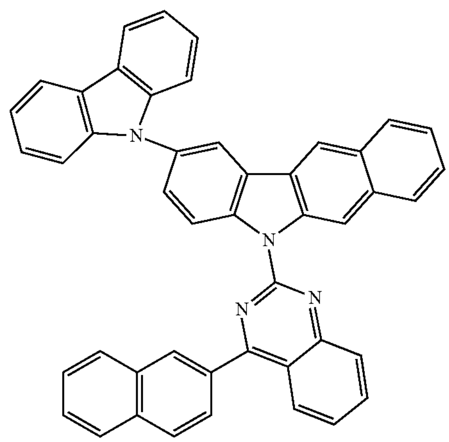
-continued
E-2-11
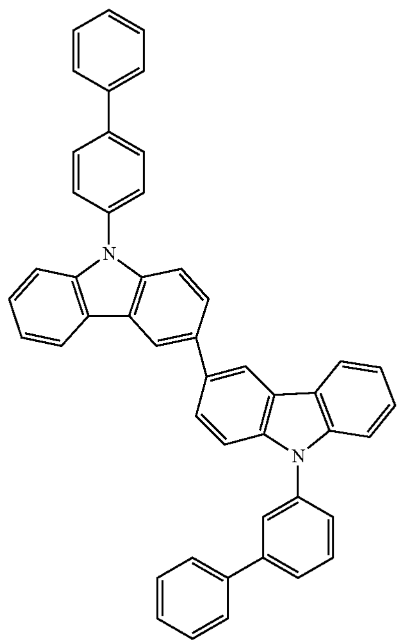
E-2-12
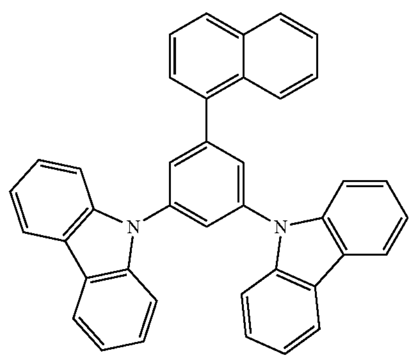
E-2-13
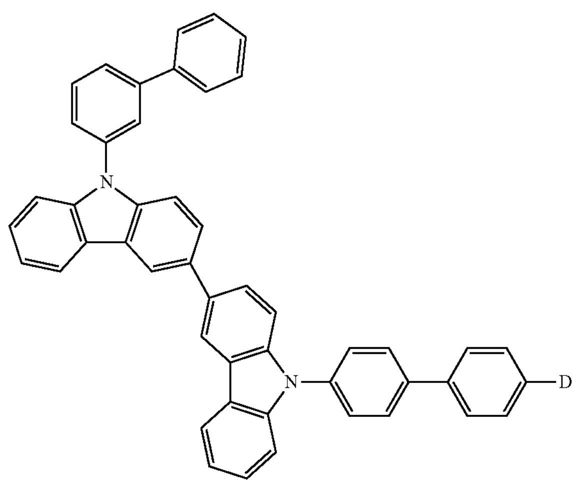

-continued
E-2-14
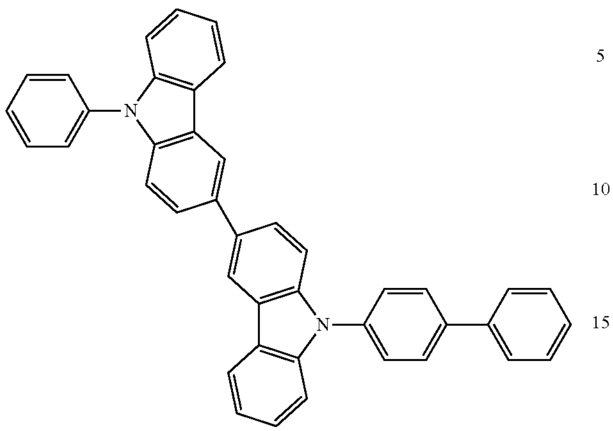
E-2-15
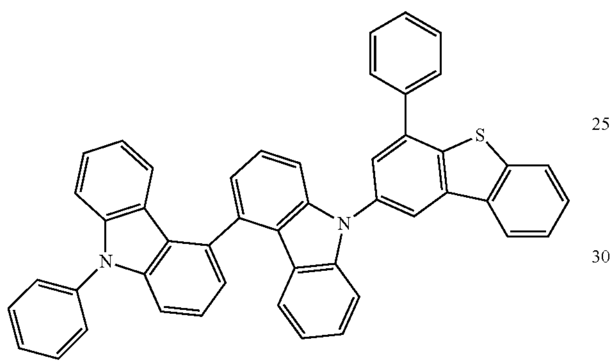
E-2-16
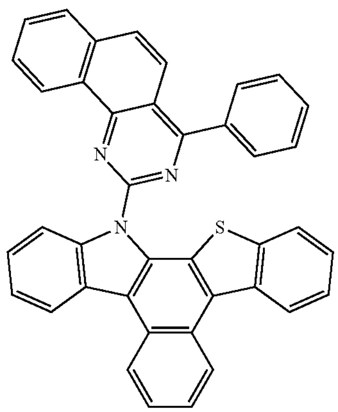
E-2-17
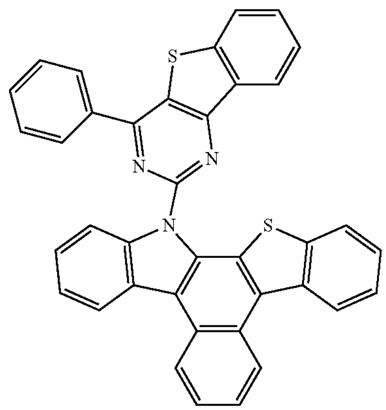
-continued
E-2-18
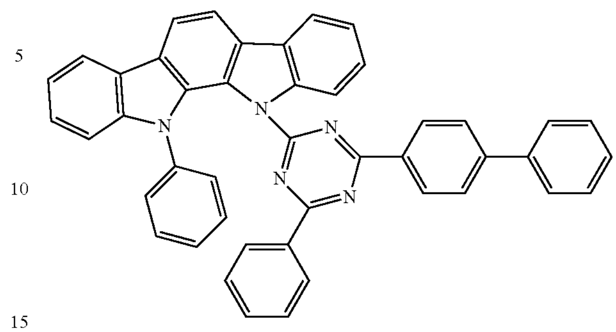
E-2-19
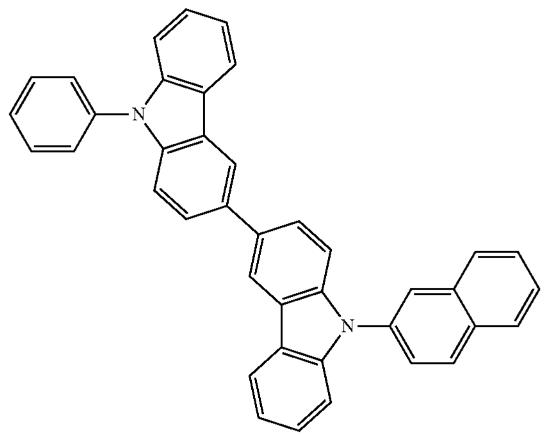
E-2-20
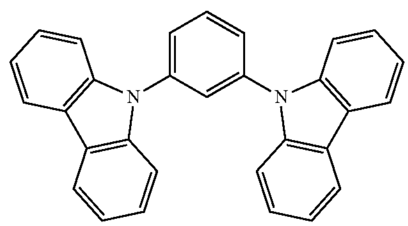
E-2-21
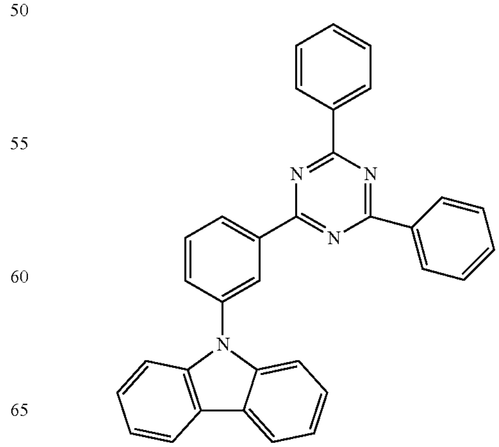

-continued

E-2-22

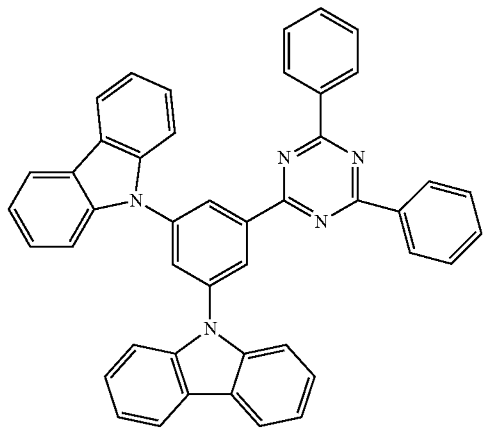

E-2-23

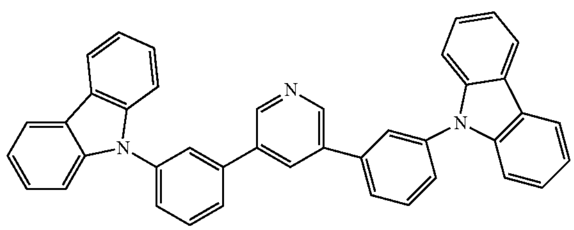

E-2-24

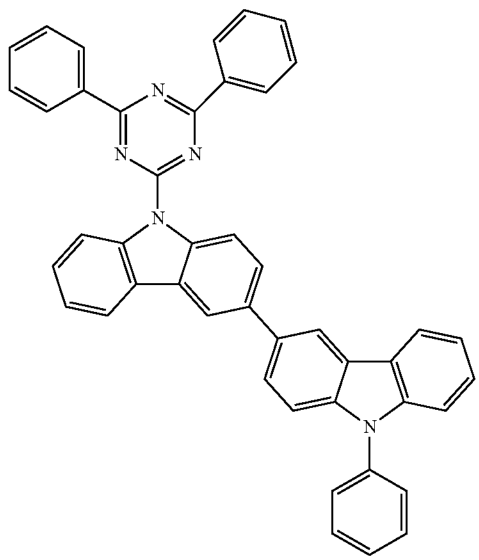

The emission layer EML may further include a general material in the art as a host material. For example, the emission layer EML may include, as a host material, at least one of bis(4-(9H-carbazol-9-yl)phenyl)diphenylsilane (BCPDS), (4-(1-(4-(diphenylamino)phenyl)cyclohexyl)phenyl)diphenyl-phosphine oxide (POPCPA), bis[2-(diphenylphosphino)phenyl]ether oxide (DPEPO), 4,4'-bis(N-carbazolyl)-1,1'-biphenyl (CBP), 1,3-bis(carbazol-9-yl) benzene (mCP), 2,8-bis(diphenylphosphoryl)dibenzo[b,d] furan (PPF), 4,4',4"-tris(carbazol-9-yl)-triphenylamine (TCTA), or 1,3,5-tris(1-phenyl-1H-benzo[d]imidazole-2-yl) benzene (TPBi). However, embodiments are not limited thereto. For example, tris(8-hydroxyquinolino)aluminum ($Alq_3$), 9,10-di(naphthalene-2-yl)anthracene (ADN), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis (triphenylsilyl)benzene (UGH2), hexaphenylcyclotrisiloxane ($DPSiO_3$), octaphenylcyclotetra siloxane ($DPSiO_4$), etc. may be used as a host material.

The emission layer EML may include a compound represented by Formula M-a or Formula M-b. The compound represented by Formula M-a or Formula M-b may be used as a phosphorescence dopant material.

[Formula M-a]

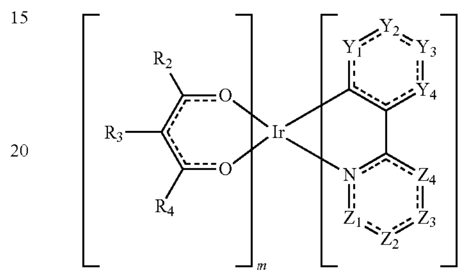

In Formula M-a, $Y_1$ to $Y_4$ and $Z_1$ to $Z_4$ may each independently be $C(R_1)$ or N, and $R_1$ to $R_4$ may each independently be a hydrogen atom, a deuterium atom, a substituted or unsubstituted amine group, a substituted or unsubstituted thio group, a substituted or unsubstituted oxy group, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring. In Formula M-a, m may be 0 or 1, and n may be 2 or 3. In Formula M-a, when m is 0, n may be 3, and when m is 1, n may be 2.

The compound represented by Formula M-a may be used as a phosphorescence dopant.

The compound represented by Formula M-a may be any one selected from Compound M-a1 to Compound M-a25. However, Compounds M-a1 to M-a25 are examples, and the compound represented by Formula M-a is not limited to Compounds M-a1 to M-a25.

M-a1

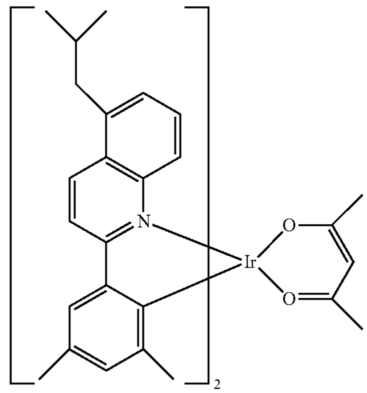

-continued
M-a2
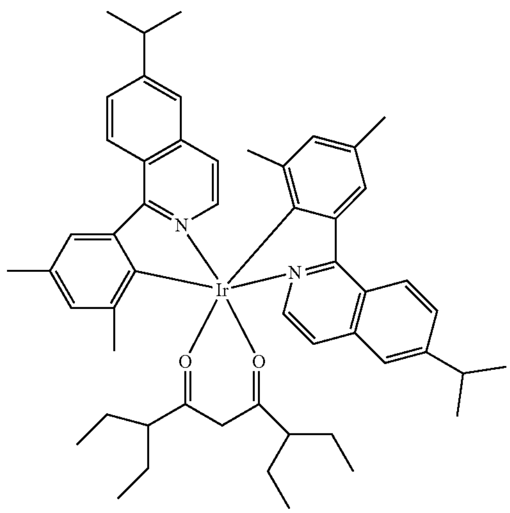
M-a3
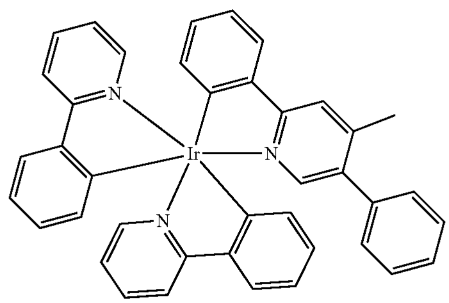
M-a4
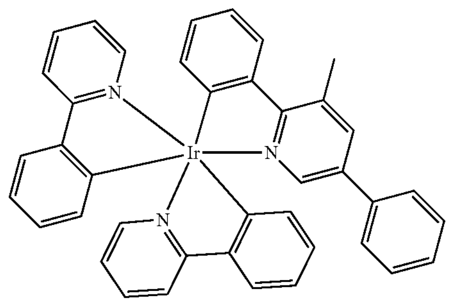
M-a5
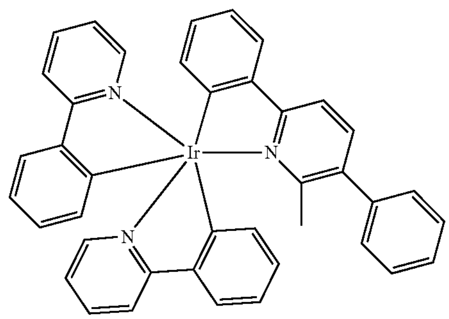
-continued
M-a6
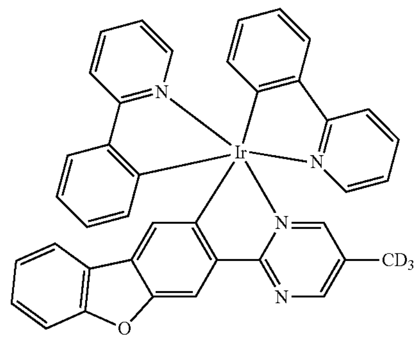
M-a7
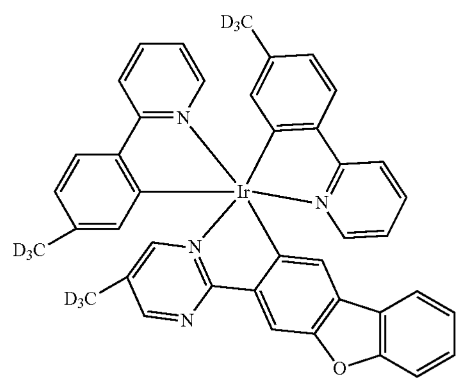
M-a8
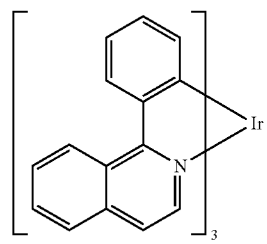
M-a9
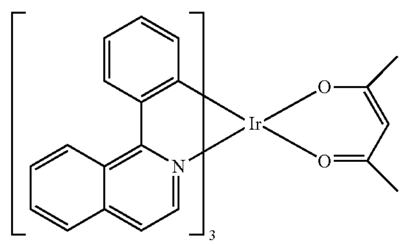
M-a10
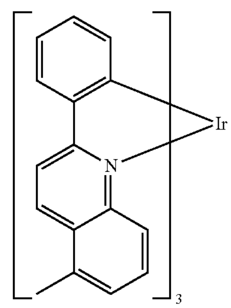

-continued
M-a11
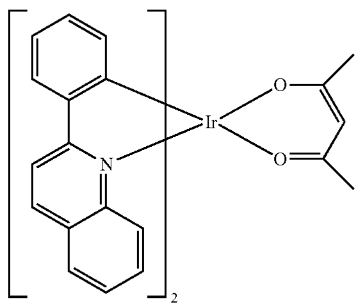
M-a12
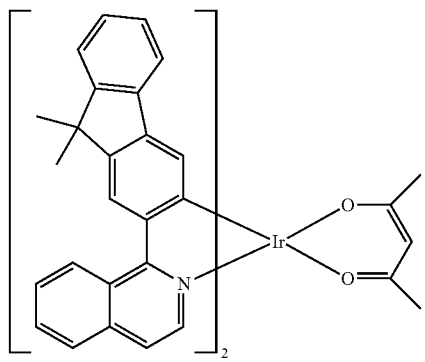
M-a13
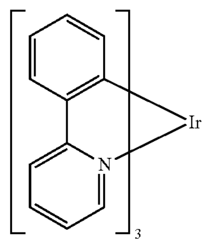
M-a14
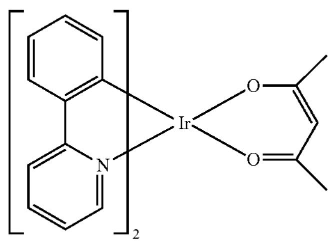
M-a15
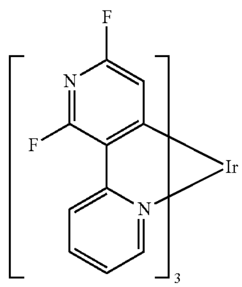
-continued
M-a16
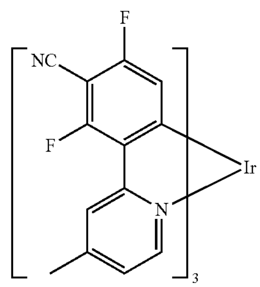
M-a17
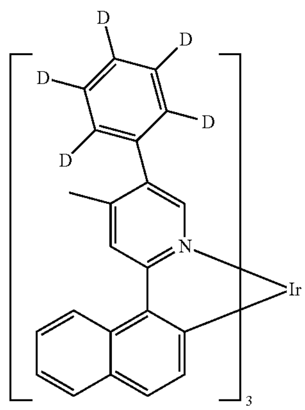
M-a18
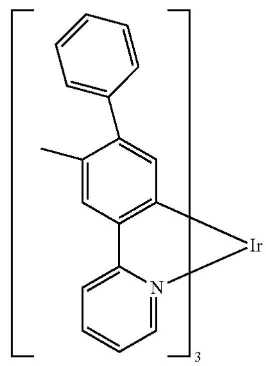
M-a19
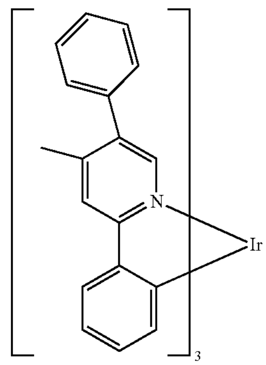

-continued

M-a20

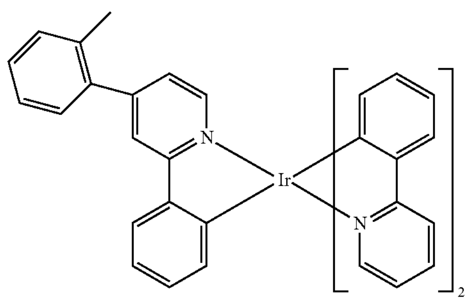

M-a21

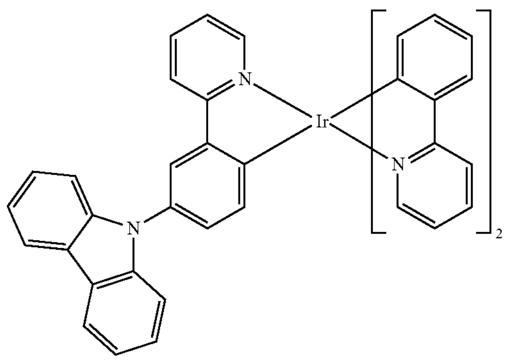

M-a22

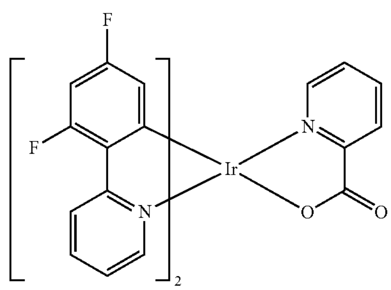

M-a23

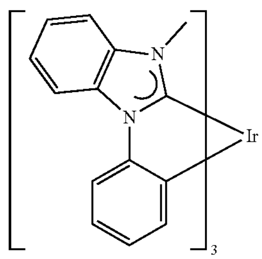

M-a24

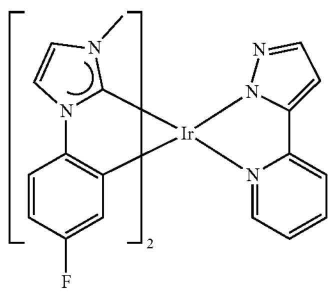

-continued

M-a25

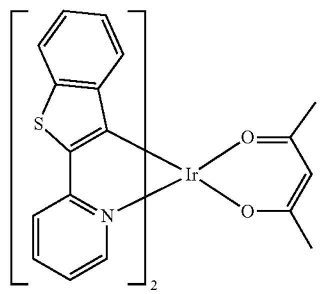

Compound M-a1 and Compound M-a2 may be used as a red dopant material, and Compound M-a3 to Compound M-a7 may be used as a green dopant material.

[Formula M-b]

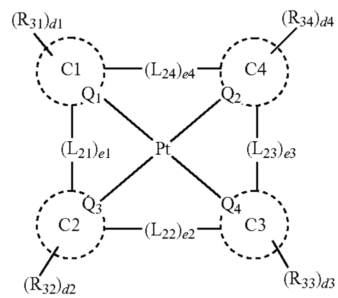

In Formula M-b, $Q_1$ to $Q_4$ may each independently be C or N, and C1 to C4 may each independently be a substituted or unsubstituted hydrocarbon ring having 5 to 30 ring-forming carbon atoms, or a substituted or unsubstituted heterocycle having 2 to 30 ring-forming carbon atoms. $L_{21}$ to $L_{24}$ may each independently be a direct linkage,

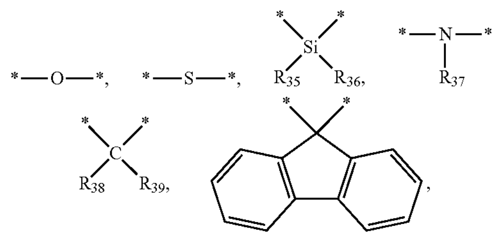

substituted or unsubstituted divalent alkyl group having 1 to 20 carbon atoms, a substituted or unsubstituted arylene group having 6 to 30 ring-forming carbon atoms, or a substituted or unsubstituted heteroarylene group having 2 to 30 ring-forming carbon atoms, and e1 to e4 may each independently be 0 or 1. In Formula M-b, $R_{31}$ to $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring, and d1 to d4 may each independently be an integer from 0 to 4.

The compound represented by Formula M-b may be used as a blue phosphorescence dopant or a green phosphorescence dopant.

The compound represented by Formula M-b may be any one selected from Compounds M-b-1 to M-b-12. However, Compounds M-b-1 to M-b-12 are examples, and the compound represented b Formula M-b is not limited to Compounds M-b-1 to M-b-12.
M-b-1
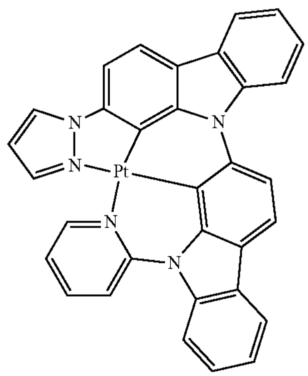
M-b-2
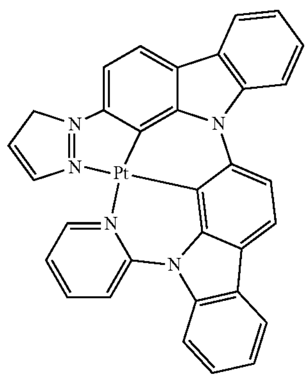
M-b-3
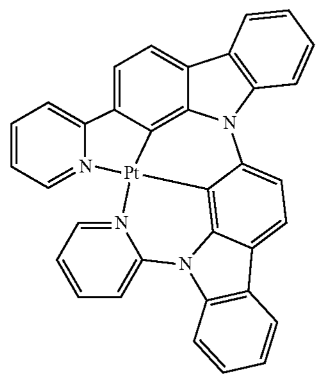
-continued
M-b-4
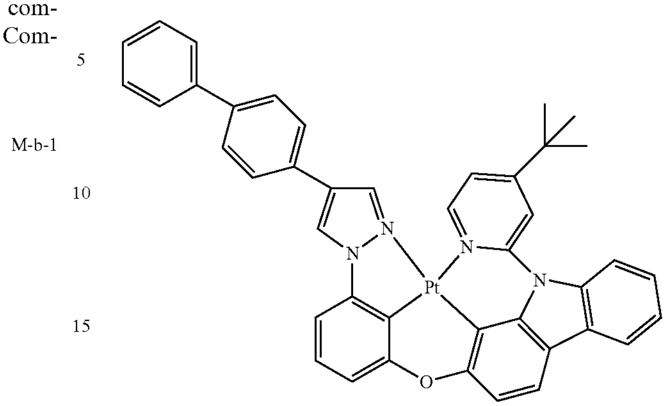
M-b-5
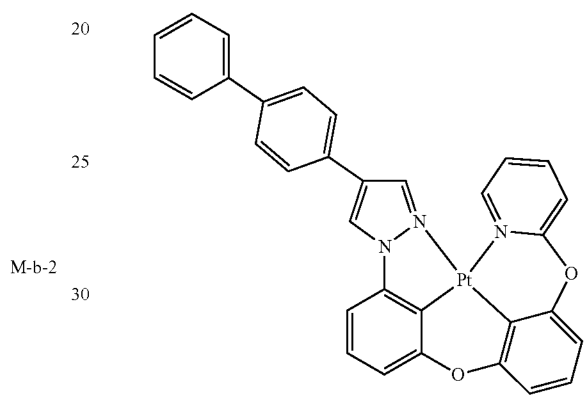
M-b-6
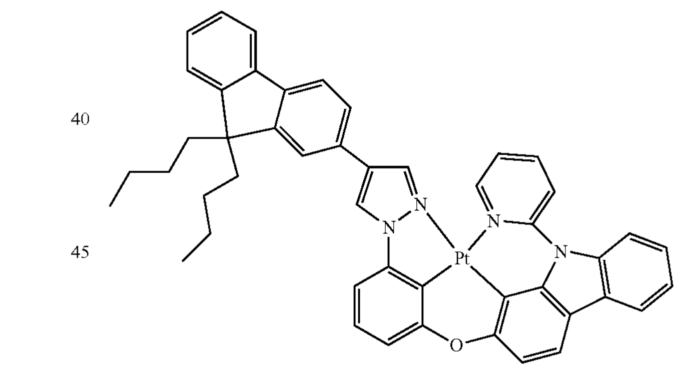
M-b-7
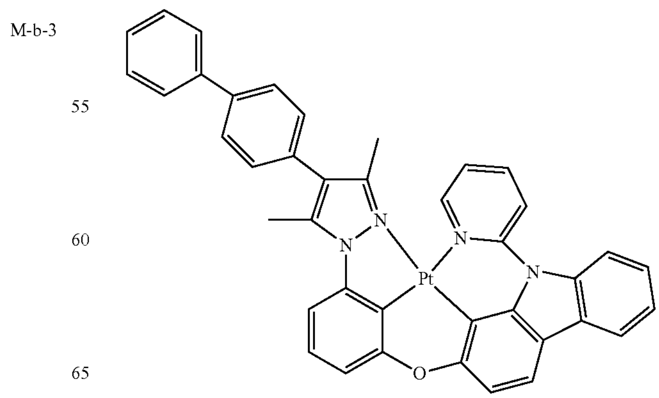

-continued

M-b-8

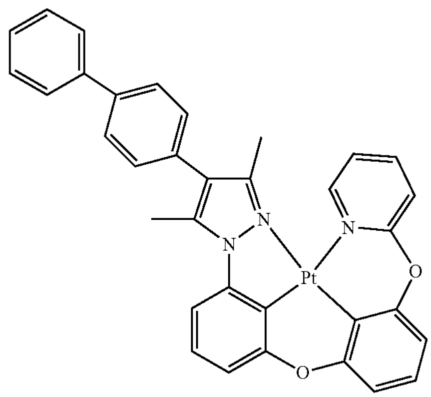

M-b-9

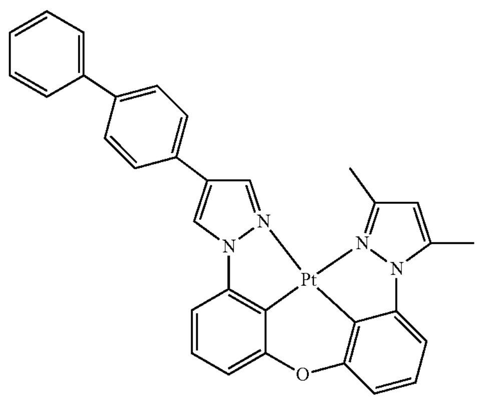

M-b-10

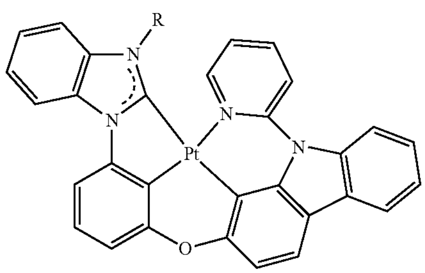

M-b-11

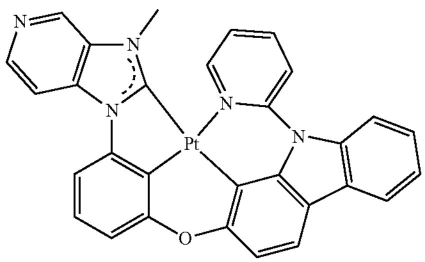

-continued

M-b-12

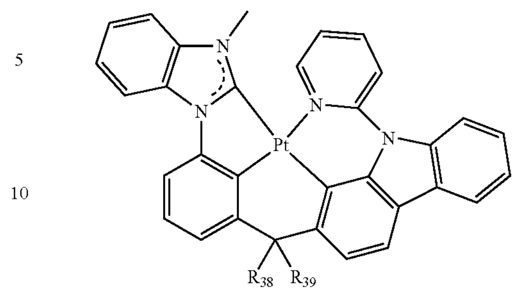

In Compounds M-b-1 to M-b-12, R, $R_{38}$, and $R_{39}$ may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

The emission layer EML may include a compound represented by any one of Formula F-a to Formula F-c. The compound represented by Formula F-a to Formula F-c may be used as a fluorescence dopant material.

[Formula F-a]

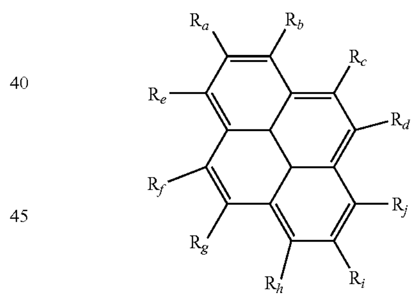

In Formula F-a, two selected from $R_a$ to $R_j$ may each independently be substituted with $-*NAr_1Ar_2$. The remainder of $R_a$ to $R_j$ which are not substituted with $-*NAr_1Ar_2$, may each independently be a hydrogen atom, a deuterium atom, a halogen atom, a cyano group, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In the group $-*N_1N_2$, $Ar_1$ and $Ar_2$ may each independently be a substituted or unsubstituted aryl group having 6 to 30 ring-forming carbon atoms, or a substituted or unsubstituted heteroaryl group having 2 to 30 ring-forming carbon atoms. For example, at least one of $Ar_1$ or $Ar_2$ may be a heteroaryl group containing O or S as a ring-forming atom.

[Formula F-b]

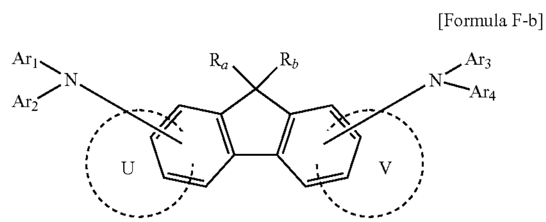

In Formula F-b, $R_a$ and $R_b$ may each independently be a hydrogen atom, a deuterium atom, a substituted or unsubstituted alkyl group having 1 to 20 carbon atoms, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-b, U and V may each independently be a substituted or unsubstituted hydrocarbon ring having 5 to 30 ring-forming carbon atoms, or a substituted or unsubstituted heterocycle having 2 to 30 ring-forming carbon atoms.

In Formula F-b, the number of rings represented by U and V may each independently be 0 or 1. For example, in Formula F-b, when the number of U or V is 1, a condensed ring may be present at the position indicated by U or V, and when the number of U or V is 0, a ring may not be present at the position indicated by U or V. When the number of U is 0 and the number of V is 1, or when the number of U is 1 and the number of V is 0, a condensed ring having a fluorene core of Formula F-b may be a cyclic compound having four rings. When each number of U and V is 0, a condensed ring having a fluorene core of Formula F-b may be a cyclic compound having three rings. When each number of U and V is 1, a condensed ring having a fluorene core of Formula F-b may be a cyclic compound having five rings.

[Formula F-c]

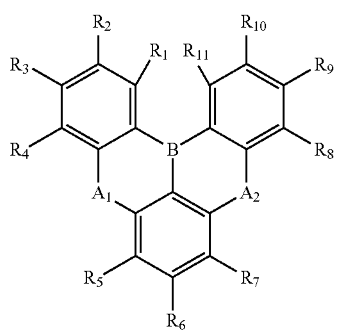

In Formula F-c, $A_1$ and $A_2$ may each independently be O, S, Se, or $N(R_m)$, and $R_m$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula F-c, $R_1$ to $R_{11}$ may each independently be a hydrogen atom, a deuterium atom, a halogen atom, a cyano group, a substituted or unsubstituted amine group, a substituted or unsubstituted boryl group, a substituted or unsubstituted oxy group, a substituted or unsubstituted thio group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula F-c, $A_1$ and $A_2$ may each independently be bonded to substituents of an adjacent ring to form a condensed ring. For example, when $A_1$ and $A_2$ are each independently $N(R_m)$, $A_1$ may be bonded to $R_4$ or $R_5$ to form a ring. For example, $A_2$ may be bonded to $R_7$ or $R_8$ to form a ring.

In an embodiment, the emission layer EML may include, as a dopant material, a styryl derivative (e.g., 1,4-bis[2-(3-N-ethylcarbazoryl)vinyl]benzene (BCzVB), 4-(di-p-tolylamino)-4'-[(di-p-tolylamino)styryl]stilbene (DPAVB), and N-(4-((E)-2-(6-((E)-4-(diphenylamino)styryl)naphthalen-2-yl)vinyl)phenyl)-N-phenylbenzena mine (N-BDAVBi), 4,4'-bis[2-(4-(N,N-diphenylamino)phenyl)vinyl]biphenyl (DPAVBi), perylene and a derivative thereof (e.g., 2,5,8,11-tetra-t-butylperylene (TBP)), pyrene and a derivative thereof (e.g., 1,1-dipyrene, 1,4-dipyrenylbenzene, 1,4-bis(N,N-diphenylamino)pyrene), etc.

The emission layer EML may include a phosphorescence dopant material. For example, a metal complex including iridium (Ir), platinum (Pt), osmium (Os), aurum (Au), titanium (Ti), zirconium (Zr), hafnium (Hf), europium (Eu), terbium (Tb), or thulium (Tm) may be used as a phosphorescence dopant. For example, iridium(III) bis(4,6-difluorophenylpyridinato-N,C2')picolinate (FIrpic), bis(2,4-difluorophenylpyridinato)-tetrakis(1-pyrazolyl)borate iridium(III) (Fir6), or platinum octaethyl porphyrin (PtOEP) may be used as a phosphorescence dopant. However, embodiments are not limited thereto.

The emission layer EML may include a quantum dot material. The quantum dot may be a Group II-VI compound, a Group III-VI compound, a Group I-III-VI compound, a Group III-V compound, a Group III-II-V compound, a Group IV-VI compound, a Group IV element, a Group IV compound, or a combination thereof.

The Group II-VI compound may be a binary compound selected from the group consisting of CdSe, CdTe, CdS, ZnS, ZnSe, ZnTe, ZnO, HgS, HgSe, HgTe, MgSe, MgS, and a mixture thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof, or any combination thereof.

The Group III-VI compound may be a binary compound such as $In_2S_3$ and $In_2Se_3$; a ternary compound such as $InGaS_3$ and $InGaSe_3$; or any combination thereof.

The Group I-III-VI compound may be a ternary compound selected from the group consisting of AgInS, $AgInS_2$, CuInS, $CuInS_2$, $AgGaS_2$, $CuGaS_2$, $CuGaO_2$, $AgGaO_2$, $AgAlO_2$, and a mixture thereof, a quaternary compound such as $AgInGaS_2$ and $CuInGaS_2$; or any combination thereof.

The Group III-V compound may be a binary compound selected from the group consisting of GaN, GaP, GaAs, GaSb, AlN, AlP, AlAs, AlSb, InN, InP, InAs, InSb, and a mixture thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and a mixture thereof; and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a mixture thereof; or any combination thereof. The Group III-V compound may further include a Group II metal. For example, InZnP, etc. may be selected as a Group III-II-V compound.

The Group IV-VI compound may be a binary compound selected from the group consisting of SnS, SnSe, SnTe, PbS, PbSe, PbTe, and a mixture thereof, a ternary compound selected from the group consisting of SnSeS, SnSeTe, SnSTe, PbSeS, PbSeTe, PbSTe, SnPbS, SnPbSe, SnPbTe, and a mixture thereof, a quaternary compound selected from the group consisting of SnPbSSe, SnPbSeTe, SnPbSTe, and a mixture thereof; or any combination thereof. The Group IV element may be selected from the group consisting of Si, Ge, and a mixture thereof. The Group IV compound may be a binary compound selected from the group consisting of SiC, SiGe, and a mixture thereof.

A binary compound, a ternary compound, or a quaternary compound may be present in a particle at a uniform concentration distribution, or may be present in a particle at a partially different concentration distribution. In an embodiment, the quantum dot may have a core/shell structure in which one quantum dot surrounds another quantum dot. The core/shell structure may have a concentration gradient in which the concentration of an element that is present in the shell decreases toward the core.

In embodiments, a quantum dot may have a core-shell structure including a core containing nanocrystals and a shell surrounding the core. The shell of the quantum dot may be a protection layer that prevents chemical deformation of the core so as to maintain semiconductor properties, and/or may be a charging layer that imparts electrophoresis properties to the quantum dot. The shell may be a single layer or a multilayer. An example of the shell of the quantum dot may include a metal oxide, a non-metal oxide, a semiconductor compound, or a combination thereof.

For example, the metal oxide or the non-metal oxide may be a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a ternary compound such as $MgAl_2O_4$, $CoFe_2O_4$, $NiFe_2P_4$, and $CoMn_2O_4$, but the embodiments are not limited thereto.

The semiconductor compound may be, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc., but embodiments are not limited thereto.

The quantum dot may have a full width of half maximum (FWHM) of a light emission wavelength spectrum equal to or less than about 45 nm. For example, the quantum dot may have a FWHM of a light emission wavelength spectrum equal to or less than about 40 nm. For example, the quantum dot may have a FWHM of a light emission wavelength spectrum equal to or less than about 30 nm. Color purity or color reproducibility may be improved in the above ranges. Light emitted through the quantum dot may be emitted in all directions, and thus, a wide viewing angle may be improved.

The form of a quantum dot is not particularly limited, as long as it is a form commonly used in the art. For example, a quantum dot may have a spherical shape, a pyramidal shape, a multi-arm shape, or a cubic shape, or the quantum dot may be in the form of nanoparticles, nanotubes, nanowires, nanofibers, nanoparticles, etc.

The quantum dot may control the color of emitted light according to a particle size thereof, and accordingly, the quantum dot may have various emission colors such as blue, red, and green.

In each light emitting device ED of embodiments illustrated in FIGS. 3 to 6, an electron transport region ETR is provided on the emission layer EML. The electron transport region ETR may include at least one of a hole blocking layer HBL, an electron transport layer ETL, or an electron injection layer EIL, but embodiments are not limited thereto.

The electron transport region ETR may be a layer formed of a single material, a layer formed of different materials, or a multilayer structure including layers formed of different materials.

For example, the electron transport region ETR may have a single layer structure of the electron injection layer EIL or the electron transport layer ETL, and may have a single layer structure formed of an electron injection material and an electron transport material. The electron transport region ETR may have a single layer structure formed of different materials, or may have a structure in which an electron transport layer ETL/electron injection layer EIL, a hole blocking layer HBL/electron transport layer ETL/electron injection layer EIL are stacked in its respective stated order from the emission layer EML, but embodiments are not limited thereto. The electron transport region ETR may have a thickness, for example, in a range of about 1,000 Å to about 1,500 Å.

The electron transport region ETR may be formed by using various methods such as a vacuum deposition method, a spin coating method, a cast method, a Langmuir-Blodgett (LB) method, an inkjet printing method, a laser printing method, a laser induced thermal imaging (LITI) method, etc.

The electron transport region ETR may include a compound represented by Formula ET-1:

[Formula ET-1]

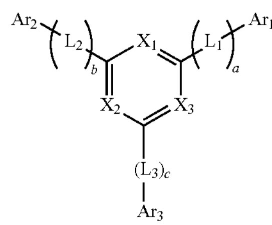

In Formula ET-1, at least one $X_1$ to $X_3$ may be N, and the remainder of $X_1$ to $X_3$ may each be $C(R_a)$. $R_a$ may be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms. In Formula ET-1, $Ar_1$ to $Ar_2$ may each independently be a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula ET-1, a to c may each independently be an integer from 0 to 10. In Formula ET-1, $L_1$ to $L_3$ may each independently be a direct linkage, a substituted or unsubstituted arylene group having 6 to 30 ring-forming carbon atoms, or a substituted or unsubstituted heteroarylene group having 2 to 30 ring-forming carbon atoms. When a to c are 2 or more, $L_1$ to $L_3$ may each independently be a substituted or unsubstituted arylene group having 6 to 30 ring-forming carbon atoms, or a substituted or unsubstituted heteroarylene group having 2 to 30 ring-forming carbon atoms.

The electron transport region ETR may include an anthracene-based compound. However, embodiments are not limited thereto, and the electron transport region ETR may include, for example, tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazol-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-$N_1$,$O_8$)-(1,1'-biphenyl-4-olato)aluminum (BAlq), berylliumbis(benzoquinolin-10-olate ($Bebq_2$), 9,10-di(naphthalene-2-yl)anthracene (ADN), 1,3-Bis[3,5-di(pyridin-3-yl)phenyl]benzene (BmPyPhB), or a mixture thereof.

The electron transport region ETR may include at least one of Compound ET1 to Compound ET36:

ET1

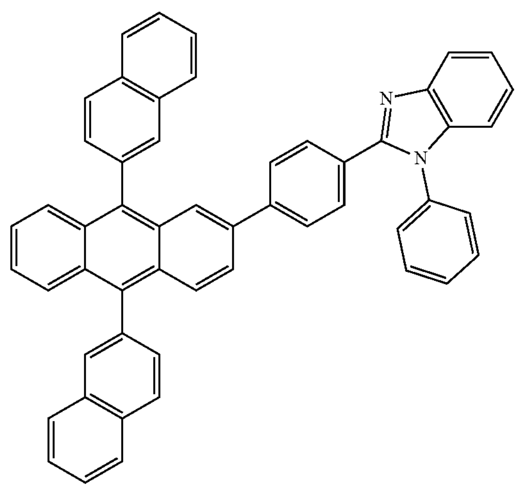

ET2

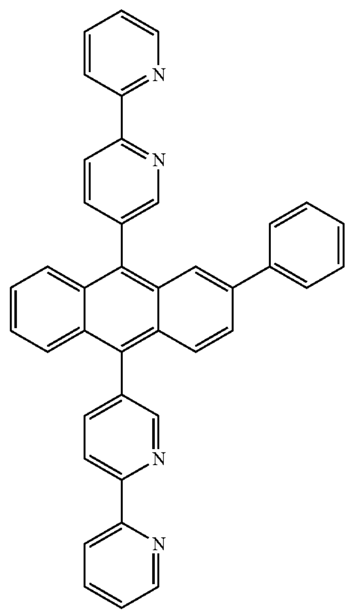

-continued

ET3

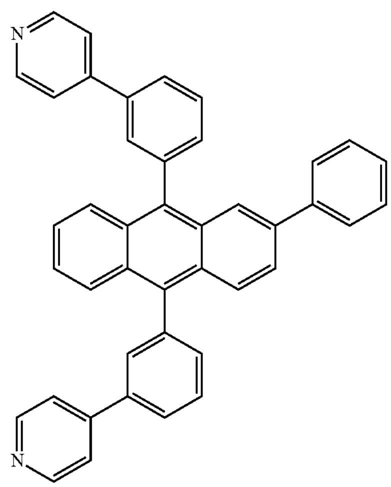

ET4

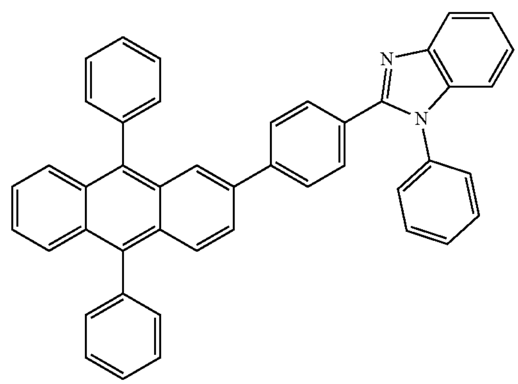

ET5

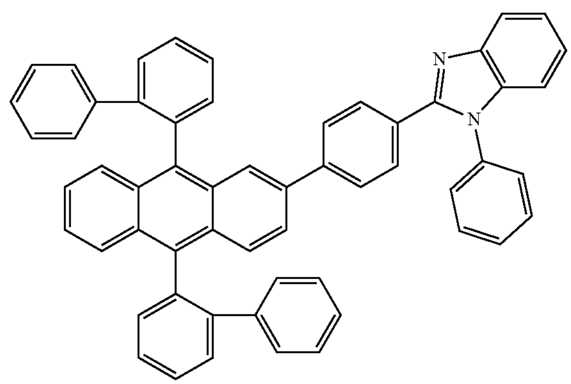

ET6

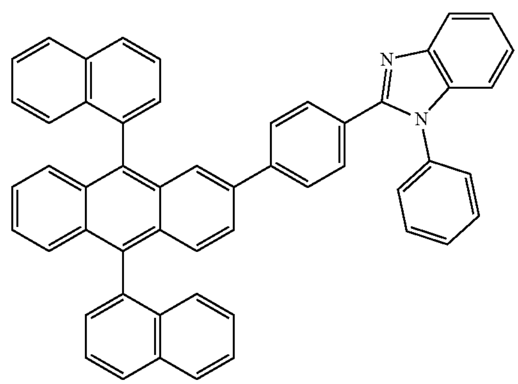

-continued
ET7
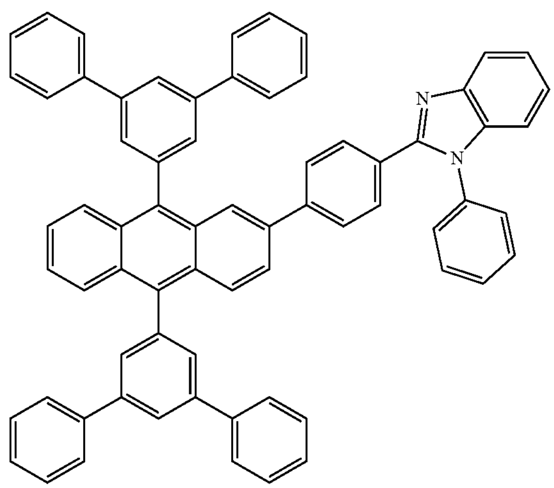
ET8
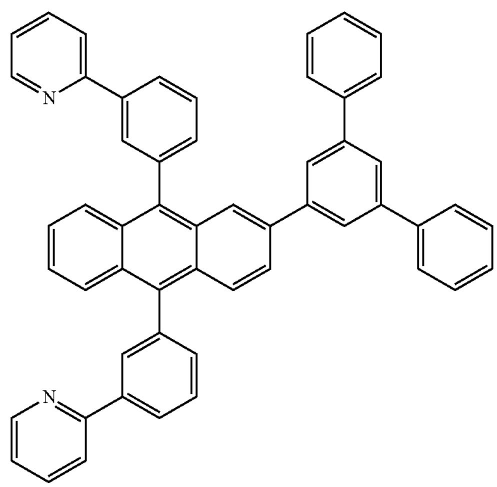
ET9
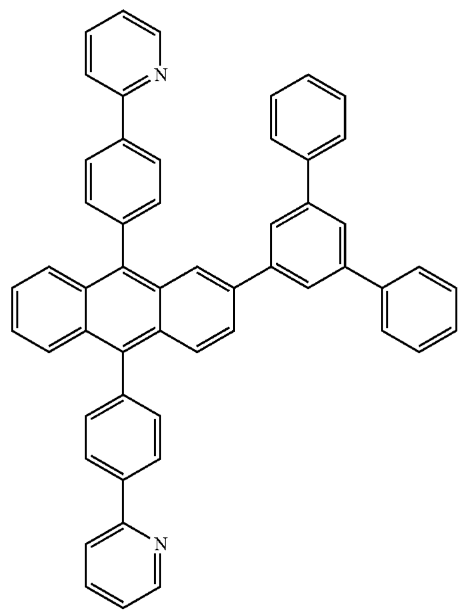
-continued
ET10
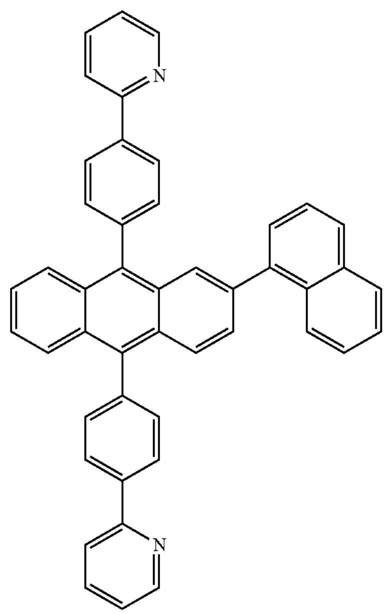
ET11
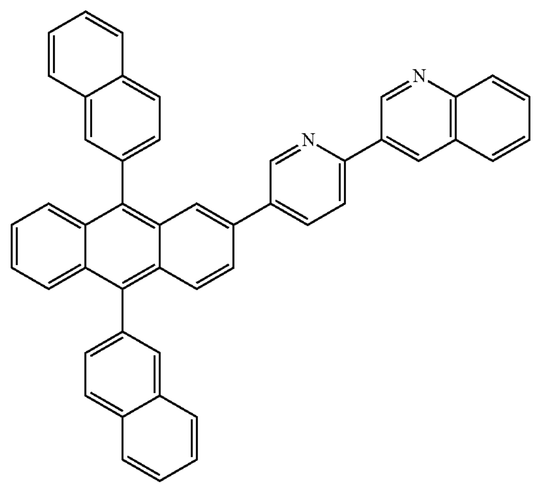
ET12
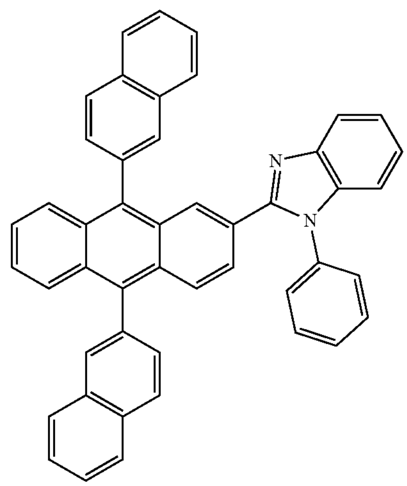

-continued
ET13
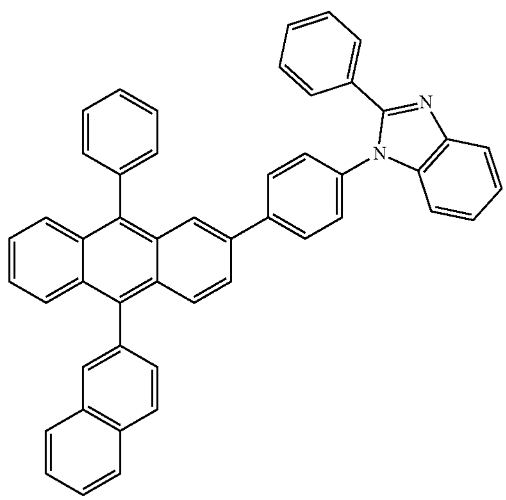
ET14
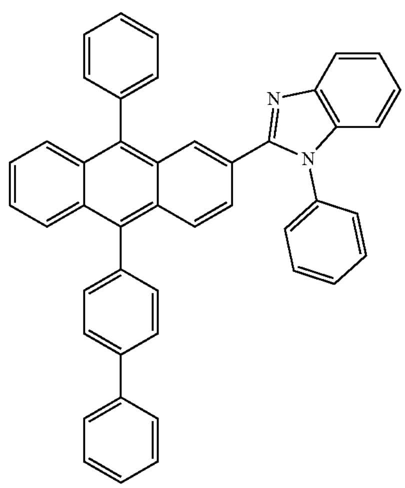
ET15
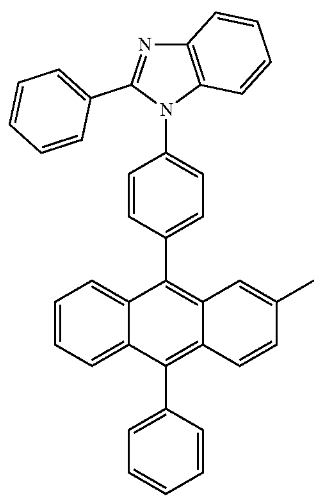
-continued
ET16
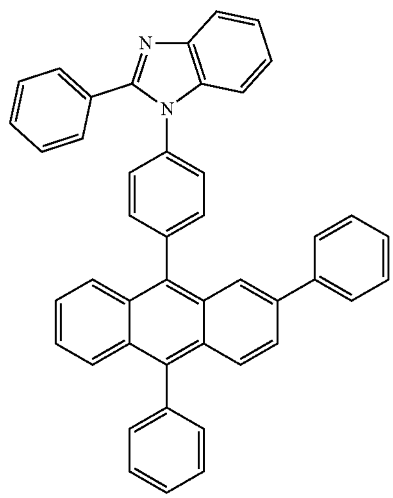
ET17
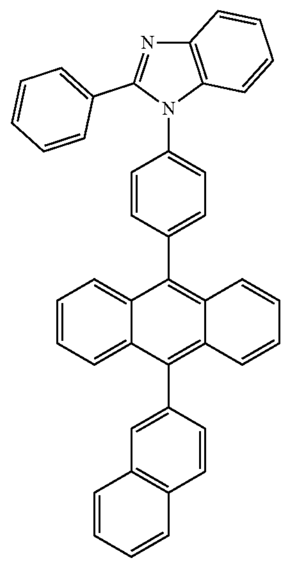
ET18
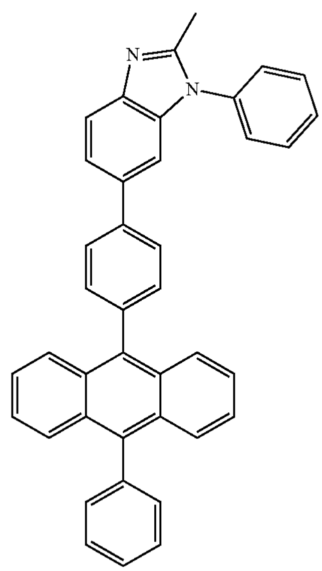

-continued
ET19
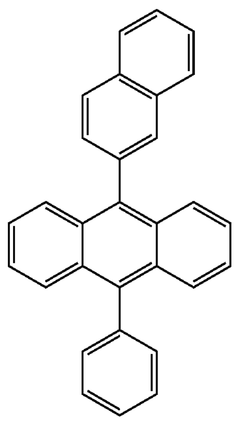
ET20
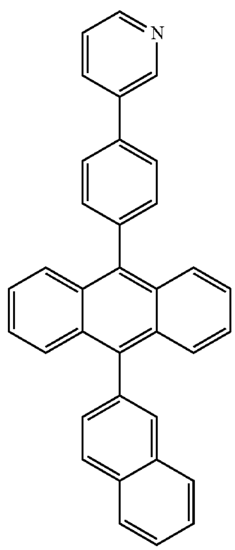
ET21
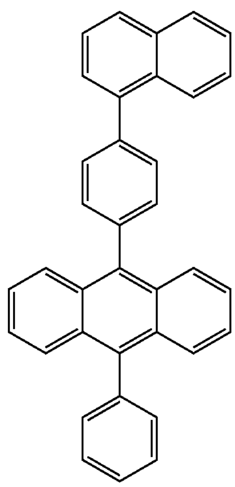
-continued
ET22
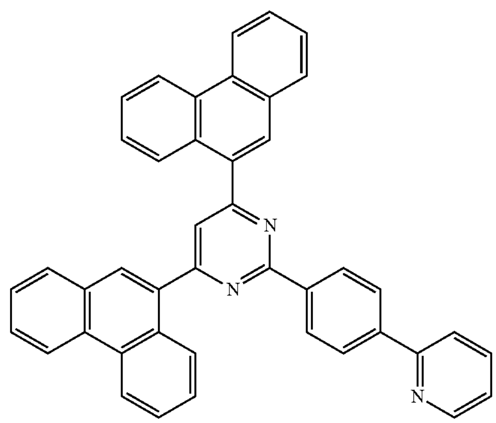
ET23
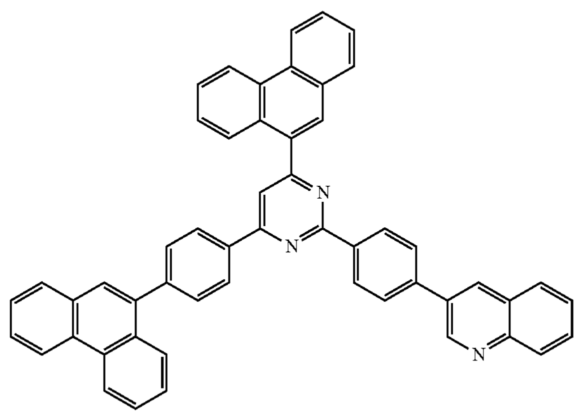
ET24
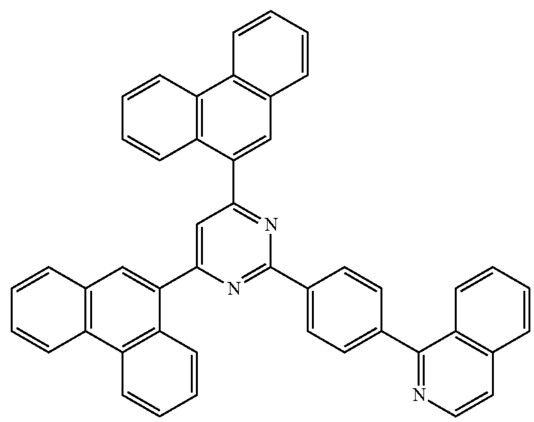

-continued
ET25
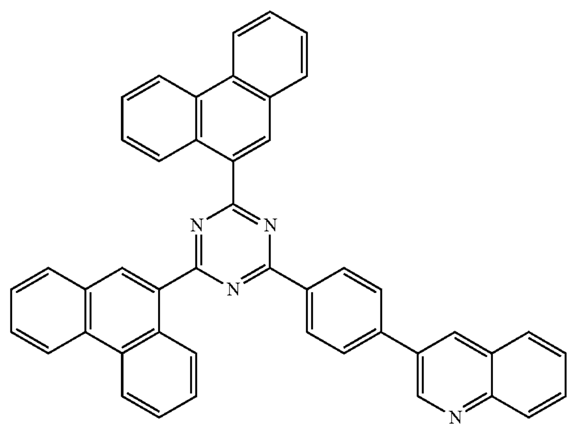
ET26
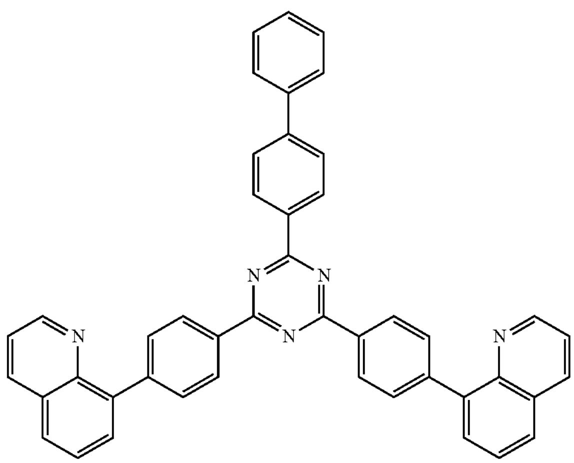
ET27
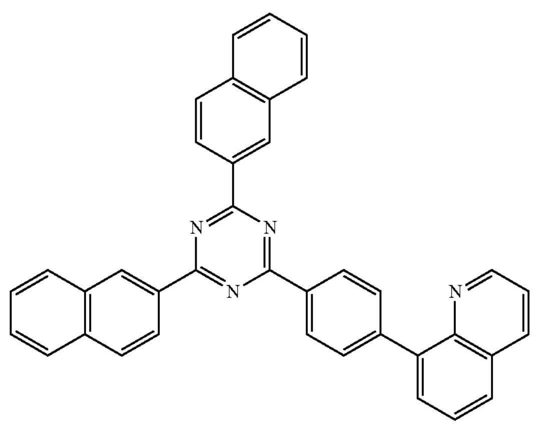
-continued
ET28
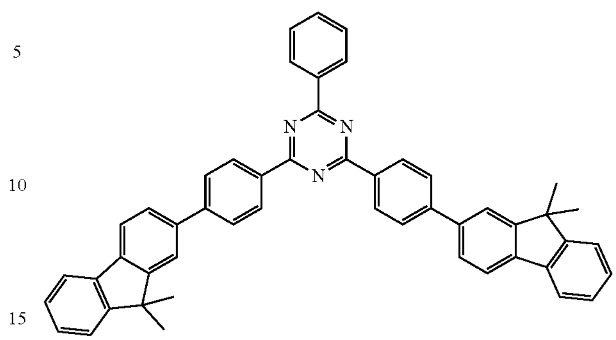
ET29
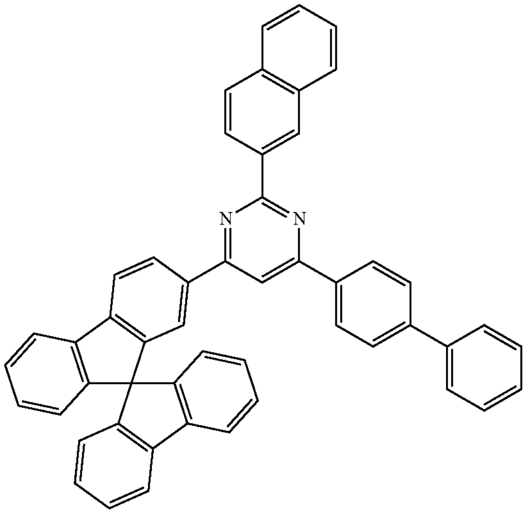
ET30
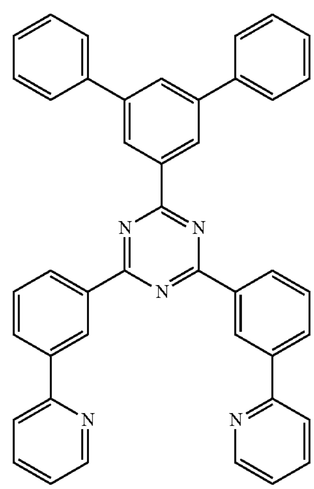

-continued

ET31

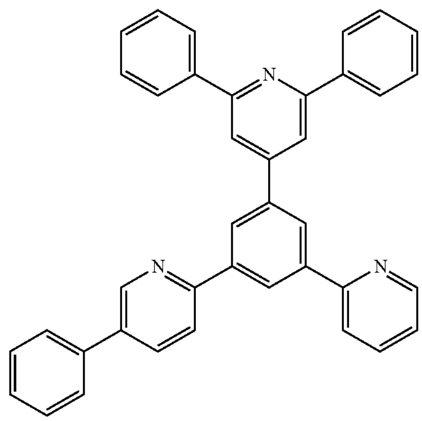

ET32

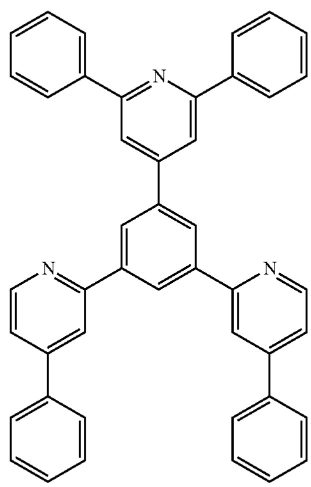

ET33

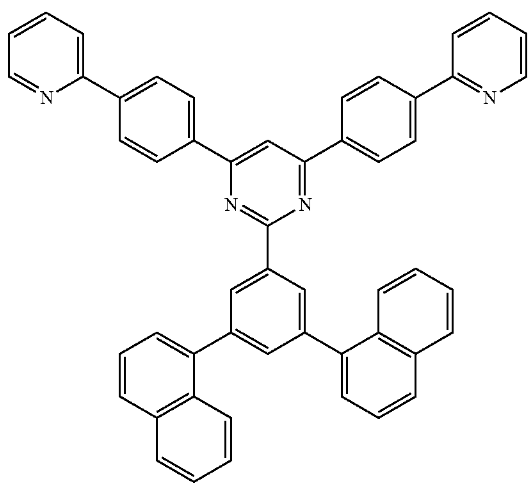

-continued

ET34

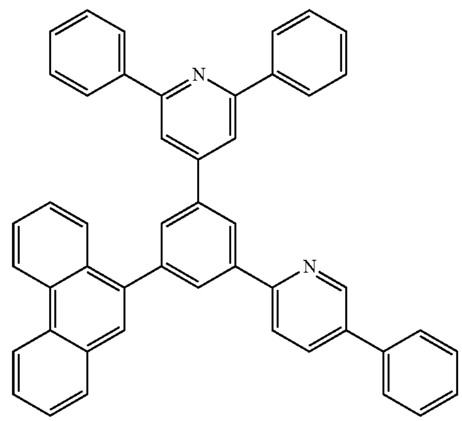

ET35

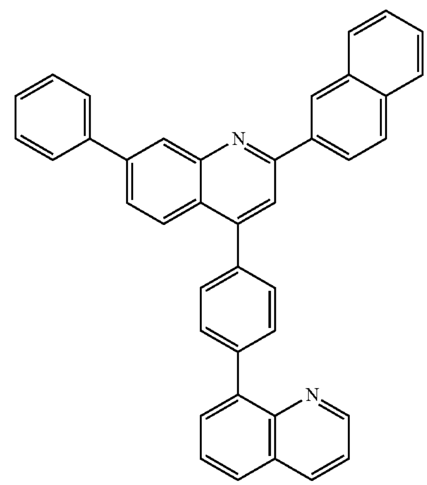

ET36

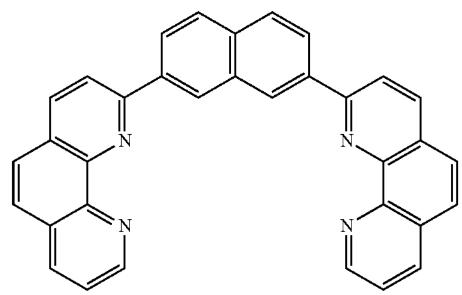

The electron transport region ETR may include a metal halide such as LiF, NaCl, CsF, RbCl, RbI, CuI, or KI, a lanthanide metal such as Yb, or a co-deposited material of a metal halide and a lanthanide metal. For example, the electron transport region ETR may include KI:Yb, RbI:Yb, etc. as a co-deposited material. The electron transport region ETR may be formed using a metal oxide such as $Li_2O$ or BaO, or 8-hydroxyl-lithium quinolate (Liq), etc., but embodiments are not limited thereto. The electron transport region ETR may also be formed of a mixture material of an electron transport material and an insulating organometallic salt. The organometallic salt may be a material having an energy band gap equal to or greater than about 4 eV. For example, the organometallic salt may include a metal acetate, a metal benzoate, a metal acetoacetate, a metal acetylacetonate, or a metal stearate.

The electron transport region ETR may further include at least one of 2,9-dimethyl-4,7-diphenyl-1,10-phenanthroline (BCP), or 4,7-diphenyl-1,10-phenanthroline (Bphen) in addition to the above-described materials, but embodiments are not limited thereto.

The electron transport region ETR may include the above-described compounds of the electron transport region in at least one of the electron injection layer EIL, the electron transport layer ETL, or the hole blocking layer HBL.

When the electron transport region ETR includes an electron transport layer ETL, the electron transport layer ETL may have a thickness in a range of about 100 Å to about 1,000 Å. For example, the electron transport layer ETL may have a thickness in a range of about 150 Å to about 500 Å. If the thickness of the electron transport layer ETL satisfies the aforementioned range, satisfactory electron transport characteristics may be obtained without a substantial increase in driving voltage. When the electron transport region ETR includes an electron injection layer EIL, the electron injection layer EIL may have a thickness in a range of about 1 Å to about 100 Å. For example, the electron injection layer EIL may have a thickness in a range of about 3 Å to about 90 Å. If the thickness of the electron injection layer EIL satisfies the above-described range, satisfactory electron injection characteristics may be obtained without a substantial increase in driving voltage.

The second electrode EL2 is provided on the electron transport region ETR. The second electrode EL2 may be a common electrode. The second electrode EL2 may be a cathode or an anode, but embodiments are not limited thereto. For example, when the first electrode EL1 is an anode, the second electrode EL2 may be a cathode, and when the first electrode EL1 is a cathode, the second electrode EL2 may be an anode.

The second electrode EL2 may be a transmissive electrode, a transflective electrode, or a reflective electrode. When the second electrode EL2 is a transmissive electrode, the second electrode EL2 may be formed of a transparent metal oxide, for example, indium tin oxide (ITO), indium zinc oxide (IZO), zinc oxide (ZnO), indium tin zinc oxide (ITZO), etc.

When the second electrode EL2 is a transflective electrode or a reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, Yb, W, a compound thereof, or a mixture thereof (e.g., AgMg, AgYb, or MgAg). In another embodiment, the second electrode EL2 may have a multi-layer structure including a reflective film or a transflective film formed of the above-described materials, and a transparent conductive film formed of ITO, IZO, ZnO, ITZO, etc. For example, the second electrode EL2 may include the above-described metal materials, combinations of at least two metal materials of the above-described metal materials, oxides of the above-described metal materials, or the like.

Although not shown in the drawings, the second electrode EL2 may be electrically connected to an auxiliary electrode. If the second electrode EL2 is electrically connected to the auxiliary electrode, the resistance of the second electrode EL2 may decrease.

In an embodiment, the light emitting device ED may further include a capping layer CPL disposed on the second electrode EL2. The capping layer CPL may be a multilayer or a single layer.

In an embodiment, the capping layer CPL may include an organic layer or an inorganic layer. For example, when the capping layer CPL contains an inorganic material, the inorganic material may include an alkaline metal compound (for example, LiF), an alkaline earth metal compound (for example, $MgF_2$), SiON, $SiN_x$, SiOy, etc.

For example, when the capping layer CPL contains an organic material, the organic material may include α-NPD, NPB, TPD, m-MTDATA, $Alq_3$, CuPc, $N_4$,$N_4$,$N_4$',$N_4$'-tetra (biphenyl-4-yl)biphenyl-4,4'-diamine (TPD15), 4,4',4"-tris (carbazol sol-9-yl)triphenylamine (TCTA), etc., or may include an epoxy resin, or an acrylate such as a methacrylate. However, embodiments are not limited thereto, and the capping layer CPL may include at least one of Compounds P1 to P5:

P1

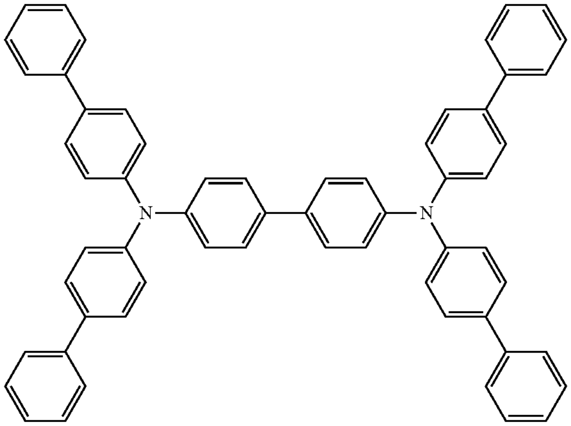

P2

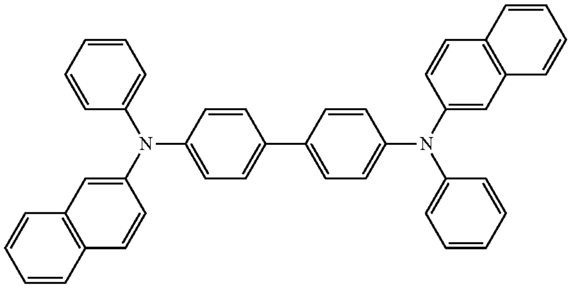

P3

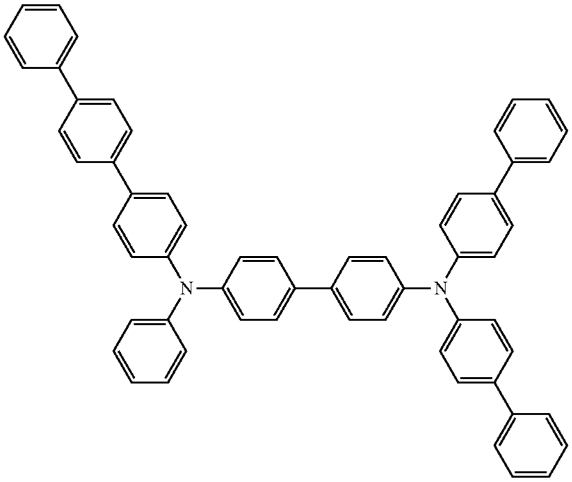

-continued

P4

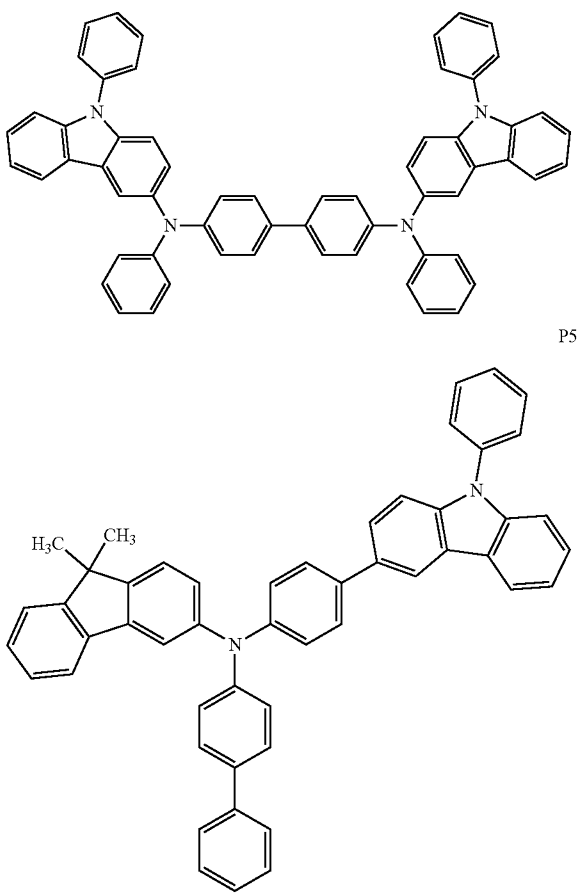

P5

A refractive index of the capping layer CPL may be equal to or greater than about 1.6. For example, the capping layer CPL may have a refractive index equal to or greater than about 1.6 with respect to light in a wavelength range of about 550 nm to about 660 nm.

Figure 7:
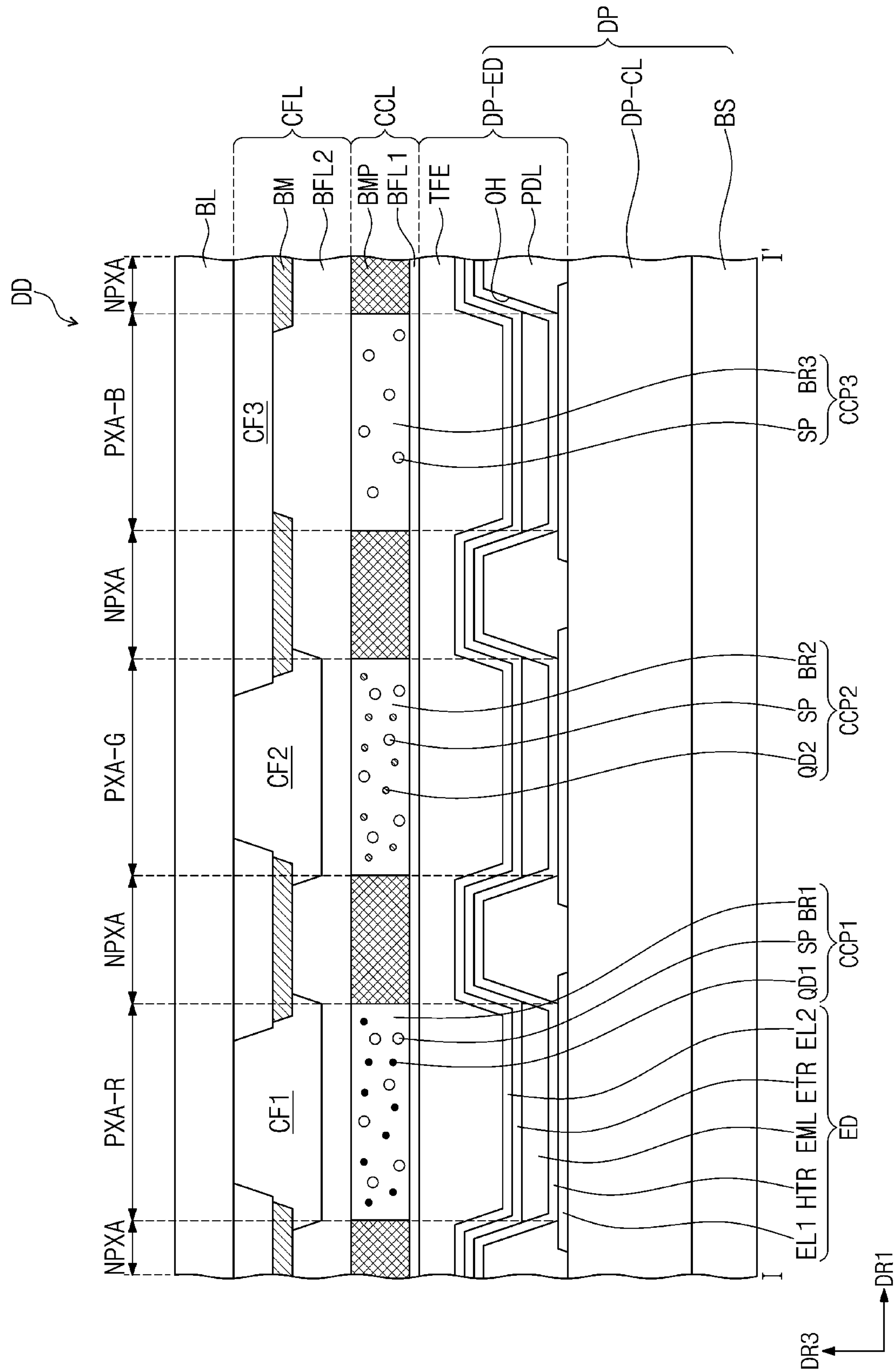
FIG. 7 is a schematic cross-sectional view illustrating a display apparatus according to an embodiment.
Figure 8:
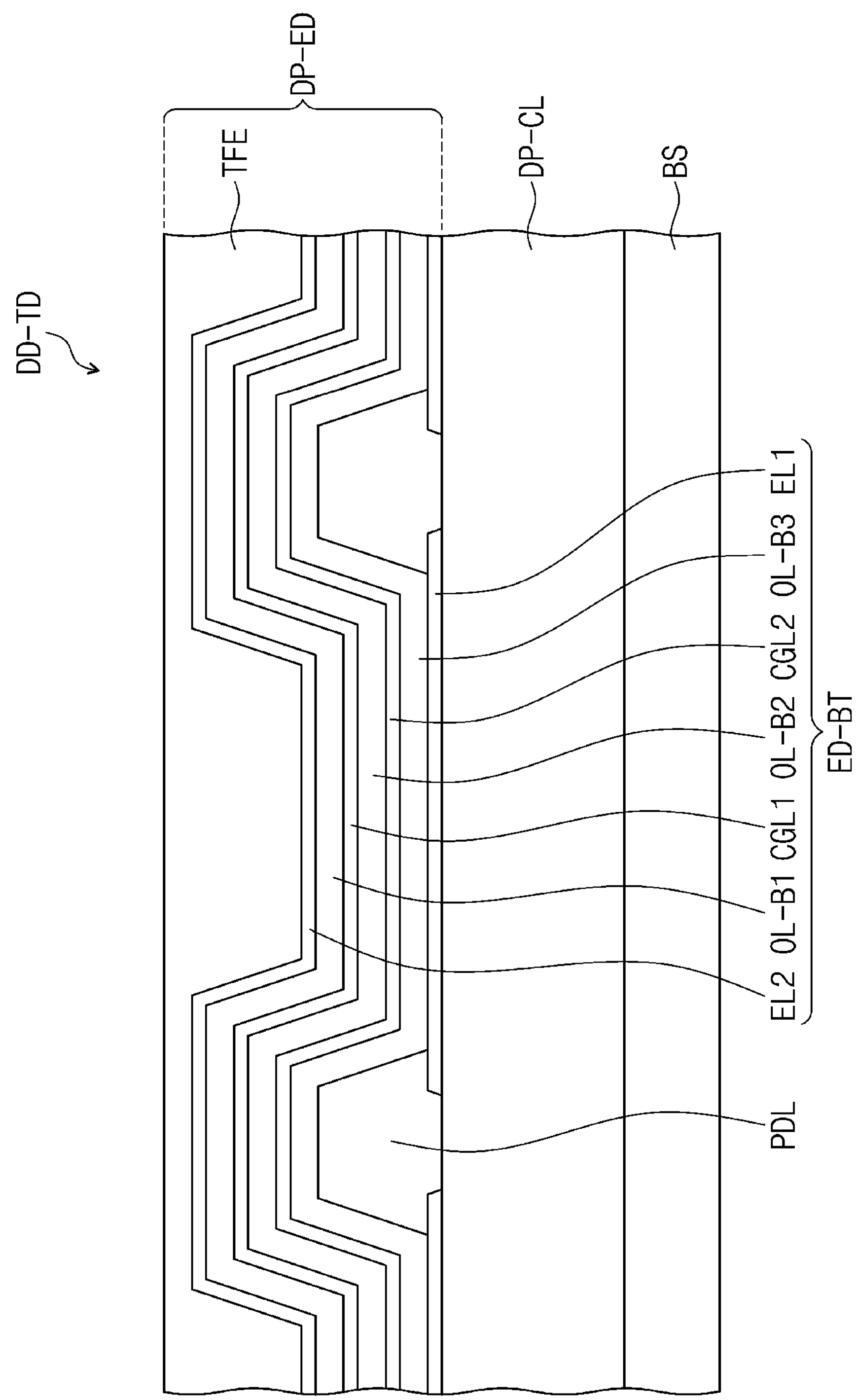
FIG. 8 is a schematic cross-sectional view illustrating a display apparatus according to an embodiment.

FIGS. 7 and 8 are each a schematic cross-sectional view of a display apparatus according to an embodiment. Hereinafter, in describing the display apparatuses of embodiments with reference to FIGS. 7 and 8, the features which have been described with respect to FIGS. 1 to 6 will not be described again, and the differences will be described.

Referring to FIG. 7, the display apparatus DD according to an embodiment may include a display panel DP including a display device layer DP-ED, a light control layer CCL disposed on the display panel DP, and a color filter layer CFL.

In an embodiment illustrated in FIG. 7, the display panel DP may include a base layer BS, a circuit layer DP-CL provided on the base layer BS, and the display device layer DP-ED, and the display device layer DP-ED may include a light emitting device ED.

The light emitting device ED may include a first electrode EL1, a hole transport region HTR disposed on the first electrode EL1, an emission layer EML disposed on the hole transport region HTR, an electron transport region ETR disposed on the emission layer EML, and a second electrode EL2 disposed on the electron transport region ETR. A structure of the light emitting device of FIGS. 3 to 6 as described above may be applied to the structure of the light emitting device ED shown in FIG. 7.

Referring to FIG. 7, the emission layer EML may be disposed in openings OH defined in a pixel defining film PDL. For example, the emission layer EML which is divided by the pixel defining film PDL and provided corresponding to each of the light emitting regions PXA-R, PXA-G, and PXA-B may emit light in a same wavelength range. In the display apparatus DD of an embodiment, the emission layer EML may emit blue light. Although not shown in the drawings, in an embodiment, the emission layer EML may be provided as a common layer for all of the light emitting regions PXA-R, PXA-G, and PXA-B.

The light control layer CCL may be disposed on the display panel DP. The light control layer CCL may include a light conversion body. The light conversion body may include a quantum dot, a phosphor, or the like. The light conversion body may convert the wavelength of a provided light and may emit the converted light. For example, the light control layer CCL may be a layer containing a quantum dot or a layer containing a phosphor.

The light control layer CCL may include light control parts CCP1, CCP2, and CCP3. The light control parts CCP1, CCP2, and CCP3 may be spaced apart from one another.

Referring to FIG. 7, divided patterns BMP may be disposed between the light control parts CCP1, CCP2, and CCP3, which are spaced apart from each other, but embodiments are not limited thereto. FIG. 7 illustrates that the divided patterns BMP do not overlap the light control parts CCP1, CCP2, and CCP3, but at least a portion of the edges of the light control parts CCP1, CCP2, and CCP3 may overlap the divided patterns BMP.

The light control layer CCL may include a first light control part CCP1 containing a first quantum dot QD1 that converts first color light provided from the light emitting device ED into second color light, a second light control part CCP2 containing a second quantum dot QD2 that converts the first color light into third color light, and a third light control part CCP3 that transmits the first color light.

In an embodiment, the first light control part CCP1 may provide red light which is the second color light, and the second light control part CCP2 may provide green light which is the third color light. The third light control part CCP3 may provide blue light by transmitting the blue light which is the first color light provided from the light emitting device ED. For example, the first quantum dot QD1 may be a red quantum dot, and the second quantum dot QD2 may be a green quantum dot. The same descriptions as provided above with respect to quantum dots may be applied to the quantum dots QD1 and QD2.

The light control layer CCL may further include a scatterer SP. The first light control part CCP1 may include the first quantum dot QD1 and the scatterer SP, the second light control part CCP2 may include the second quantum dot QD2 and the scatterer SP, and the third light control part CCP3 may not include any quantum dot but may include the scatterer SP.

The scatterer SP may be inorganic particles. For example, the scatterer SP may include at least one of $TiO_2$, ZnO, $Al_2O_3$, $SiO_2$, or hollow silica. The scatterer SP may include any one of $TiO_2$, ZnO, $Al_2O_3$, $SiO_2$, or hollow silica, or may be a mixture of at least two materials selected from $TiO_2$, ZnO, $Al_2O_3$, $SiO_2$, and hollow silica.

The first light control part CCP1, the second light control part CCP2, and the third light control part CCP3 may each include base resins BR1, BR2, and BR3 in which the quantum dots QD1 and QD2 and the scatterer SP are dispersed. In an embodiment, the first light control part CCP1 may include the first quantum dot QD1 and the scatterer SP dispersed in a first base resin BR1, the second light control part CCP2 may include the second quantum dot QD2 and the scatterer SP dispersed in a second base resin BR2, and the third light control part CCP3 may include the scatterer SP dispersed in a third base resin BR3. The base resins BR1, BR2, and BR3 may each be a medium in which the quantum dots QD1 and QD2 and the scatterer SP are dispersed, and may be formed of various resin compositions, which may be generally referred to as a binder. For example, the base resins BR1, BR2, and BR3 may each independently be acrylic-based resins, urethane-based resins, silicone-based resins, epoxy-based resins, etc. The base resins BR1, BR2, and BR3 may each be a transparent resin. In an embodiment, the first base resin BR1, the second base resin BR2, and the third base resin BR3 may each be the same as or different from each other.

The light control layer CCL may include a barrier layer BFL1. The barrier layer BFL1 may prevent penetration of moisture and/or oxygen (hereinafter, referred to as 'moisture/oxygen'). The barrier layer BFL1 may be disposed on the light control units CCP1, CCP2, and CCP3 to prevent the light control units CCP1, CCP2, and CCP3 from being exposed to moisture/oxygen. The barrier layer BFL1 may cover the light control units CCP1, CCP2, and CCP3. The barrier layer BFL1 may be provided between the light control units CCP1, CCP2, and CCP3 and the color filter layer CFL.

The barrier layers BFL1 and BFL2 may each include at least one inorganic layer. For example, the barrier layers BFL1 and BFL2 may each include an inorganic material. For example, the barrier layers BFL1 and BFL2 may each independently include a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, a silicon oxynitride, a metal thin film which secures a transmittance, etc. The barrier layers BFL1 and BFL2 may each further include an organic film. The barrier layers BFL1 and BFL2 may each be formed of a single layer or of multiple layers.

In the display apparatus DD of an embodiment, the color filter layer CFL may be disposed on the light control layer CCL. In an embodiment, the color filter layer CFL may be directly disposed on the light control layer CCL. For example, the barrier layer BFL2 may be omitted.

The color filter layer CFL may include a light shielding part BM and color filters CF1, CF2, and CF3. The color filter layer CFL may include a first filter CF1 that transmits the second color light, a second filter CF2 that transmits the third color light, and a third filter CF3 that transmits the first color light. For example, the first filter CF1 may be a red filter, the second filter CF2 may be a green filter, and the third filter CF3 may be a blue filter. The filters CF1, CF2, and CF3 may each include a polymeric photosensitive resin and a pigment or dye. The first filter CF1 may include a red pigment or dye, the second filter CF2 may include a green pigment or dye, and the third filter CF3 may include a blue pigment or dye. However, embodiments are not limited thereto, and the third filter CF3 may not include a pigment or dye. The third filter CF3 may include a polymeric photosensitive resin and may not include a pigment or dye. The third filter CF3 may be transparent. The third filter CF3 may be formed of a transparent photosensitive resin.

In an embodiment, the first filter CF1 and the second filter CF2 may each be a yellow filter. The first filter CF1 and the second filter CF2 may not be separated but may be provided as one filter.

The light shielding part BM may be a black matrix. The light shielding part BM may include an organic light shielding material or an inorganic light shielding material containing a black pigment or dye. The light shielding part BM may prevent light leakage, and may separate boundaries between the adjacent filters CF1, CF2, and CF3. In an embodiment, the light shielding part BM may be formed of a blue filter.

The first to third filters CF1, CF2, and CF3 may be disposed corresponding to the red light emitting region PXA-R, the green light emitting region PXA-G, and the blue light emitting region PXA-B, respectively.

A base substrate BL may be disposed on the color filter layer CFL. The base substrate BL may provide a base surface on which the color filter layer CFL, the light control layer CCL, and the like are disposed. The base substrate BL may be a glass substrate, a metal substrate, a plastic substrate, etc. However, embodiments are not limited thereto, and the base substrate BL may include an inorganic layer, an organic layer, or a composite material layer. Although not shown in the drawings, in an embodiment, the base substrate BL may be omitted.

FIG. 8 is a schematic cross-sectional view illustrating a part of a display apparatus according to an embodiment. FIG. 8 illustrates a schematic cross-sectional view of a part corresponding to the display panel DP of FIG. 7. In the display apparatus DD-TD of an embodiment, the light emitting device ED-BT may include light emitting structures OL-B1, OL-B2, and OL-B3. The light emitting device ED-BT may include a first electrode EL1 and a second electrode EL2 facing each other, and the light emitting structures OL-B1, OL-B2, and OL-B3 stacked in a thickness direction between the first electrode EL1 and the second electrode EL2. The light emitting structures OL-B1, OL-B2, and OL-B3 may each include an emission layer EML (FIG. 7) and a hole transport region HTR and an electron transport region ETR disposed with the emission layer EML (FIG. 7) therebetween.

For example, the light emitting device ED-BT included in the display apparatus DD-TD of an embodiment may be a light emitting device having a tandem structure and including multiple emission layers.

In an embodiment illustrated in FIG. 8, light respectively emitted from the light emitting structures OL-B1, OL-B2, and OL-B3 may all be blue light. However, embodiments are not limited thereto, and the light respectively emitted from the light emitting structures OL-B1, OL-B2, and OL-B3 may have wavelength ranges that are different from each other. For example, the light emitting device ED-BT including the light emitting structures OL-B1, OL-B2, and OL-B3 which emit light having wavelength ranges different from each other may emit white light.

Charge generation layers CGL1 and CGL2 may be disposed between two neighboring light emitting structures among OL-B1, OL-B2, and OL-B3. The charge generation layers CGL1 and CGL2 may each independently include a p-type charge generation layer and/or an n-type charge generation layer.

Hereinafter, with reference to Examples and Comparative Examples, an amine compound according to an embodiment and a light emitting device of an embodiment will be described in detail. The Examples shown below are only illustrations for understanding the disclosure, and the scope thereof is not limited thereto.

EXAMPLES

1. Synthesis of Amine Compound

A synthesis method of an amine compound according to the present embodiment will be described in detail by illustrating the synthesis methods of Compounds 5, 8, 16, 37, 43, 112, 114, 121, 122, 198, 185, 54, 57, 92, 111, and 220. In the following descriptions, the synthesis method of the amine compound is provided as an example, but the synthesis method according to an embodiment is not limited to Examples below.

(1) Synthesis of Intermediate A to Intermediate N

Synthesis of Intermediate A

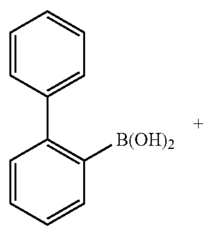

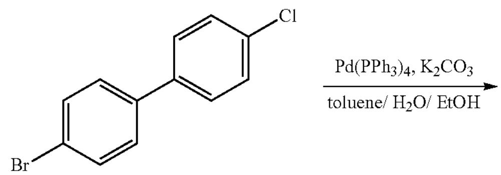

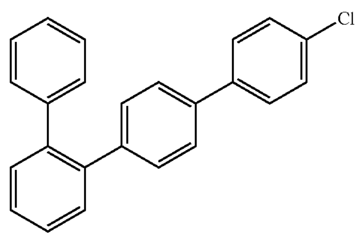

A

In an Ar atmosphere, 2-biphenylboronic acid (20.0 g), 4-bromo-4'-chloro-1,1'-biphenyl (27.0 g), tetrakis(triphenylphosphine)palladium(0) ($Pd(PPh_3)_4$, 5.8 g), and potassium carbonate ($K_2CO_3$, 30 g) were added in a 2 L three-neck flask and dissolved in a mixed solution of toluene, water, and ethanol (10:2:1, 500 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate A (27.5 g, yield 80%). The molecular weight of Intermediate A measured by FAB-MS measurement was 340.

Synthesis of Intermediate B

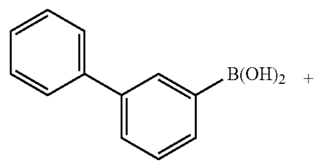

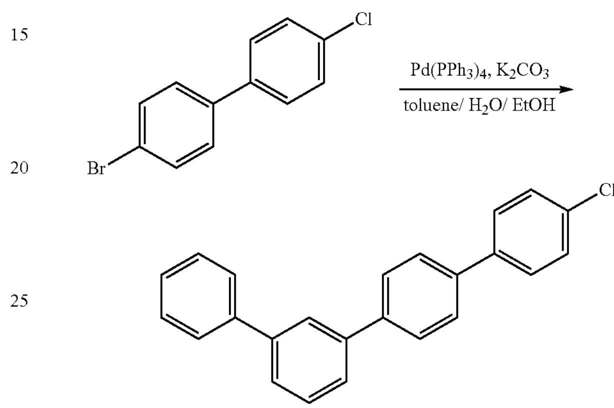

B

In an Ar atmosphere, 3-biphenylboronic acid (20.0 g), 4-bromo-4'-chloro-1,1'-biphenyl (27.0 g), $Pd(PPh_3)_4$ (5.8 g), and $K_2CO_3$ (30 g) were added in a 2 L three-neck flask and dissolved in a mixed solution of toluene, water, and ethanol (10:2:1, 500 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate B (26.8 g, yield 78%). The molecular weight of Intermediate B measured by FAB-MS measurement was 340.

Synthesis of Intermediate C

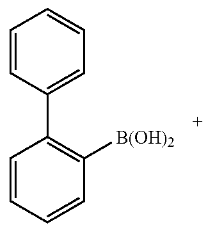

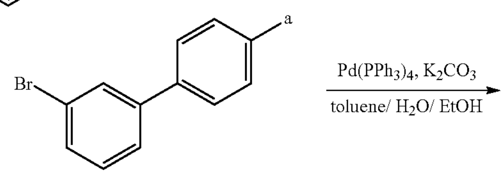

-continued

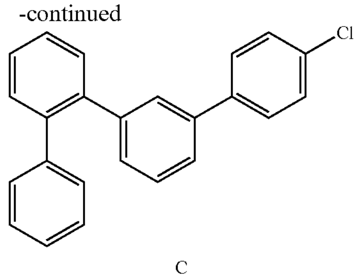

C

In an Ar atmosphere, 2-biphenylboronic acid (20.0 g), 3-bromo-4'-chloro-1,1'-biphenyl (27.0 g), $Pd(PPh_3)_4$ (5.8 g), and $K_2CO_3$ (30 g) were added in a 2 L three-neck flask and dissolved in a mixed solution of toluene, water, and ethanol (10:2:1, 500 mL), and a resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate C (29.3 g, yield 85%). The molecular weight of Intermediate C measured by FAB-MS measurement was 340.

Synthesis of Intermediate D

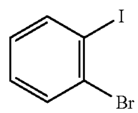

+

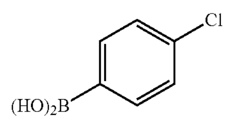

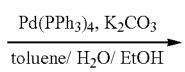

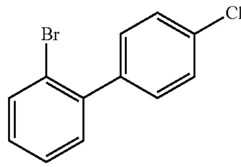

D

In an Ar atmosphere, 1-bromo-2-iodobenzene (25.0 g), 4-chlorophenylboronic acid (13.8 g), $Pd(PPh_3)_4$ (5.1 g), and $K_2CO_3$ (24.4 g) were added in a 1 L three-neck flask and dissolved in a mixed solvent of toluene, water, and ethanol (10:2:1, 350 mL), and the resultant mixture was heated and stirred at about 80° C. for about 4 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate D (22.1 g, yield 94%). The molecular weight of Intermediate D measured by FAB-MS measurement was 267.

Synthesis of Intermediate E

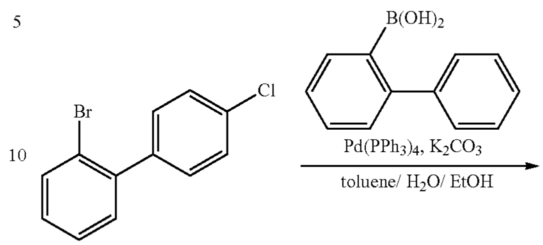

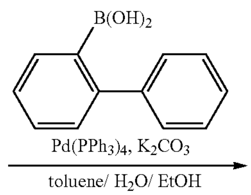

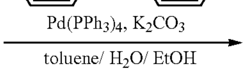

D

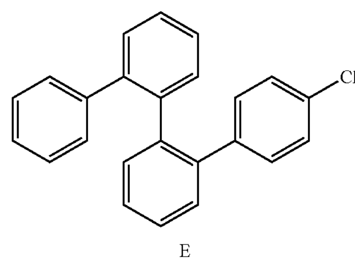

E

In an Ar atmosphere, Intermediate D (15.0 g), 2-biphenylboronic acid (11.1 g), $Pd(PPh_3)_4$ (6.5 g), and $K_2CO_3$ (15.5 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate E (12.4 g, yield 65%). The molecular weight of Intermediate E measured by FAB-MS measurement was 340.

Synthesis of Intermediate F

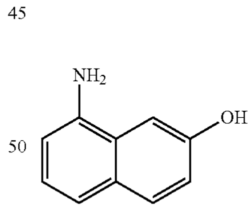

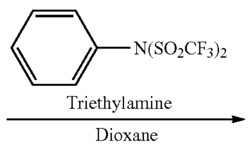

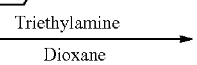

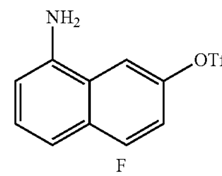

F

In an Ar atmosphere, 8-amino-2-naphthol (10.0 g) and triethylamine (12.0 mL) were added in a 1 L three-neck flask and dissolved in dioxane (200 mL) and a dioxane solution (80 mL) of N-phenylbis(trifluoromethanesulfonimide) (25.1 g) was dropped thereto. The resultant mixture was stirred at room temperature for about 4 hours, and hexane was added thereto to extract solid. The extracted solid was filtered and taken out to obtain Intermediate F (15.9 g, yield 87%). The molecular weight of Intermediate F measured by FAB-MS measurement was 291.

Synthesis of Intermediate G

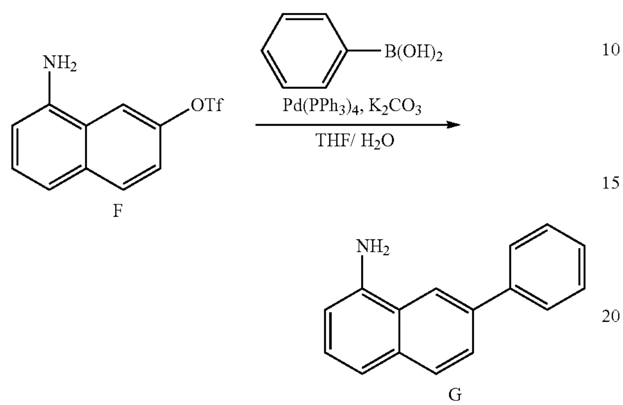

In an Ar atmosphere, Intermediate F (3.0 g), phenylboronic acid (1.67 g), $Pd(PPh_3)_4$ (0.4 g), and $K_2CO_3$ (2.85 g) were added in a 500 mL three-neck flask, and dissolved in a mixed solution of THF and water (8:2, 110 mL) and the resultant mixture was heated and stirred at about 70° C. for about 5 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate G (1.83 g, yield 81%). The molecular weight of Intermediate G measured by FAB-MS measurement was 219.

Synthesis of Intermediate H

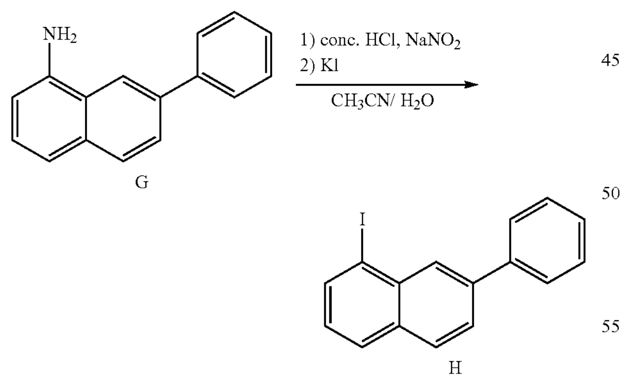

In an air atmosphere, Intermediate G (1.5 g) was added in a 300 mL three-neck flask and dissolved in acetonitrile/water (1:1, 13 mL). A concentrated hydrochloric acid (5.2 mL) and sodium nitrite (0.8 g) were added thereto, and the resultant mixture was stirred at about 0° C. for about 15 minutes. An aqueous solution (25 mL) of potassium iodide (9.4 g) was slowly added thereto, and the resultant mixture was stirred at about 0° C. for about 2 hours. The resultant mixture was extracted with $CH_2Cl_2$ to obtain organic layers. The obtained organic layers were combined and dried over $MgSO_4$, and the solvent was removed by distillation under reduced pressure. The resulting crude product was purified by silica gel column chromatography to obtain Intermediate H (1.29 g, yield 57%). The molecular weight of Intermediate H measured by FAB-MS measurement was 330.

Synthesis of Intermediate I

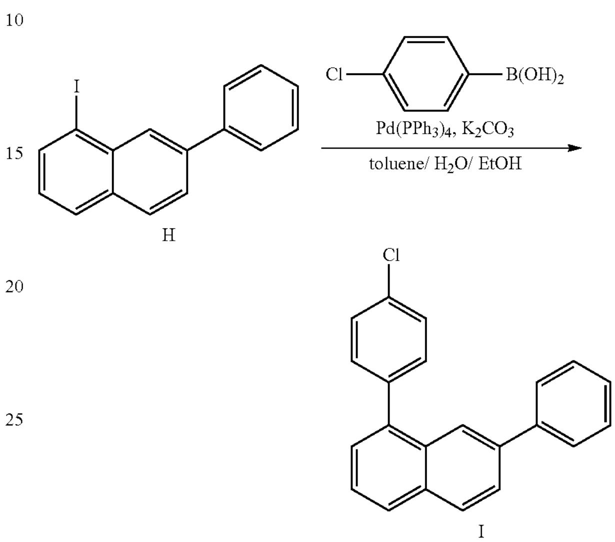

In an Ar atmosphere, Intermediate H (5.0 g), 4-chlorophenylboronic acid (2.37 g), $Pd(PPh_3)_4$ (0.9 g), and $K_2CO_3$ (4.2 g) were added in a 300 mL three-neck flask and dissolved in a mixed solvent of toluene, water, and ethanol (10:2:1, 100 mL), and the resultant mixture was heated and stirred at about 80° C. for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate I (3.62 g, yield 76%). The molecular weight of Intermediate I measured by FAB-MS measurement was 314.

Synthesis of Intermediate J

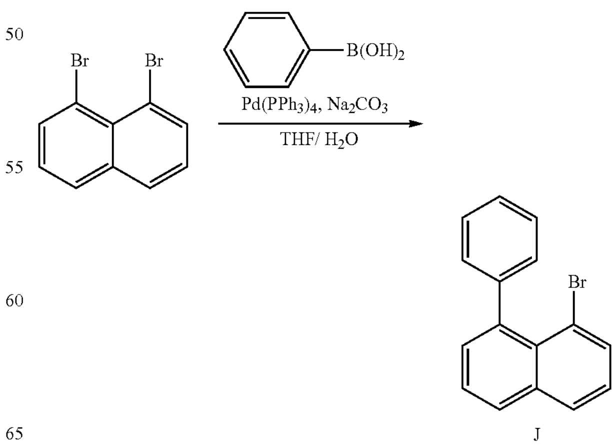

In an Ar atmosphere, 1,8-dibromonaphthalene (20.0 g), phenylboronic acid (8.52 g), $Pd(PPh_3)_4$ (4.0 g), and sodium carbonate ($Na_2CO_3$, 15 g) were added in a 1 L three-neck flask and dissolved in a mixed solution of THF and water (8:2, 350 mL), and the resultant mixture was heated and stirred at about 70° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate J (14.8 g, yield 75%). The molecular weight of Intermediate J measured by FAB-MS measurement was 283.

Synthesis of Intermediate K

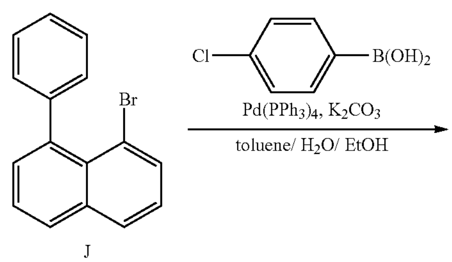

J

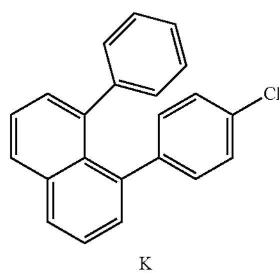

K

In an Ar atmosphere, Intermediate J (5.0 g), 4-chlorophenylboronic acid (2.76 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate K (3.17 g, yield 57%). The molecular weight of Intermediate K measured by FAB-MS measurement was 314.

Synthesis of Intermediate L

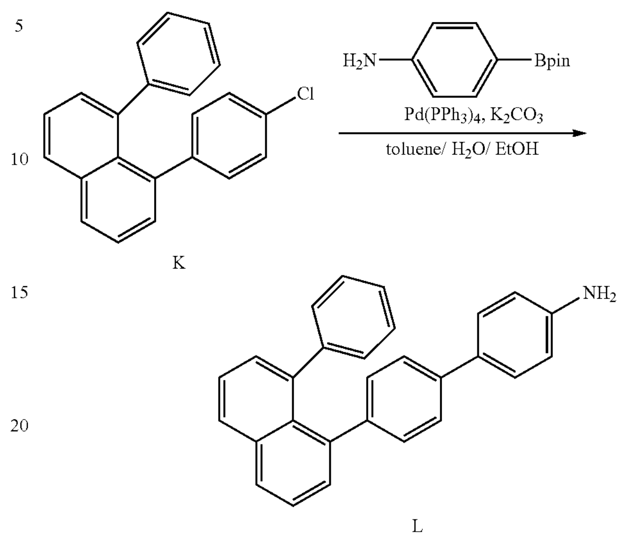

In an Ar atmosphere, Intermediate K (5.0 g), 4-(4,4,5,5-tetramethyl-1,3,2-dioxaborolan-2-yl)aniline (3.48 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate L (3.17 g, yield 57%). The molecular weight of Intermediate L measured by FAB-MS measurement was 371.

Synthesis of Intermediate M

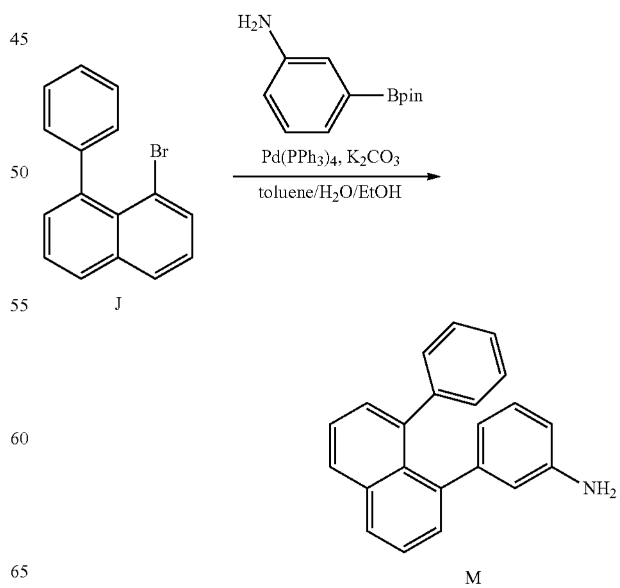

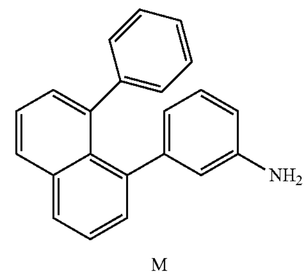

M

In an Ar atmosphere, Intermediate J (5.0 g), 3-(4,4,5,5-Tetramethyl-1,3,2-dioxaborolan-2-yl)aniline (3.87 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate M (2.87 g, yield 55%). The molecular weight of Intermediate M measured by FAB-MS measurement was 295.

Synthesis of Intermediate N

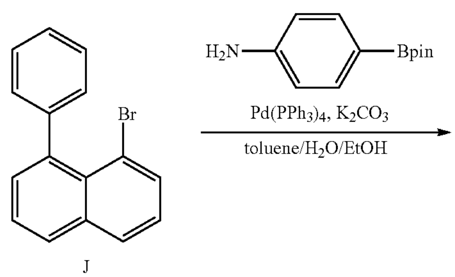

J

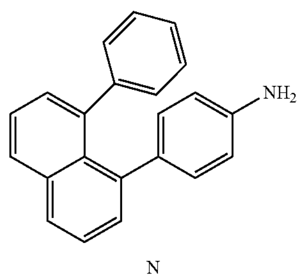

N

In an Ar atmosphere, Intermediate J (5.0 g), 4-(4,4,5,5-Tetramethyl-1,3,2-dioxaborolan-2-yl)aniline (3.8 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate N (2.09 g, yield 40%). The molecular weight of Intermediate N measured by FAB-MS measurement was 295.

(2) Synthesis of Compound 5

Synthesis of Intermediate O

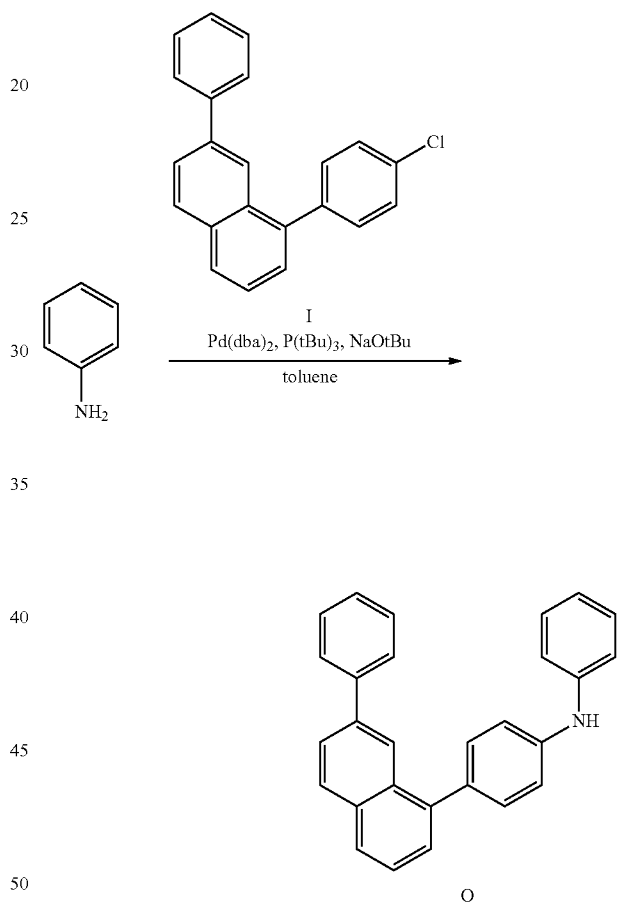

I

O

In an Ar atmosphere, aniline (1.0 g), Intermediate I (3.38 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate 0 (3.39 g, yield 85%). The molecular weight of Intermediate O measured by FAB-MS measurement was 371.

Synthesis of Compound 5

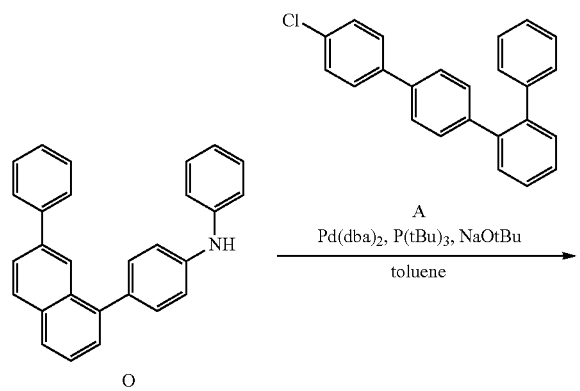

O

A

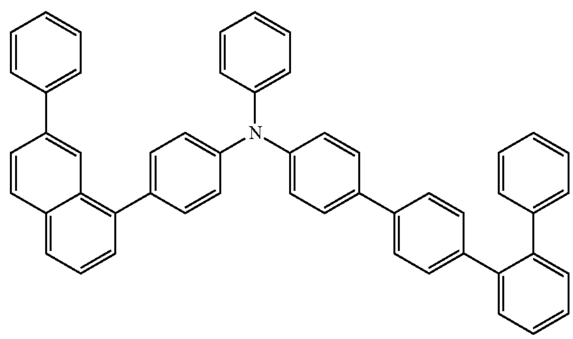

5

In an Ar atmosphere, Intermediate 0 (1.5 g), Intermediate A (1.51 g), Pd(dba)$_2$ (0.1 g), and NaOtBu (0.6 g) were added in a 200 mL three-neck flask and dissolved in toluene (50 mL), P(tBu)$_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 5 (2.16 g, yield 79%). The molecular weight of Compound 5 measured by FAB-MS measurement was 675.

(3) Synthesis of Compound 8

Synthesis of Intermediate P

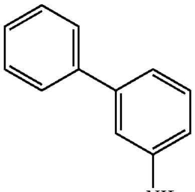

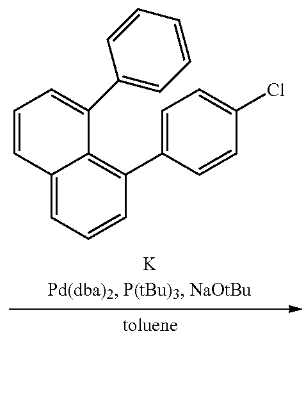

K

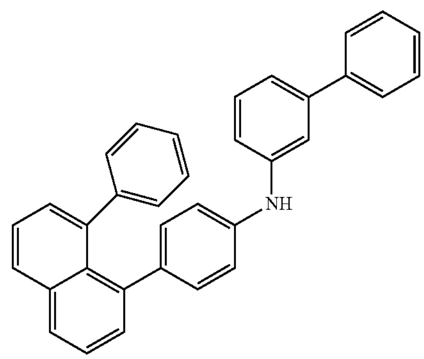

P

In an Ar atmosphere, 3-aminobiphenyl (1.5 g), Intermediate K (2.79 g), Pd(dba)$_2$ (0.3 g), and NaOtBu (1.1 g) were added in a 200 mL three-neck flask and dissolved in toluene (50 mL), P(tBu)$_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate P (2.74 g, yield 69%). The molecular weight of Intermediate P measured by FAB-MS measurement was 447.

Synthesis of Compound 8

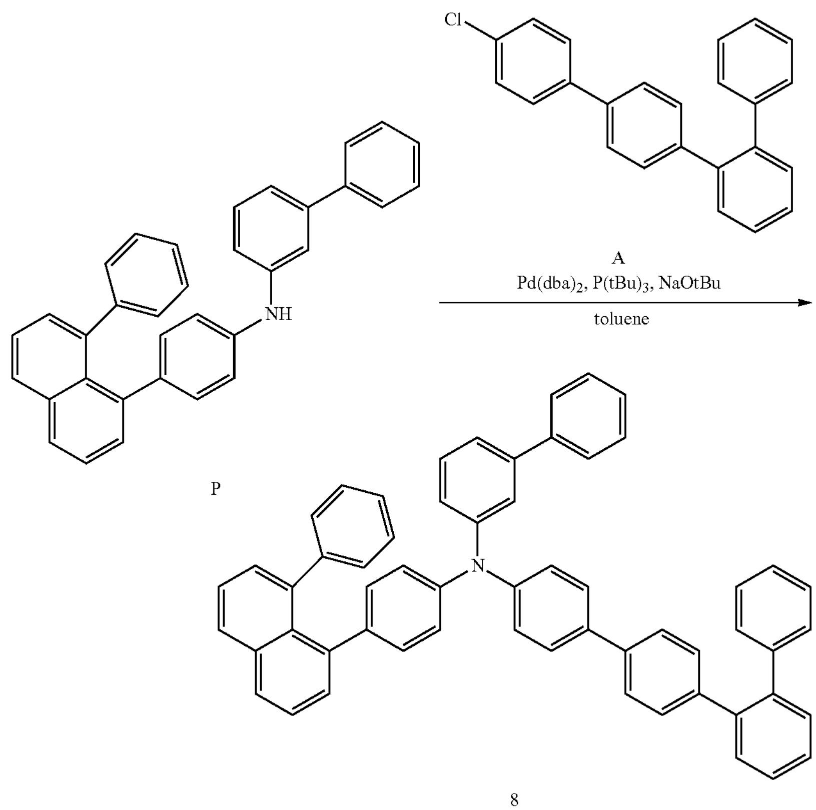

A

P

8

In an Ar atmosphere, Intermediate P (1.5 g), Intermediate A (1.25 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 8 (2.12 g, yield 84%). The molecular weight of Compound 8 measured by FAB-MS measurement was 751.

(4) Synthesis of Compound 16

Synthesis of Intermediate Q

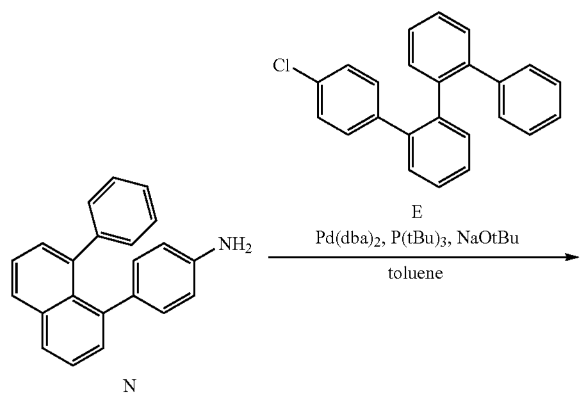

E

N

-continued

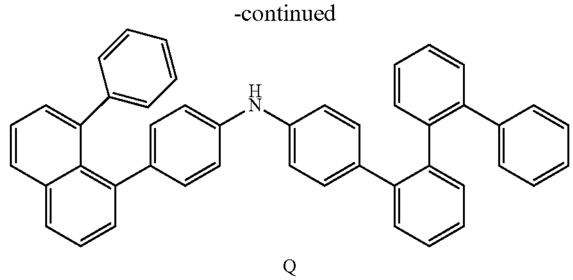

Q

In an Ar atmosphere, Intermediate N (1.5 g), Intermediate E (1.73 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate Q (1.98 g, yield 65%). The molecular weight of Intermediate Q measured by FAB-MS measurement was 599.

Synthesis of Compound 16

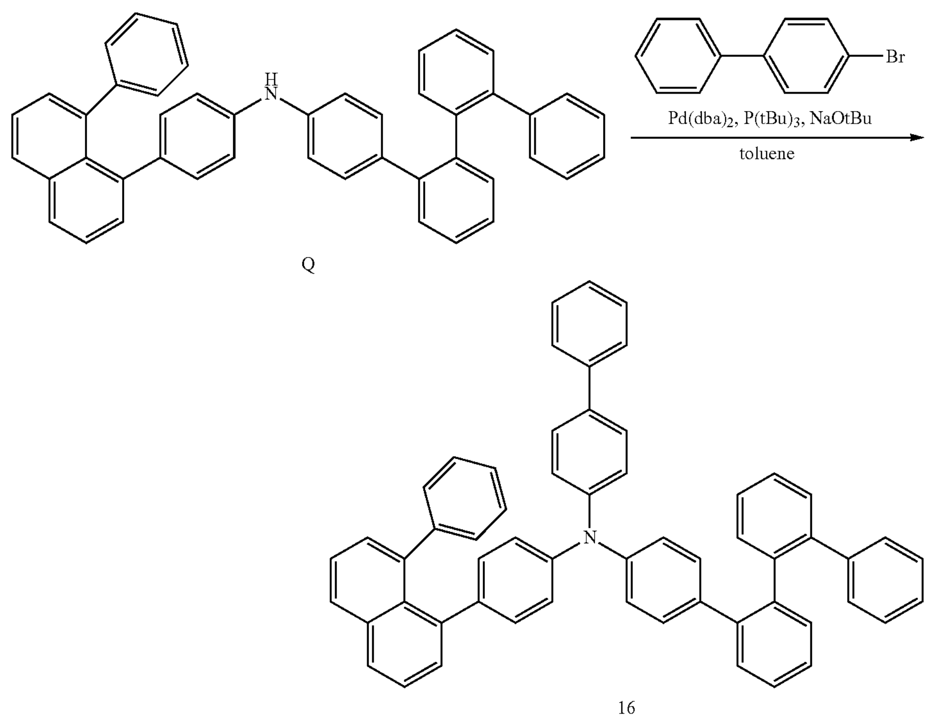

Q

16

In an Ar atmosphere, Intermediate Q (1.5 g), 4-bromobiphenyl (0.64 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 16 (1.58 g, yield 84%). The molecular weight of Compound 16 measured by FAB-MS measurement was 751.

(5) Synthesis of Compound 37

Synthesis of Intermediate R

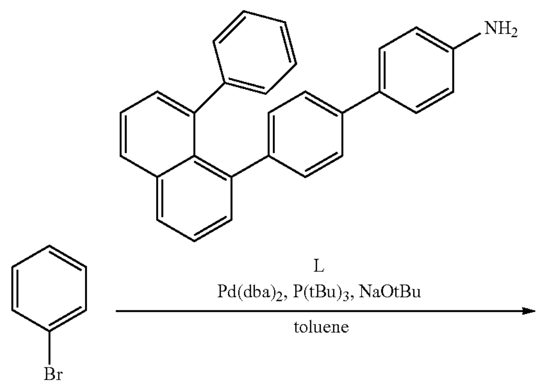

L

-continued

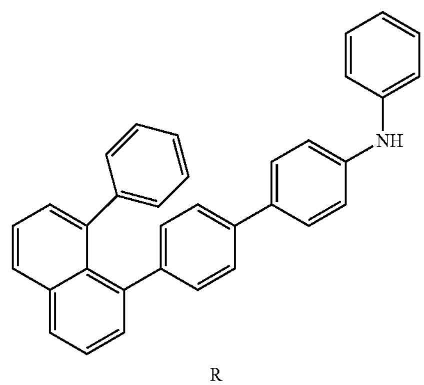

R

In an Ar atmosphere, bromobenzene (1.0 g), Intermediate L (2.36 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate R (1.57 g, yield 55%). The molecular weight of Intermediate R measured by FAB-MS measurement was 447.

Synthesis of Compound 37

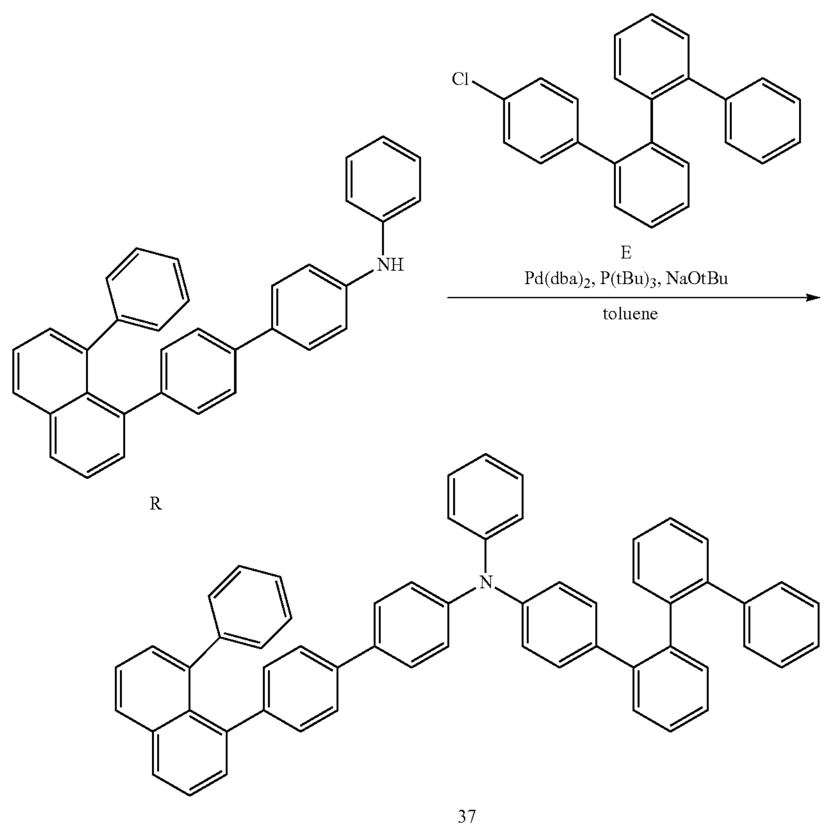

E

R

37

In an Ar atmosphere, Intermediate R (1.5 g), Intermediate E (1.25 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 37 (2.02 g, yield 80%). The molecular weight of Compound 37 measured by FAB-MS measurement was 751.

(6) Synthesis of Compound 43

Synthesis of Intermediate S

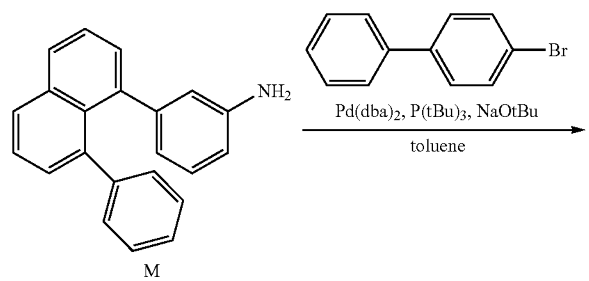

M

-continued

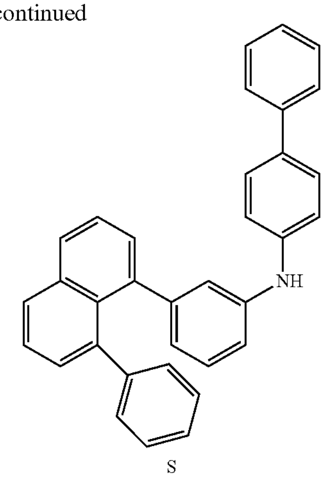

S

In an Ar atmosphere, Intermediate M (1.5 g), 4-bromobiphenyl (1.19 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate S (1.57 g, yield 59%). The molecular weight of Intermediate S measured by FAB-MS measurement was 447.

Synthesis of Compound 43

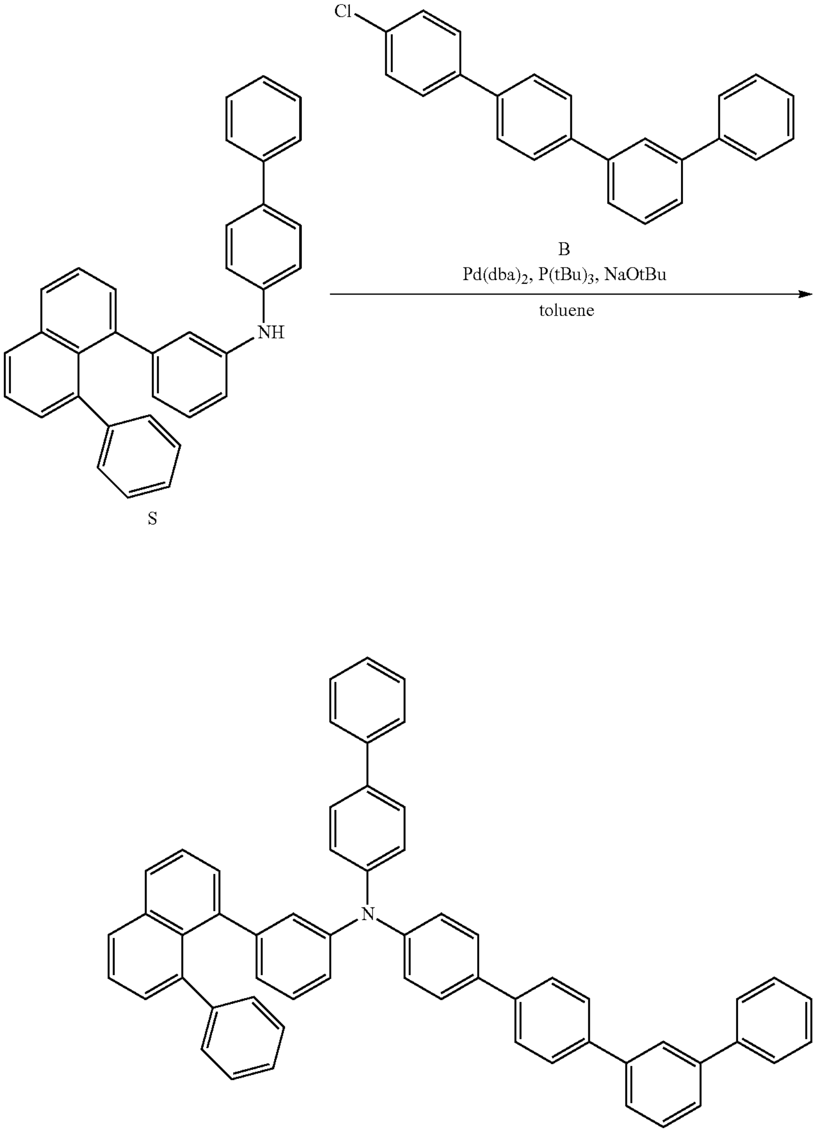

43

In an Ar atmosphere, Intermediate S (1.5 g), Intermediate B (1.26 g), Pd(dba)$_2$ (0.1 g), and NaOtBu (0.6 g) were added in a 200 mL three-neck flask and dissolved in toluene (50 mL), P(tBu)$_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 43 (1.99 g, yield 79%). The molecular weight of Compound 43 measured by FAB-MS measurement was 751.

(7) Synthesis of Compound 112

Synthesis of Intermediate T

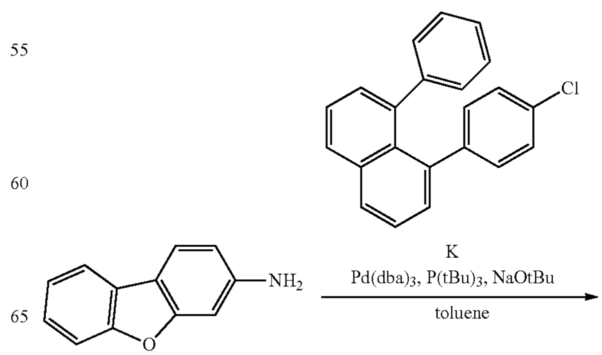

-continued

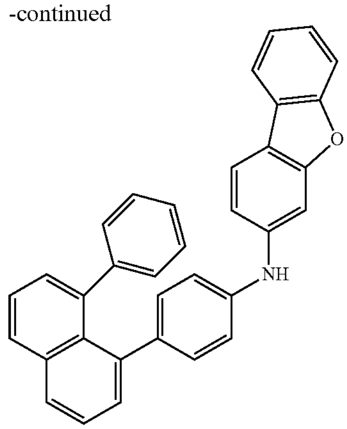

T

In an Ar atmosphere, 3-aminodibenzofuran (1.5 g), Intermediate K (2.58 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate T (2.68 g, yield 71%). The molecular weight of Intermediate T measured by FAB-MS measurement was 461.

Synthesis of Compound 112

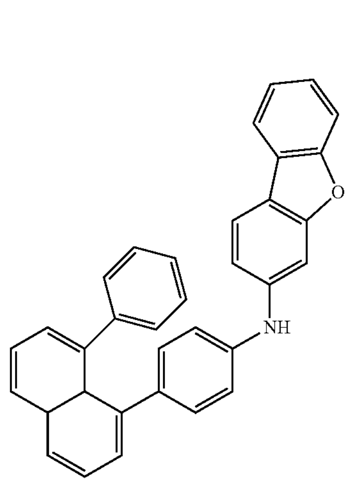

T

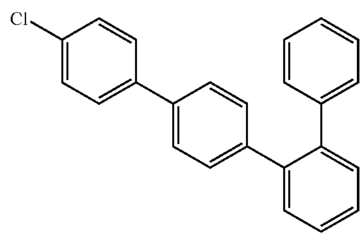

A $Pd(dba)_3$, $P(tBu)_3$, NaOtBu toluene

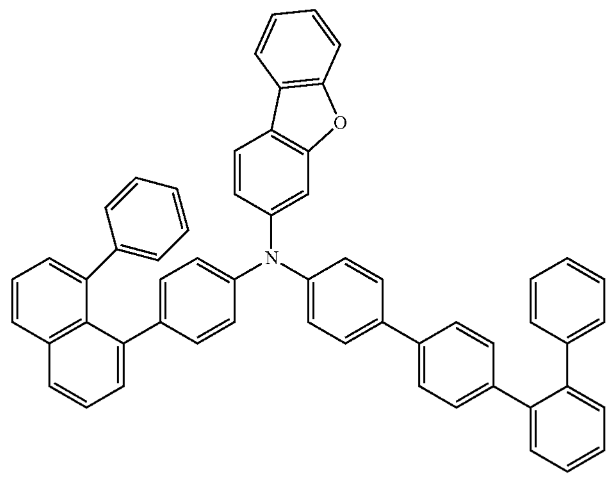

112

In an Ar atmosphere, Intermediate T (1.5 g), Intermediate A (1.22 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 112 (1.99 g, yield 80%). The molecular weight of Compound 112 measured by FAB-MS measurement was 765.

(8) Synthesis of Compound 114

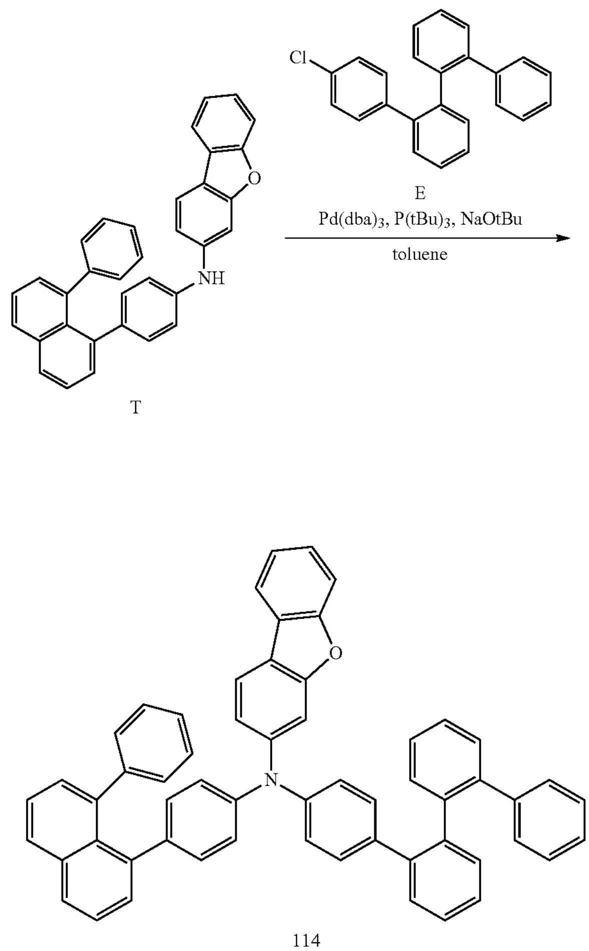

E

T

114

In an Ar atmosphere, Intermediate T (1.5 g), Intermediate E (1.22 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 114 (2.07 g, yield 83%). The molecular weight of Compound 114 measured by FAB-MS measurement was 765.

(9) Synthesis of Compound 121

Synthesis of Intermediate U

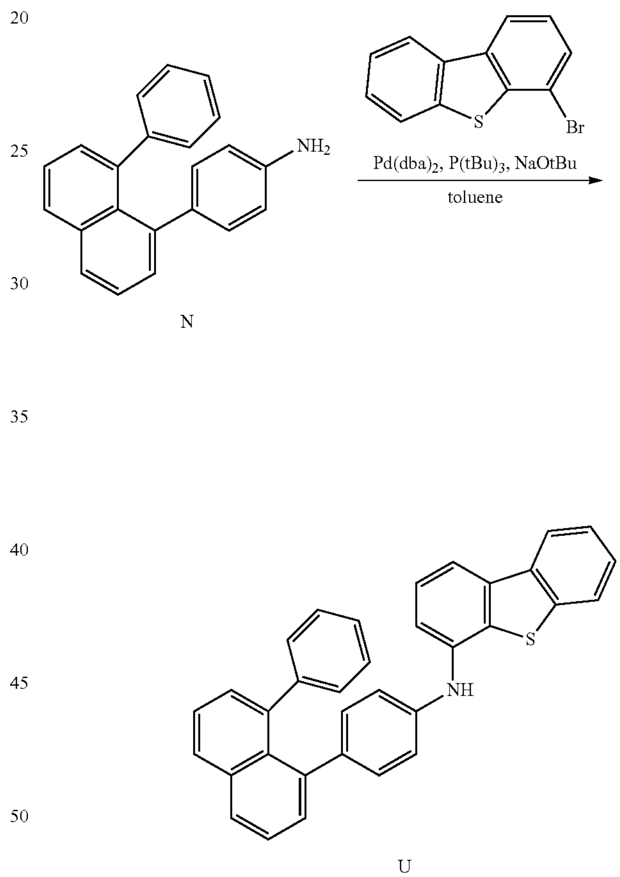

N

U

In an Ar atmosphere, Intermediate N (1.5 g), 4-bromodibenzothiophene (1.34 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate U (1.87 g, yield 77%). The molecular weight of Intermediate U measured by FAB-MS measurement was 477.

Synthesis of Compound 121

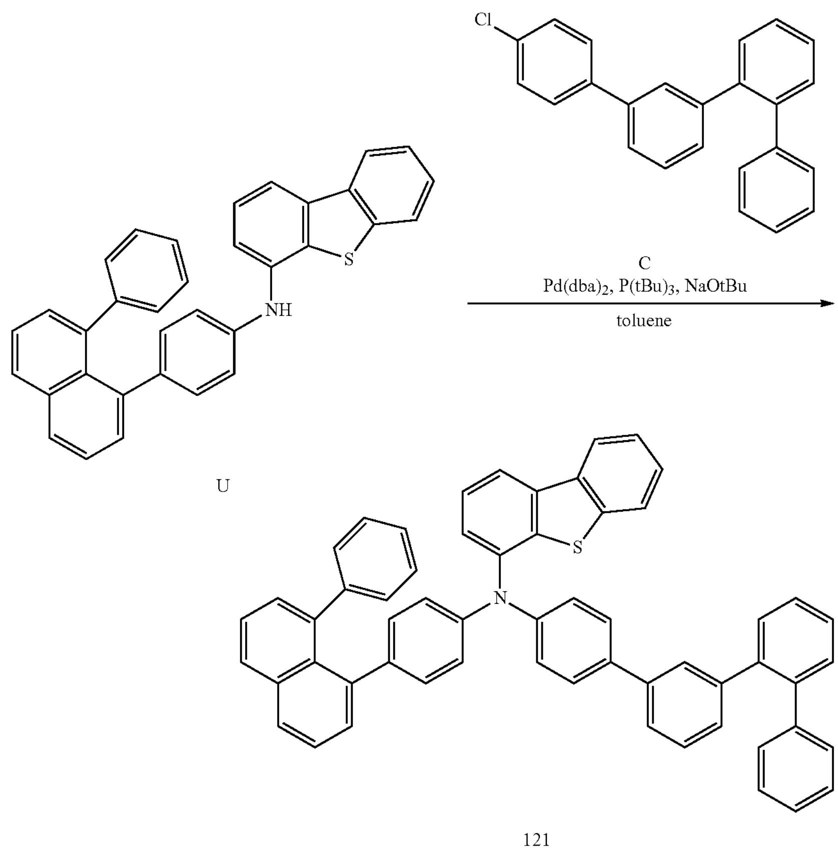

U

121

In an Ar atmosphere, Intermediate U (1.5 g), Intermediate C (1.18 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 121 (1.89 g, yield 77%). The molecular weight of Compound 121 measured by FAB-MS measurement was 782.

(10) Synthesis of Compound 122

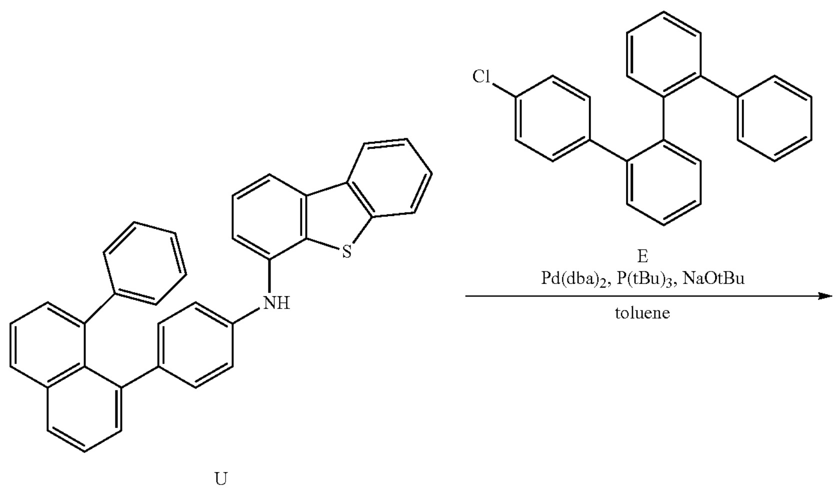

U

-continued

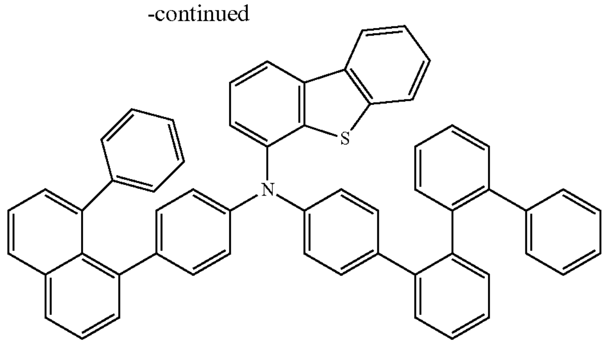

122

In an Ar atmosphere, Intermediate U (1.5 g), Intermediate E (1.18 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 122 (1.96 g, yield 80%). The molecular weight of Compound 122 measured by FAB-MS measurement was 782.

(11) Synthesis of Compound 198

Synthesis of Intermediate V

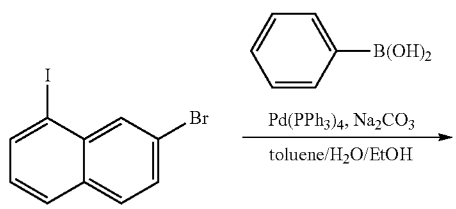

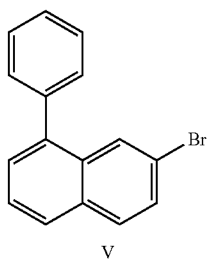

V

In an Ar atmosphere, 8-Iodo-2-bromonaphthalene (25.0 g), phenylboronic acid (10.1 g), $Pd(PPh_3)_4$ (4.3 g), and $K_2CO_3$ (22 g) were added in a 1 L three-neck flask and dissolved in a mixed solvent of toluene, water, and ethanol (10:2:1, 350 mL), and the resultant mixture was heated and stirred at about 80° C. for about 4 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate V (16.0 g, yield 75%). The molecular weight of Intermediate V measured by FAB-MS measurement was 283.

Synthesis of Intermediate W

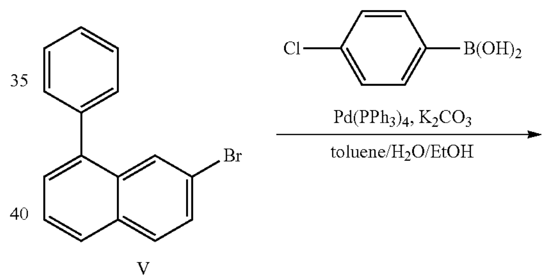

V

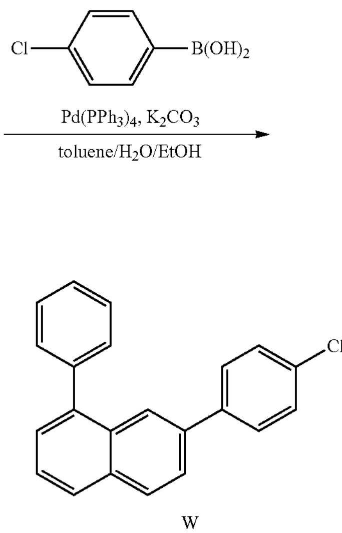

W

In an Ar atmosphere, Intermediate V (13.0 g), 4-chlorophenylboronic acid (7.9 g), $Pd(PPh_3)_4$ (2.7 g), and $K_2CO_3$ (13 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate W (11.7 g, yield 81%). The molecular weight of Intermediate W measured by FAB-MS measurement was 314.

Synthesis of Intermediate X

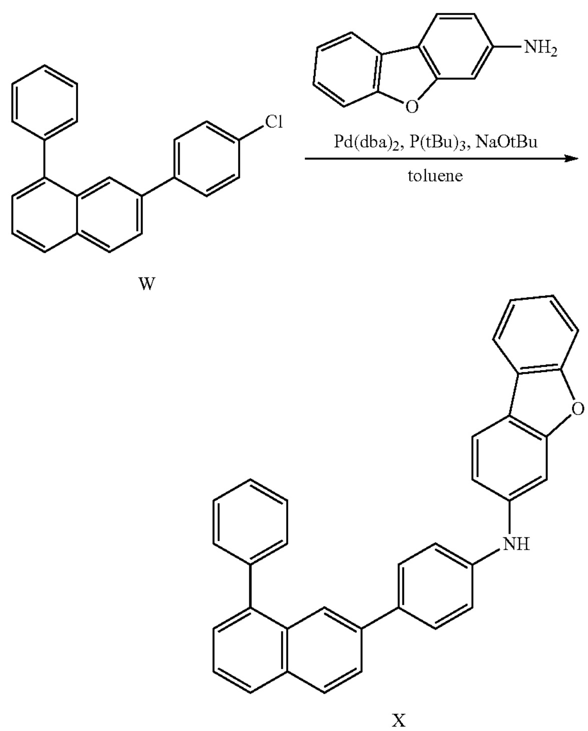

W

X

In an Ar atmosphere, Intermediate W (1.5 g), 3-aminodibenzofuran (0.87 g), Pd(dba)$_2$ (0.3 g), and NaOtBu (1.1 g) were added in a 200 mL three-neck flask and dissolved in toluene (50 mL), P(tBu)$_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate X (1.54 g, yield 70%). The molecular weight of Intermediate X measured by FAB-MS measurement was 461.

Synthesis of Compound 198

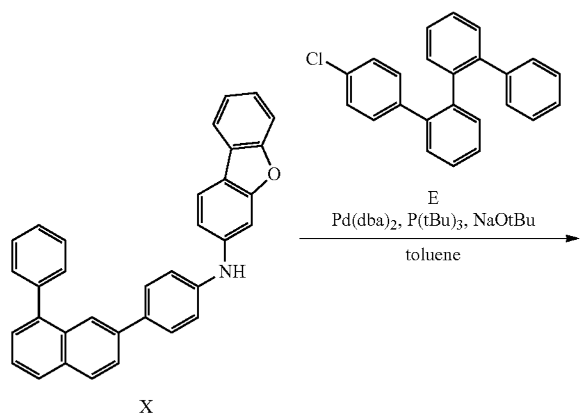

E

X

-continued

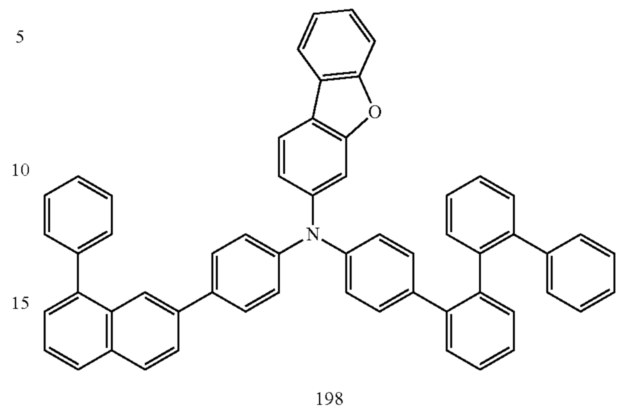

198

In an Ar atmosphere, Intermediate X (1.5 g), Intermediate E (1.11 g), Pd(dba)$_2$ (0.1 g), and NaOtBu (0.6 g) were added in a 200 mL three-neck flask and dissolved in toluene (50 mL), P(tBu)$_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 198 (2.09 g, yield 84%). The molecular weight of Compound 198 measured by FAB-MS measurement was 765.

(12) Synthesis of Compound 185

Synthesis of Intermediate Y

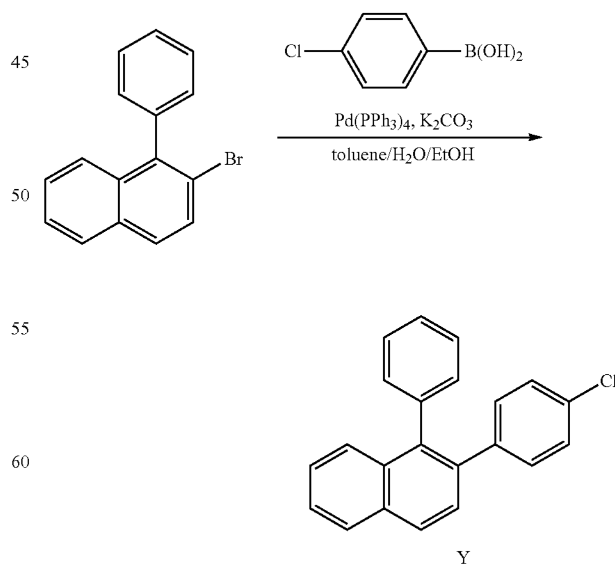

Y

In an Ar atmosphere, 2-bromo-1-phenylnaphthalene (5.0 g), 4-chlorophenylboronic acid (2.76 g), Pd(PPh$_3$)$_4$ (2.7 g), and $K_2CO_3$ (13 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate Y (4.06 g, yield 73%). The molecular weight of Intermediate Y measured by FAB-MS measurement was 314.

Synthesis of Intermediate Z

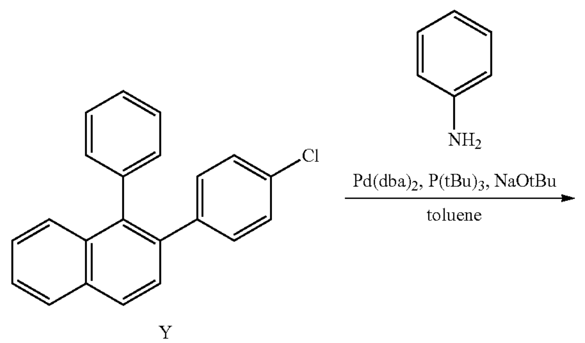

Y

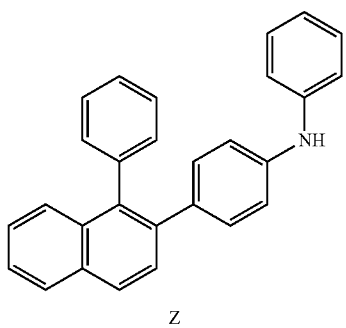

Z

In an Ar atmosphere, aniline (0.9 g), Intermediate Y (3.0 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate Z (2.58 g, yield 73%). The molecular weight of Intermediate Z measured by FAB-MS measurement was 371.

Synthesis of Compound 185

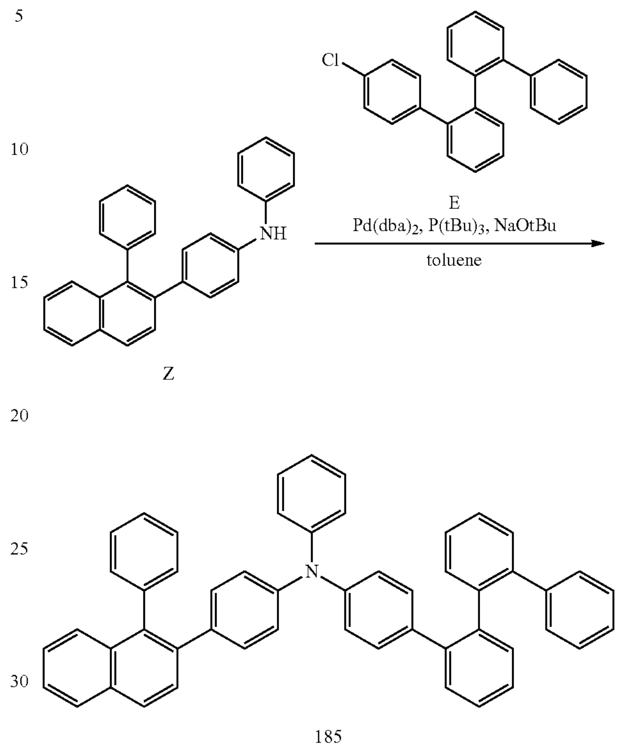

E

Z

185

In an Ar atmosphere, Intermediate Z (1.5 g), Intermediate E (1.37 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 185 (2.18 g, yield 80%). The molecular weight of Compound 185 measured by FAB-MS measurement was 675.

(13) Synthesis of Compound 54

Synthesis of Intermediate AA

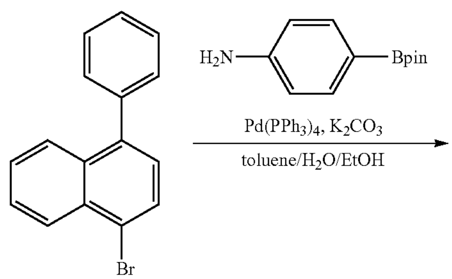

-continued

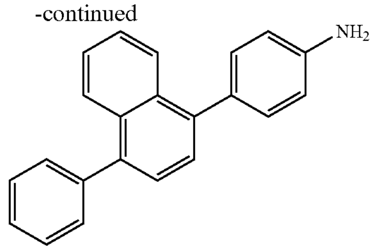

AA

In an Ar atmosphere, 1-bromo-4-phenylnaphthalene (10.0 g), 4-(4,4,5,5-Tetramethyl-1,3,2-dioxaborolan-2-yl)aniline (7.73 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AA (6.68 g, yield 64%). The molecular weight of Intermediate AA measured by FAB-MS measurement was 295.

Synthesis of Intermediate AB

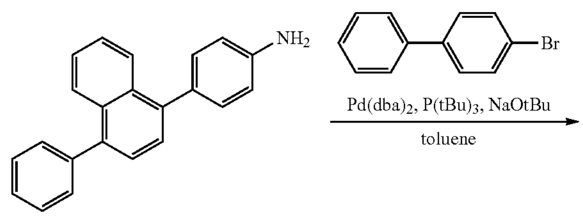

AA

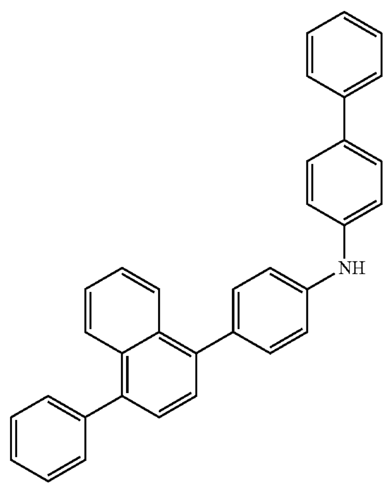

AB

In an Ar atmosphere, Intermediate AA (3.0 g), 4-bromobiphenyl (2.37 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AB (3.45 g, yield 76%). The molecular weight of Intermediate AB measured by FAB-MS measurement was 447.

Synthesis of Compound 54

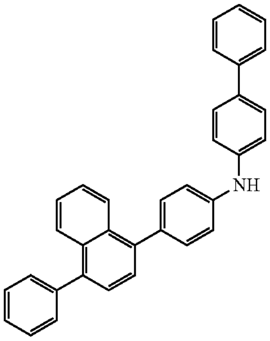

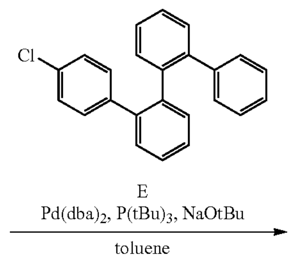

AB

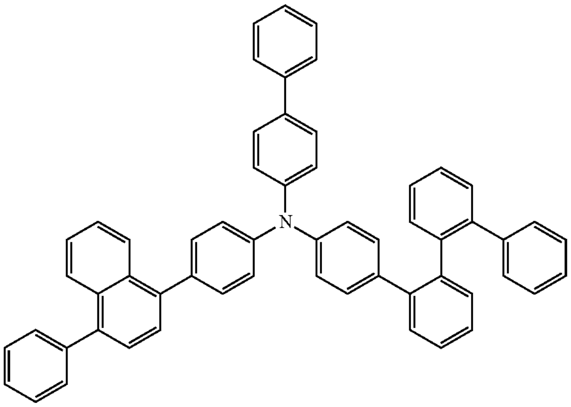

54

In an Ar atmosphere, Intermediate AB (1.5 g), Intermediate E (1.14 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 54 (2.02 g, yield 80%). The molecular weight of Compound 54 measured by FAB-MS measurement was 751.

(14) Synthesis of Compound 57

Synthesis of Intermediate AC

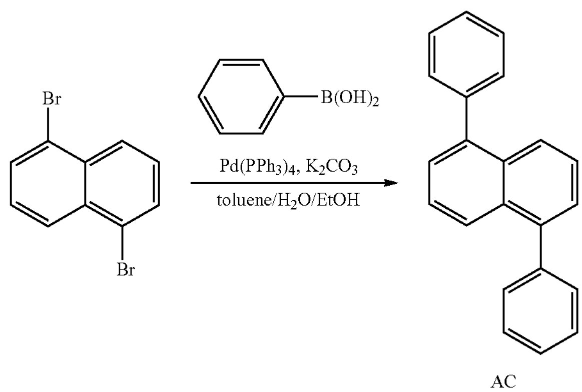

AC

In an Ar atmosphere, 1,5-dibromonaphthalene (20.0 g), phenylboronic acid (17.05 g), $Pd(PPh_3)_4$ (8.1 g), and $K_2CO_3$ (39 g) were added in a 1 L three-neck flask and dissolved in a mixed solvent of toluene water, and ethanol (10:2:1, 500 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AC (15.7 g, yield 80%). The molecular weight of Intermediate AC measured by FAB-MS measurement was 280.

Synthesis of Intermediate AD

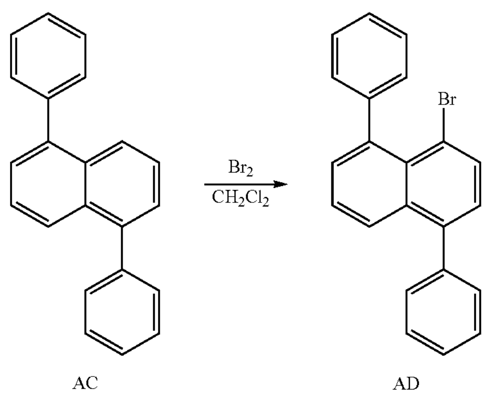

AC AD

In an Ar atmosphere, Intermediate AC (15.0 g) was added in a 500 mL three-neck flask and dissolved in $CH_2Cl_2$ (100 mL), and the resultant mixture was stirred at about 0° C. A solution in which $Br_2$ (9.4 g) was dissolved in $CH_2Cl_2$ (50 mL) was slowly added thereto. The resultant mixture was stirred at room temperature for about 3 hours, and extracted with $CH_2Cl_2$ by adding a $NaHCO_3$ aqueous solution to obtain organic layers. The obtained organic layers were combined and dried over $MgSO_4$, and the solvent was removed by distillation under reduced pressure. The resulting crude product was washed with acetone to obtain Intermediate AD (17.3 g, yield 90%). The molecular weight of Intermediate AD measured by FAB-MS measurement was 359.

Synthesis of Intermediate AE

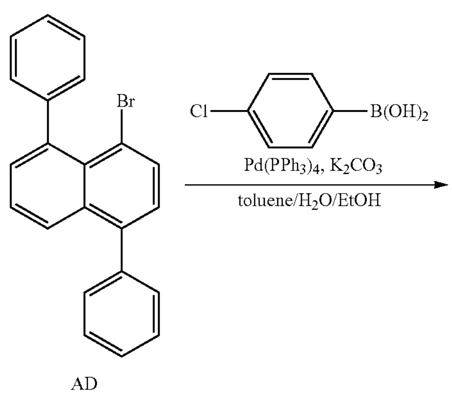

AD

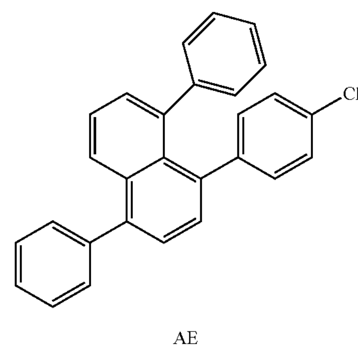

AE

In an Ar atmosphere, Intermediate AD (5.0 g), 4-chlorophenylboronic acid (2.18 g), $Pd(PPh_3)_4$ (2.7 g), and $K_2CO_3$ (13 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AE (4.24 g, yield 78%). The molecular weight of Intermediate AE measured by FAB-MS measurement was 390.

Synthesis of Intermediate AF

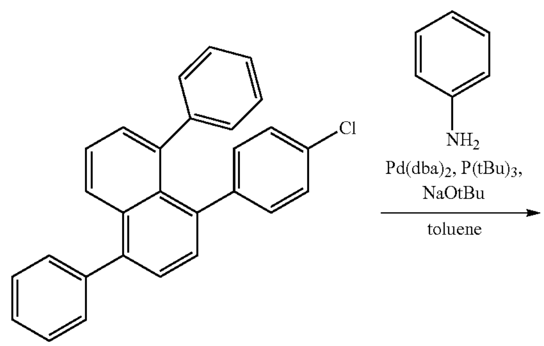

AE

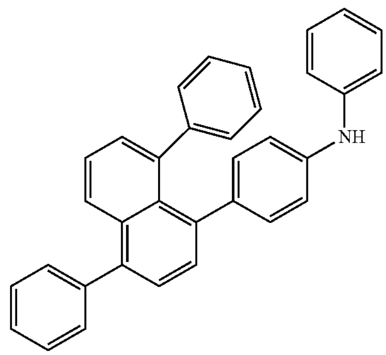

AF

In an Ar atmosphere, aniline (0.71 g), Intermediate AE (3.0 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AF (2.40 g, yield 70%). The molecular weight of Intermediate AF measured by FAB-MS measurement was 447.

Synthesis of Compound 57

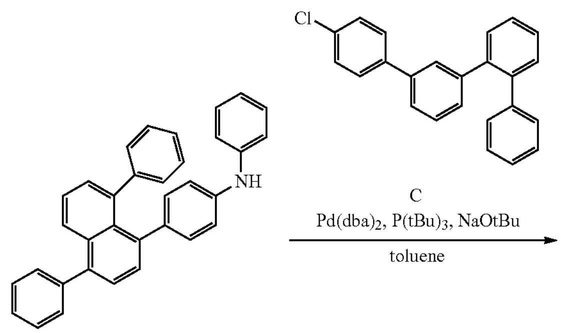

AF

-continued

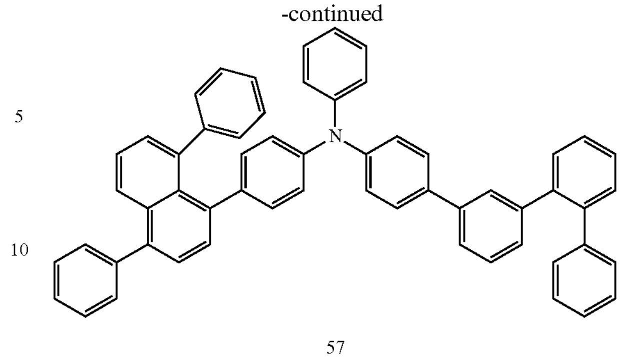

57

In an Ar atmosphere, Intermediate AF (1.5 g), Intermediate C (1.14 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 57 (2.07 g, yield 82%). The molecular weight of Compound 57 measured by FAB-MS measurement was 751.

(15) Synthesis of Compound 92

Synthesis of Intermediate AG

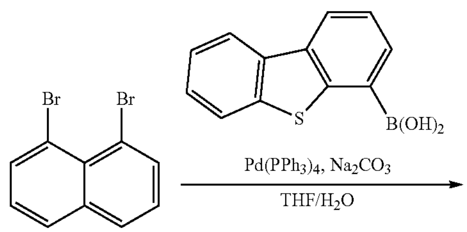

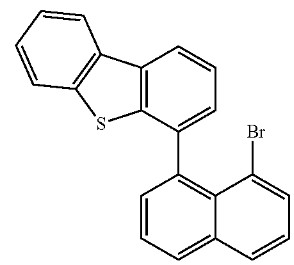

AG

In an Ar atmosphere, 1,8-dibromonaphthalene (10.0 g), dibenzothiophen-4-ylboronic acid (7.97 g), $Pd(PPh_3)_4$ (4.0 g), and $Na_2CO_3$ (15 g) were added in a 1 L three-neck flask and dissolved in a mixed solution of THF and water (8:2, 350 mL), and the resultant mixture was heated and stirred at about 70° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AG (9.12 g, yield 67%). The molecular weight of Intermediate AG measured by FAB-MS measurement was 389.

Synthesis of Intermediate AH

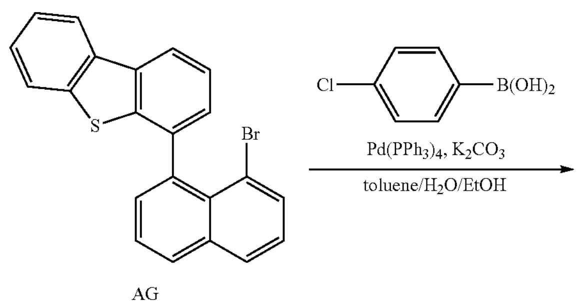

AG

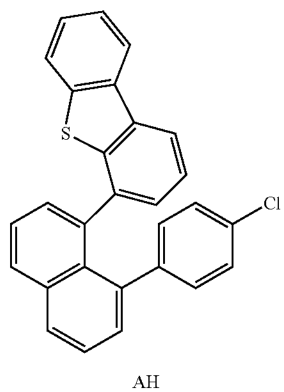

AH

In an Ar atmosphere, Intermediate AG (5.0 g), 4-chlorophenylboronic acid (2.01 g), $Pd(PPh_3)_4$ (2.7 g), and $K_2CO_3$ (13 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AH (3.14 g, yield 58%). The molecular weight of Intermediate AH measured by FAB-MS measurement was 420.

Synthesis of Intermediate AI

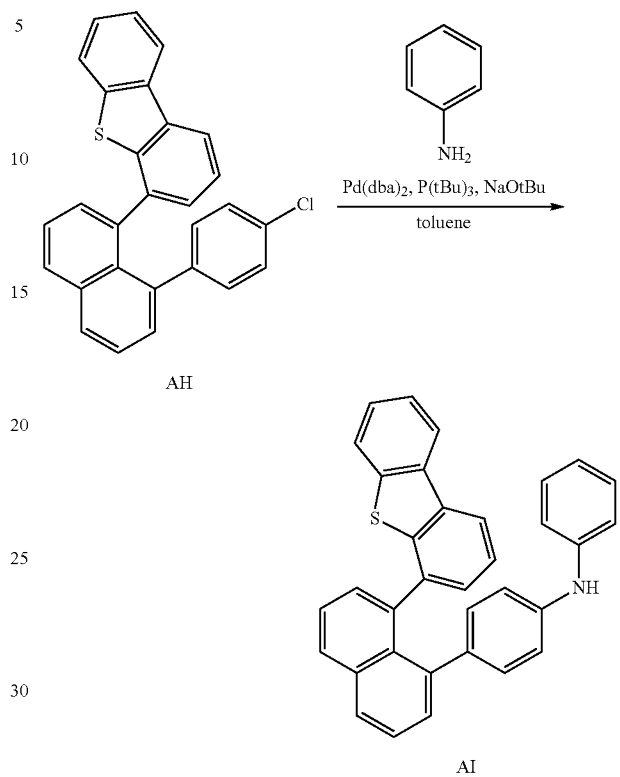

AH

AI

In an Ar atmosphere, aniline (0.66 g), Intermediate AH (3.0 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AI (2.66 g, yield 78%). The molecular weight of Intermediate AI measured by FAB-MS measurement was 477.

Synthesis of Compound 92

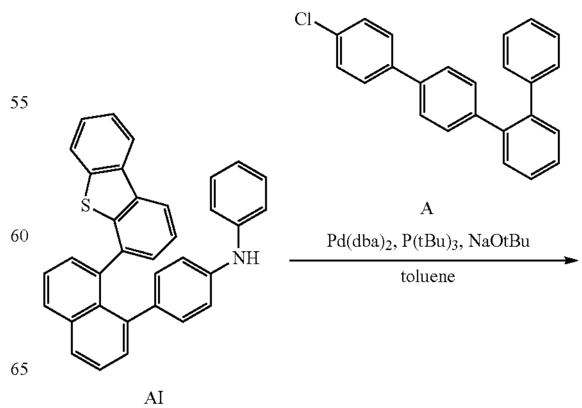

A

AI

-continued

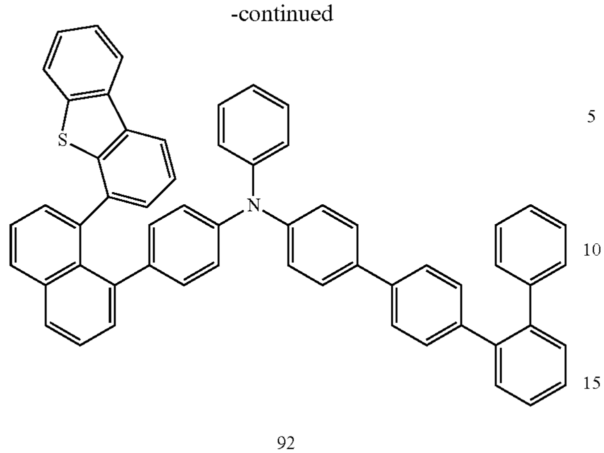

92

In an Ar atmosphere, Intermediate AI (1.5 g), Intermediate A (1.07 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 92 (1.79 g, yield 73%). The molecular weight of Compound 92 measured by FAB-MS measurement was 782.

(16) Synthesis of Compound 111

Synthesis of Intermediate AJ

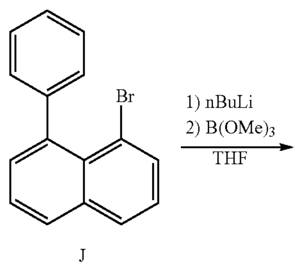

J

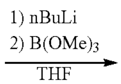

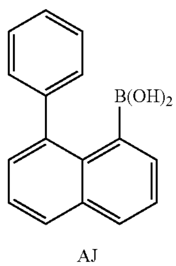

AJ

In an Ar atmosphere, Intermediate J (10.0 g) was added in a 500 mL three-neck flask, dissolved in THF (100 mL), and cooled to about −78° C., and an n-BuLi hexane solution (1.6 M, 33 mL) was dropped and the resultant mixture was stirred for about 1 hour, stirred at about −78° C. for about 1 hour by adding $B(OMe)_3$ (19.8 g), and stirred at room temperature for about 3 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was washed with acetone to obtain Intermediate AJ (6.22 g, yield 71%). The molecular weight of Intermediate AJ measured by FAB-MS measurement was 248.

Synthesis of Intermediate AK

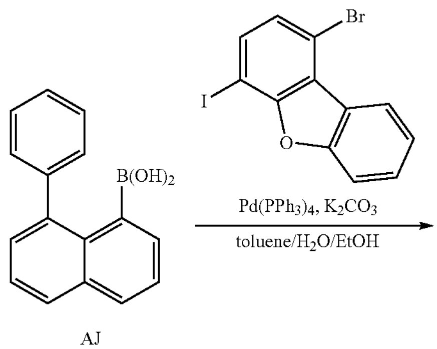

AJ

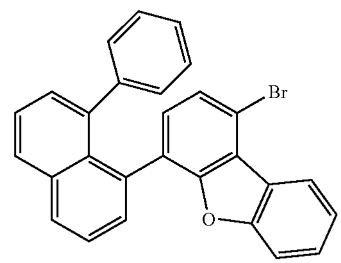

AK

In an Ar atmosphere, Intermediate AJ (5.0 g), 1-bromo-4-iododibenzofuran (7.52 g), $Pd(PPh_3)_4$ (2.7 g), and $K_2CO_3$ (13 g) were added in a 1 L three-neck flask and dissolved in a mixed solvent of toluene, water, and ethanol (10:2:1, 280 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AK (5.89 g, yield 65%). The molecular weight of Intermediate AK measured by FAB-MS measurement was 449.

Synthesis of Intermediate AL

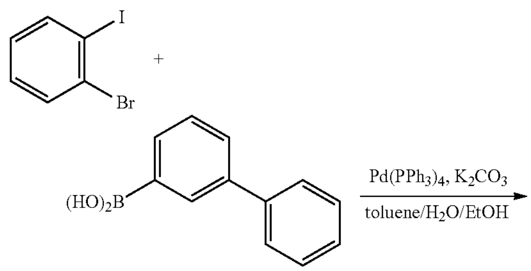

-continued

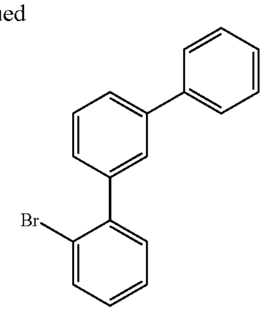

AL

In an Ar atmosphere, 1-bromo-2-iodobenzene (10.0 g), 3-biphenylboronic acid (7.00 g), $Pd(PPh_3)_4$ (5.1 g), and $K_2CO_3$ (24.4 g) were added in a 1 L three-neck flask and dissolved in a mixed solvent of toluene, water, and ethanol (10:2:1, 350 mL), and the resultant mixture was heated and stirred at about 80° C. for about 4 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AL (8.74 g, yield 80%). The molecular weight of Intermediate AL measured by FAB-MS measurement was 309.

Synthesis of Intermediate AM

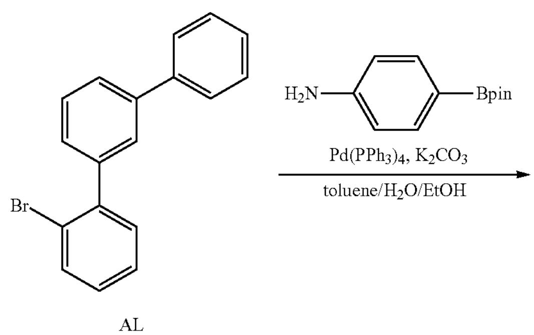

AL

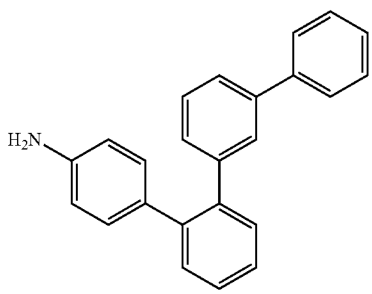

AM

In an Ar atmosphere, Intermediate AL (8.0 g), 4-(4,4,5,5-Tetramethyl-1,3,2-dioxaborolan-2-yl)aniline (5.67 g), $Pd(PPh_3)_4$ (1.0 g), and $K_2CO_3$ (4.9 g) were added in a 300 mL three-neck flask and dissolved in a mixed solvent of toluene, water, and ethanol (10:2:1, 100 mL), and the resultant mixture was heated and stirred at about 80° C. for about 10 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AM (4.41 g, yield 53%). The molecular weight of Intermediate AM measured by FAB-MS measurement was 321.

Synthesis of Intermediate AN

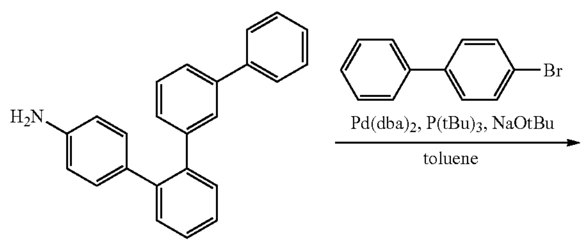

AM

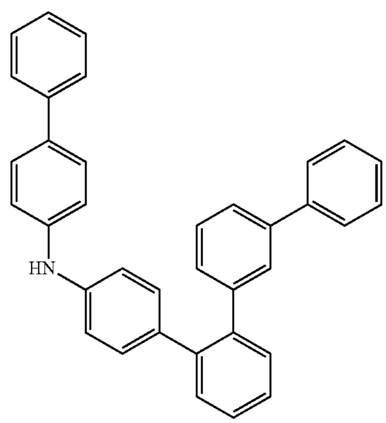

AN

In an Ar atmosphere, 4-bromobiphenyl (2.18 g), Intermediate AM (3.0 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AN (3.27 g, yield 74%). The molecular weight of Intermediate AN measured by FAB-MS measurement was 473.

Synthesis of Compound 111

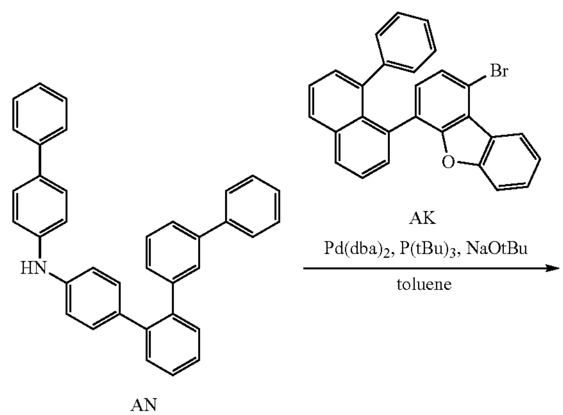

AN

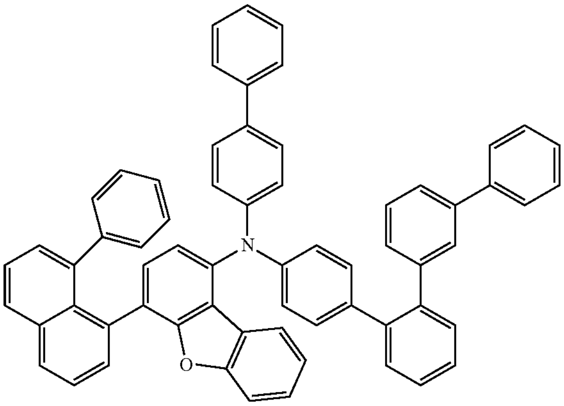

111

In an Ar atmosphere, Intermediate AN (1.5 g), Intermediate AK (1.42 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 111 (2.16 g, yield 81%). The molecular weight of Compound 111 measured by FAB-MS measurement was 842.

(17) Synthesis of Compound 220

Synthesis of Intermediate AO

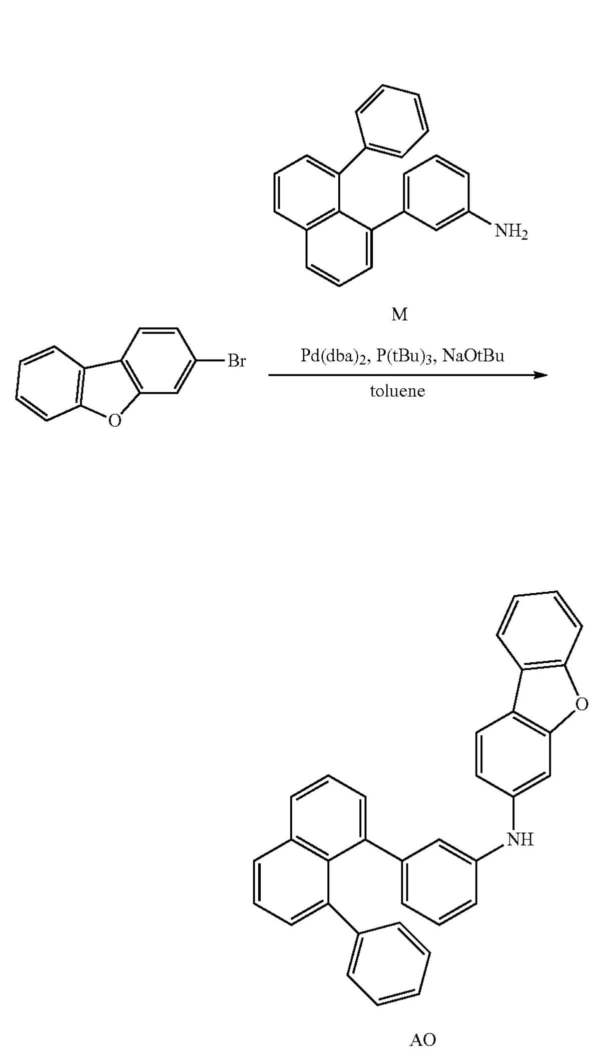

AO

In an Ar atmosphere, 3-bromodibenzofuran (3.0 g), Intermediate M (3.58 g), $Pd(dba)_2$ (0.3 g), and NaOtBu (1.1 g) were added in a 200 mL three-neck flask and dissolved in toluene (50 mL), $P(tBu)_3$ (2.0 M in toluene, 0.5 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Intermediate AO (4.54 g, yield 81%). The molecular weight of Intermediate AO measured by FAB-MS measurement was 461.

Synthesis of Compound 220

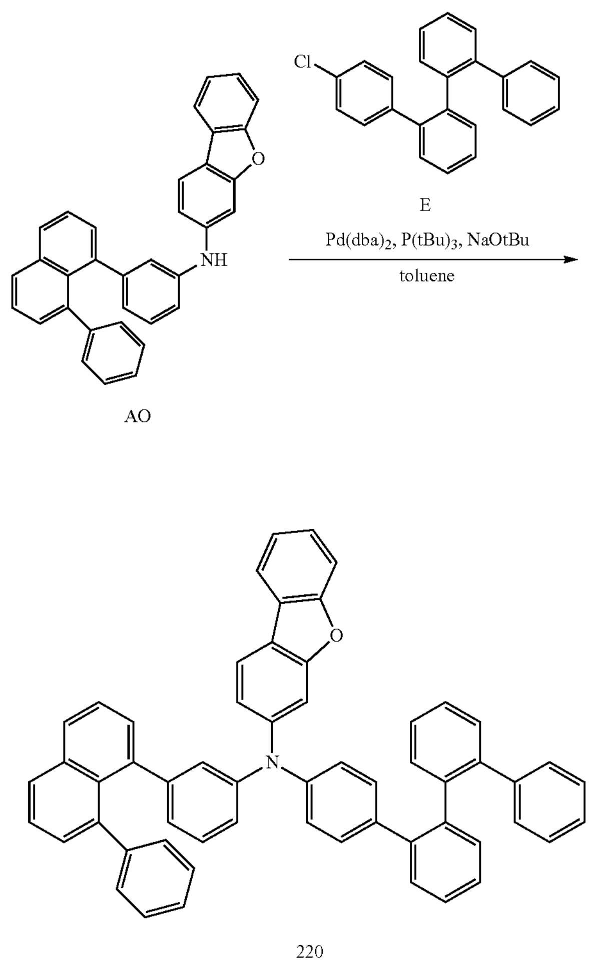

AO

E

220

In an Ar atmosphere, Intermediate AO (1.5 g), Intermediate E (1.10 g), $Pd(dba)_2$ (0.1 g), and NaOtBu (0.6 g) were added in a 200 mL three-neck flask and dissolved in toluene (50 mL), $P(tBu)_3$ (2.0 M in toluene, 0.2 mL) was added thereto, and the resultant mixture was heated under reflux for about 6 hours. The resultant mixture was extracted with $CH_2Cl_2$ by adding water to obtain organic layers. The obtained organic layers were combined and dried over $MgSO_4$, and the solvent was removed by distillation under reduced pressure. The resulting crude product was purified by silica gel column chromatography to obtain Compound 220 (1.97 g, yield 79%). The molecular weight of Compound 220 measured by FAB-MS measurement was 765.

1. Manufacture and Evaluation of Light Emitting Device Including Amine Compound (1) Manufacture and Evaluation of Light Emitting Device Using Amine Compound as Hole Transport Layer Material (Manufacture of Light Emitting Device)

Compounds 5, 8, 16, 37, 43, 112, 114, 121, 122, 198, 185, 54, 57, 92, 111, and 220 as described above were used as a hole transport layer material to manufacture the light emitting devices of Examples 1 to 16, respectively.

Example Compounds

5

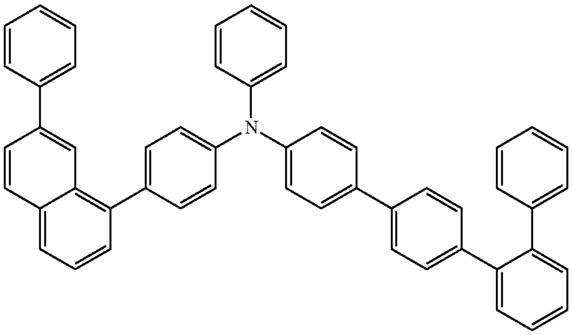

8

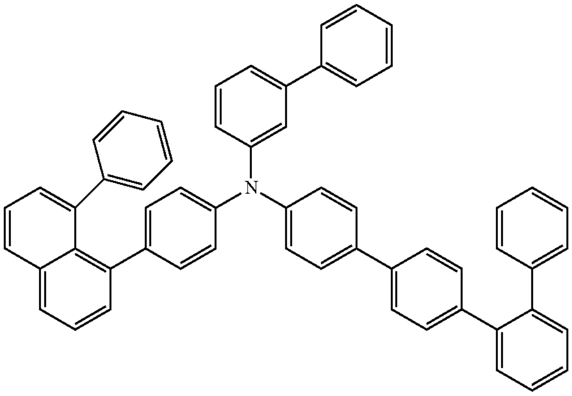

16

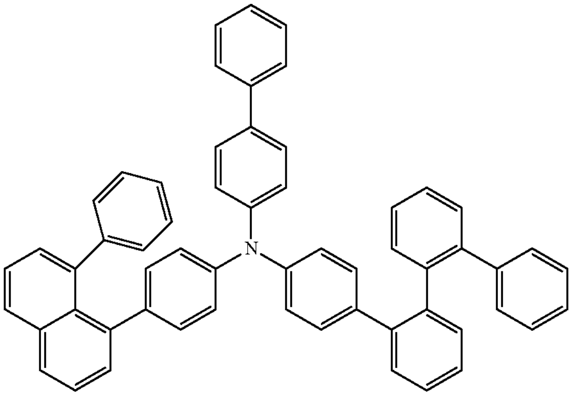

37

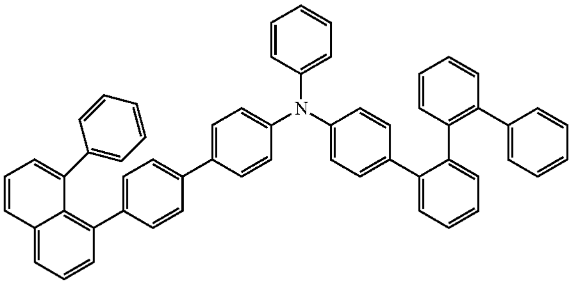

-continued
43
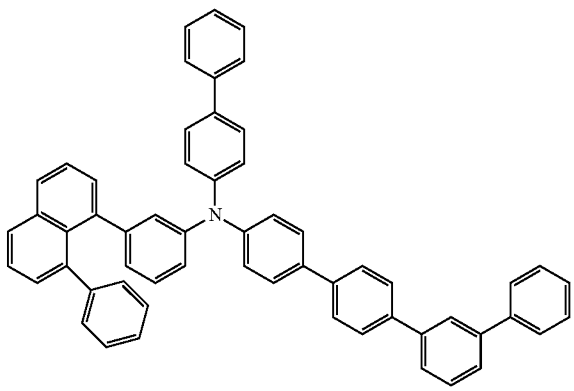
112
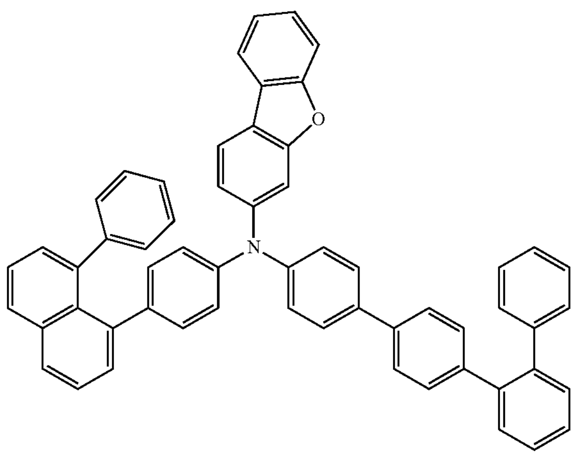
114
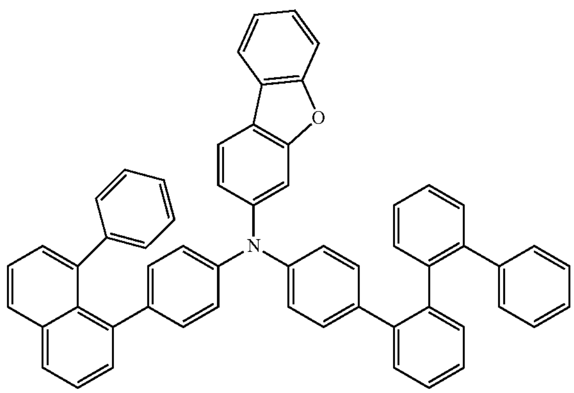
-continued
121
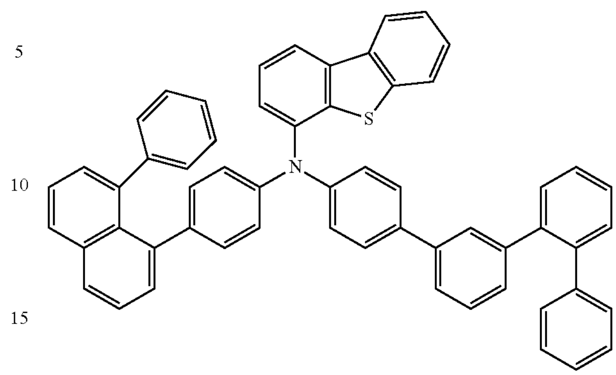
122
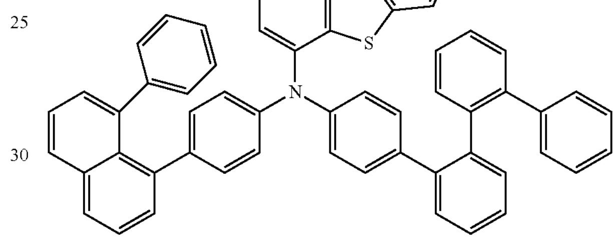
198
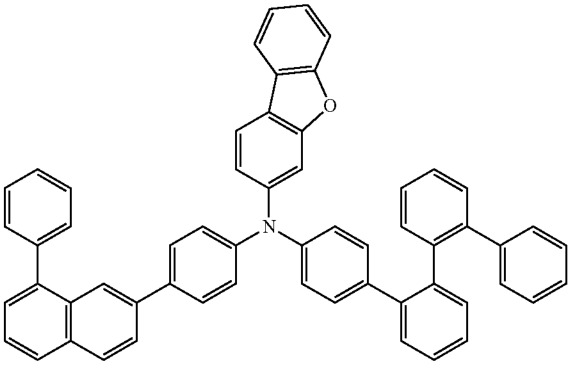
185
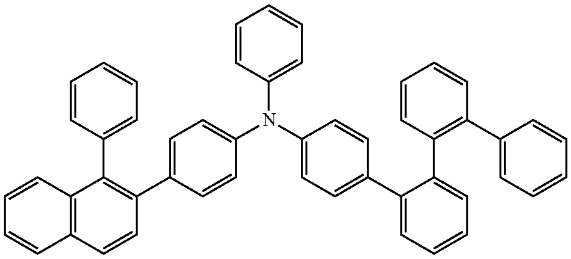

-continued
54
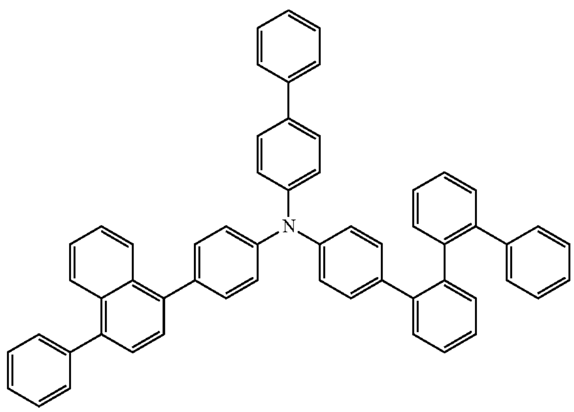
57
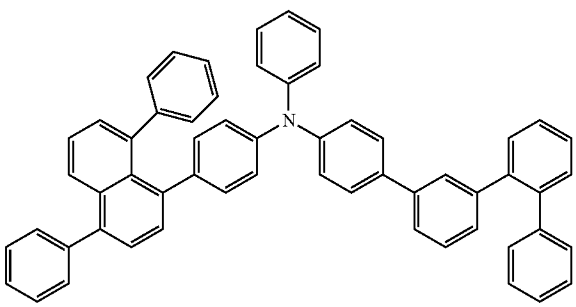
92
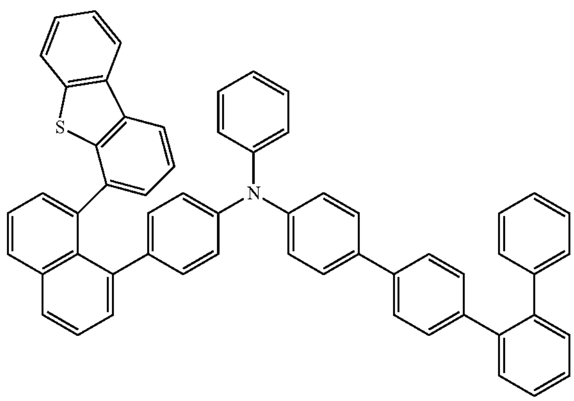
111
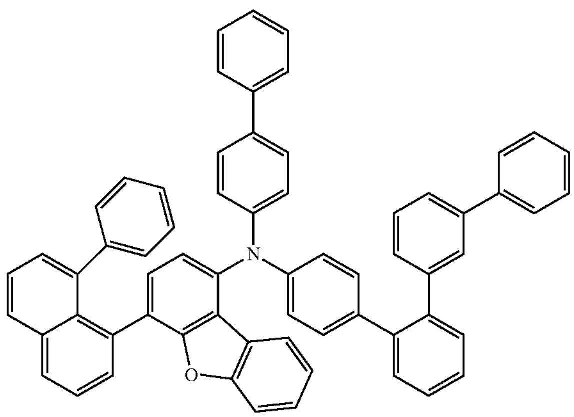
-continued
220
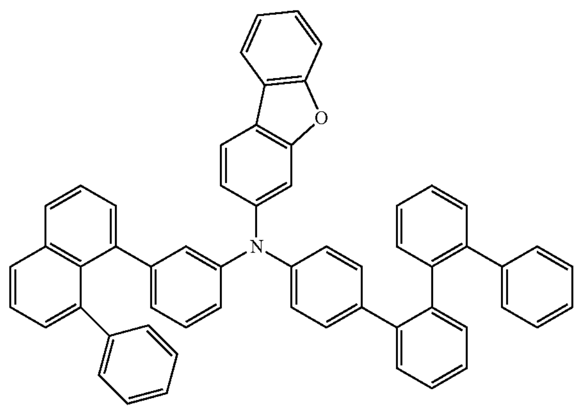
Comparative Example Compounds X-1 to X-7 below were used to manufacture devices of Comparative Examples.
Comparative Example Compounds
X-1
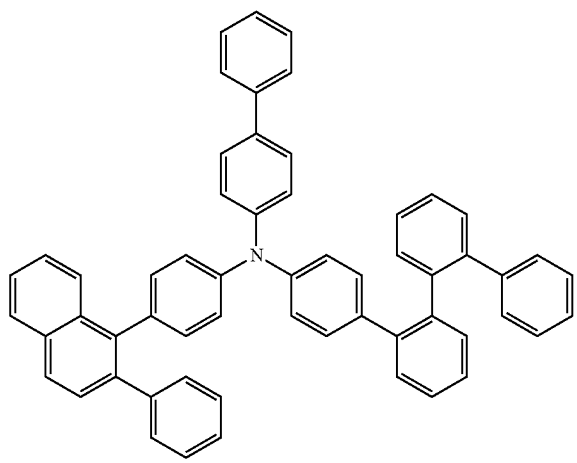
X-2
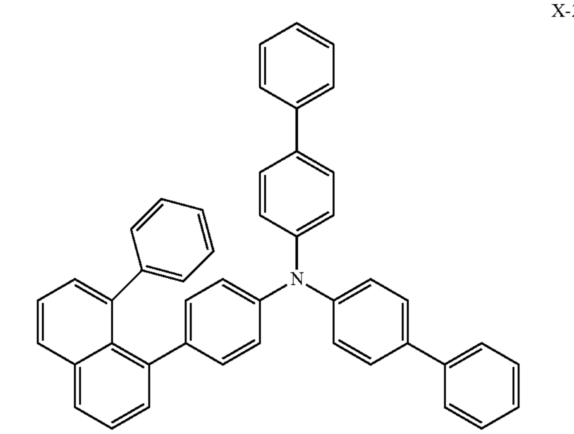

-continued

X-3

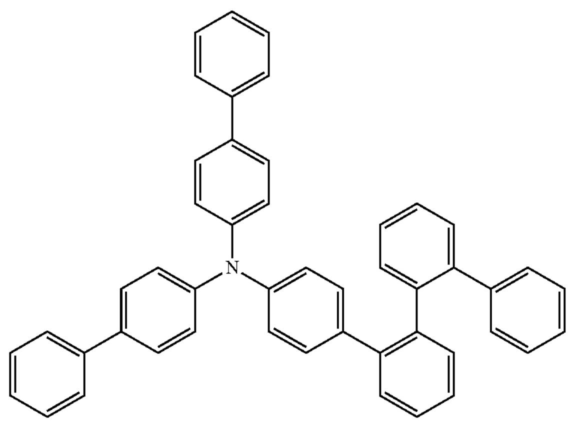

X-4

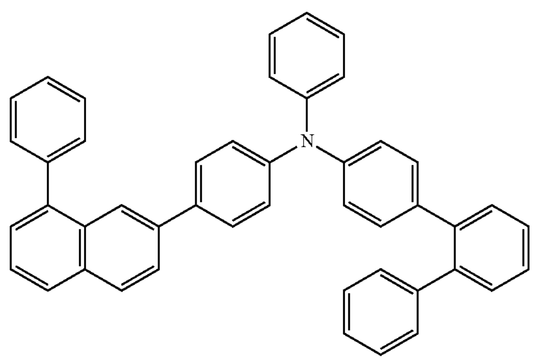

X-5

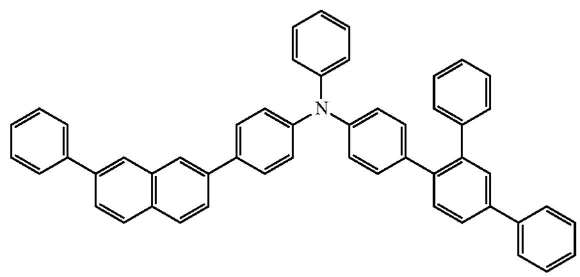

-continued

X-6

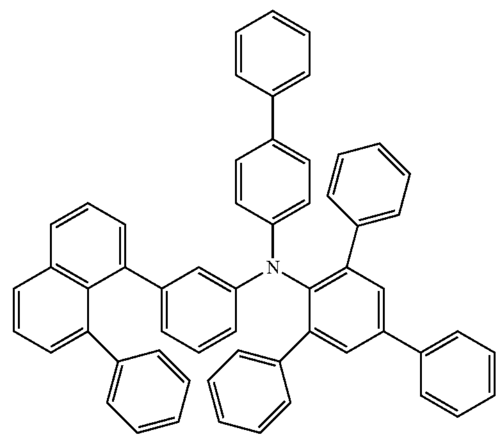

X-7

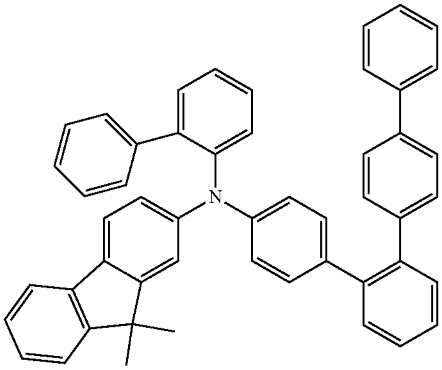

The light emitting device of an embodiment including the amine compound of an embodiment in a hole transport layer was manufactured as follows. Examples 1 to 16 correspond to the light emitting devices manufactured by using Compounds 5, 8, 16, 37, 43, 112, 114, 121, 122, 198, 185, 54, 57, 92, 111, and 220 which are the above-described Example Compounds as a hole transport layer material, respectively. Comparative Examples 1 to 7 correspond to the light emitting devices manufactured by using Comparative Example Compounds X-1 to X-7 as a hole transport layer material, respectively.

ITO was used to form a 150 nm-thick first electrode, 4,4',4"-tris[N(2-naphthyl)-N-phenylamino]-triphenylamine (2-TNATA) was used to form a 60 nm-thick hole injection layer, Example Compound or Comparative Example Compound was used to form a 30 nm-thick hole transport layer, 2,5,8,11-tetra-t-butylperylene (TBP) was doped by 3% to 9,10-di(naphthalene-2-yl)anthracene (ADN) to form a 25 nm-thick emission layer, tris(8-hydroxyquinolinato)aluminum ($Alq_3$) was used to form a 25 nm-thick electron transport layer, LiF was used to form a 1 nm-thick electron injection layer, and Al was used to form a 100 nm-thick second electrode. Each layer was formed by a deposition method in a vacuum atmosphere.

Compounds used for manufacturing the light emitting devices of Examples and Comparative Examples are disclosed below. Commercial products were subjected to sublimation purification and used to manufacture the devices.

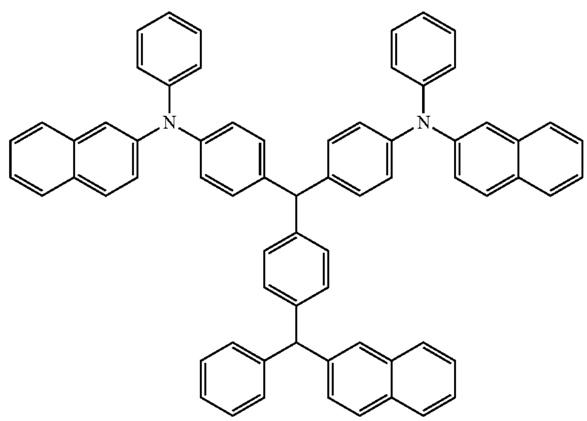

2-TNATA

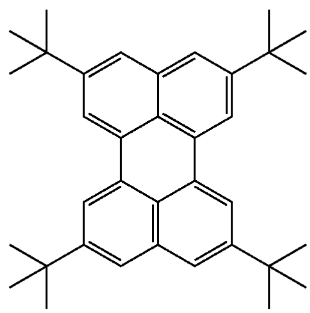

TBP

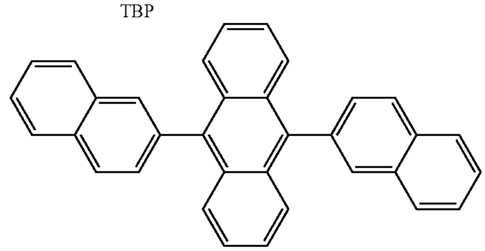

ADN

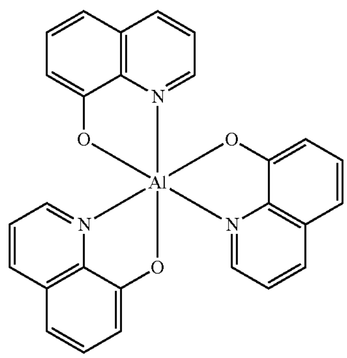

$Alq_3$

Experimental Example

Device efficiencies of the light emitting devices manufactured with Experimental Example Compounds 5, 8, 16, 37, 43, 112, 114, 121, 122, 198, 185, 54, 57, 92, 111, and 220, and Comparative Example Compounds X-1 to X-7 as described above were evaluated. The evaluation results are shown in Table 1 below. In the evaluation of the device, luminous efficiencies and device service lives of the light emitting devices were measured at a current density of 10 $mA/cm^2$ and listed. Luminous efficiencies and device service lives are represented as a comparative value when luminous efficiency and device service life of Comparative Example 1 are considered 100%. In the evaluation of the luminous efficiencies and device service lives of the light emitting device, a brightness light distribution characteristics measurement device, C9920-11 manufactured by Hamamatsu Photonics, Inc. was used.

TABLE 1

| Device manufacturing examples | Hole transport layer compound | Luminous efficiency (%) | Device service life ($LT_{50}$, %) |
|---|---|---|---|
| Example 1 | Example Compound 5 | 110% | 110% |
| Example 2 | Example Compound 8 | 107% | 120% |
| Example 3 | Example Compound 16 | 103% | 180% |
| Example 4 | Example Compound 37 | 103% | 170% |
| Example 5 | Example Compound 43 | 108% | 130% |
| Example 6 | Example Compound 112 | 103% | 150% |
| Example 7 | Example Compound 114 | 103% | 190% |
| Example 8 | Example Compound 121 | 110% | 150% |
| Example 9 | Example Compound 122 | 111% | 160% |
| Example 10 | Example Compound 198 | 103% | 170% |
| Example 11 | Example Compound 185 | 110% | 120% |
| Example 12 | Example Compound 54 | 105% | 150% |
| Example 13 | Example Compound 57 | 103% | 120% |
| Example 14 | Example Compound 92 | 108% | 130% |
| Example 15 | Example Compound 111 | 111% | 120% |
| Example 16 | Example Compound 220 | 110% | 170% |
| Comparative Example 1 | Comparative Example Compound X-1 | 100% | 100% |
| Comparative Example 2 | Comparative Example Compound X-2 | 95% | 110% |
| Comparative Example 3 | Comparative Example Compound X-3 | 98% | 90% |
| Comparative Example 4 | Comparative Example Compound X-4 | 97% | 100% |
| Comparative Example 5 | Comparative Example Compound X-5 | 96% | 100% |
| Comparative Example 6 | Comparative Example Compound X-6 | 100% | 50% |
| Comparative Example 7 | Comparative Example Compound X-7 | 99% | 80% |

Referring to the results of Table 1, it may be confirmed that Examples of the light emitting devices in which the amine compounds according to embodiments are used as a hole transport layer material have improved luminous efficiencies and device service lives compared to Comparative Examples. Example Compounds have a structure in which the naphthyl group and the quaterphenyl group are linked to the nitrogen atom of the amine group. The quaterphenyl group may be linked to the nitrogen atom of the amine group at the position of one carbon atom in the benzene ring at a terminus of the quaterphenyl group. The naphthyl group may be linked to the nitrogen atom of the amine group via a linker, and may include at least one substituent which expands a conjugated structure of the naphthyl group. Example Compounds having such a structure have improved hole transport ability of the entire molecule, the electron resistance characteristics may be increased, and thus when Example Compounds are applied to the light emitting devices, efficiencies and service lives of the light emitting devices are improved. The light emitting device of an example includes the amine compound of an example as a hole transport layer material of the light emitting device, thereby improving efficiency and a service life of the light emitting device.

Comparative Example Compound X-1 included in Comparative Example 1 includes a Z-type quaterphenyl group as a substituent, and includes a structure in which carbon at position 1 of the naphthyl group and the nitrogen atom of the amine group are linked by interposing a p-phenylene therebetween, but a phenyl group is substituted at carbon at position 2 of the naphthyl group, and thus both luminous efficiency and service life of the light emitting device are reduced. This may be confirmed through the results of Comparative Example 1 and Example 6, and it is thought that the results appeared because Comparative Example Compound X-1 has a structure in which a conjugation is relatively difficult to expand since a phenyl group is substituted at carbon at position 2 of the naphthyl group, resulting in an increase in a bond angle between the naphthyl group and a linker, and thus the hole transport ability decreases so that charge balance in the emission layer is reduced.

It may be confirmed that Comparative Example Compounds X-2 to X-4 included in Comparative Examples 2 to 4 have reduced luminous efficiencies and service lives compared to Examples because neither the naphthyl group nor the quaterphenyl group is included as a substituent so that the hole transport properties and electron resistance are not sufficient.

Comparative Example Compounds X-5 and X-6 included in Comparative Examples 5 and 6 have reduced luminous efficiencies and service lives compared to Examples because Comparative Example Compounds X-5 and X-6 include the naphthyl group and the quaterphenyl group as a substituent of the amine group, and have a structure in which the naphthyl group is linked to the nitrogen atom of the amine group by interposing phenylene therebetween, but include not a linear quaterphenyl group but a branched quaterphenyl group as a substituent, and thus the volume of the whole molecule is insufficient, thereby reducing resistance characteristics with respect to electrons and excitons. It may be confirmed that in the case where the volume around the nitrogen atom is expanded like Comparative Example Compound X-6, steric repulsions in the molecule increases to reduce the stability of materials, thereby significantly reducing device service life characteristics.

It may be confirmed that Comparative Example Compound X-7 included in Comparative Example 7 includes the quaterphenyl group as a substituent of the amine group, but includes not the naphthyl group but a 9,9-dimethylfluorene group containing a quaternary carbon as another substituent so that the stability of material is reduced compared to Example Compounds, and accordingly the device of Comparative Example 7 has reduced luminous efficiency and device service life compared to Examples.

The light emitting device of an embodiment may exhibit improved device characteristics with high efficiency and a long service life.

The amine compound of an embodiment may be included in a hole transport region of the light emitting device to contribute to high efficiency and a long service life of the light emitting device.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A light emitting device comprising:

a first electrode;

a second electrode facing the first electrode; and a plurality of organic layers disposed between the first electrode and the second electrode, wherein the plurality of organic layers comprises at least one organic layer that includes an amine compound represented by Formula 1:

[Formula 1]

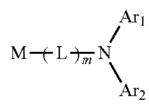

wherein in Formula 1,

L is a substituted or unsubstituted arylene group having 6 to 30 ring-forming carbon atoms, or a substituted or unsubstituted heteroarylene group having 2 to 30 ring-forming carbon atoms, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, m is 1 or 2, M is a group represented by Formula 2, and at least one of $Ar_1$ and $Ar_2$ is a group represented by Formula 3:

[Formula 2]

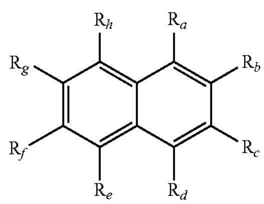

wherein in Formula 2, one of $R_a$, $R_b$, and $R_c$ is a position linked to L in Formula 1, the remainder of $R_a$ to $R_h$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one of the remainder of $R_a$ to $R_h$ is not a hydrogen atom:

[Formula 3]

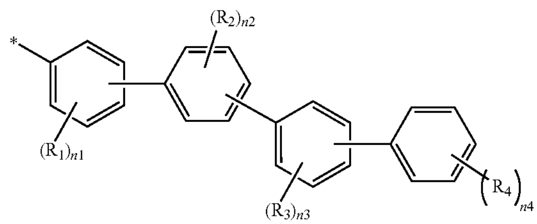

wherein in Formula 3, $R_1$ to $R_4$ are each independently a hydrogen atom, a deuterium atom, a halogen atom, a substituted or unsubstituted alkyl group having 1 to 20 carbon atoms, or a substituted or unsubstituted heteroaryl group having 2 to 30 ring-forming carbon atoms, where the case in which each of $R_1$ and $R_2$ is an unsubstituted phenyl group is excluded, ——* is a position linked to N in Formula 1, $n_1$ to $n_3$ are each independently an integer from 0 to 4, $n_4$ is an integer from 0 to 5, and wherein at least one arene moiety in Formula 3 is bound to two other arene moieties of Formula 3 at ortho or meta positions, and when L in Formula 1 is a p-phenylene group, when a group represented by Formula 3 is a group represented by Formula 3-a, and when $R_a$ in Formula 2 is linked to L in Formula 1, $R_b$ in Formula 2 is not an unsubstituted phenyl group:

[Formula 3-a]

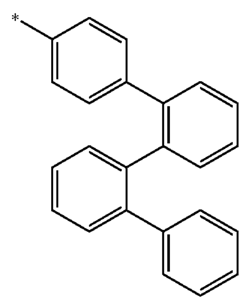

and when $R_a$ in Formula 2 is linked to L in Formula 1, $R_b$ and $R_h$ in Formula 2 are each independently a hydrogen atom, or a substituted or unsubstituted heteroaryl group having 2 to 30 ring-forming carbon atoms.

2. The light emitting device of claim 1, wherein the plurality of organic layers comprise:

a hole transport region disposed on the first electrode;

an emission layer disposed on the hole transport region; and an electron transport region disposed on the emission layer, and the hole transport region comprises the amine compound.

3. The light emitting device of claim 2, wherein the hole transport region further comprises:

a hole injection layer disposed on the first electrode; and a hole transport layer disposed on the hole injection layer, and the hole transport layer comprises the amine compound.

4. The light emitting device of claim 2, wherein the hole transport region comprises a plurality of hole transport organic layers, and the plurality of hole transport organic layers comprises a layer that is adjacent to the emission layer and includes the amine compound.

5. The light emitting device of claim 1, wherein the amine compound represented by Formula 1 is a monoamine compound.

6. The light emitting device of claim 1, wherein the amine compound represented by Formula 1 is represented by Formula 4-1 or Formula 4-2:

[Formula 4-1]

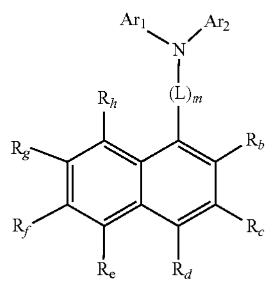

[Formula 4-2]

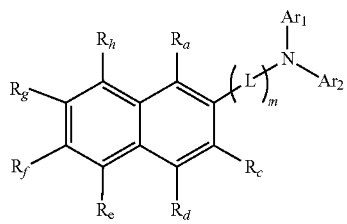

wherein in Formula 4-1 and Formula 4-2, $Ar_1$, $Ar_2$, L, $R_a$ to $R_h$, and m are the same as defined in Formula 1 and Formula 2.

7. The light emitting device of claim 1, wherein the amine compound represented by Formula 1 is represented by one of Formula 5-1 to Formula 5-3:

[Formula 5-1]

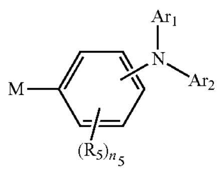

[Formula 5-2]

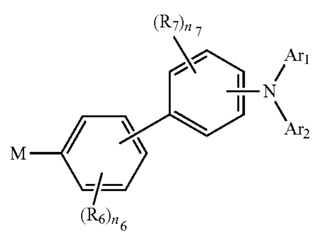

[Formula 5-3]

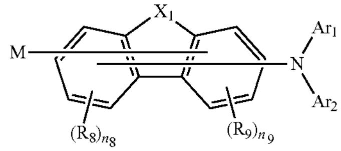

wherein in Formula 5-1 to Formula 5-3, $X_1$ is $N(R_{10})$, O, or S, $R_5$ to $R_{10}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $n_5$ to $n_9$ are each independently an integer from 0 to 4, the sum of $n_8$ and $n_9$ is equal to or less than 6, and M, $Ar_1$, and $Ar_2$ are the same as defined in Formula 1.

8. The light emitting device of claim 7, wherein the amine compound represented by Formula 1 is represented by one of Formula 6-1 to Formula 6-5:

[Formula 6-1]

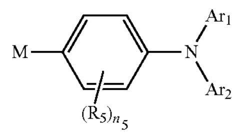

[Formula 6-2]

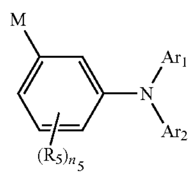

[Formula 6-3]

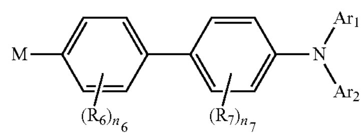

[Formula 6-4]

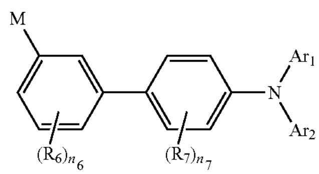

[Formula 6-5]

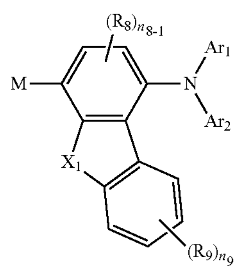

wherein in Formula 6-1 to Formula 6-5, $n_{8-1}$ is an integer from 0 to 2, $Ar_1$, $Ar_2$, M, $X_1$, $R_5$ to $R_9$, $n_5$ to $n_7$, and $n_9$ are the same as defined in Formula 1 and Formula 5-1 to Formula 5-3.

9. The light emitting device of claim 1, wherein $Ar_1$ is a group represented by Formula 3, and $Ar_2$ is a group represented by one of Formula 7-1 to Formula 7-5:

[Formula 7-1]

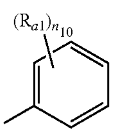

[Formula 7-2]

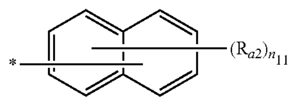

-continued

[Formula 7-3]

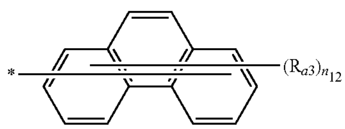

[Formula 7-4]

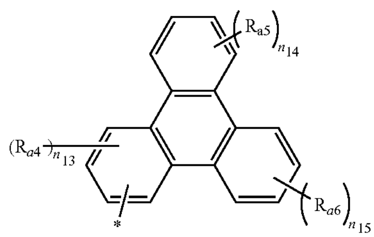

[Formula 7-5]

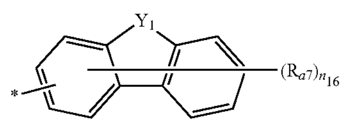

wherein in Formula 7-1 to Formula 7-5, $Y_1$ is $N(R_{11})$, O, or S, $R_{a1}$ to $R_{a6}$ and $R_{11}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{a7}$ is a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, $n_{10}$ is an integer from 0 to 5, $n_{11}$ and $n_{16}$ are each independently an integer from 0 to 7, $n_{12}$ is an integer from 0 to 9, $n_{13}$ is an integer from 0 to 3, $n_{14}$ and $n_{15}$ are each independently an integer from 0 to 4, and ——* is a position linked to N in Formula 1.

10. The light emitting device of claim 1, wherein the remainder of $R_a$ to $R_h$ are each independently a hydrogen atom, a deuterium atom, a halogen atom, a substituted or unsubstituted alkyl group having 1 to 10 carbon atoms, a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group, provided that at least one of the remainder of $R_a$ to $R_h$ is not a hydrogen atom.

11. The light emitting device of claim 1, wherein the at least one of $Ar_1$ and $Ar_2$ that is represented by Formula 3 is a group represented by one of Formula 8-1 to Formula 8-9:

[Formula 8-1]

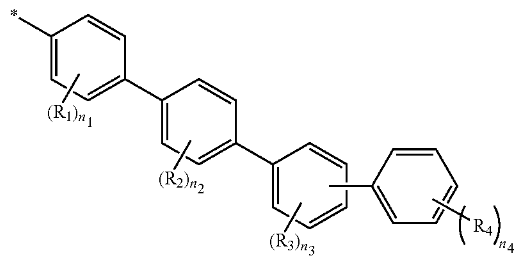

[Formula 8-2]

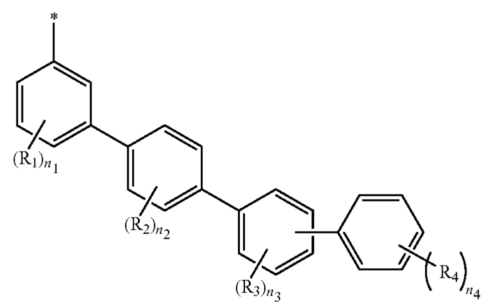

[Formula 8-3]

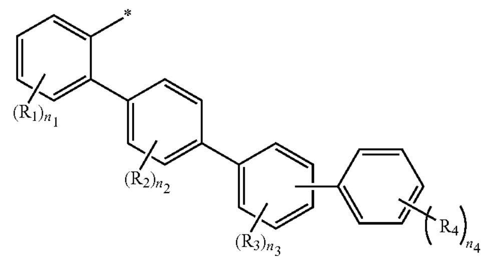

[Formula 8-4]

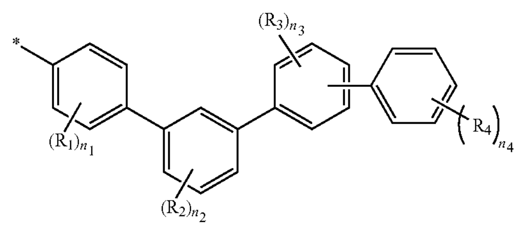

[Formula 8-5]

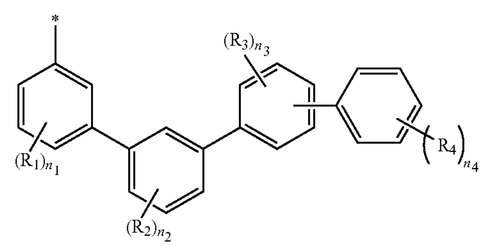

-continued

[Formula 8-6]

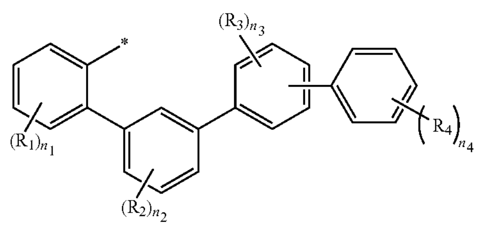

[Formula 8-7]

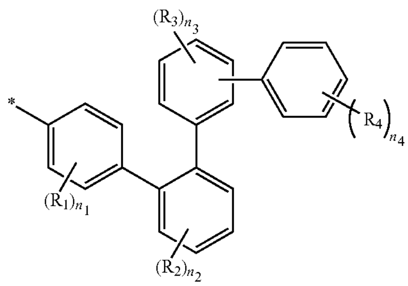

[Formula 8-8]

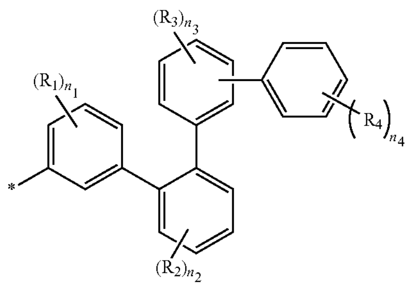

-continued

[Formula 8-9]

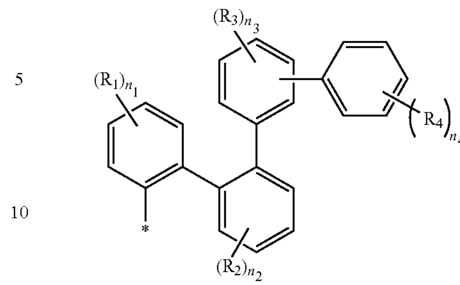

wherein in Formula 8-1 to Formula 8-9, $R_1$ to $R_4$, $n_1$ to $n_4$, and ——∗ are the same as defined in Formula 3.

12. The light emitting device of claim 1, wherein $R_1$ to $R_4$ are each independently a hydrogen atom, a deuterium atom, a halogen atom, or a substituted or unsubstituted alkyl group having 1 to 10 carbon atoms.

13. The light emitting device of claim 1, wherein when L in Formula 1 is linked to $R_a$ in Formula 2, at least one of $R_b$ to $R_h$ is a substituted or unsubstituted phenyl group, a substituted or unsubstituted biphenyl group, a substituted or unsubstituted naphthyl group, a substituted or unsubstituted pyridine group, a substituted or unsubstituted dibenzofuran group, a substituted or unsubstituted dibenzothiophene group, or a substituted or unsubstituted carbazole group, and when L in Formula 1 above is linked to $R_b$ in Formula 2, at least one of $R_a$ and Re to $R_h$ is a substituted or unsubstituted phenyl group.

14. The light emitting device of claim 1, wherein the amine compound represented by Formula 1 comprises at least one selected from Compound Group 1:

[Compound Group 1]

1

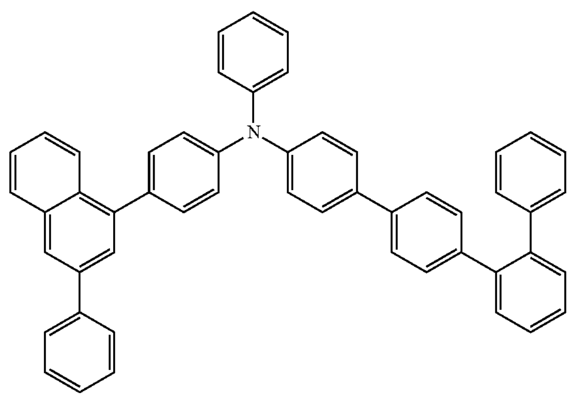

2

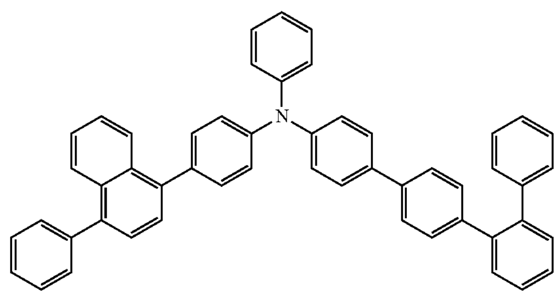

3

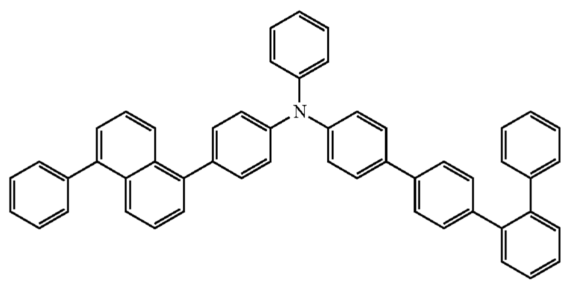

4

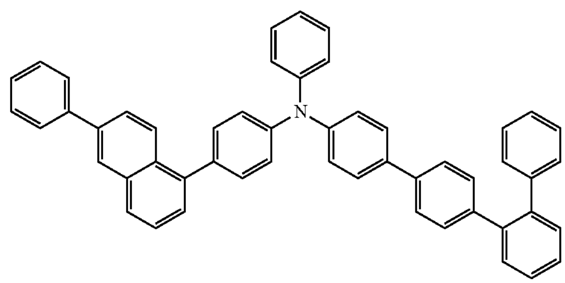

-continued
5
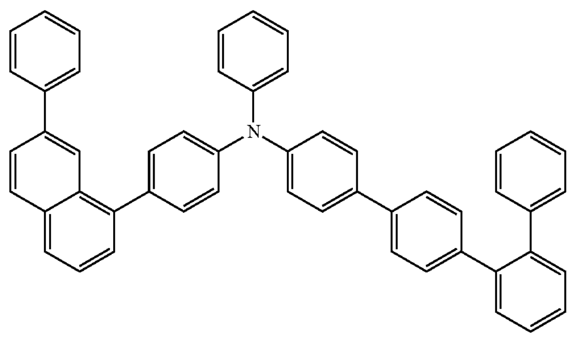
48
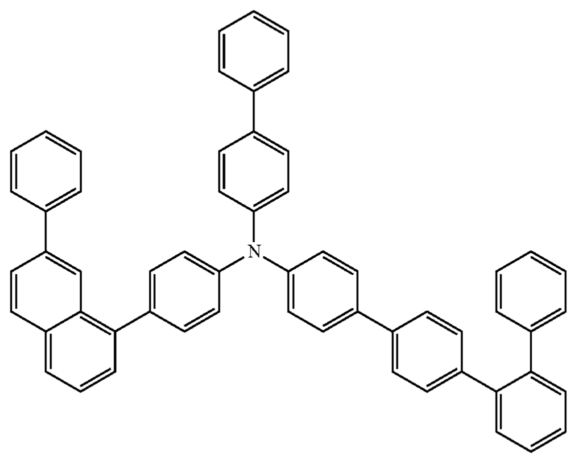
49
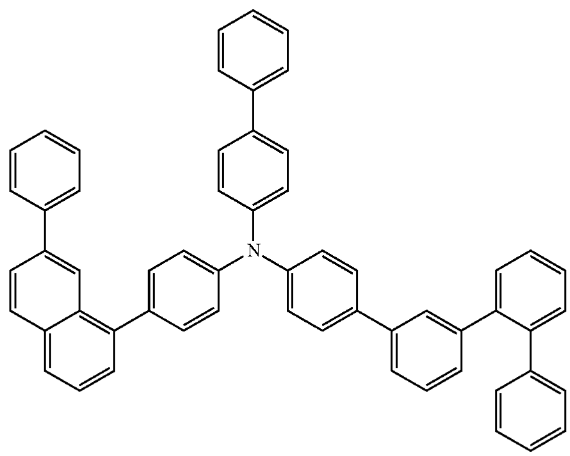
50
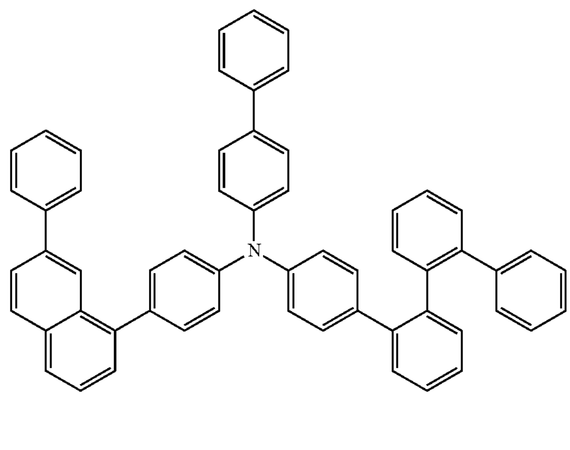
51
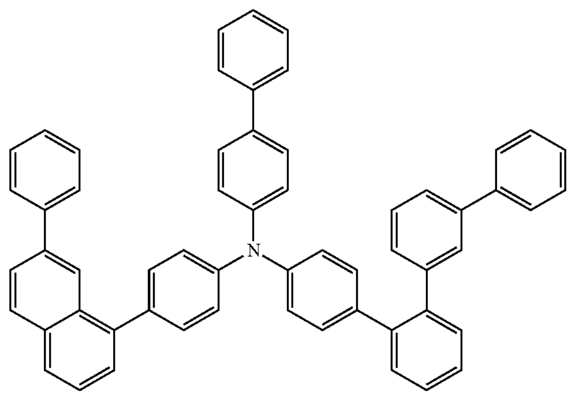
52
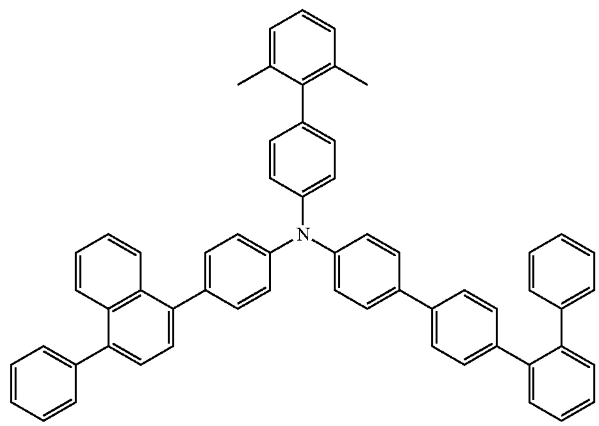

-continued
53
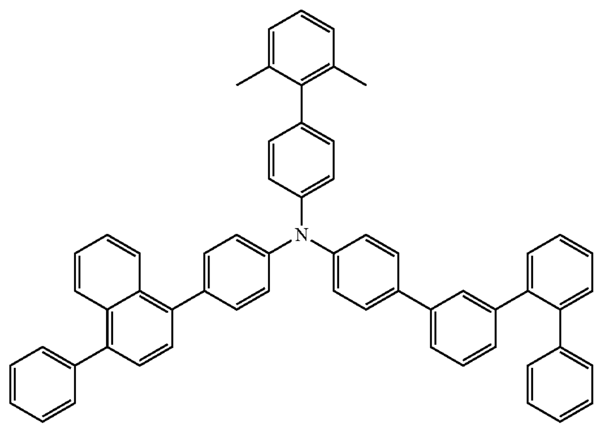
54
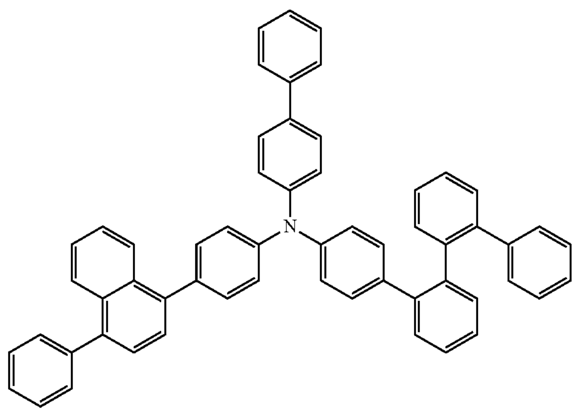
55
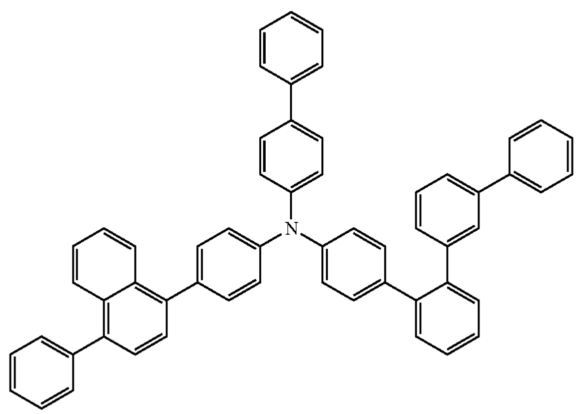
80
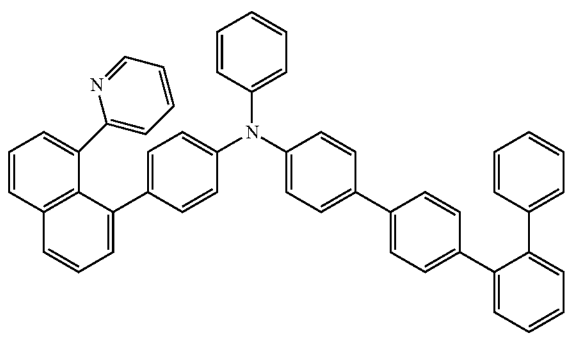
81
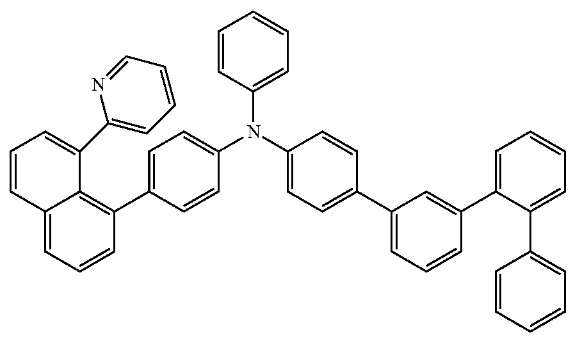
82
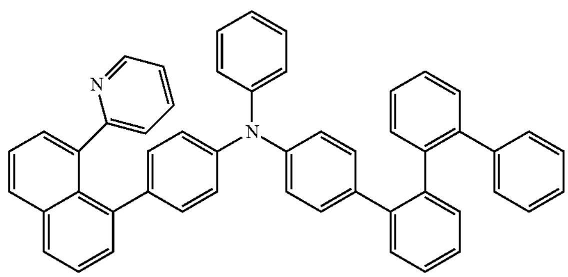
83
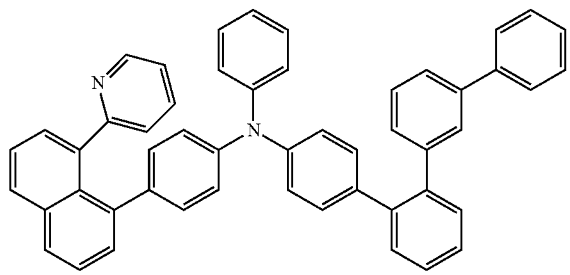
84
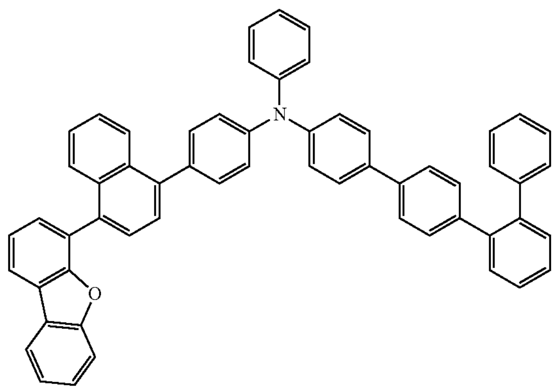

-continued
85
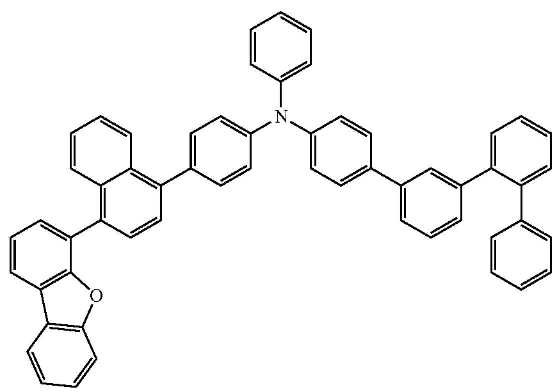
86
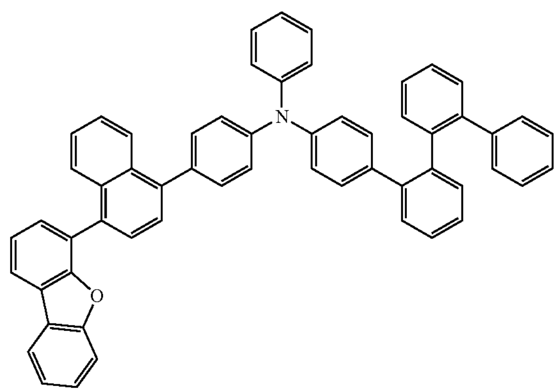
87
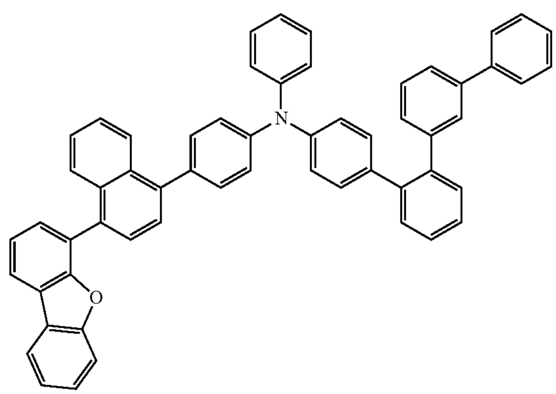
88
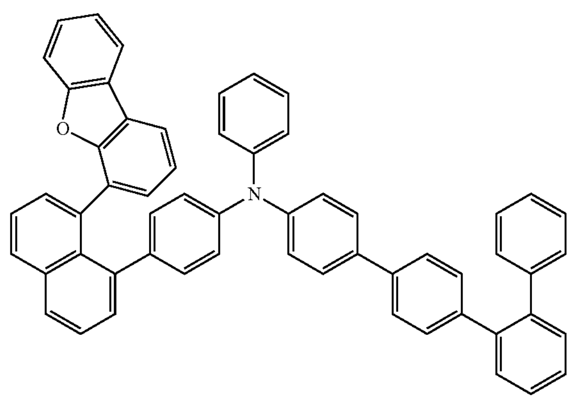
89
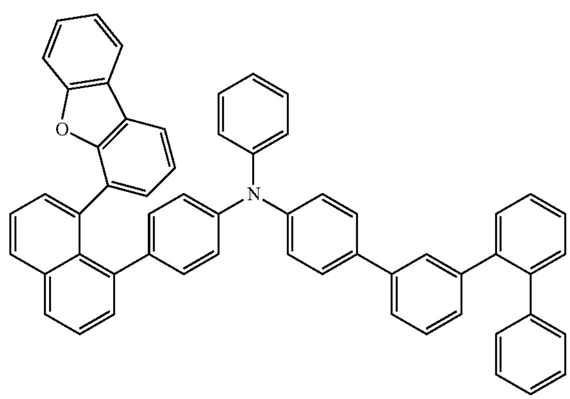
90
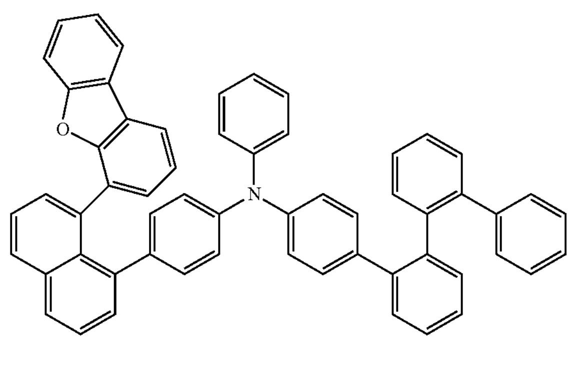
91
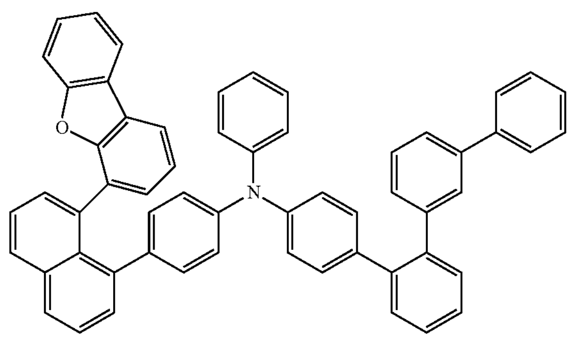
92
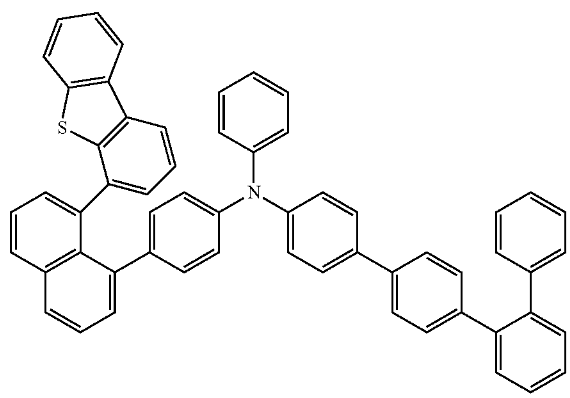

-continued
93
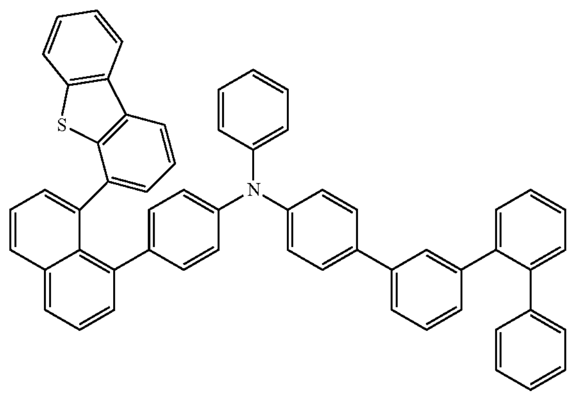
94
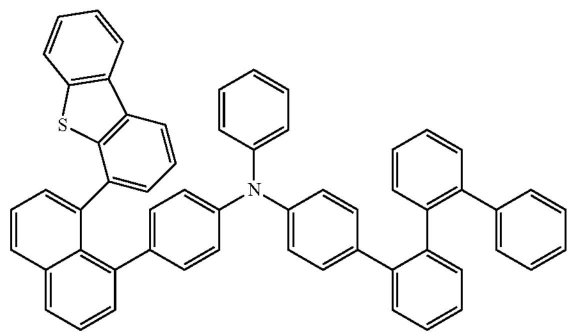
95
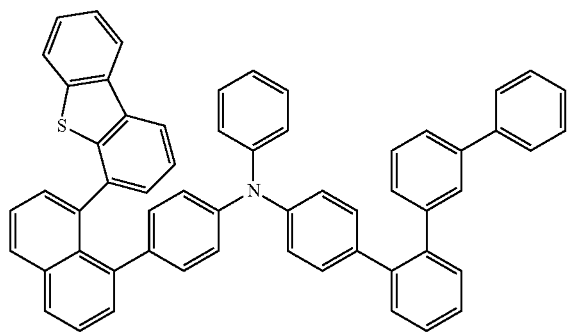
96
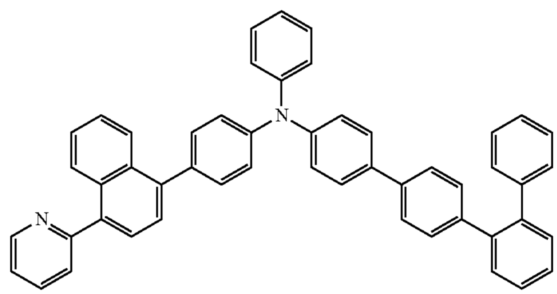
97
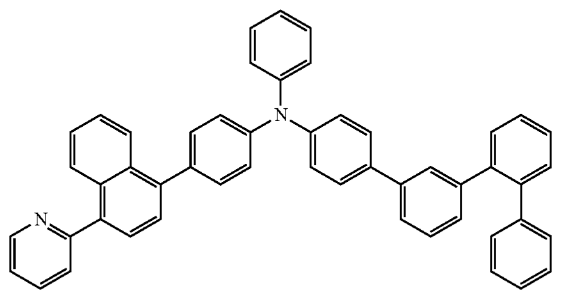
98
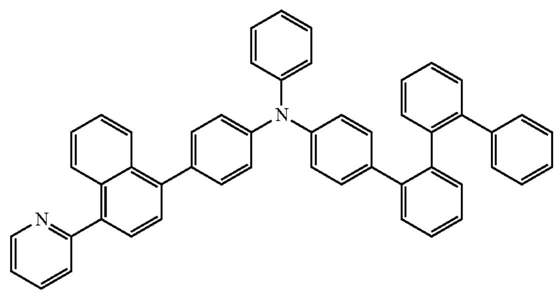
99
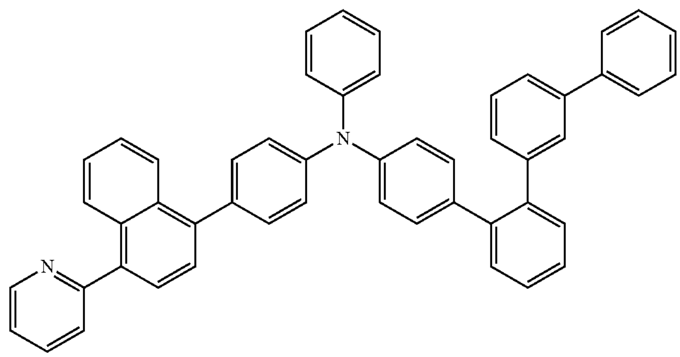

-continued
100
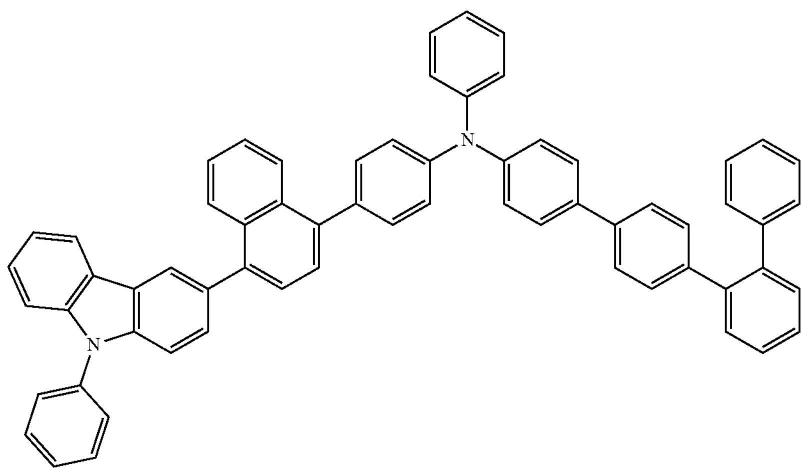
102
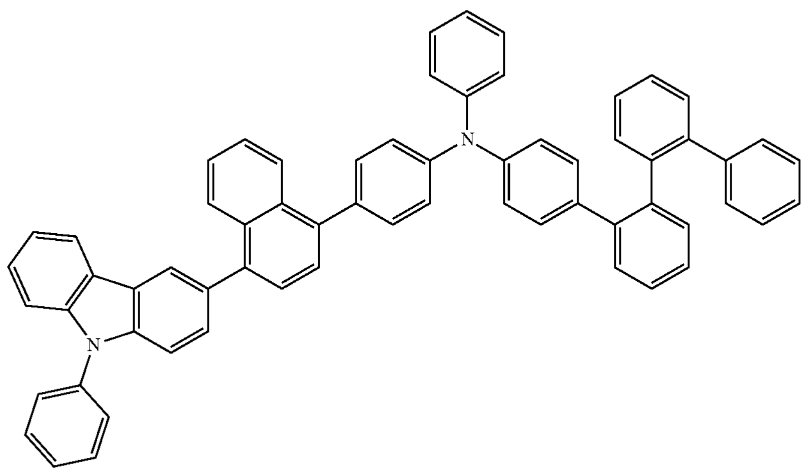
104
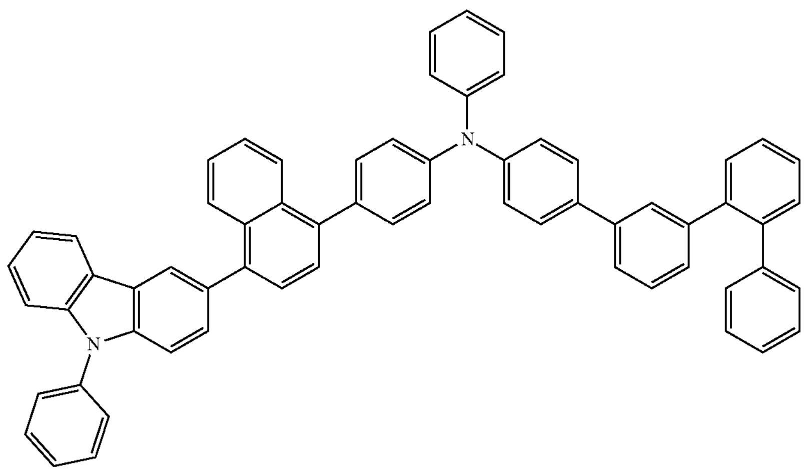

-continued
106
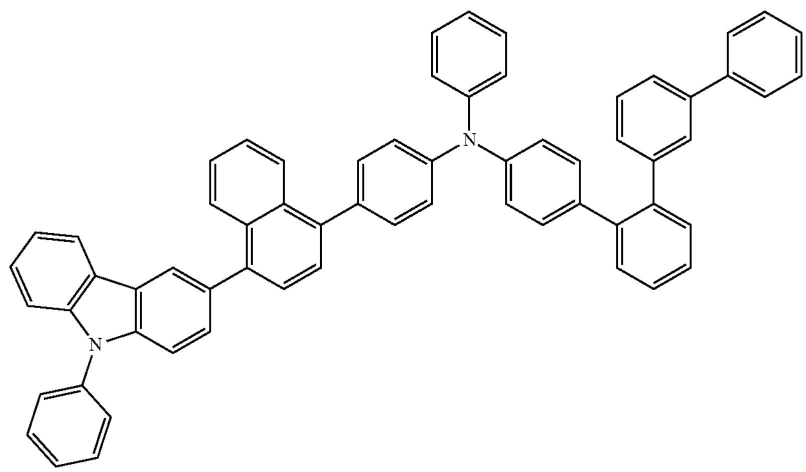
185
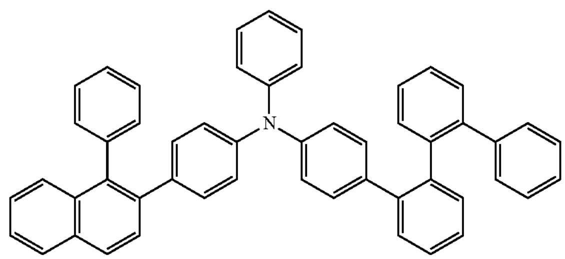
186
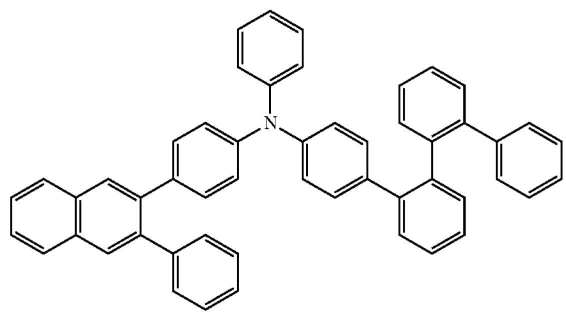
187
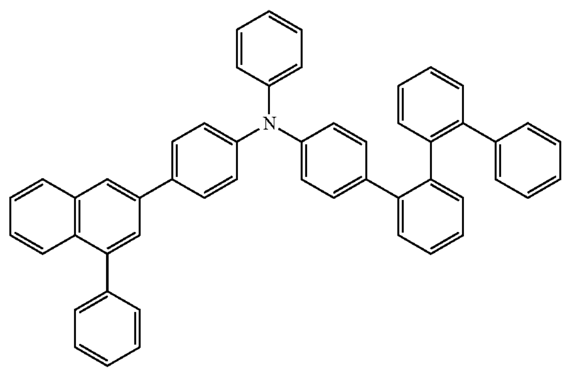
188
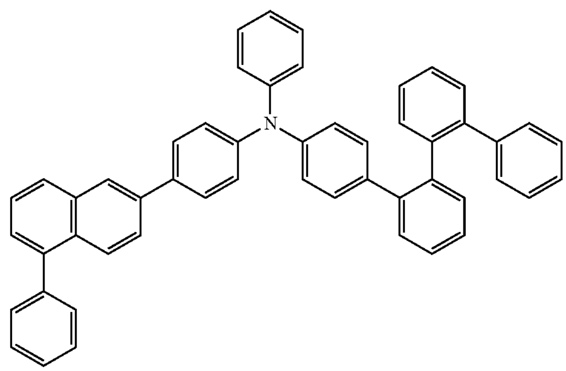
189
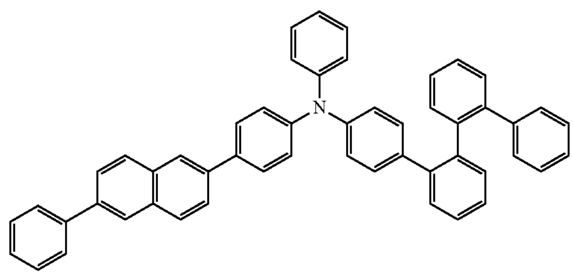
190
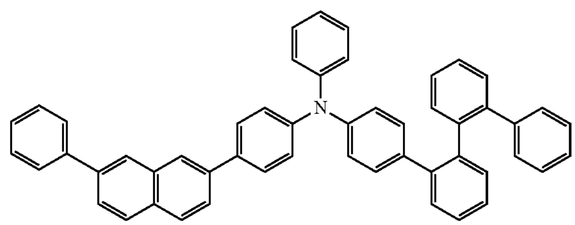

-continued
191
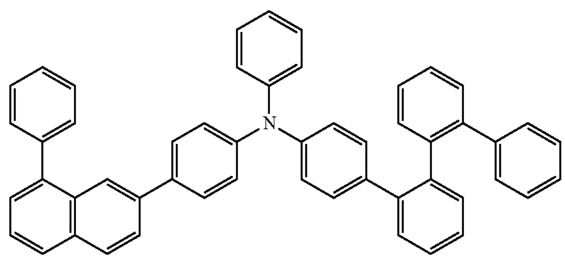
192
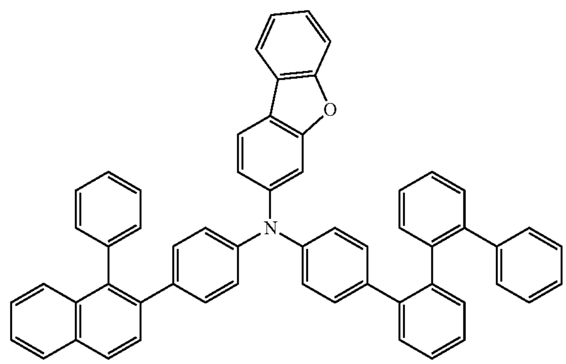
193
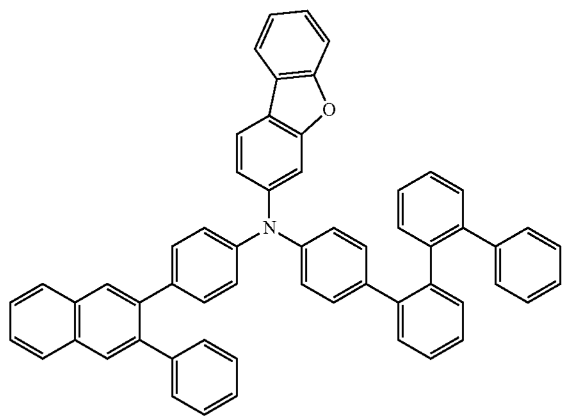
194
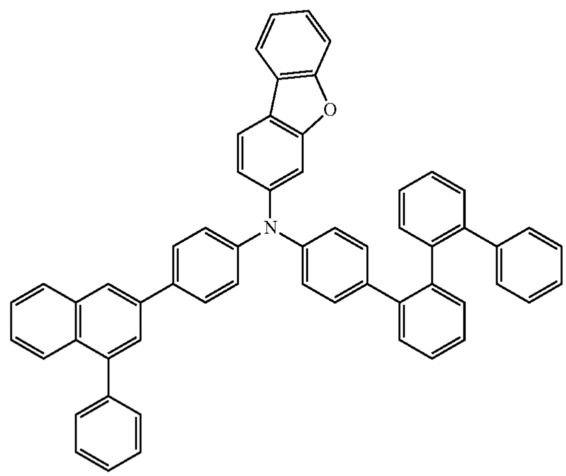
195
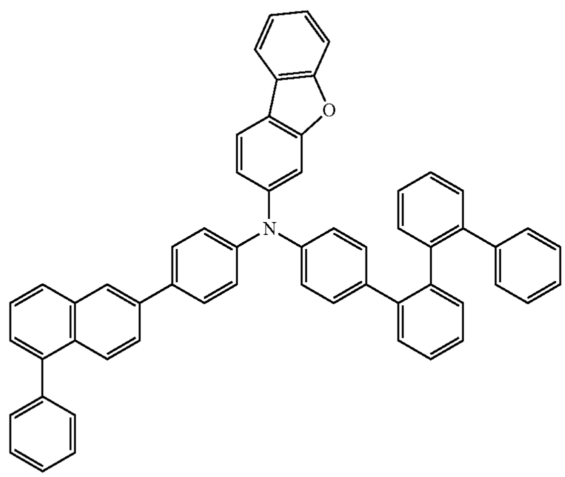
196
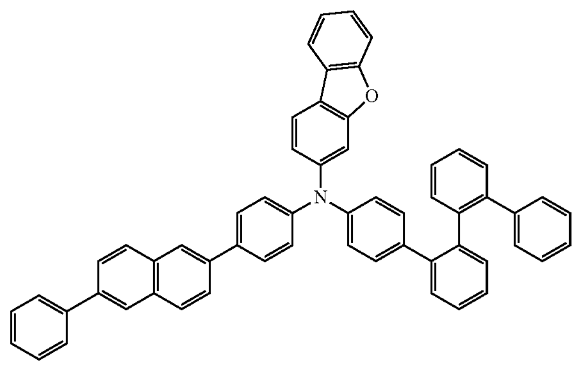

-continued
197
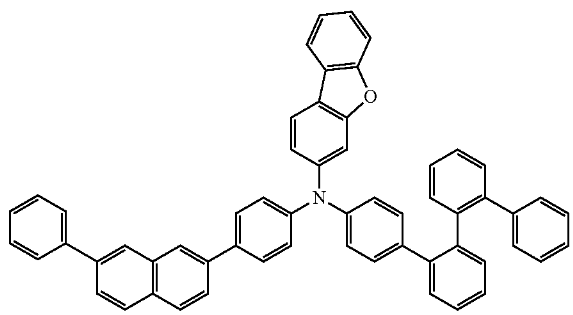
198
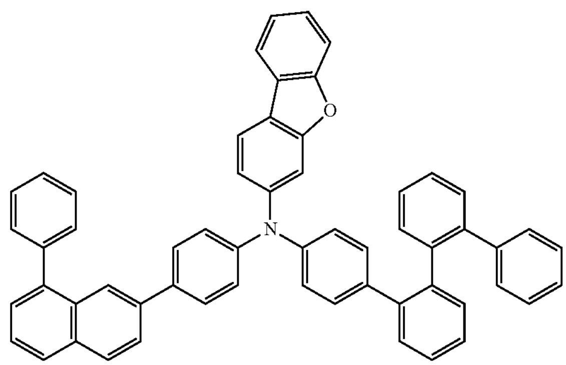
199
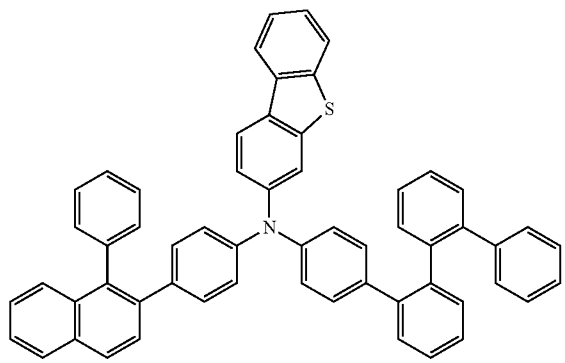
200
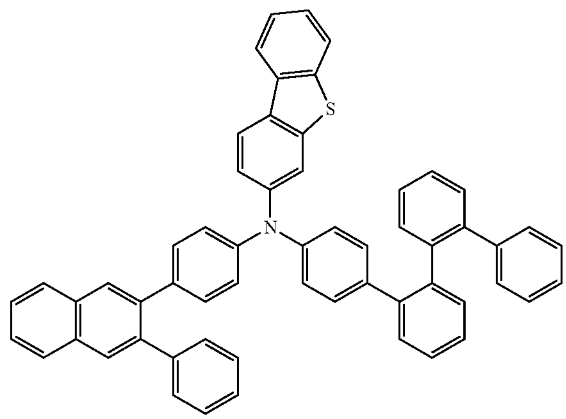
201
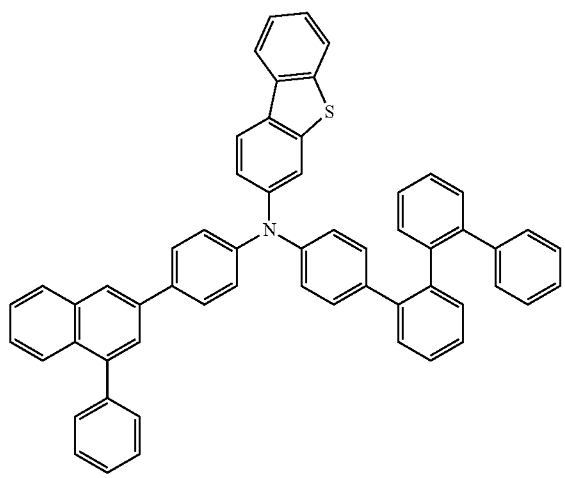
202
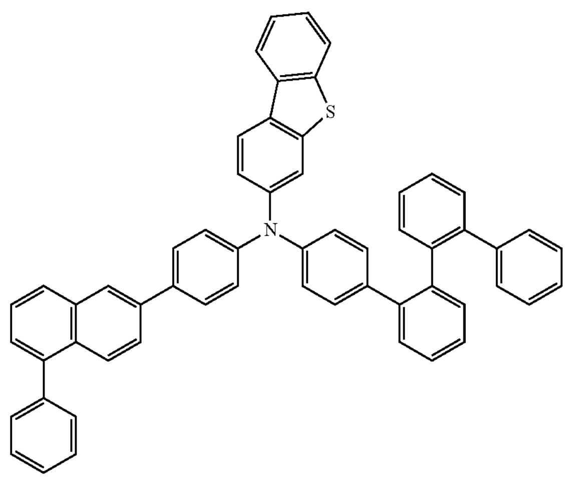

-continued
203
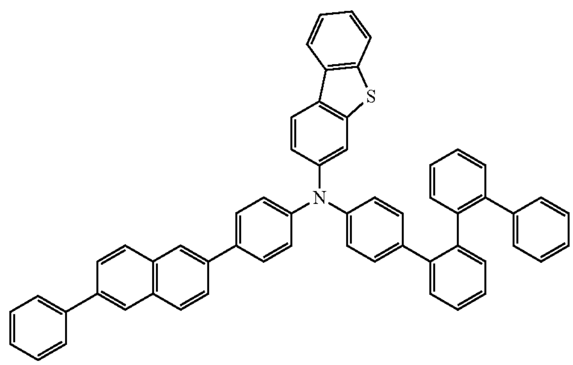
204
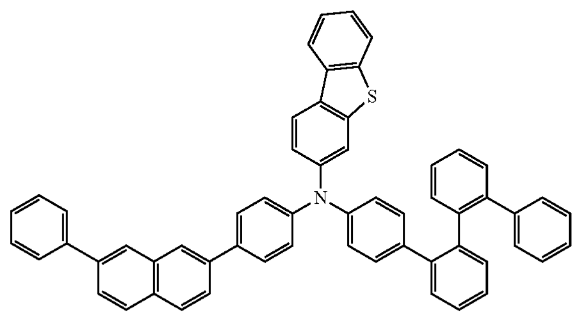
205
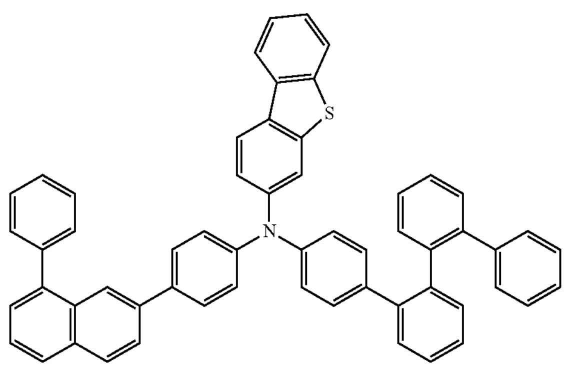
206
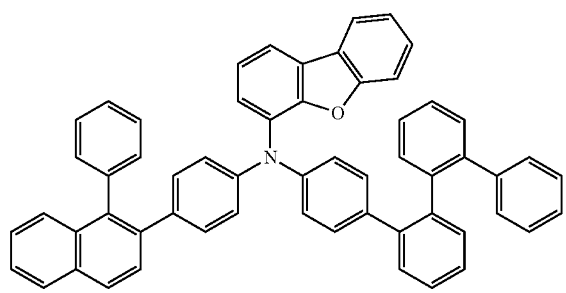
207
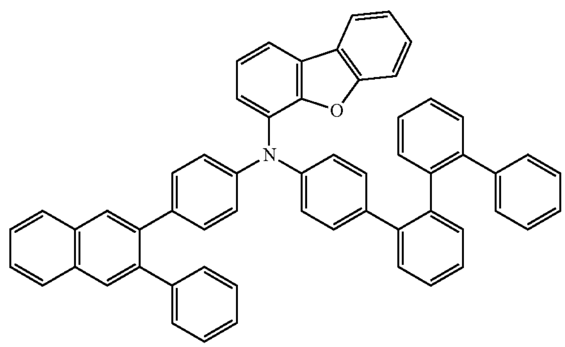
208
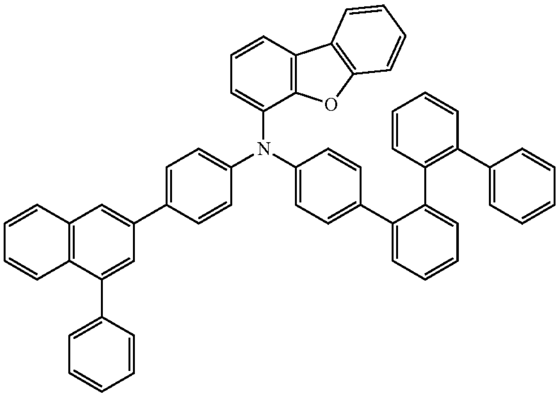
207
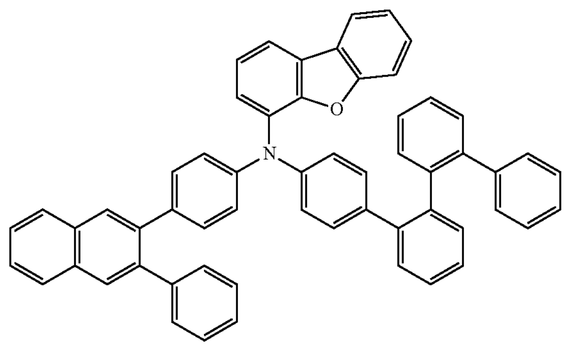

208
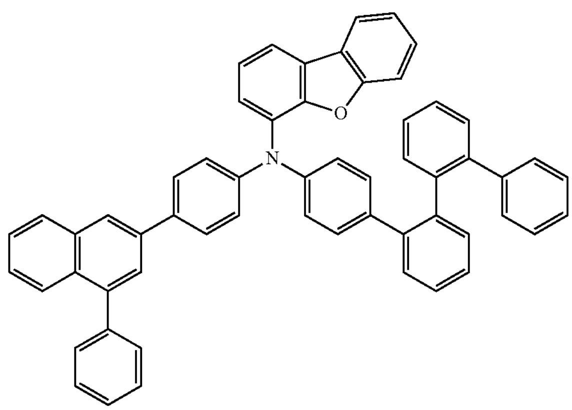
209
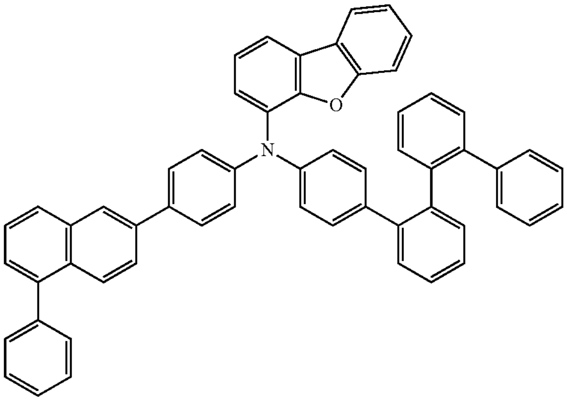
210
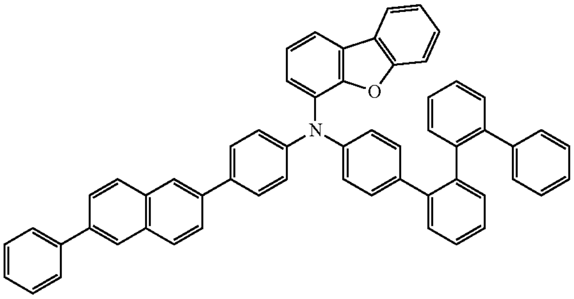
211
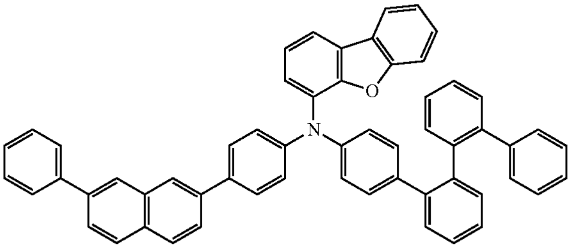
-continued
212
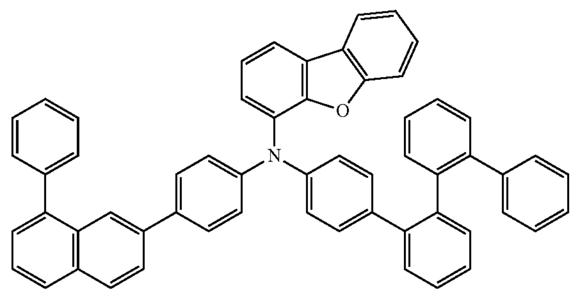
213
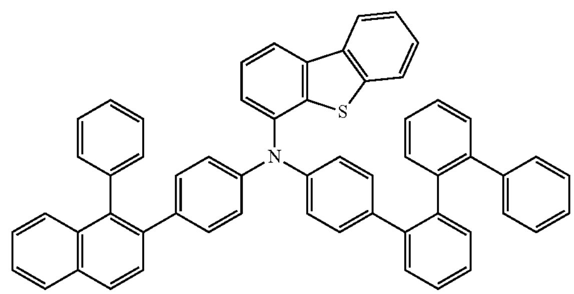
214
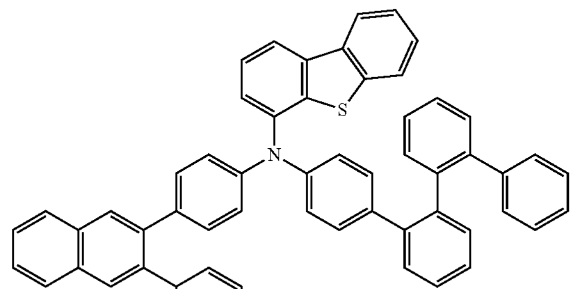
215
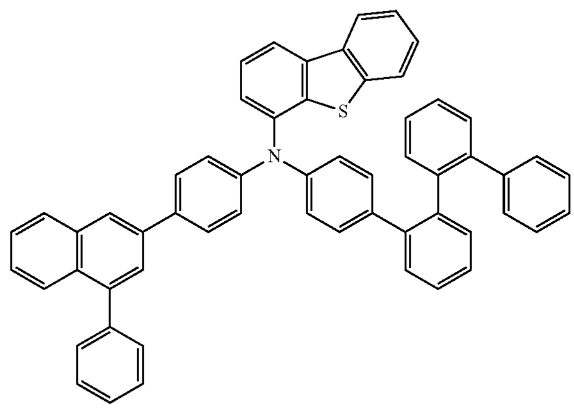

-continued

216

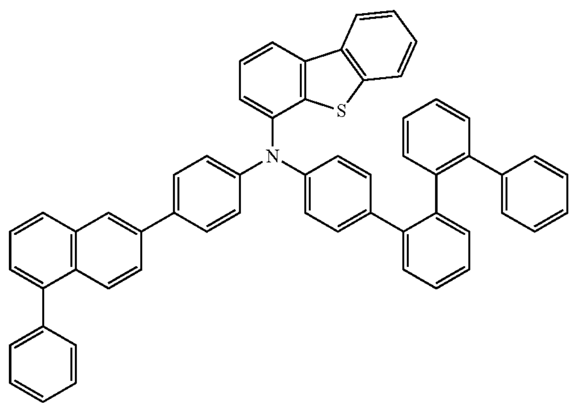

217

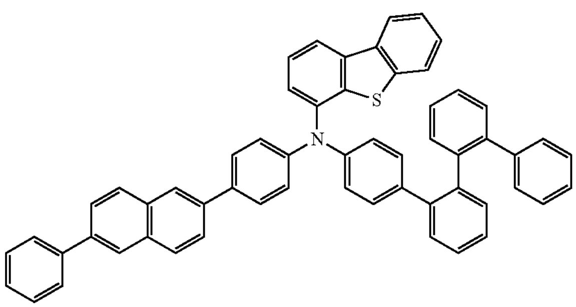

218

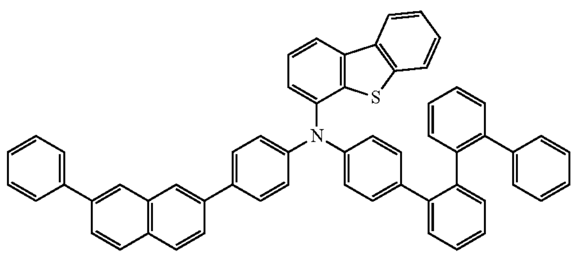

219

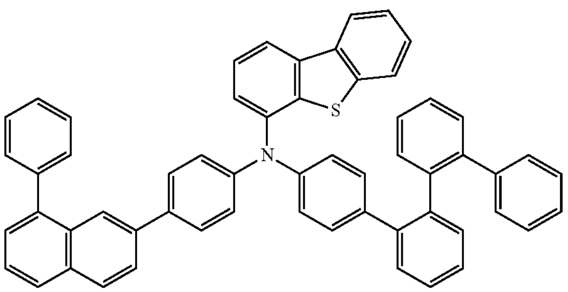

.

15. An amine compound represented by Formula 1:

[Formula 1]

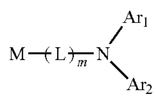

wherein in Formula 1,

L is a substituted or unsubstituted arylene group having 6 to 30 ring-forming carbon atoms, or a substituted or unsubstituted heteroarylene group having 2 to 30 ring-forming carbon atoms, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, m is 1 or 2, M is a group represented by Formula 2, and at least one of $Ar_1$ and $Ar_2$ is a group represented by Formula 3:

[Formula 2]

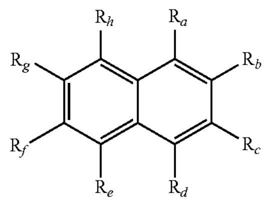

wherein in Formula 2, one of $R_a$, $R_b$, and $R_c$ is a position linked to L in Formula 1, the remainder of $R_a$ to $R_h$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one of the remainder of $R_a$ to $R_h$ is not a hydrogen atom:

[Formula 3]

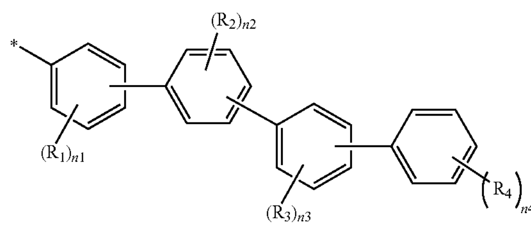

wherein in Formula 3, $R_1$ to $R_4$ are each independently a hydrogen atom, a deuterium atom, a halogen atom, a substituted or unsubstituted alkyl group having 1 to 20 carbon atoms, or a substituted or unsubstituted heteroaryl group having 2 to 30 ring-forming carbon atoms, where the case in which each of $R_1$ and $R_2$ is an unsubstituted phenyl group is excluded, —* is a position linked to N in Formula 1, $n_1$ to $n_3$ are each independently an integer from 0 to 4, $n_4$ is an integer from 0 to 5, wherein at least one arene moiety in Formula 3 is bound to two other arene moieties of Formula 3 at ortho or meta positions, and when L in Formula 1 is a p-phenylene group, when a group represented by Formula 3 is a group represented by Formula 3-a, and when $R_a$ in Formula 2 is linked to L in Formula 1, $R_b$ in Formula 2 is not an unsubstituted phenyl group:

[Formula 3-a]

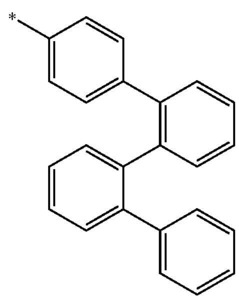

and when $R_a$ in Formula 2 is linked to L in Formula 1, $R_b$ and $R_h$ in Formula 2 are each independently a hydrogen atom, or a substituted or unsubstituted heteroaryl group having 2 to 30 ring-forming carbon atoms.

16. The amine compound of claim 15, wherein the amine compound represented by Formula 1 is represented by Formula 4-1 or Formula 4-2:

[Formula 4-1]

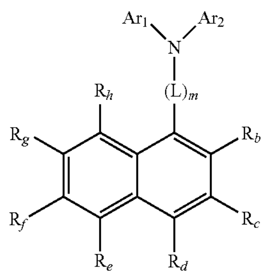

[Formula 4-2]

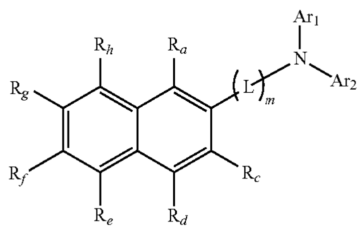

wherein in Formula 4-1 and Formula 4-2, $Ar_1$, $Ar_2$, L, $R_a$ to $R_h$, and m are the same as defined in Formula 1 and Formula 2.

17. The amine compound of claim 15, wherein the amine compound represented by Formula 1 is represented by one of Formula 5-1 to Formula 5-3:

[Formula 5-1]

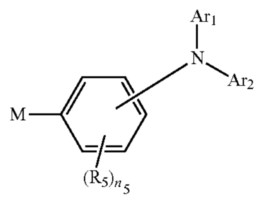

-continued

[Formula 5-2]

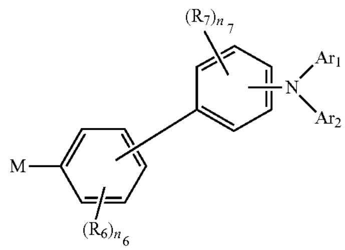

[Formula 5-3]

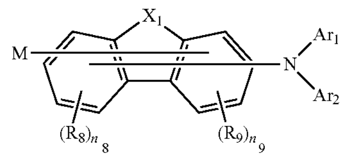

wherein in Formula 5-1 to Formula 5-3, $X_1$ is $N(R_{10})$, O, or S, $R_5$ to $R_{10}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $n_5$ to $n_9$ are each independently an integer from 0 to 4, the sum of $n_8$ and $n_9$ is equal to or less than 6, and M, $Ar_1$, and $Ar_2$ are the same as defined in Formula 1.

18. The amine compound of claim 17, wherein the amine compound represented by Formula 1 is represented by one of Formula 6-1 to Formula 6-5:

[Formula 6-1]

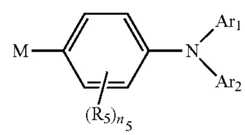

[Formula 6-2]

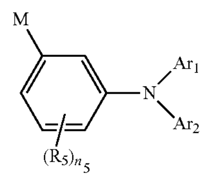

[Formula 6-3]

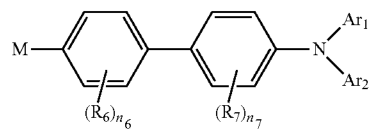

[Formula 6-4]

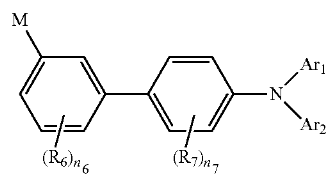

-continued

[Formula 6-5]

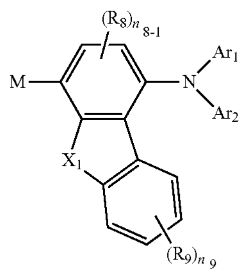

wherein in Formula 6-1 to Formula 6-5, $n_{8-1}$ is an integer from 0 to 2, $Ar_1$, $Ar_2$, M, $X_1$, $R_5$ to $R_9$, $n_5$ to $n_7$, and $n_9$ are the same as defined in Formula 1 and Formula 5-1 to Formula 5-3.

19. The amine compound of claim 15, wherein $Ar_1$ is a group represented by Formula 3, and $Ar_2$ is a group represented by one of Formula 7-1 to Formula 7-5:

[Formula 7-1]

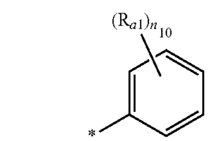

[Formula 7-2]

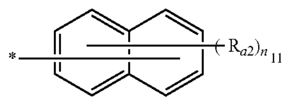

[Formula 7-3]

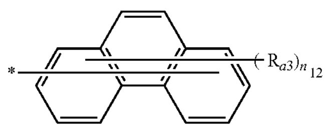

-continued

[Formula 7-4]

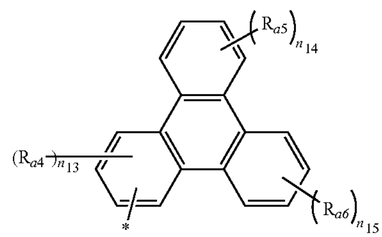

[Formula 7-5]

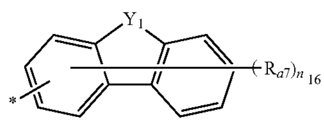

wherein in Formula 7-1 to Formula 7-5, $Y_1$ is $N(R_{11})$, O, or S, $R_{a1}$ to $R_{a6}$ and $R_{11}$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, $R_{a7}$ is a hydrogen atom, a deuterium atom, a halogen atom, a substituted or unsubstituted alkyl group having 1 to 20 carbon group, a substituted or unsubstituted alkenyl group having 2 to 20 carbon atoms, a substituted or unsubstituted aryl group having 6 to 30 ring-forming carbon atoms, or a substituted or unsubstituted heteroaryl group having 2 to 30 ring-forming carbon atoms, or is bonded to an adjacent group to form a ring, $n_{10}$ is an integer from 0 to 5, $n_{11}$ and $n_{16}$ are each independently an integer from 0 to 7, $n_{12}$ is an integer from 0 to 9, $n_{13}$ is an integer from 0 to 3, $n_{14}$ and $n_{15}$ are each independently an integer from 0 to 4, and ——* is a position linked to N in Formula 1.

20. The amine compound of claim 15, wherein the amine compound represented by Formula 1 is one selected from Compound Group 1:

[Compound Group 1]

1

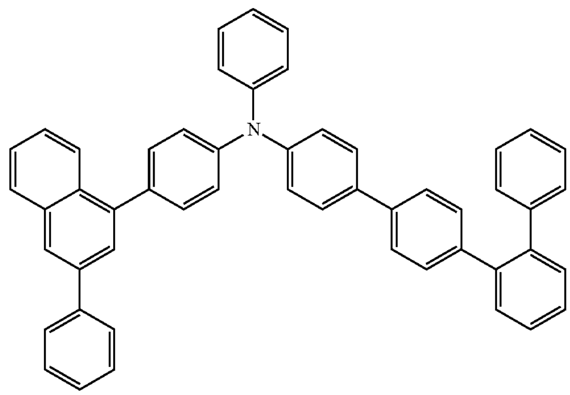

2

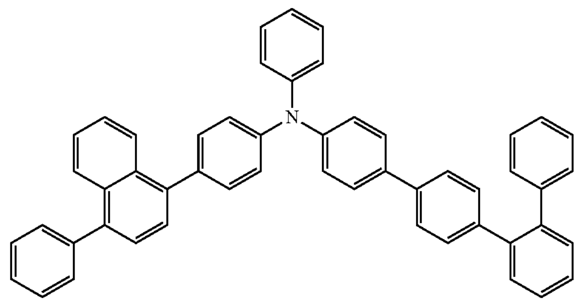

-continued
3
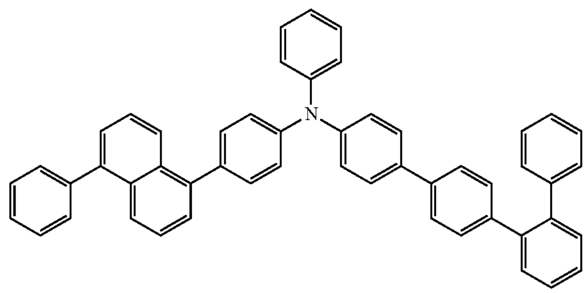
4
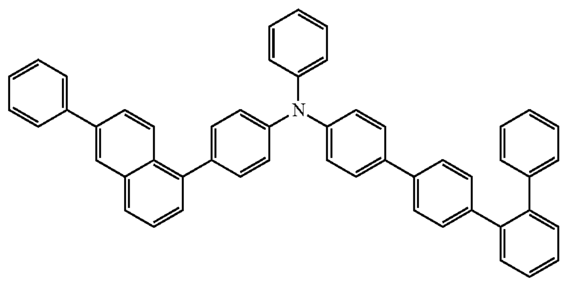
5
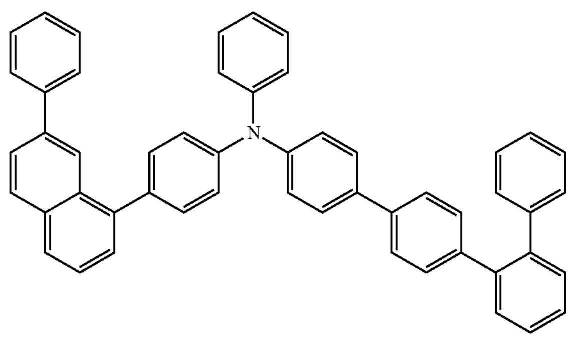
48
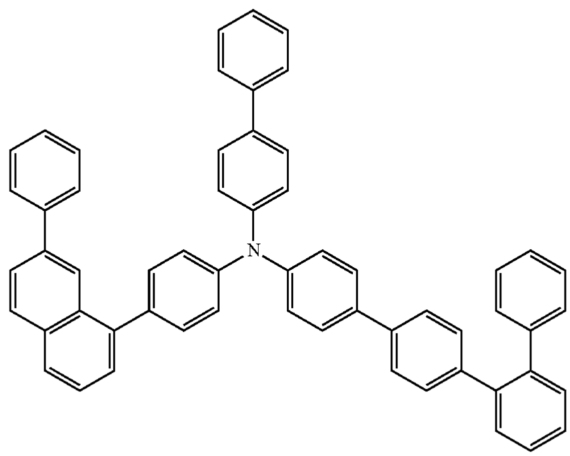
49
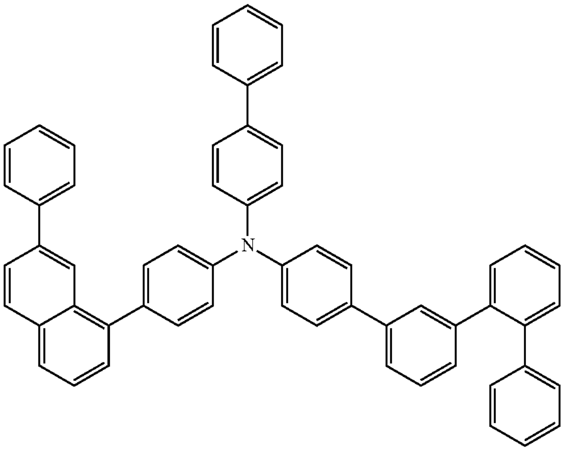
50
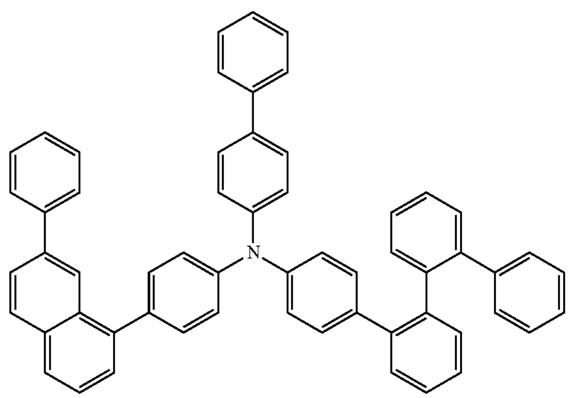
51
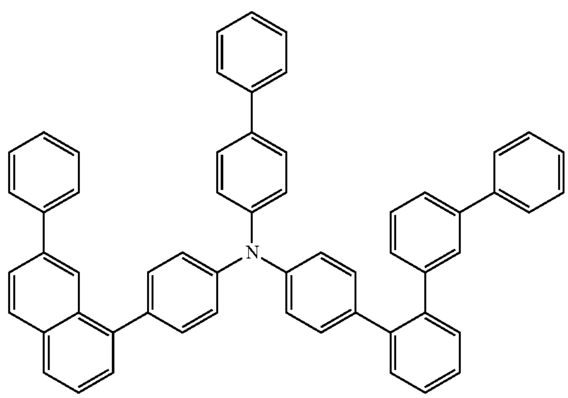

-continued
52
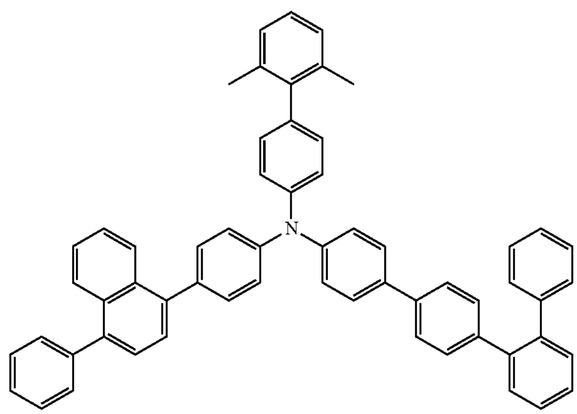
53
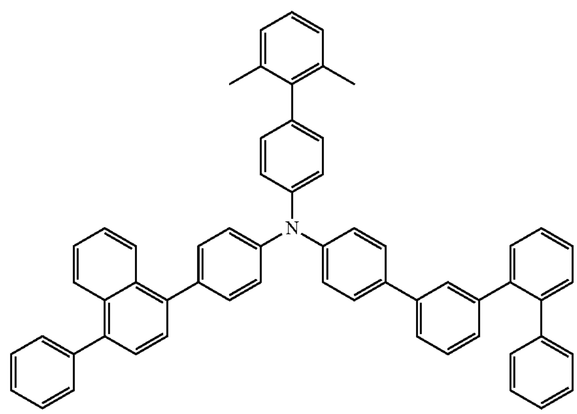
54
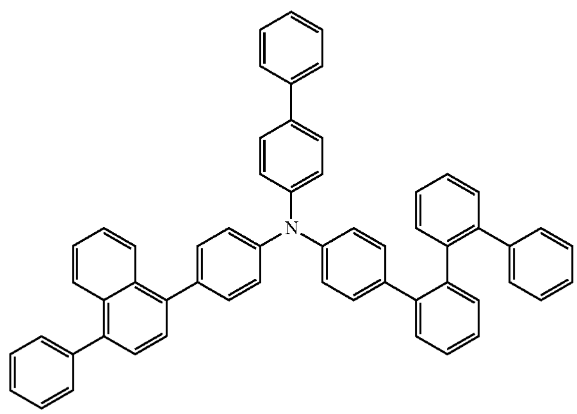
55
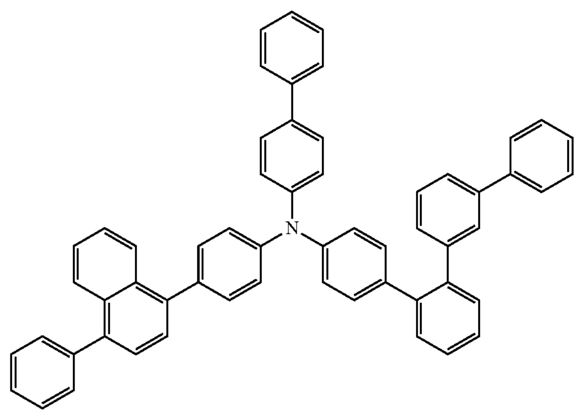
80
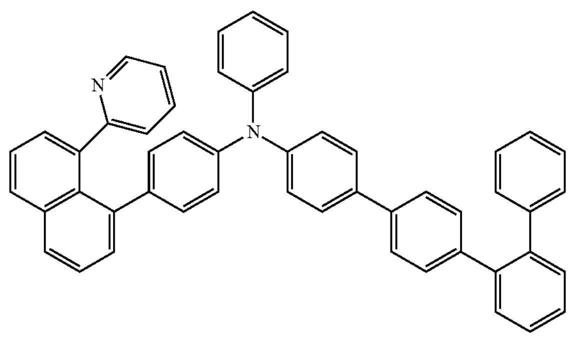
81
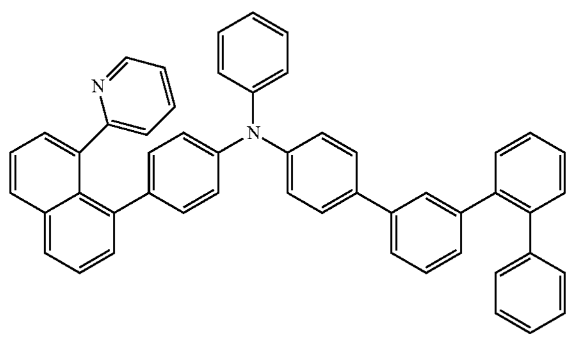
82
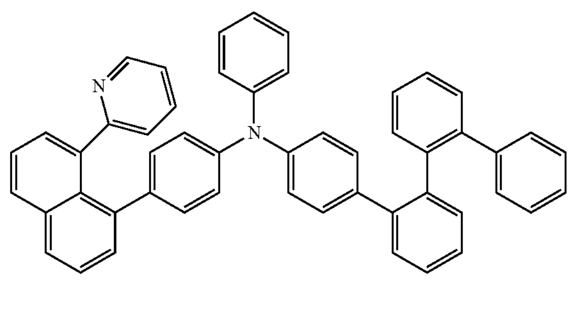

-continued
83
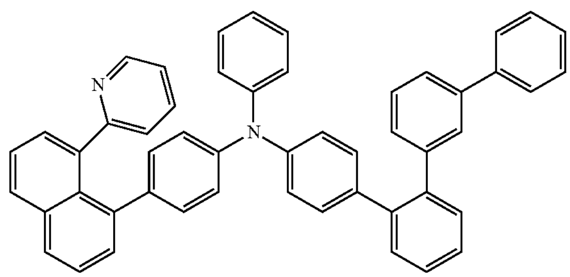
84
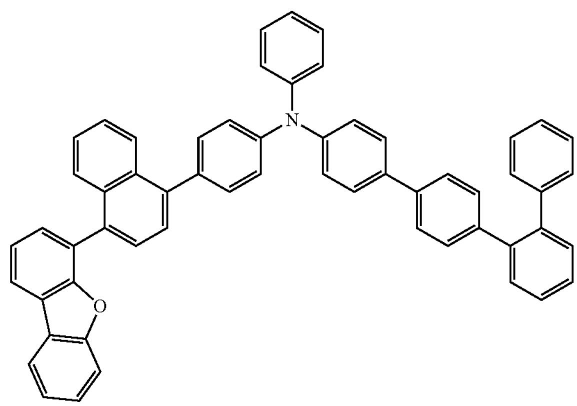
85
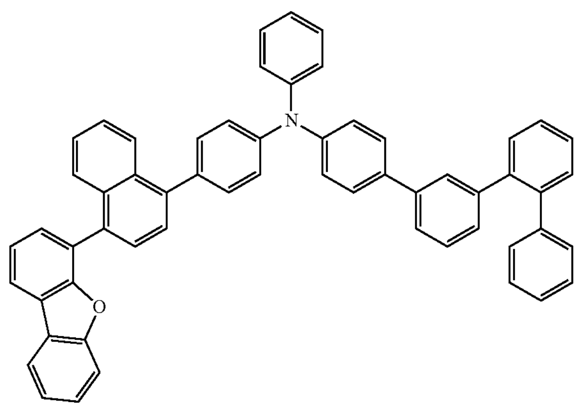
86
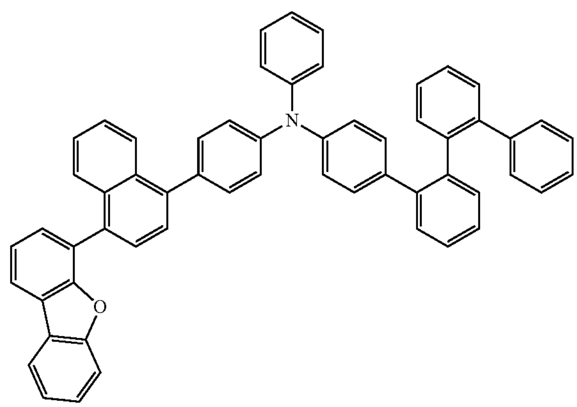
87
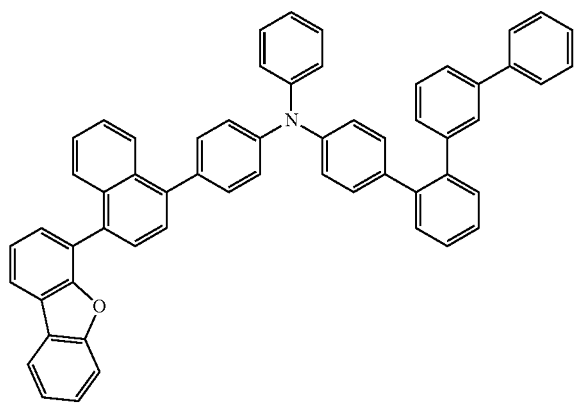
88
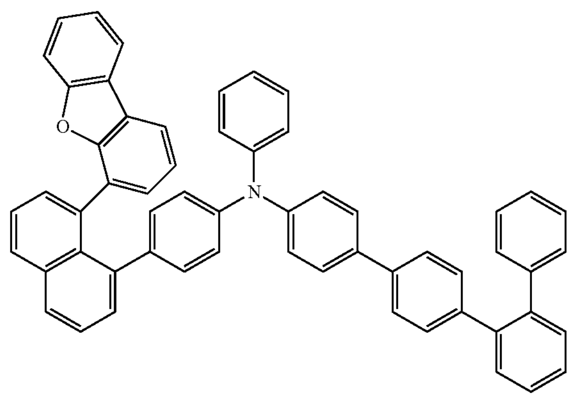

-continued
89
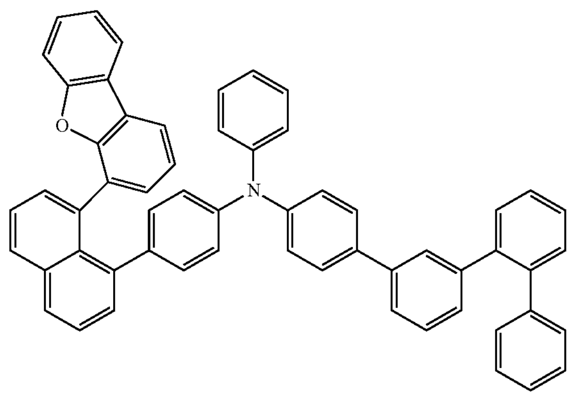
90
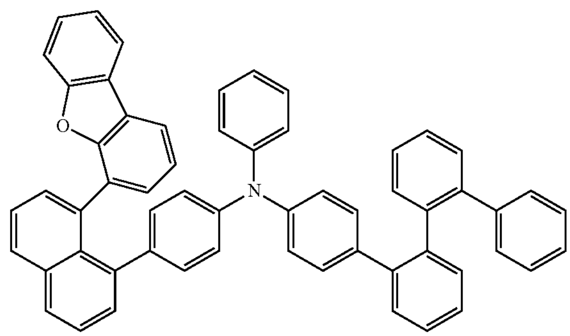
91
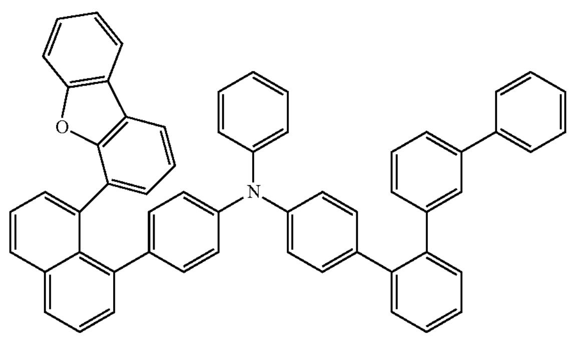
92
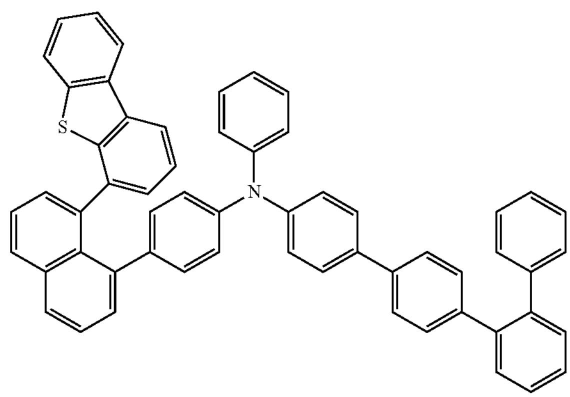
93
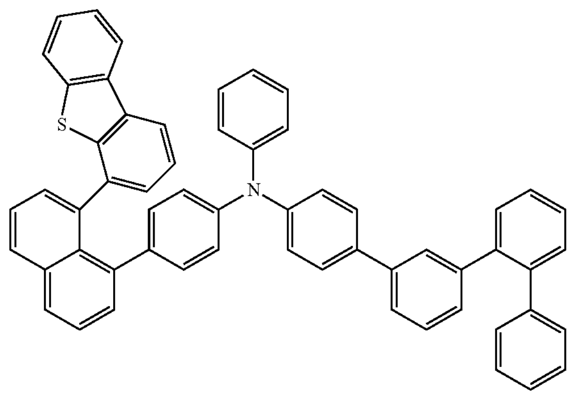
94
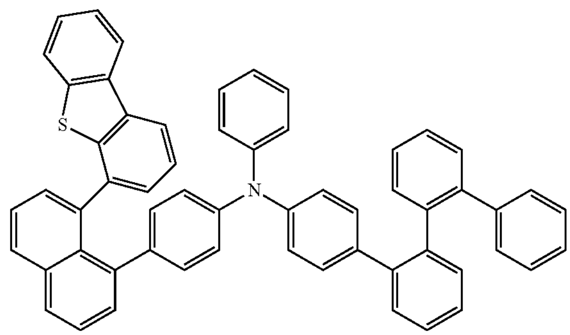
95
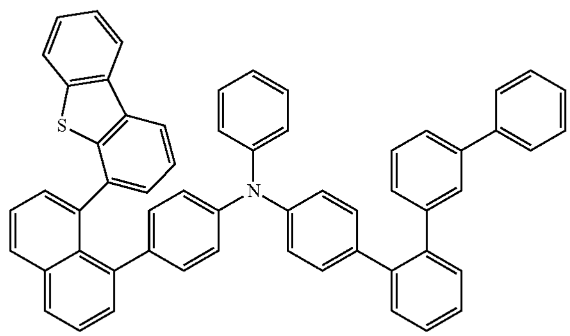
96
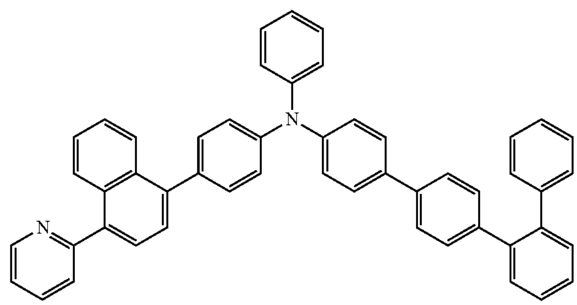

-continued
97
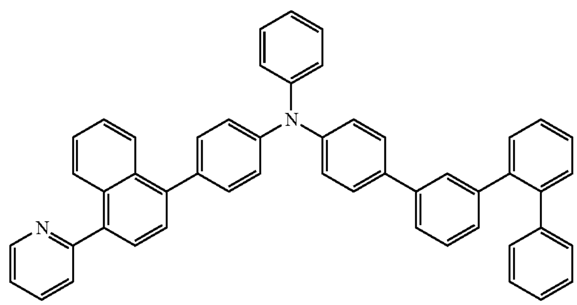
98
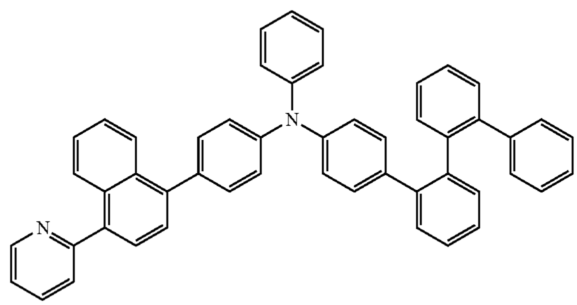
99
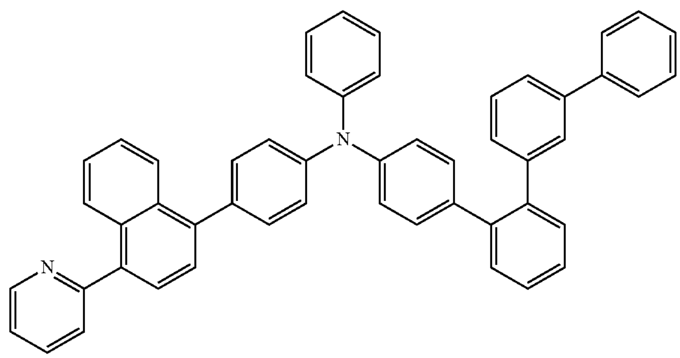
100
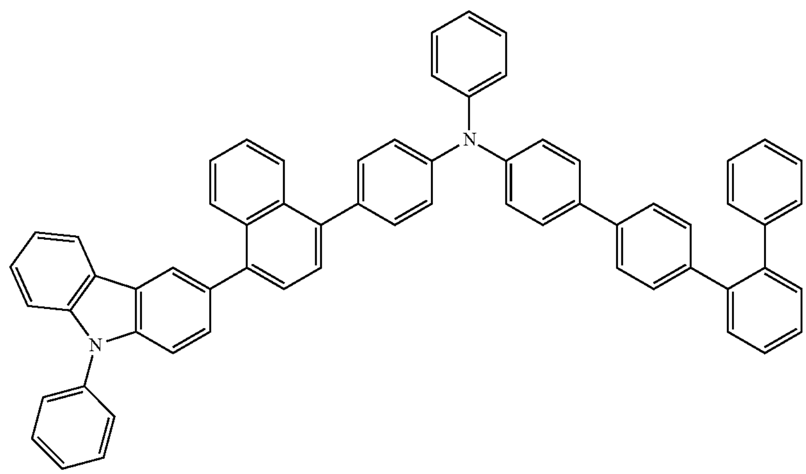
102
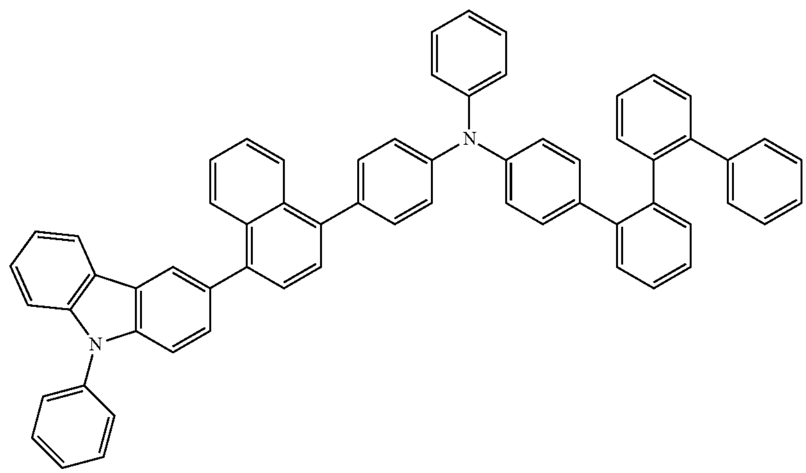

-continued
104
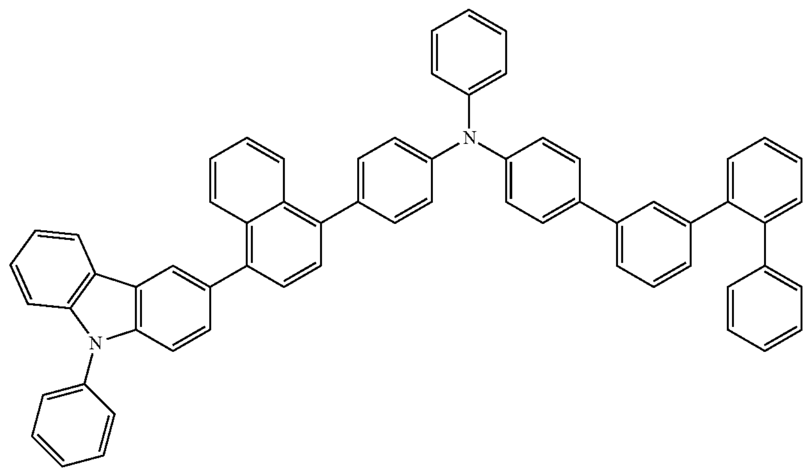
106
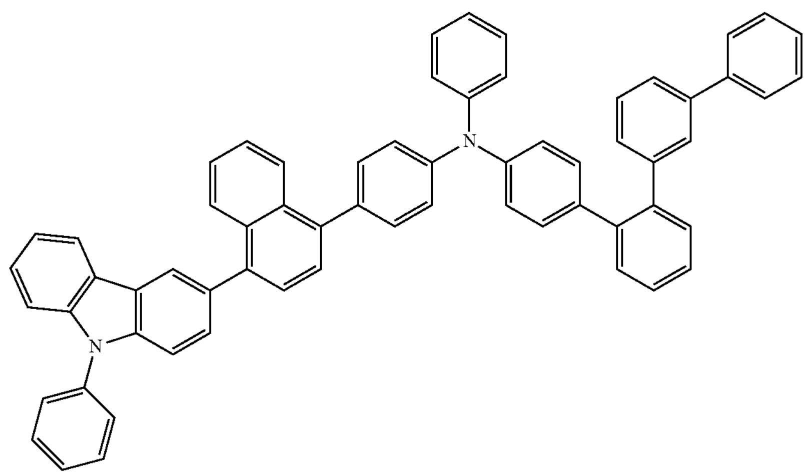

-continued
185
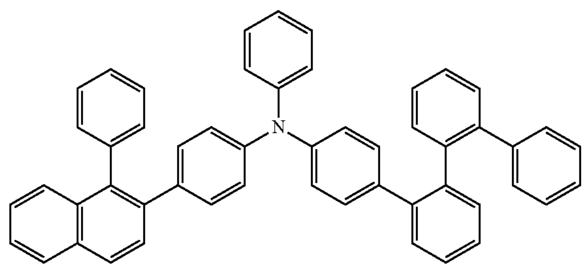
186
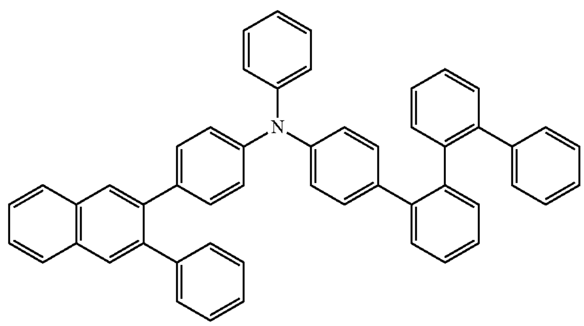
187
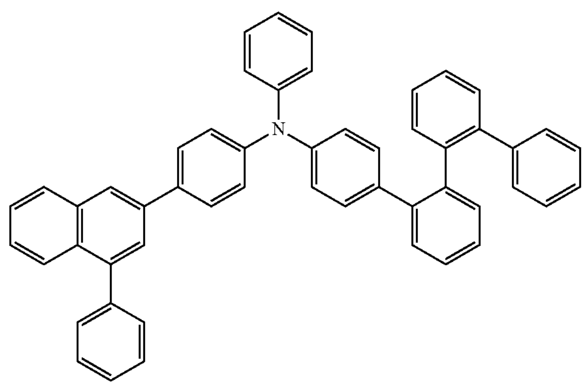
188
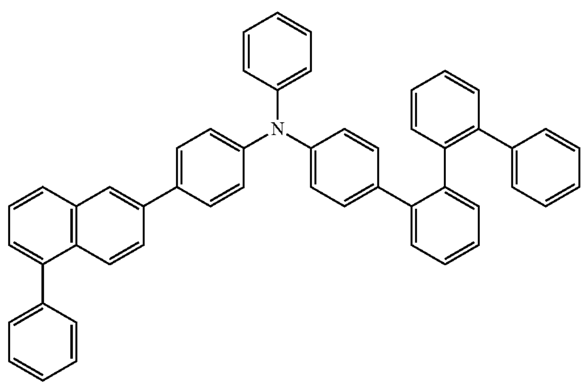
189
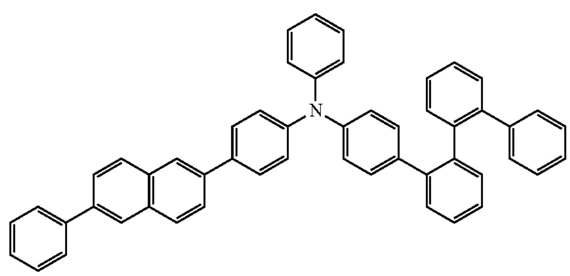
190
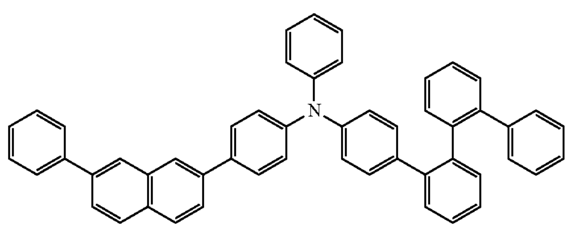
191
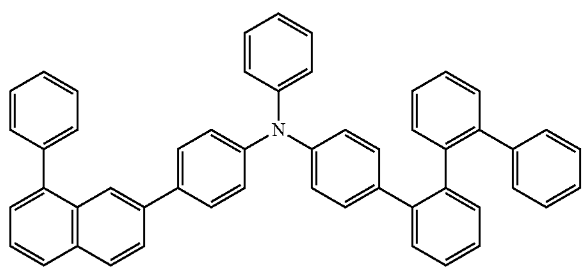
192
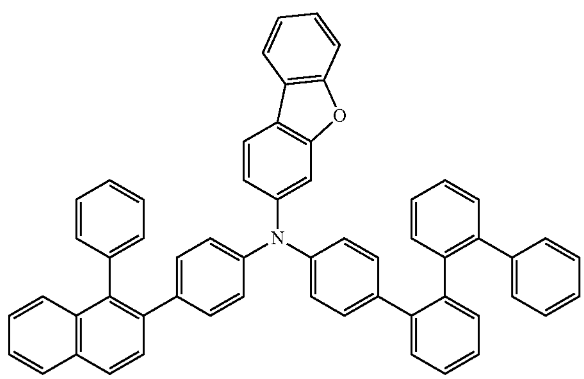

-continued
193
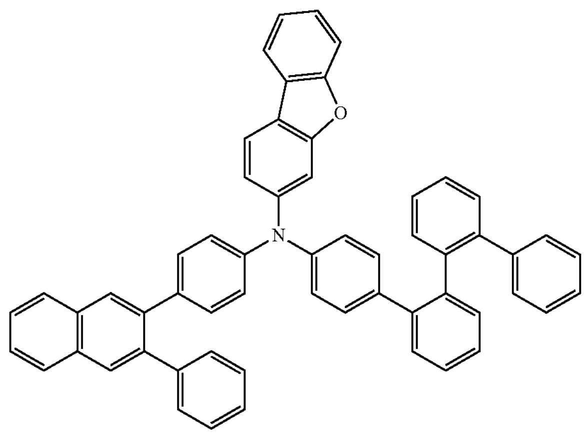
194
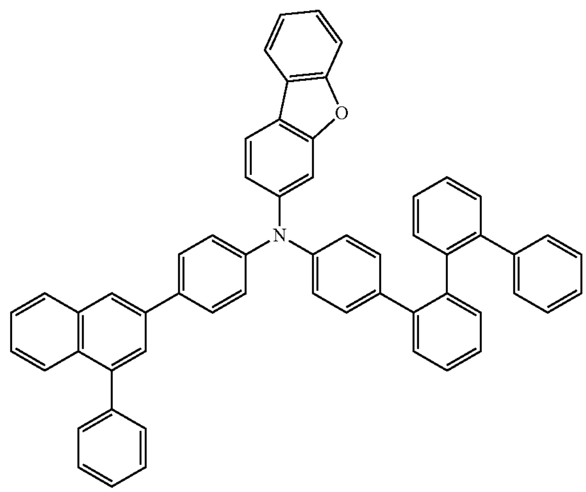
195
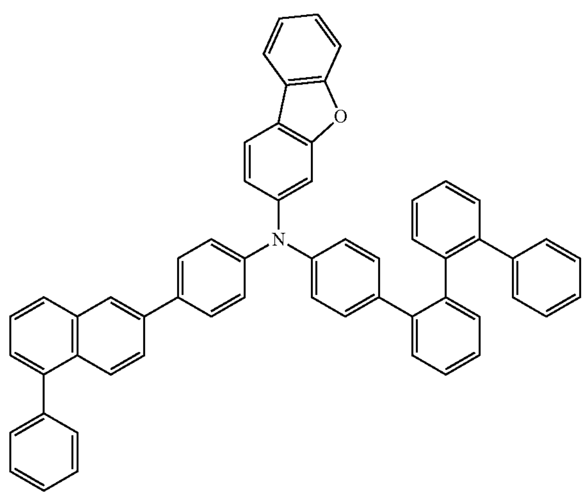
196
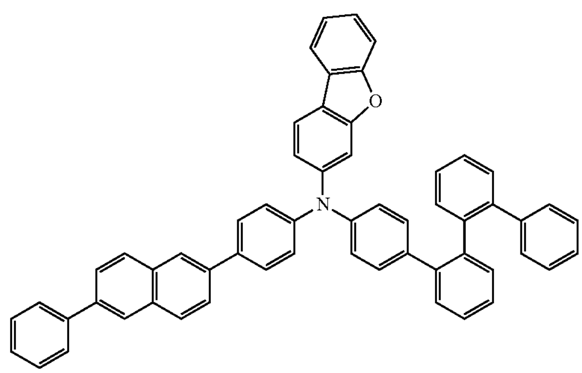
197
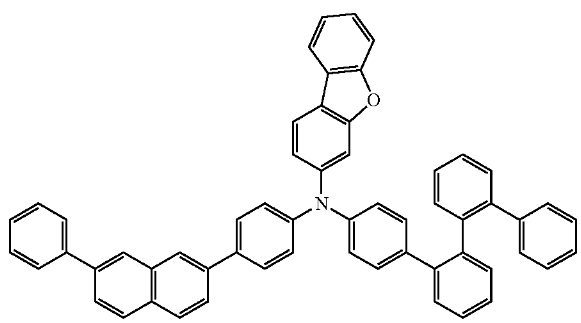
198
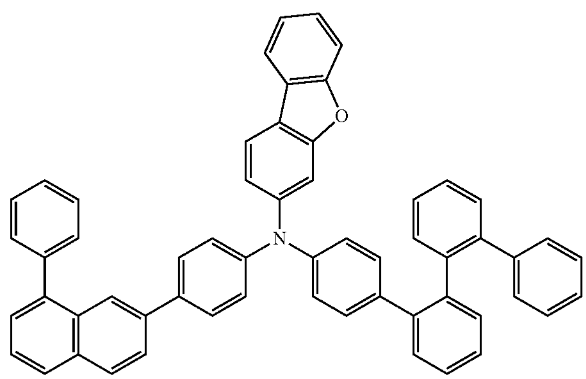

-continued
199
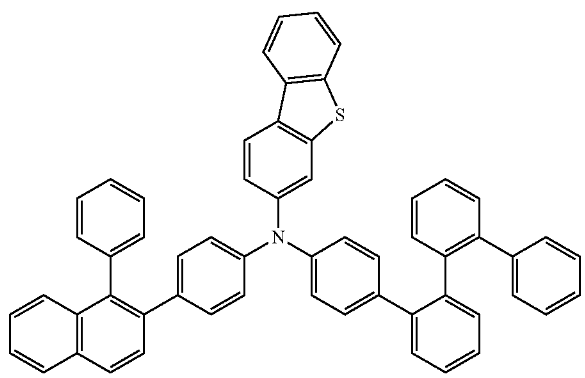
200
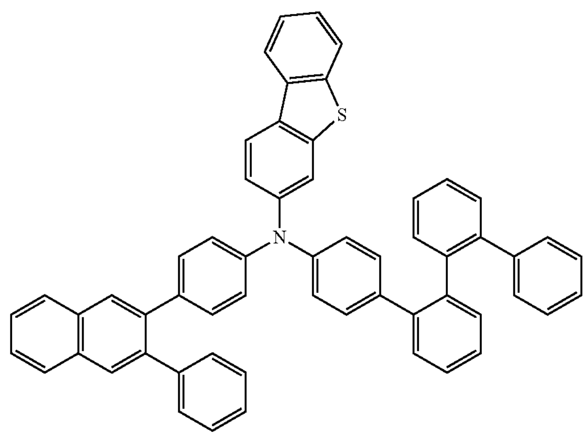
201
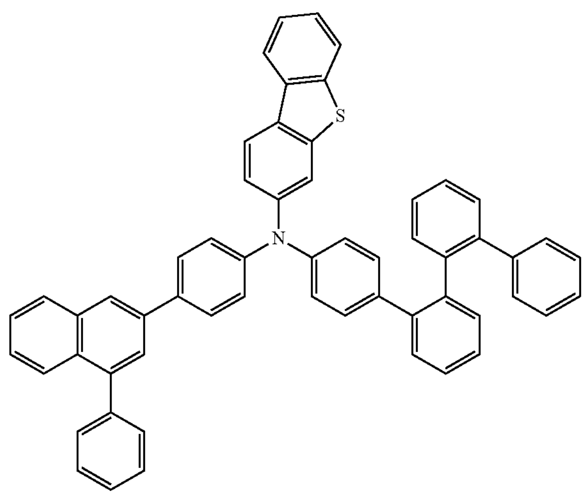
202
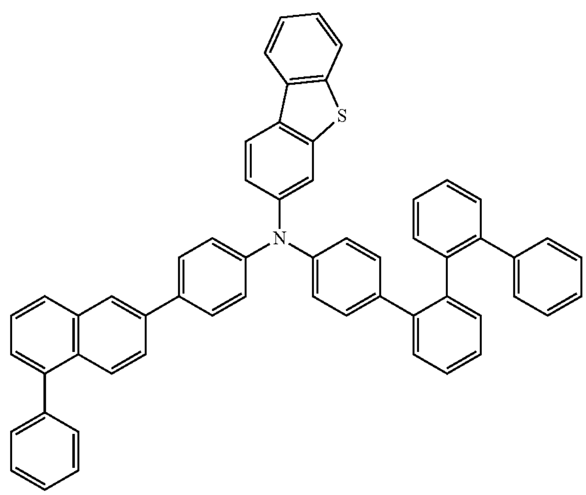
203
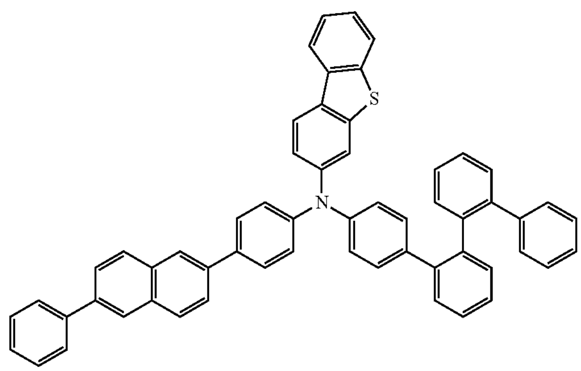
204
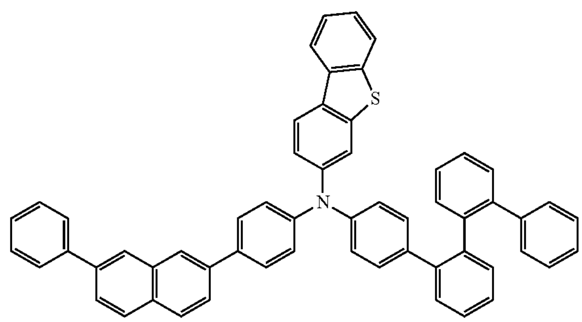

-continued
205
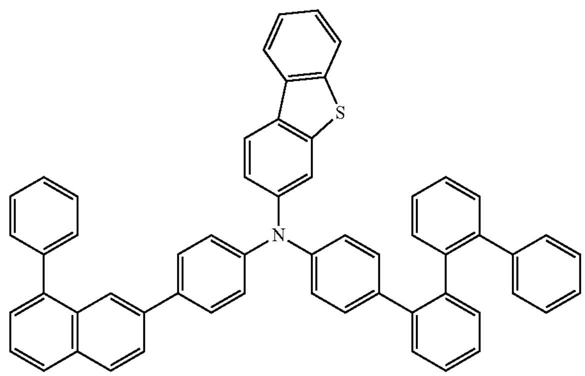
206
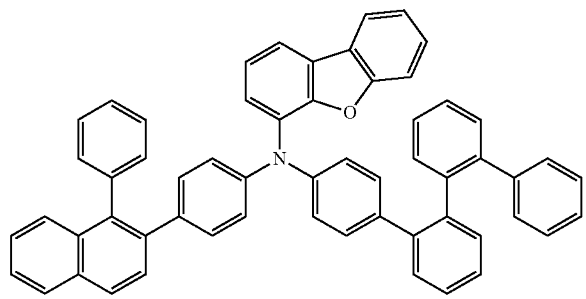
207
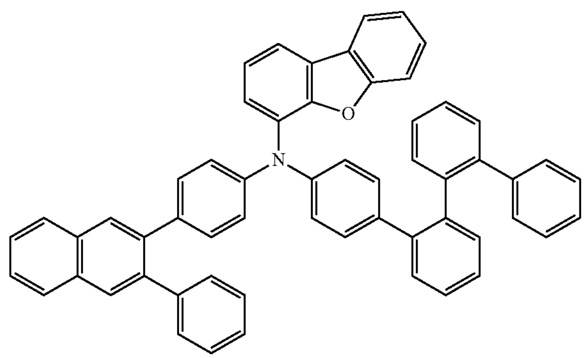
208
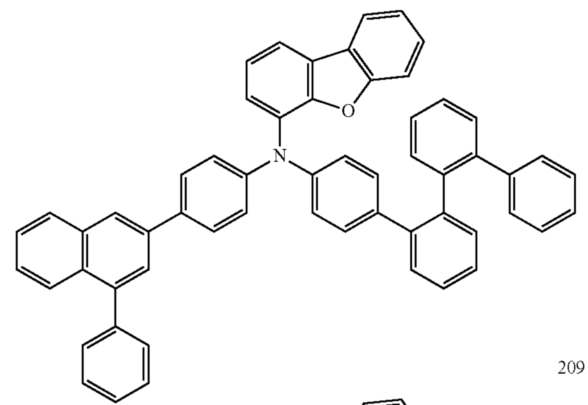
209
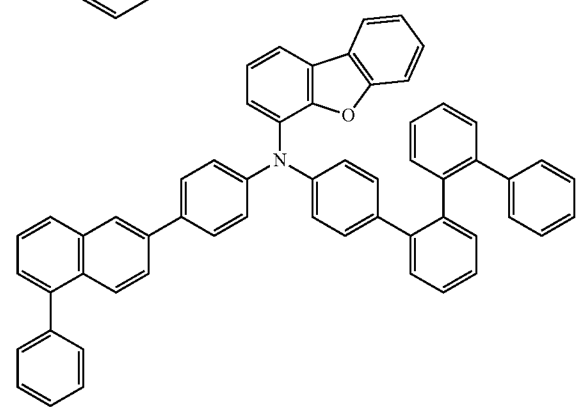
-continued
210
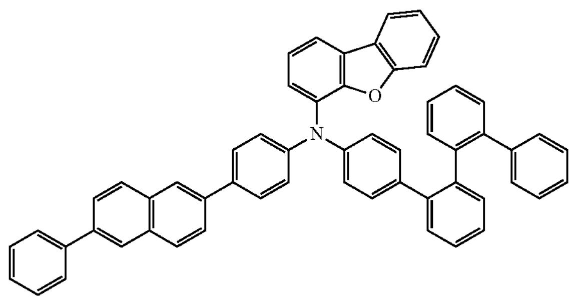
211
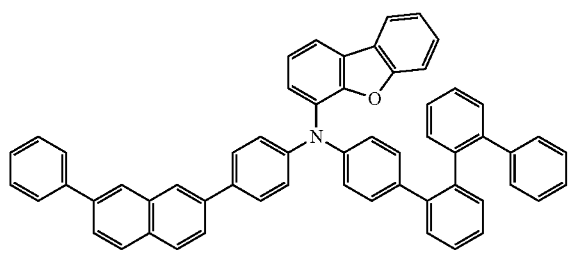

-continued
212
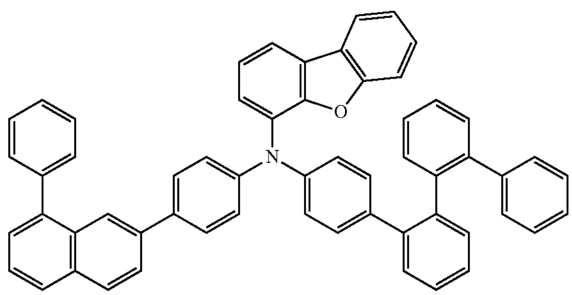
213
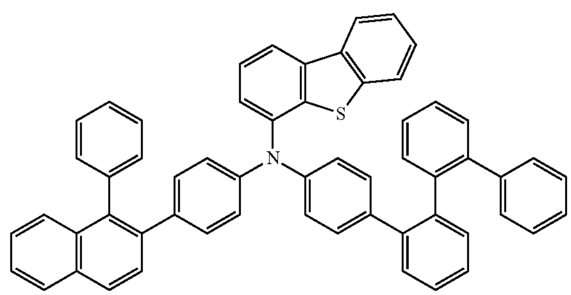
214
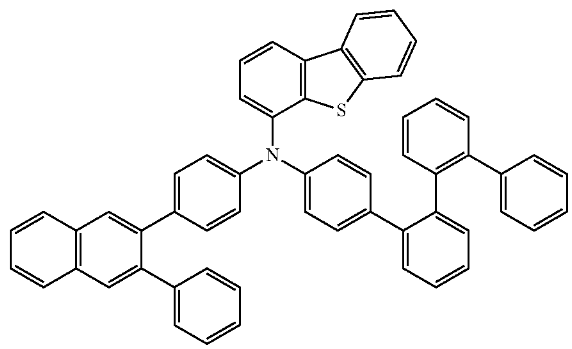
215
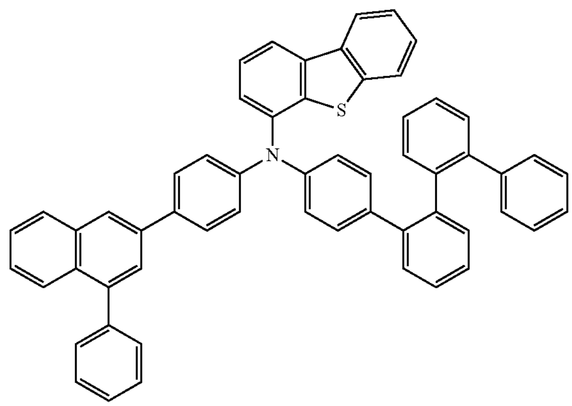
-continued
216
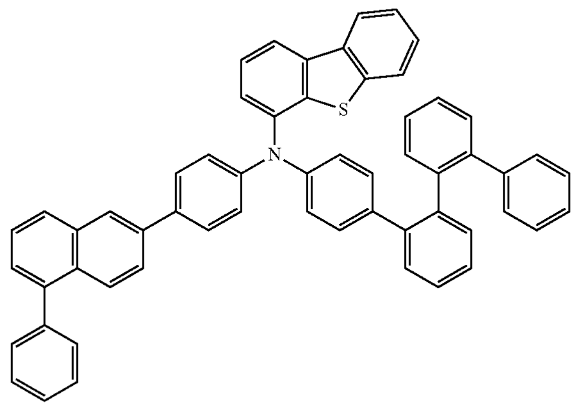
217
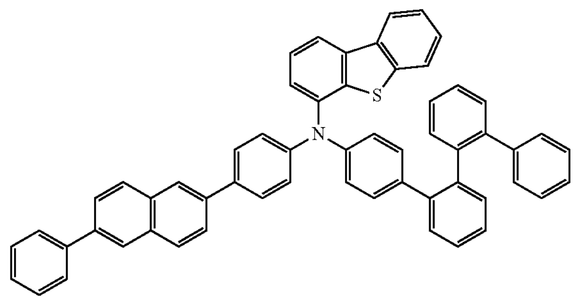
218
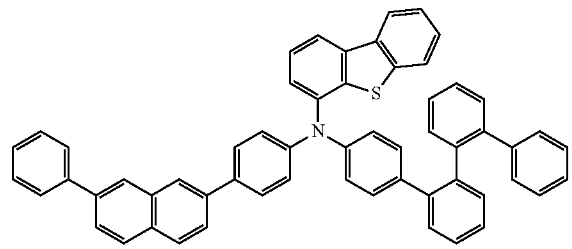
219
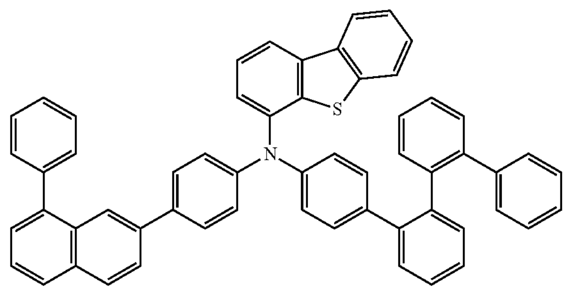
.
21. A display apparatus comprising:
a light emitting device comprising:
a first electrode;
a second electrode facing the first electrode; and
a plurality of organic layers disposed between the first electrode and the second electrode, wherein the plurality of organic layers comprises at least one organic layer that includes an amine compound represented by Formula 1:

[Formula 1]

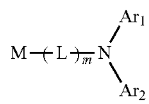

wherein in Formula 1,

L is a substituted or unsubstituted arylene group having 6 to 30 ring-forming carbon atoms, or a substituted or unsubstituted heteroarylene group having 2 to 30 ring-forming carbon atoms, $Ar_1$ and $Ar_2$ are each independently a substituted or unsubstituted aryl group having 6 to 30 ring-forming carbon atoms, or a substituted or unsubstituted heteroaryl group having 2 to 30 ring-forming carbon atoms, m is 1 or 2, M is a group represented by Formula 2, and at least one of $Ar_1$ and $Ar_2$ is a group represented by Formula 3:

[Formula 2]

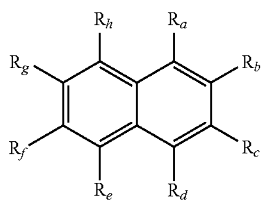

wherein in Formula 2, one of $R_a$, $R_b$, and $R_c$ is a position linked to L in Formula 1, the remainder of $R_a$ to $R_h$ are each independently a hydrogen atom, a deuterium atom, a halogen atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one of the remainder of $R_a$ to $R_h$ is not a hydrogen atom:

[Formula 3]

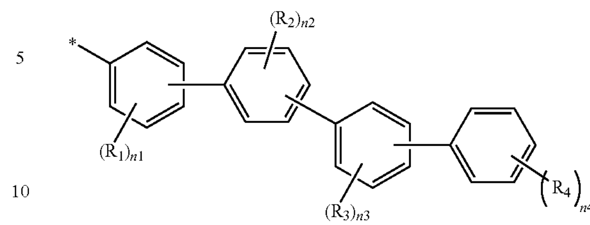

wherein in Formula 3, $R_1$ to $R_4$ are each independently a hydrogen atom, a deuterium atom, a halogen atom, a substituted or unsubstituted alkyl group having 1 to 20 carbon atoms, or a substituted or unsubstituted heteroaryl group having 2 to 30 ring-forming carbon atoms, where the case in which each of $R_1$ and $R_2$ is an unsubstituted phenyl group is excluded, ——* is a position linked to N in Formula 1, $n_1$ to $n_3$ are each independently an integer from 0 to 4, $n_4$ is an integer from 0 to 5, and wherein at least one arene moiety in Formula 3 is bound to two other arene moieties of Formula 3 at ortho or meta positions, and when L in Formula 1 is a p-phenylene group, when a group represented by Formula 3 is a group represented by Formula 3-a, and when $R_a$ in Formula 2 is linked to L in Formula 1, $R_b$ in Formula 2 is not an unsubstituted phenyl group:

[Formula 3-a]

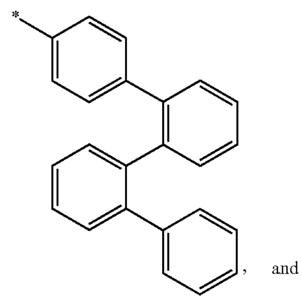 [SMILES: *c1ccc(-c2ccccc2-c2ccccc2-c2ccccc2)cc1]

, and when $R_a$ in Formula 2 is linked to L in Formula 1, $R_b$ and $R_h$ in Formula 2 are each independently a hydrogen atom, or a substituted or unsubstituted heteroaryl group having 2 to 30 ring-forming carbon atoms.

* * * * *